US010991896B2

(12) United States Patent
Boudreault et al.

(10) Patent No.: US 10,991,896 B2
(45) **Date of Patent: *Apr. 27, 2021**

(54) ORGANIC ELECTROLUMINESCENT MATERIALS AND DEVICES

(71) Applicant: UNIVERSAL DISPLAY CORPORATION, Ewing, NJ (US)

(72) Inventors: Pierre-Luc T. Boudreault, Pennington, NJ (US); Alexey Dyatkin, Ambler, PA (US); David Zenan Li, Princeton, NJ (US); Scott Joseph, Ewing, NJ (US); Chuanjun Xia, Lawrenceville, NJ (US); Hitoshi Yamamoto, Pennington, NJ (US); Michael S. Weaver, Princeton, NJ (US); Bert Alleyne, Newtown, PA (US); James Fiordeliso, Yardley, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 88 days.

This patent is subject to a terminal disclaimer.

(21) Appl. No.: 16/129,152

(22) Filed: Sep. 12, 2018

(65) Prior Publication Data

US 2019/0071461 A1 Mar. 7, 2019

Related U.S. Application Data

(63) Continuation of application No. 13/932,508, filed on Jul. 1, 2013, now Pat. No. 10,199,581.

(51) Int. Cl.

| | |
|---|---|
| *H01L 51/50* | (2006.01) |
| *H01L 51/00* | (2006.01) |
| *C09K 11/06* | (2006.01) |
| *C07F 15/00* | (2006.01) |
| *H01L 51/54* | (2006.01) |
| *H01L 51/52* | (2006.01) |

(52) U.S. Cl.

CPC ...... *H01L 51/0085* (2013.01); *C07F 15/0033* (2013.01); *C09K 11/06* (2013.01); *H01L 51/5012* (2013.01); *C09K 2211/1007* (2013.01); *C09K 2211/1029* (2013.01); *C09K 2211/185* (2013.01); *H01L 51/5016* (2013.01); *H01L 51/5056* (2013.01); *H01L 51/5072* (2013.01); *H01L 51/5088* (2013.01); *H01L 51/5096* (2013.01); *H01L 51/5206* (2013.01); *H01L 51/5221* (2013.01); *Y02E 10/549* (2013.01)

(58) Field of Classification Search

CPC ................. C07F 15/0033; C09K 11/06; C09K 2211/1007; C09K 2211/1029; C09K 2211/185; H01L 51/0085; H01L 51/5016

USPC ..... 556/40, 41, 136; 313/500–512; 428/690, 428/917, 691; 257/40, 88–104, 257/E51.001–E51.052; 427/58, 66; 252/301.16–301.35

See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | Vanslyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,316,064 | B1 | 11/2001 | Onozawa et al. |
| 6,337,102 | B1 | 1/2002 | Forrest et al. |
| 6,468,819 | B1 | 10/2002 | Kim et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Nandurkar, Nitin S. et al., "Synthesis of Sterically Hindered 1,3-Diketones", Synthetic Communications 2007, 37, pp. 4111-4115.

(Continued)

*Primary Examiner* — Dylan C Kershner
(74) *Attorney, Agent, or Firm* — Duane Morris LLP

(57) ABSTRACT

A compound having an ancillary ligand $L^1$ having the formula:

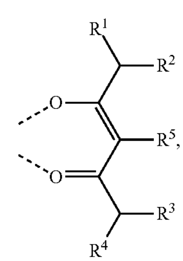

Formula I is disclosed. The ligand $L^1$ is coordinated to a metal M having an atomic number greater than 40, and two adjacent substituents are optionally joined to form into a ring. Such compound is suitable for use as emitters in organic light emitting devices.

20 Claims, 3 Drawing Sheets

(56) References Cited

U.S. PATENT DOCUMENTS

| | | | | |
|---|---|---|---|---|
| 6,528,187 | B1 | 3/2003 | Okada | |
| 6,687,266 | B1 | 2/2004 | Ma et al. | |
| 6,835,469 | B2 | 12/2004 | Kwong et al. | |
| 6,921,915 | B2 | 7/2005 | Takiguchi et al. | |
| 7,087,321 | B2 | 8/2006 | Kwong et al. | |
| 7,090,928 | B2 | 8/2006 | Thompson et al. | |
| 7,154,114 | B2 | 12/2006 | Brooks et al. | |
| 7,250,226 | B2 | 7/2007 | Tokito et al. | |
| 7,279,704 | B2 | 10/2007 | Walters et al. | |
| 7,332,232 | B2 | 2/2008 | Ma et al. | |
| 7,338,722 | B2 | 3/2008 | Thompson et al. | |
| 7,393,599 | B2 | 7/2008 | Thompson et al. | |
| 7,396,598 | B2 | 7/2008 | Takeuchi et al. | |
| 7,431,968 | B1 | 10/2008 | Shtein et al. | |
| 7,445,855 | B2 | 11/2008 | MacKenzie et al. | |
| 7,534,505 | B2 | 5/2009 | Lin et al. | |
| 7,740,957 | B2 | 6/2010 | Kim et al. | |
| 9,163,174 | B2 * | 10/2015 | Alleyne | C07F 15/0033 |
| 9,397,302 | B2 * | 7/2016 | Boudreault | H01L 51/0085 |
| 9,512,355 | B2 * | 12/2016 | Ma | H01L 51/0085 |
| 9,590,194 | B2 * | 3/2017 | Boudreault | H01L 51/0085 |
| 9,799,838 | B2 * | 10/2017 | Boudreault | H01L 51/0085 |
| 9,847,496 | B2 * | 12/2017 | Xia | H01L 51/0085 |
| 9,929,353 | B2 * | 3/2018 | Kottas | C07D 487/06 |
| 9,929,357 | B2 * | 3/2018 | Boudreault | C09K 11/06 |
| 9,935,277 | B2 * | 4/2018 | Xia | H01L 51/0085 |
| 10,003,033 | B2 * | 6/2018 | Boudreault | H01L 51/0085 |
| 10,008,677 | B2 * | 6/2018 | Xia | C07F 15/0033 |
| 10,074,806 | B2 * | 9/2018 | Adamovich | C07D 495/04 |
| 10,199,581 | B2 * | 2/2019 | Boudreault | H01L 51/0085 |
| 10,457,699 | B2 * | 10/2019 | Boudreault | C07D 491/048 |
| 2002/0034656 | A1 | 3/2002 | Thompson et al. | |
| 2002/0134984 | A1 | 9/2002 | Igarashi | |
| 2002/0158242 | A1 | 10/2002 | Son et al. | |
| 2003/0072964 | A1 | 4/2003 | Kwong | |
| 2003/0138657 | A1 | 7/2003 | Li et al. | |
| 2003/0152802 | A1 | 8/2003 | Tsuboyama et al. | |
| 2003/0162053 | A1 | 8/2003 | Marks et al. | |
| 2003/0175553 | A1 | 9/2003 | Thompson et al. | |
| 2003/0230980 | A1 | 12/2003 | Forrest et al. | |
| 2004/0036077 | A1 | 2/2004 | Ise | |
| 2004/0137267 | A1 | 7/2004 | Igarashi et al. | |
| 2004/0137268 | A1 | 7/2004 | Igarashi et al. | |
| 2004/0174116 | A1 | 9/2004 | Lu et al. | |
| 2005/0025993 | A1 | 2/2005 | Thompson et al. | |
| 2005/0112407 | A1 | 5/2005 | Ogasawara et al. | |
| 2005/0238919 | A1 | 10/2005 | Ogasawara | |
| 2005/0244673 | A1 | 11/2005 | Satoh et al. | |
| 2005/0260441 | A1 | 11/2005 | Thompson et al. | |
| 2005/0260449 | A1 | 11/2005 | Walters et al. | |
| 2006/0008670 | A1 | 1/2006 | Lin et al. | |
| 2006/0202194 | A1 | 9/2006 | Jeong et al. | |
| 2006/0240279 | A1 | 10/2006 | Adamovich et al. | |
| 2006/0251923 | A1 | 11/2006 | Lin et al. | |
| 2006/0263635 | A1 | 11/2006 | Ise | |
| 2006/0280965 | A1 | 12/2006 | Kwong et al. | |
| 2007/0104979 | A1 | 5/2007 | Kim et al. | |
| 2007/0104980 | A1 | 5/2007 | Kim et al. | |
| 2007/0190359 | A1 | 8/2007 | Knowles et al. | |
| 2007/0224450 | A1 | 9/2007 | Kim et al. | |
| 2007/0247061 | A1 | 10/2007 | Adamovich | |
| 2007/0278936 | A1 | 12/2007 | Herron et al. | |
| 2007/0278938 | A1 | 12/2007 | Yabunouchi et al. | |
| 2008/0015355 | A1 | 1/2008 | Schafer et al. | |
| 2008/0018221 | A1 | 1/2008 | Egen et al. | |
| 2008/0074033 | A1 | 3/2008 | Ionkin et al. | |
| 2008/0106190 | A1 | 5/2008 | Yabunouchi et al. | |
| 2008/0124572 | A1 | 5/2008 | Mizuki et al. | |
| 2008/0220265 | A1 | 9/2008 | Xia et al. | |
| 2008/0261076 | A1 * | 10/2008 | Kwong | C07F 15/0033 428/690 |
| 2008/0286604 | A1 * | 11/2008 | Inoue | C07F 15/0033 428/690 |
| 2008/0297033 | A1 | 12/2008 | Knowles et al. | |
| 2009/0008605 | A1 | 1/2009 | Kawamura et al. | |
| 2009/0009065 | A1 | 1/2009 | Nishimura et al. | |
| 2009/0017330 | A1 | 1/2009 | Iwakuma et al. | |
| 2009/0030202 | A1 | 1/2009 | Iwakuma et al. | |
| 2009/0039776 | A1 | 2/2009 | Yamada et al. | |
| 2009/0045730 | A1 | 2/2009 | Nishimura et al. | |
| 2009/0045731 | A1 | 2/2009 | Nishimura et al. | |
| 2009/0085476 | A1 | 4/2009 | Park et al. | |
| 2009/0101870 | A1 | 4/2009 | Prakash et al. | |
| 2009/0108737 | A1 | 4/2009 | Kwong et al. | |
| 2009/0115316 | A1 | 5/2009 | Zheng et al. | |
| 2009/0165846 | A1 | 7/2009 | Johannes et al. | |
| 2009/0167162 | A1 | 7/2009 | Lin et al. | |
| 2009/0179554 | A1 | 7/2009 | Kuma et al. | |
| 2012/0119190 | A1 | 5/2012 | Alleyne et al. | |
| 2012/0181511 | A1 | 7/2012 | Ma | |
| 2012/0217868 | A1 | 8/2012 | Ma et al. | |
| 2013/0137866 | A1 * | 5/2013 | Inoue | C07F 15/0033 544/225 |
| 2013/0146848 | A1 | 6/2013 | Ma | |
| 2013/0299795 | A1 | 11/2013 | Xia | |
| 2014/0246656 | A1 | 9/2014 | Inoue et al. | |
| 2015/0188061 | A1 | 7/2015 | Xia | |
| 2015/0236277 | A1 | 8/2015 | Boudreault | |
| 2015/0236279 | A1 | 8/2015 | Szigethy | |
| 2015/0295187 | A1 | 10/2015 | Boudreault | |
| 2015/0315222 | A1 | 11/2015 | Boudreault | |

FOREIGN PATENT DOCUMENTS

| | | | | |
|---|---|---|---|---|
| EP | 2034538 | | 3/2009 | |
| EP | 2602302 | A2 | 6/2013 | |
| JP | 2000-212744 | | 8/2000 | |
| JP | 200511610 | | 1/2005 | |
| JP | 2007123392 | | 5/2007 | |
| JP | 2007254297 | | 10/2007 | |
| JP | 2008074939 | | 4/2008 | |
| WO | 01/39234 | | 5/2001 | |
| WO | 02/02714 | | 1/2002 | |
| WO | 02015654 | | 2/2002 | |
| WO | 03040257 | | 5/2003 | |
| WO | 03060956 | | 7/2003 | |
| WO | 2004093207 | | 10/2004 | |
| WO | 04107822 | | 12/2004 | |
| WO | 2005014551 | | 2/2005 | |
| WO | 2005019373 | | 3/2005 | |
| WO | 2005030900 | | 4/2005 | |
| WO | 2005089025 | | 9/2005 | |
| WO | 2005123873 | | 12/2005 | |
| WO | 20050124889 | | 12/2005 | |
| WO | WO-2005124889 | A1 * | 12/2005 | H05B 33/14 |
| WO | 2006009024 | | 1/2006 | |
| WO | 2006056418 | | 6/2006 | |
| WO | 2006072002 | | 7/2006 | |
| WO | 2006082742 | | 8/2006 | |
| WO | 2006098120 | | 9/2006 | |
| WO | 2006100298 | | 9/2006 | |
| WO | 2006103874 | | 10/2006 | |
| WO | 2006114966 | | 11/2006 | |
| WO | 2006132173 | | 12/2006 | |
| WO | 2007002683 | | 1/2007 | |
| WO | 2007004380 | | 1/2007 | |
| WO | 2007063754 | | 6/2007 | |
| WO | 2007063796 | | 6/2007 | |
| WO | 2008056746 | | 5/2008 | |
| WO | 2008101842 | | 8/2008 | |
| WO | 2008132085 | | 11/2008 | |
| WO | 2009000673 | | 12/2008 | |
| WO | 2009003898 | | 1/2009 | |
| WO | 2009008311 | | 1/2009 | |
| WO | 2009018009 | | 2/2009 | |
| WO | 2009021126 | | 2/2009 | |
| WO | WO-2009021126 | A2 * | 2/2009 | H01L 51/0054 |
| WO | 2009050290 | | 4/2009 | |
| WO | 2009062578 | | 5/2009 | |
| WO | 2009063833 | | 5/2009 | |
| WO | 2009066778 | | 5/2009 | |
| WO | 2009066779 | | 5/2009 | |
| WO | 2009086028 | | 7/2009 | |

(56) References Cited

FOREIGN PATENT DOCUMENTS

| | | |
|---|---|---|
| WO | 2009100991 | 8/2009 |
| WO | 2010033550 | 3/2010 |
| WO | 2012148511 | 1/2012 |

OTHER PUBLICATIONS

Man, Eugene H. Man et al., "The Claisen Acylation of Methyl Ketones with Branched Chain Aliphatic Esters", JACS 1951, vol. 73, pp. 901-903.

Kim, Do Han et al., "Highly Efficient Red Phosphorescent Dopants in Organic Light-Emitting Devices", Adv. Mater. 2011, vol. 23, pp. 2721-2726.

Tsujimoto, Hidetaka et al., "Pure Red Electrophosphorescence from polymer light-emitting diodes doped with highly emissive bis-cyclometalated iridium (III) complexes", J. Organomet. Chem. 2010, vol. 695, pp. 1972-1978.

Noine, Keiji et al., "Red Phosphorescent Iridium Complexes Having a Bulky Ancillary Ligand for Solution-Processed Organic Light-Emitting Diodes", J. of Photopolymer Sci. Tech. 2008, 21 (2), pp. 323-325.

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato)beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007)

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]ainc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91: 209-215 (1997).

Shirota, Yasuhiko et al., "Starburst Molecules Based on pi-Electron Systems as Materials for Organic Electroluminescent Devices," Journal of Luminescence, 72-74:985-991 (1997).

Sotoyama, Wataru et al., "Efficient Organic LIght-Emitting Diodes with Phosphorescent Platinum Complexes Containing N∧C∧N-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

(56) References Cited

OTHER PUBLICATIONS

T. Östergård et al., "Langmuir-Blodgett Light-Emitting Diodes of Poly(3-Hexylthiophene) Electro-Optical Characteristics Related to Structure," Synthetic Metals, 88:171-177 (1997).

Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).

Tang, C.W. and VanSlyke, S.A., "Organic Electroluminescent Diodes," Appl. Phys. Lett., 51(12):913-915 (1987).

Tung, Yung-Liang et al., "Organic Light-Emitting Diodes Based on Charge-Neutral Ru II PHosphorescent Emitters," Adv. Mater., 17(8)1059-1064 (2005).

Van Slyke, S. A. et al., "Organic Electroluminescent Devices with Improved Stability," Appl. Phys. Lett., 69 (15):2160-2162 (1996).

Wang, Y. et al., "Highly Efficient Electroluminescent Materials Based on Fluorinated Organometallic Iridium Compounds," Appl. Phys. Lett., 79(4):449-451 (2001).

Wong, Keith Man-Chung et al., A Novel Class of Phosphorescent Gold(III) Alkynyl-Based Organic Light-Emitting Devices with Tunable Colour, Chem. Commun., 2906-2908 (2005).

Wong, Wai-Yeung, "Multifunctional Iridium Complexes Based on Carbazole Modules as Highly Efficient Electrophosphors," Angew. Chem. Int. Ed., 45:7800-7803 (2006).

Seebach, Dieter, et al., "Synthesis of the Lithium Enolate of (S)-(+)-sec-Butyl Methyl Ketone and Formation of Chiral 1,3-Diketones by Acylation" Angew. Chem. Int. Ed. Engl., vol. 11, Issue 2, Feb. 1972, pp. 127-128.

Brittain, Harry G., "Solvent Dependence of the Optical Activity associated with Tris (DD-dicampholylmethanato) europium(III)," J. Chem Soc. Dalton Trans., No. 6, (1983), pp. 1165-1170.

Ficker, Robert et al., "Nickel (II) Bis(d-campholyl-l-campholyl-methanate)," Acta Crystallographica Section C Crystal Structure Communications, vol. 52, No. 3, (1996), pp. 543-545.

Hayashi, Tamio et al., "Chirality Transfer from Optically Active Allylsilanes to ?-Allylpalladium Complexes," J. Chem. Soc., Chem. Commun., No. 13, (1983), pp. 736-737.

Kandybin et al., "Volatile complexes of Nb(IV) with new sterically hindered ?-diketones," Russian Journal of General Chemistry, vol. 69, No. 6, (1999), pp. 866-875.

* cited by examiner

Formula I

ORGANIC ELECTROLUMINESCENT MATERIALS AND DEVICES

CROSS-REFERENCE TO RELATED APPLICATIONS

This application is a continuation of U.S. application Ser. No. 13/932,508, filed Jul. 1, 2013, the disclosure of which is herein expressly incorporated by reference in its entirety.

FIELD OF THE INVENTION

The present invention relates to compounds for use as emitters and devices, such as organic light emitting diodes, including the same. More particularly, the compounds disclosed herein are novel ancillary ligands for metal complexes.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

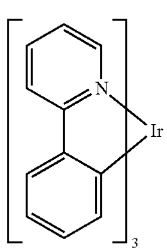

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, a compound is provided that comprises a first ligand $L^1$ having the formula:

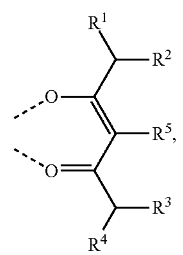

Formula I; wherein $R^1$, $R^2$, $R^3$, and $R^4$ are independently selected from group consisting of alkyl, cycloalkyl, aryl, and heteroaryl; wherein at least one of $R^1$, $R^2$, $R^3$, and $R^4$ has at least two C; wherein $R^5$ is selected from group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein the first ligand $L^1$ is coordinated to a metal M having an atomic number greater than 40; and wherein two adjacent substituents are optionally joined to form into a ring.

According to another aspect of the present disclosure, a first device comprising a first organic light emitting device is provided. The first organic light emitting device can comprise an anode, a cathode, and an organic layer, disposed between the anode and the cathode. The organic layer can include a compound comprising the first ligand $L^1$ having Formula I. The first device can be a consumer product, an organic light-emitting device, and/or a lighting panel.

The compounds disclosed herein are novel ancillary ligands for metal complexes. The incorporation of these ligands can narrow the emission spectrum, decrease evaporation temperature, and improve device efficiency. The inventors have discovered that incorporating these novel ancillary ligands in iridium complexes improved sublimation of the resulting iridium complexes, color spectrum of phosphorescence by these iridium complexes, and their EQE.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
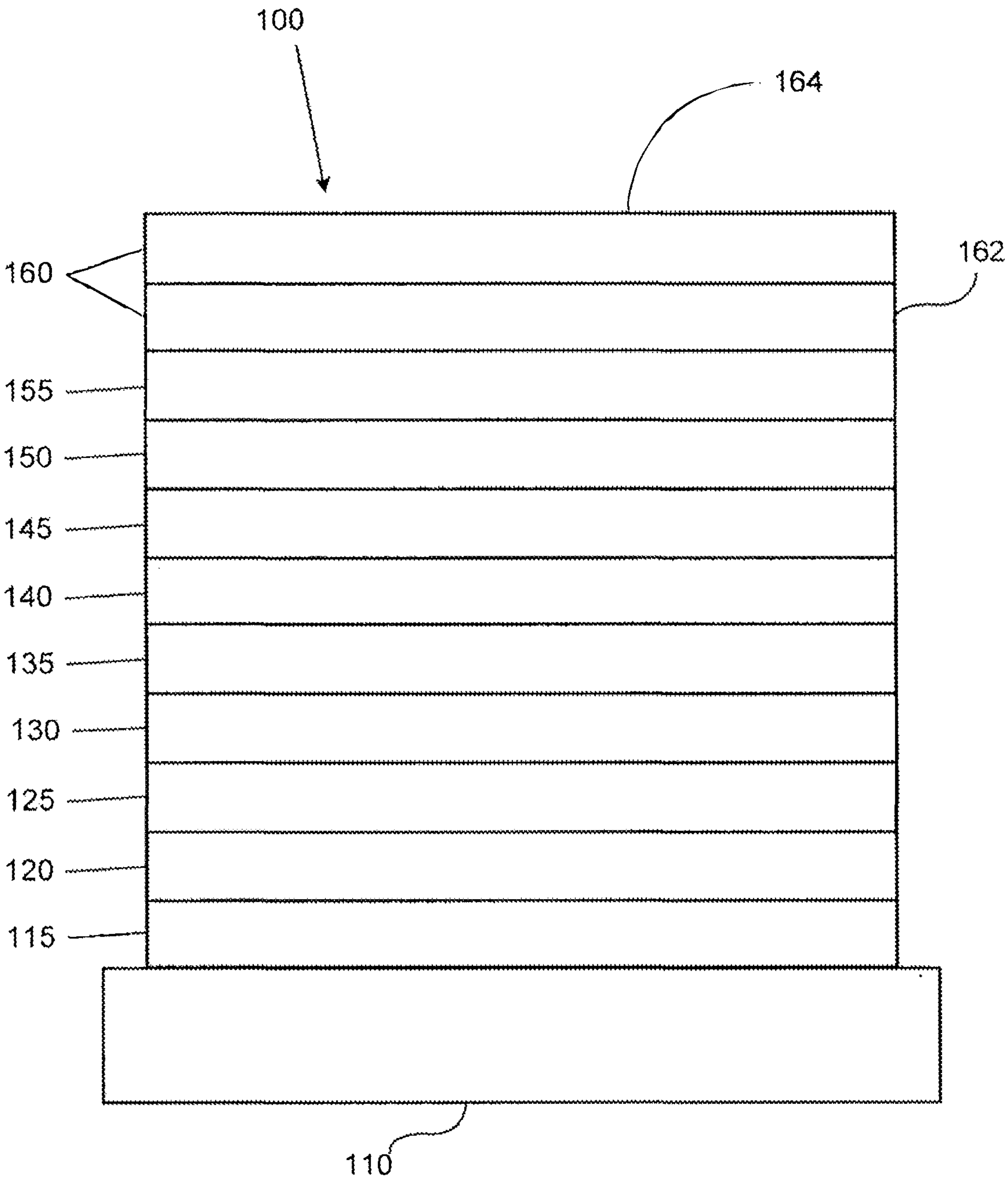
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
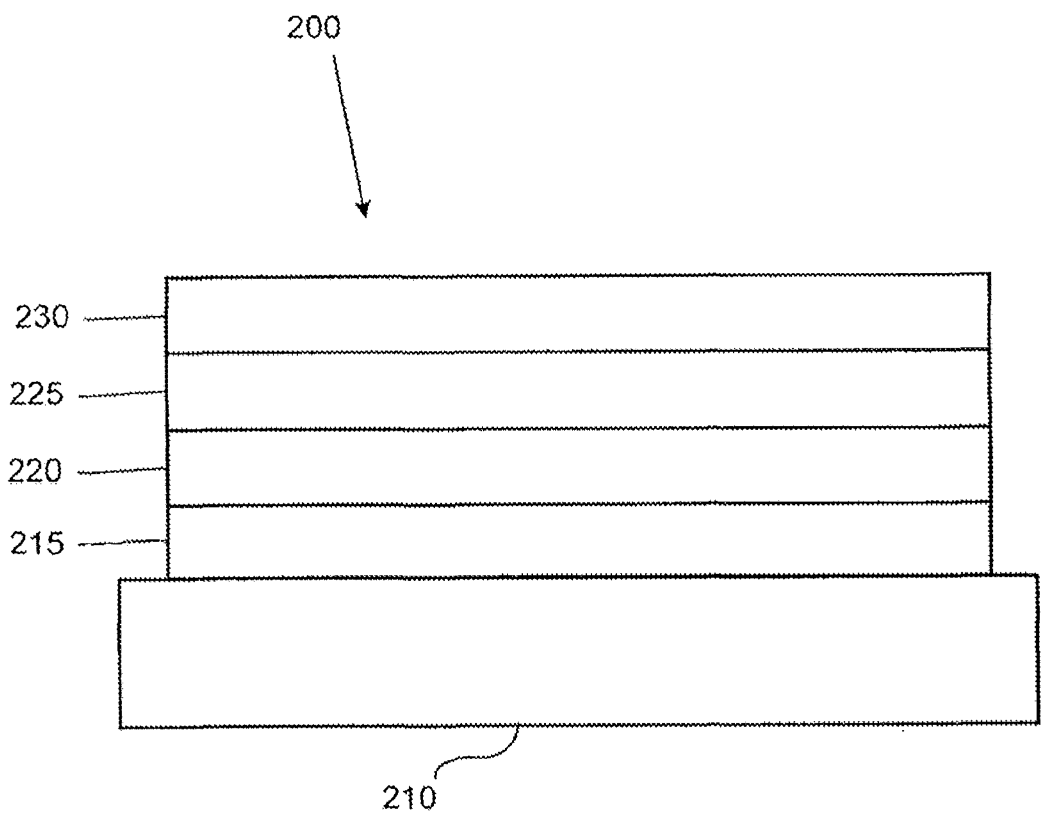
FIG. 2 shows an inverted organic light emitting device that does not have a separate electron transport layer.
Figure 3:
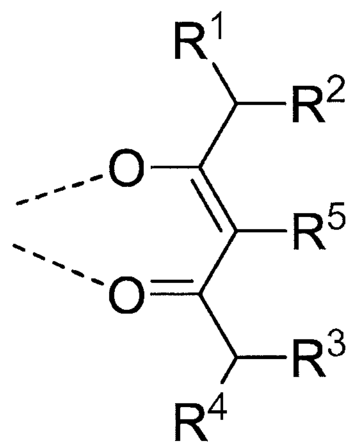
FIG. 3 shows Formula I as disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVID. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

As used herein, "substituted" indicates that a substituent other than H is bonded to the relevant carbon. Thus, where $R^2$ is monosubstituted, then one $R^2$ must be other than H. Similarly, where $R^3$ is disubstituted, then two of $R^3$ must be other than H. Similarly, where $R^2$ is unsubstituted $R^2$ is hydrogen for all available positions.

According to an embodiment, novel ancillary ligands for metal complexes are disclosed. The inventors have discovered that incorporation of these ligands unexpectedly narrow the emission spectrum, decrease evaporation temperature, and improve device efficiency.

According to an embodiment, a compound is provided that comprises a first ligand $L^1$ having the formula:

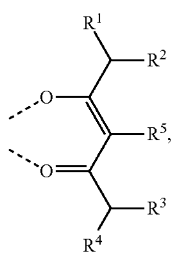

Formula I; wherein $R^1$, $R^2$, $R^3$, and $R^4$ are independently selected from group consisting of alkyl, cycloalkyl, aryl, and heteroaryl; wherein at least one of $R^1$, $R^2$, $R^3$, and $R^4$ has at least two C; wherein $R^5$ is selected from group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein the first ligand $L^1$ is coordinated to a metal M having an atomic number greater than 40; and wherein two adjacent substituents are optionally joined to form into a ring. The dash lines in Formula I show the connection points to the metal.

In one embodiment the metal M is Ir. In one embodiment $R^5$ is selected from group consisting of hydrogen, deuterium, alkyl, cycloalkyl, and combinations thereof. In one embodiment, $R^5$ is hydrogen.

In another embodiment, $R^1$, $R^2$, $R^3$, and $R^4$ are alkyl or cycloalkyl. In one embodiment, $R^1$, $R^2$, $R^3$, and $R^4$ are selected from the group consisting of methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, cyclopentyl, cyclohexyl, partially or fully deuterated variants thereof, and combinations thereof.

In one embodiment, the compound has the formula of $M(L^1)_x(L^2)_y(L^3)_z$; wherein $L^2$ is a second ligand and $L^3$ is a third ligand and $L^2$ and $L^3$ can be the same or different; x is 1, 2, or 3; y is 0, 1, or 2; z is 0, 1, or 2; and x+y+z is the oxidation state of the metal M.

In one embodiment, $L^2$ and $L^3$ are independently selected from the group consisting of:

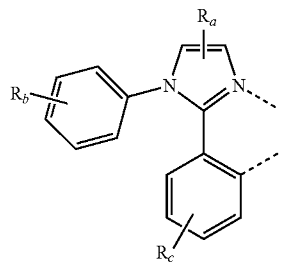
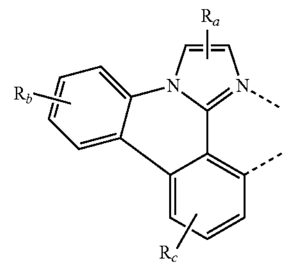
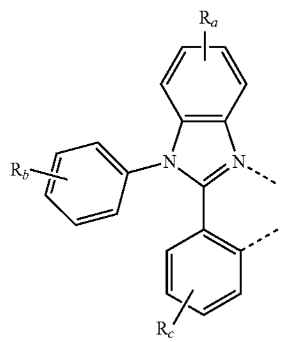
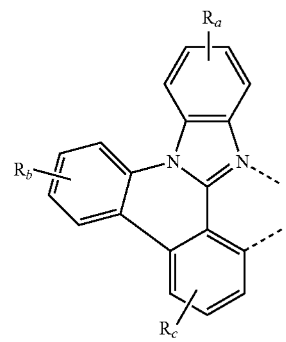
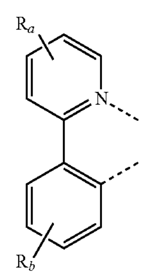
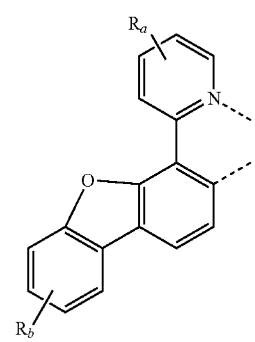
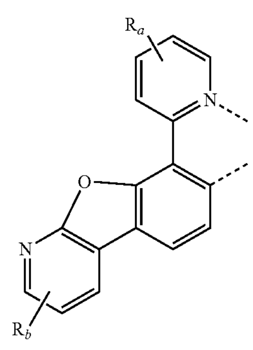
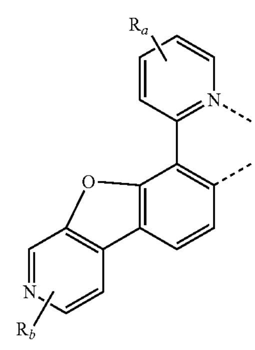

-continued

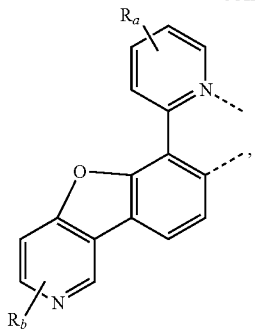

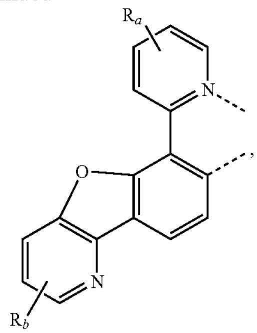

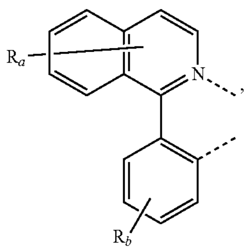

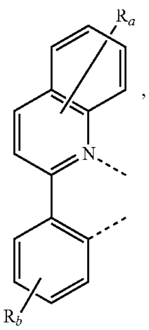

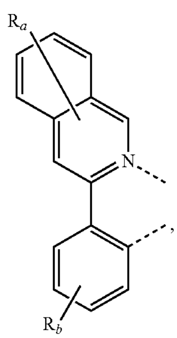

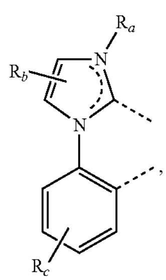

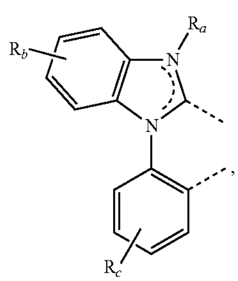

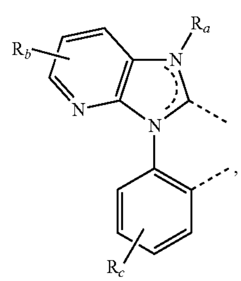

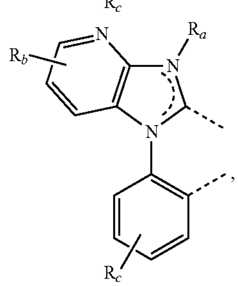

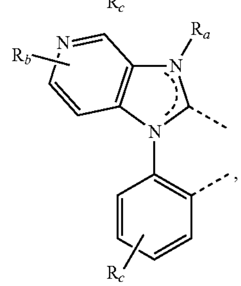

-continued

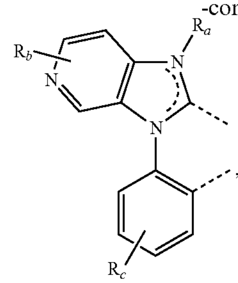

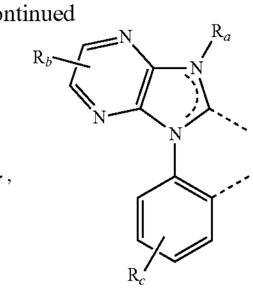

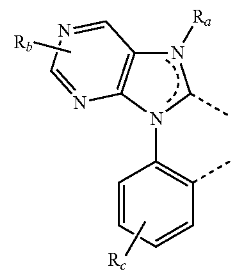

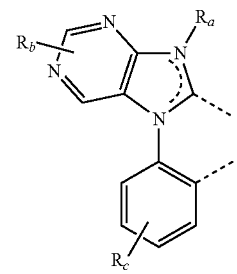

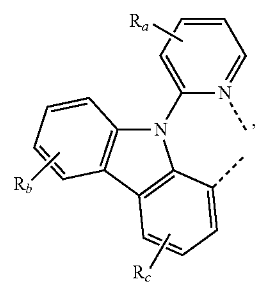

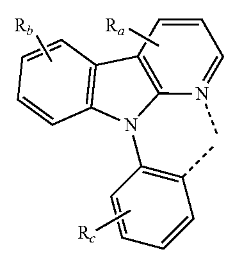

and

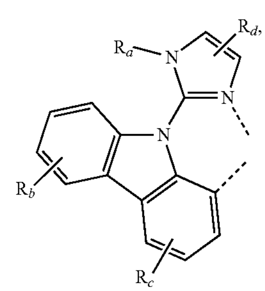

wherein $R_a$, $R_b$, $R_c$, and $R_d$ can represent mono, di, tri, or tetra substitution, or no substitution; and $R_a$, $R_b$, $R_c$, and $R_d$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein two adjacent substituents of $R_a$, $R_b$, $R_c$, and $R_d$ are optionally joined to form a fused ring or form a multidentate ligand. In another embodiment, $L^3$ is same as $L^2$ and the compound has the formula of $M(L^1)(L^2)_2$.

In another embodiment where the compound has the formula of $M(L^1)_x(L^2)_y(L^3)_z$, the first ligand $L^1$ is selected from group consisting of:

-continued
$L_{A1}$
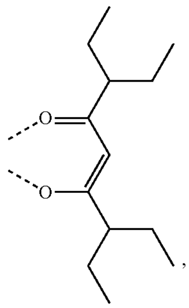
$L_{A2}$
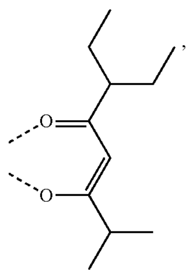
$L_{A3}$
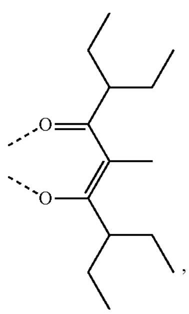
$L_{A4}$
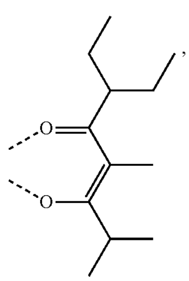
$L_{A5}$
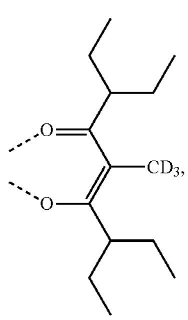
$L_{A6}$
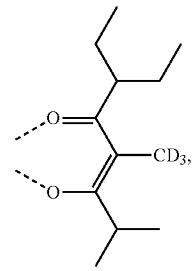
$L_{A7}$
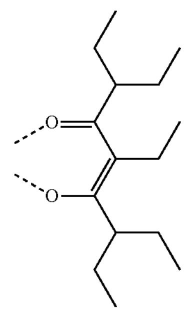
$L_{A8}$
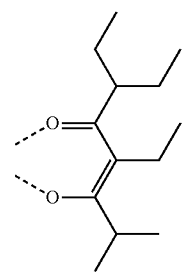
$L_{A9}$
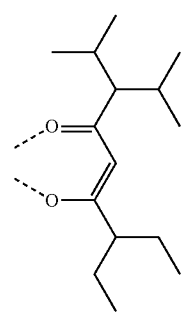
$L_{A10}$
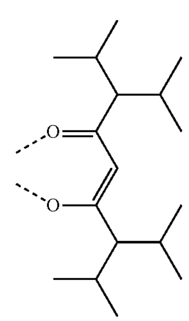

-continued
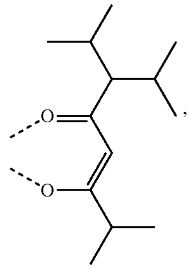
$L_{A11}$
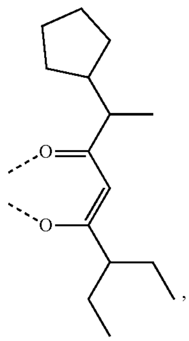
$L_{A12}$
and
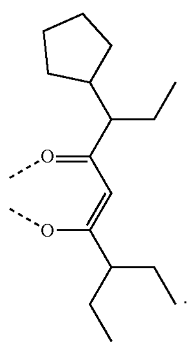
$L_{A13}$
In one embodiment, the second ligand $L^2$ is selected from group consisting of:
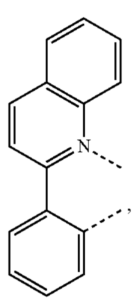
$L_{Q1}$
-continued
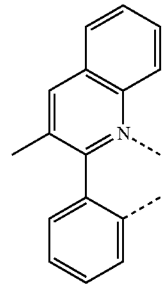
$L_{Q2}$
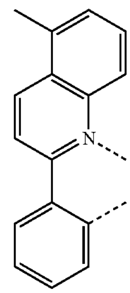
$L_{Q3}$
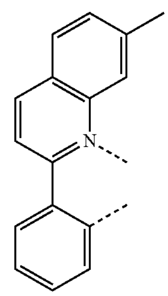
$L_{Q4}$
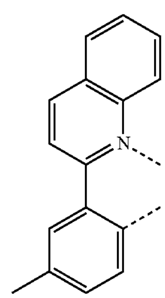
$L_{Q5}$
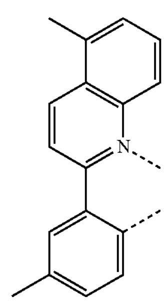
$L_{Q6}$ -continued
$L_{Q7}$
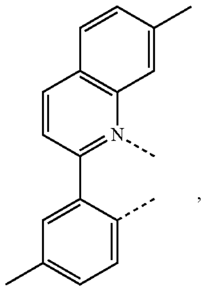
$L_{Q8}$
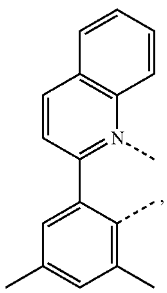
$L_{Q9}$
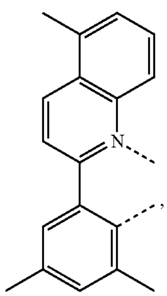
$L_{Q10}$
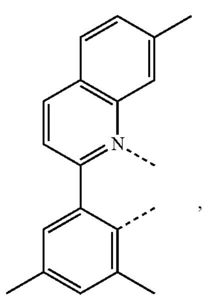
$L_{Q11}$
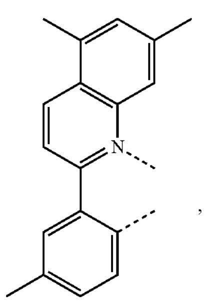
-continued
$L_{Q12}$
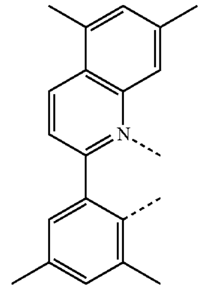
$L_{Q13}$
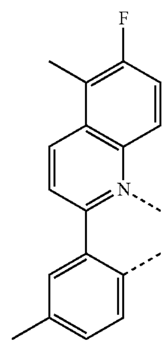
$L_{Q14}$
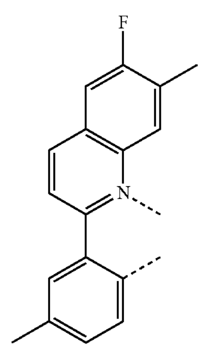
$L_{Q15}$
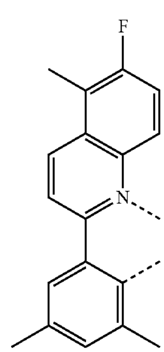

-continued
$L_{Q16}$
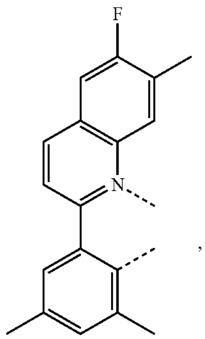
$L_{Q17}$
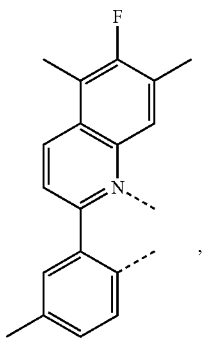
$L_{Q18}$
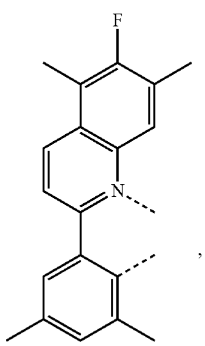
$L_{Q19}$
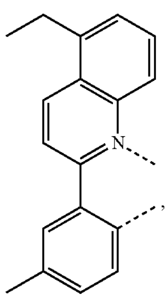
$L_{Q20}$
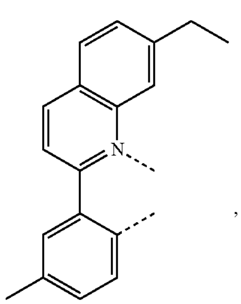
-continued
$L_{Q21}$
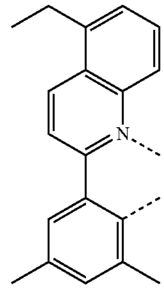
$L_{Q22}$
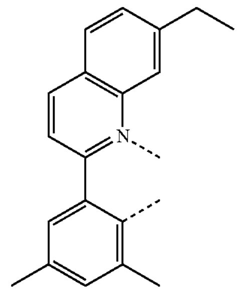
$L_{Q23}$
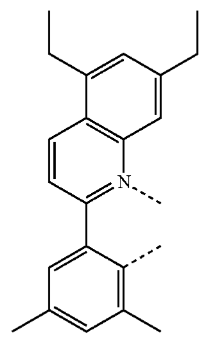
$L_{Q24}$
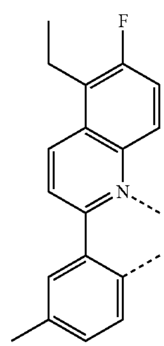
$L_{Q25}$
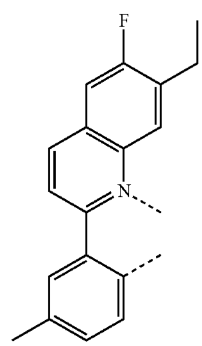

-continued
$L_{Q26}$
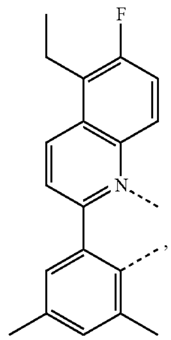
$L_{Q27}$
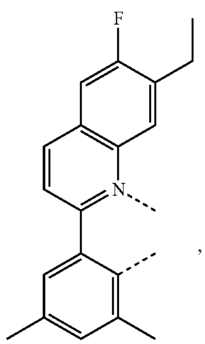
$L_{Q28}$
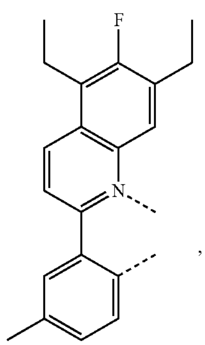
$L_{Q29}$
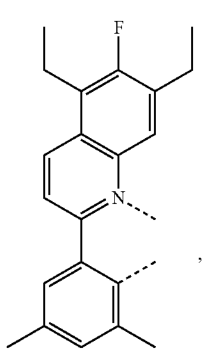
-continued
$L_{Q30}$
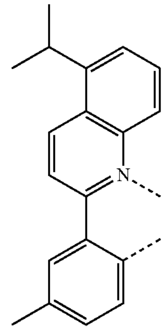
$L_{Q31}$
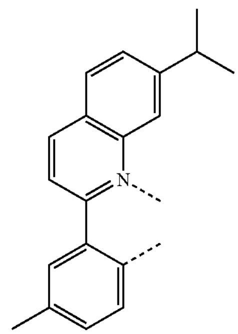
$L_{Q32}$
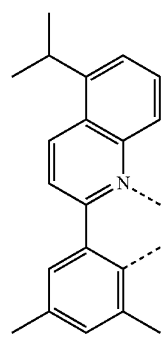
$L_{Q33}$
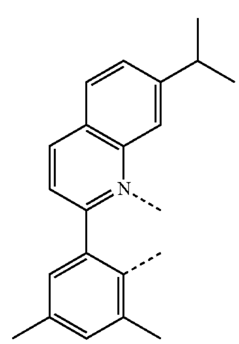

-continued
$L_{Q34}$
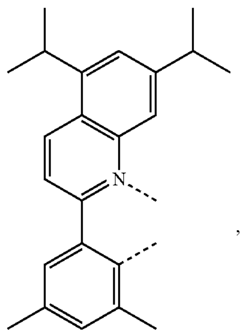
$L_{Q35}$
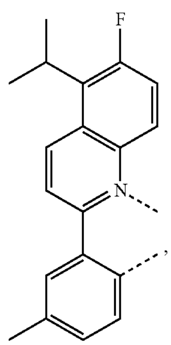
$L_{Q36}$
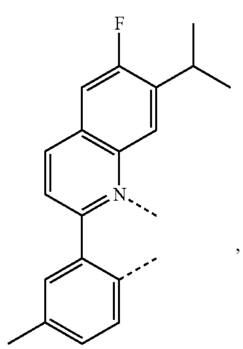
$L_{Q37}$
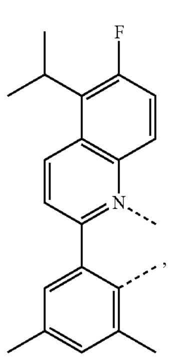
-continued
$L_{Q38}$
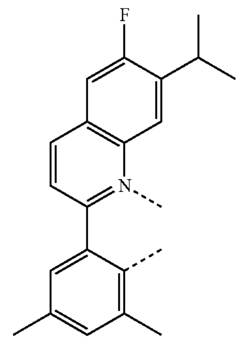
$L_{Q39}$
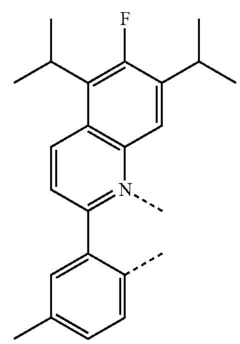
$L_{Q40}$
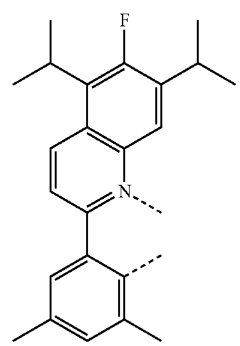
$L_{Q41}$
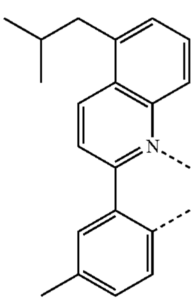
$L_{Q42}$
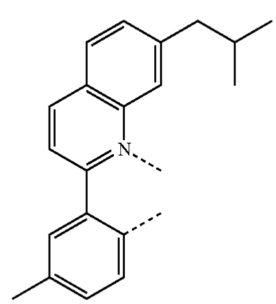

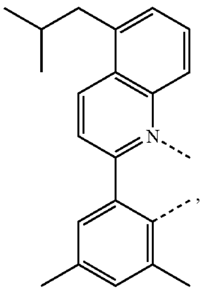
$L_{Q43}$
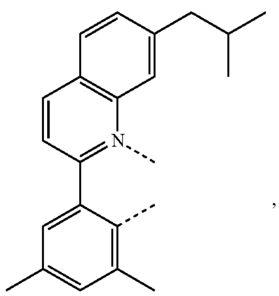
$L_{Q44}$
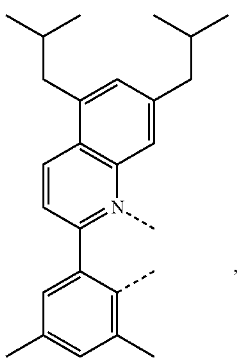
$L_{Q45}$
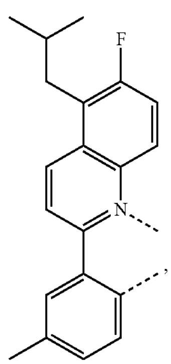
$L_{Q46}$
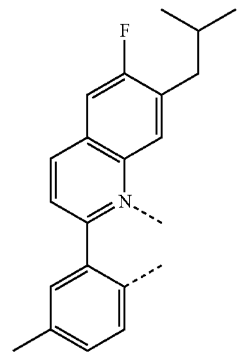
$L_{Q47}$
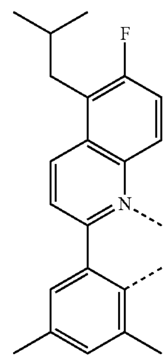
$L_{Q48}$
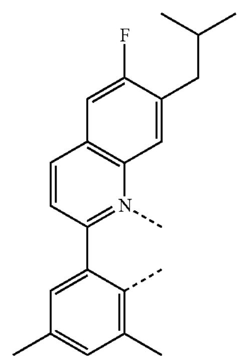
$L_{Q49}$
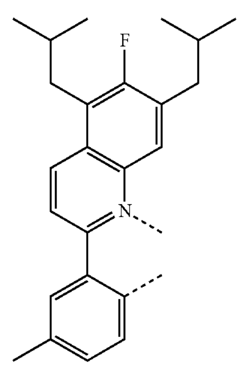
$L_{Q50}$ -continued
$L_{Q51}$
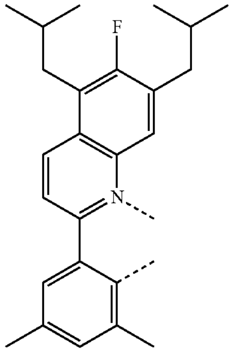
,
$L_{Q52}$
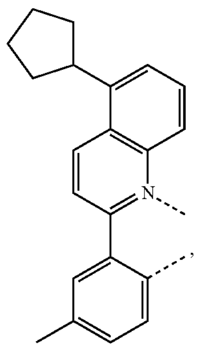
$L_{Q53}$
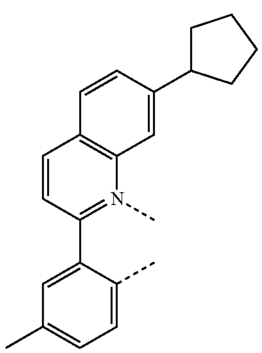
,
$L_{Q54}$
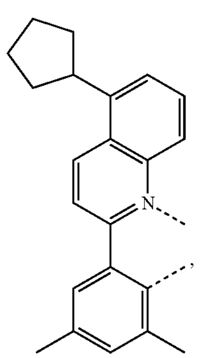
-continued
$L_{Q55}$
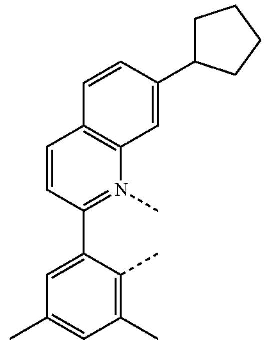
,
$L_{Q56}$
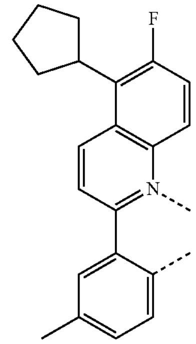
$L_{Q57}$
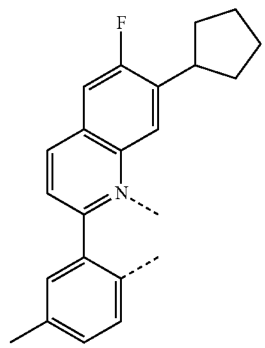
,
$L_{Q58}$
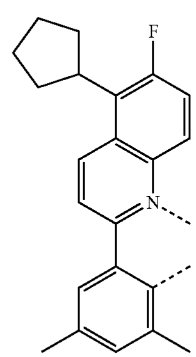

$L_{Q59}$
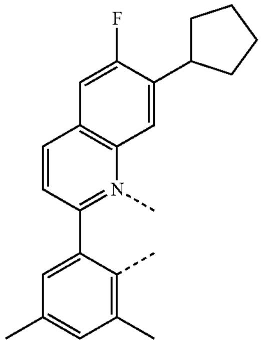
,
$L_{Q60}$
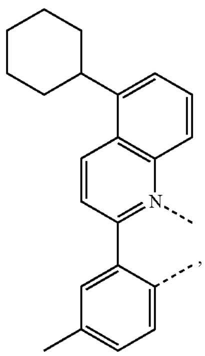
$L_{Q61}$
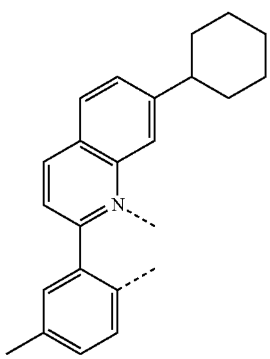
,
$L_{Q62}$
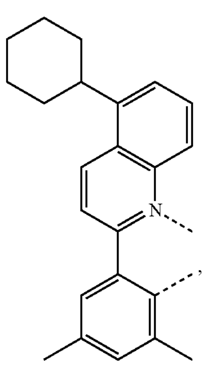
$L_{Q63}$
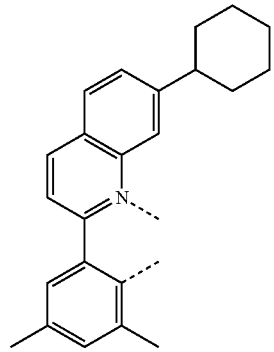
,
$L_{Q64}$
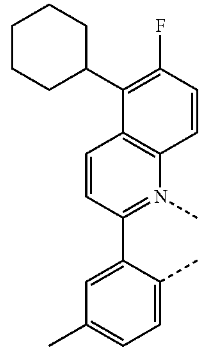
$L_{Q65}$
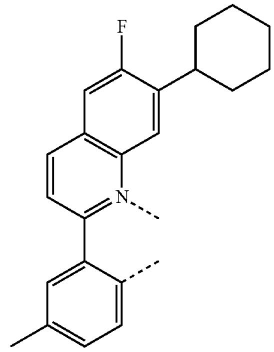
,
$L_{Q66}$
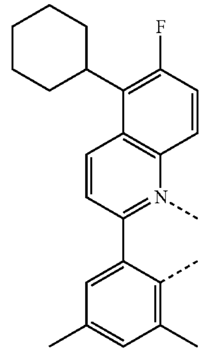

-continued
$L_{Q67}$
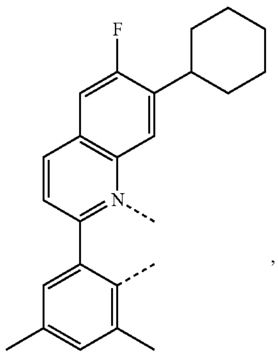
$L_{Q68}$
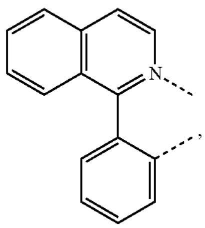
$L_{Q69}$
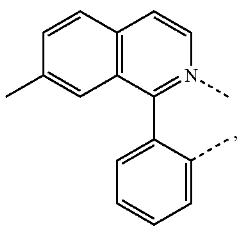
$L_{Q70}$
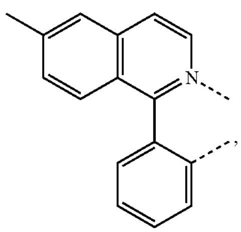
$L_{Q71}$
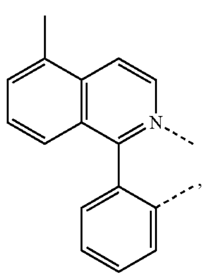
$L_{Q72}$
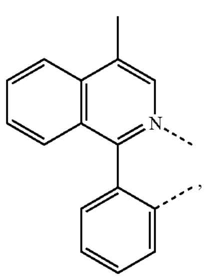
-continued
$L_{Q73}$
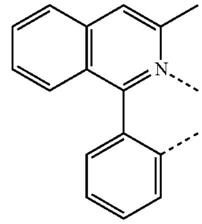
$L_{Q74}$
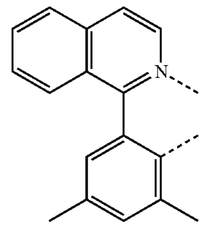
$L_{Q75}$
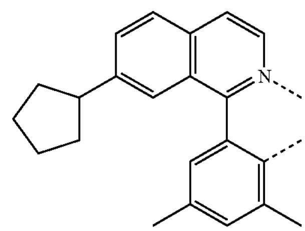
$L_{Q76}$
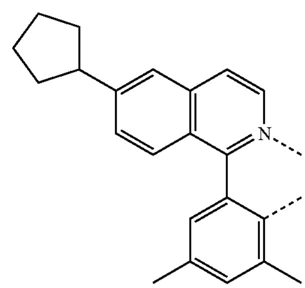
$L_{Q77}$
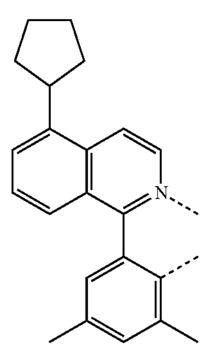

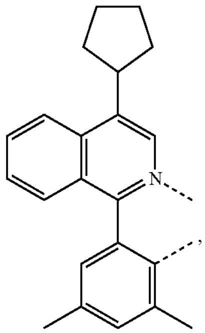
$L_{Q78}$
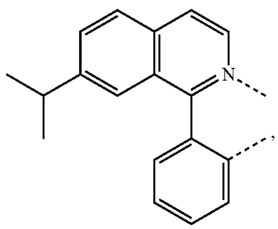
$L_{Q79}$
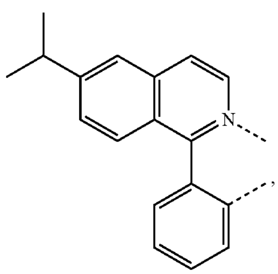
$L_{Q80}$
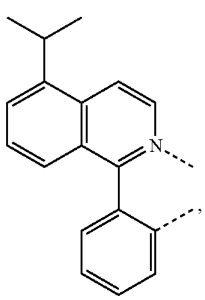
$L_{Q81}$
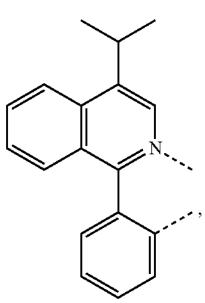
$L_{Q82}$
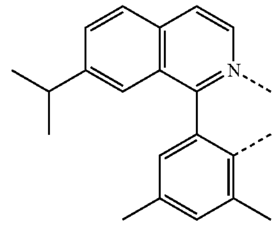
$L_{Q83}$
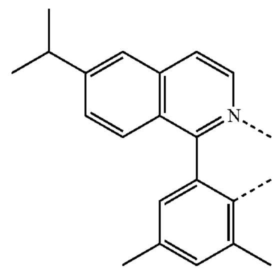
$L_{Q84}$
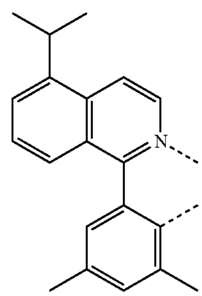
$L_{Q85}$
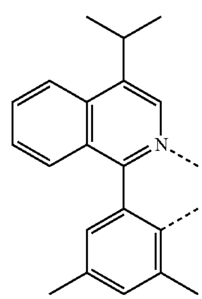
$L_{Q86}$
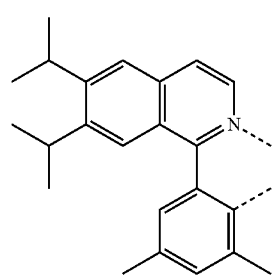
$L_{Q87}$

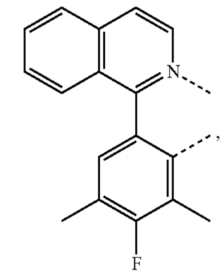
$L_{Q88}$
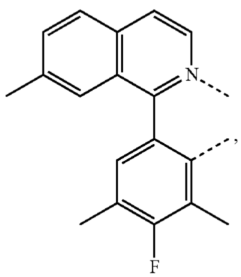
$L_{Q89}$
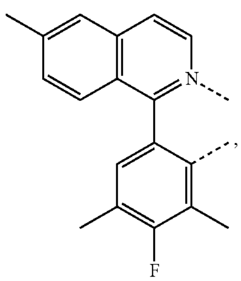
$L_{Q90}$
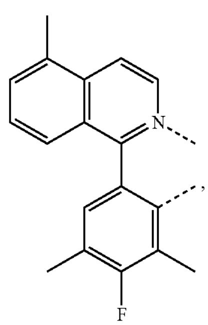
$L_{Q91}$
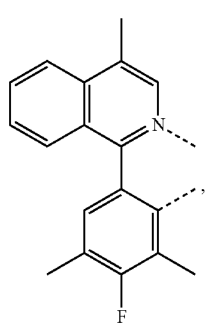
$L_{Q92}$
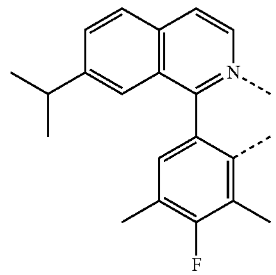
$L_{Q93}$
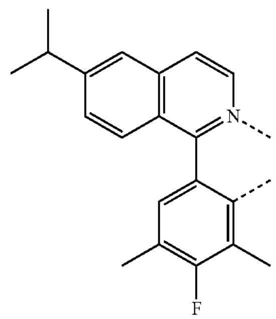
$L_{Q94}$
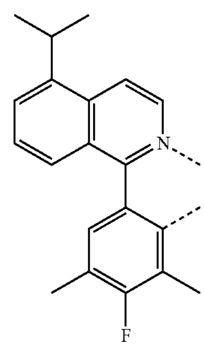
$L_{Q95}$
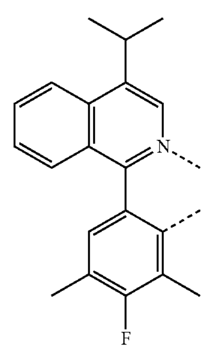
$L_{Q96}$
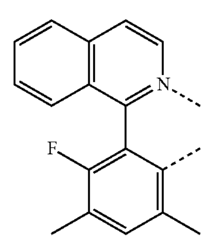
$L_{Q97}$ -continued
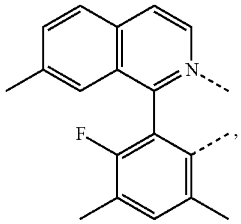
$L_{Q98}$
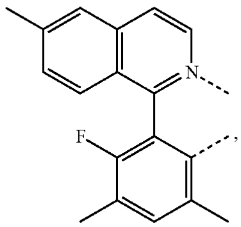
$L_{Q99}$
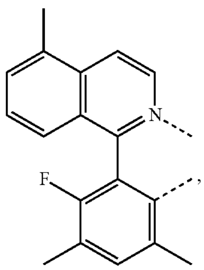
$L_{Q100}$
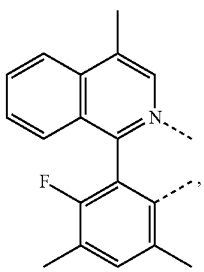
$L_{Q101}$
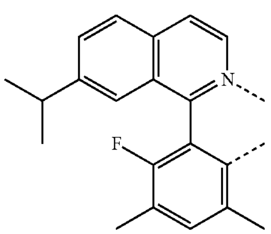
$L_{Q102}$
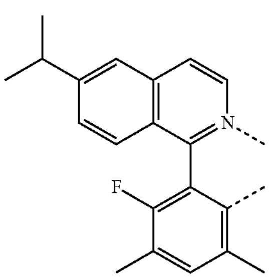
$L_{Q103}$
-continued
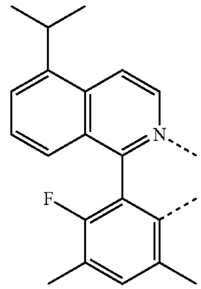
$L_{Q104}$
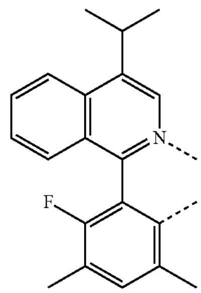
$L_{Q105}$
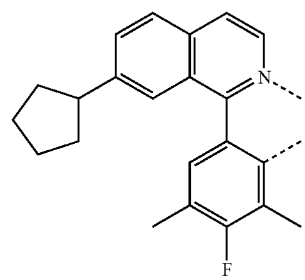
$L_{Q106}$
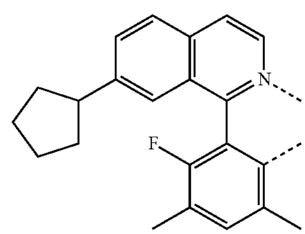
$L_{Q107}$
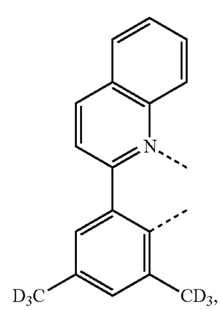
$L_{Q108}$ -continued
$L_{Q109}$
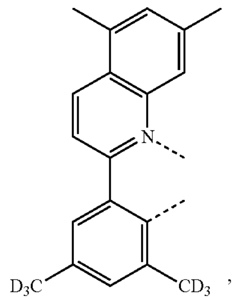
$L_{Q110}$
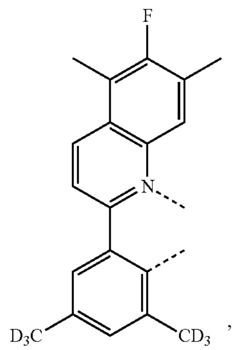
$L_{Q111}$
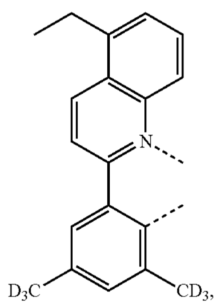
$L_{Q112}$
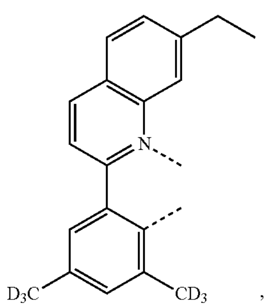
$L_{Q113}$
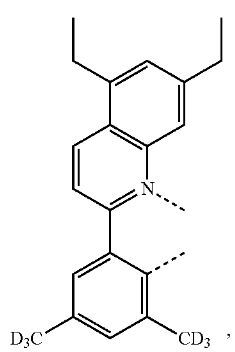
-continued
$L_{Q114}$
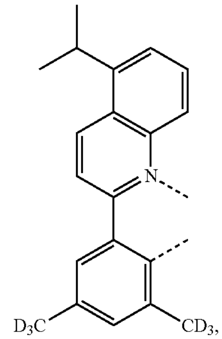
$L_{Q115}$
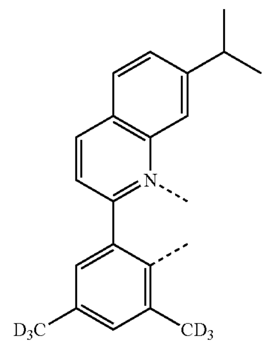
$L_{Q116}$
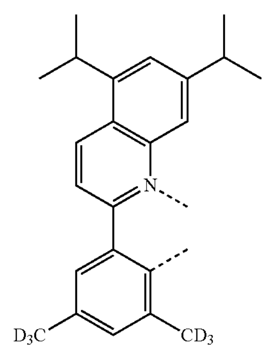
$L_{Q117}$
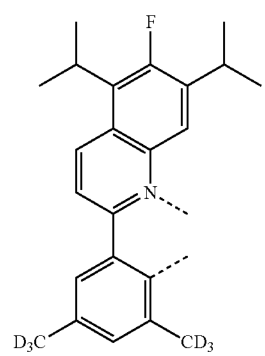

-continued
$L_{Q118}$
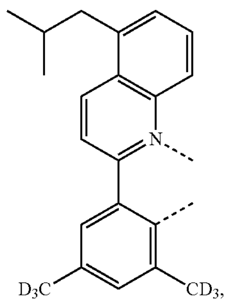
$L_{Q119}$
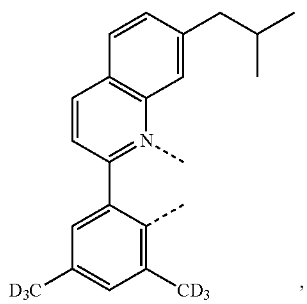
$L_{Q120}$
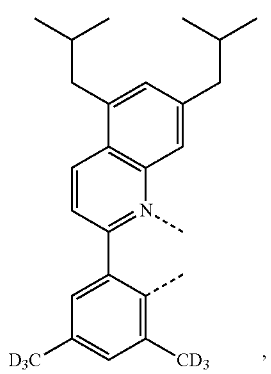
$L_{Q121}$
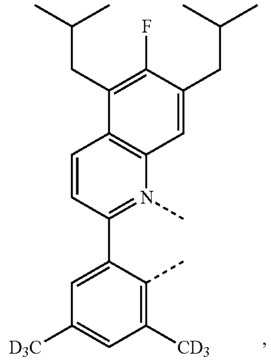
-continued
$L_{Q122}$
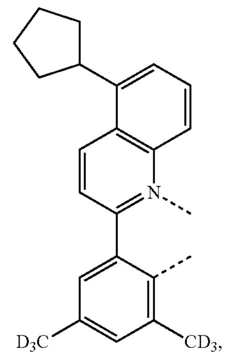
$L_{Q123}$
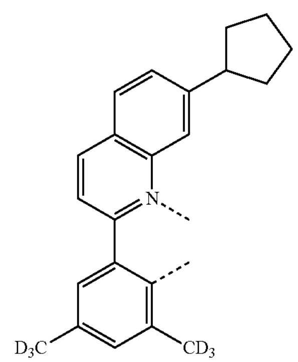
$L_{Q124}$
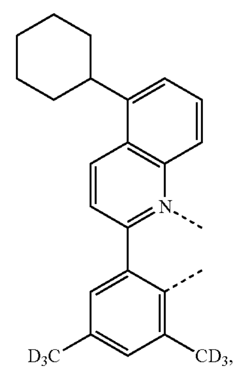
$L_{Q6125}$
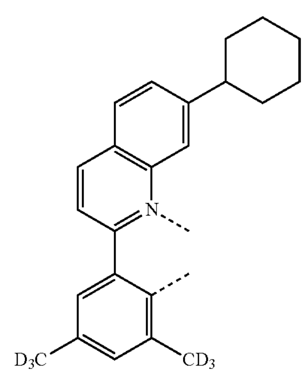

-continued $L_{Q126}$

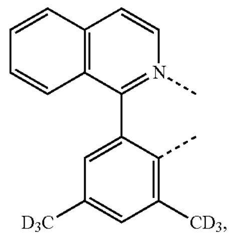

$L_{Q127}$

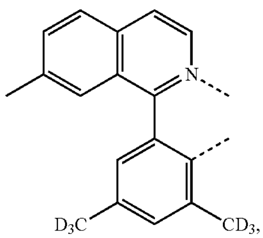

$L_{Q128}$

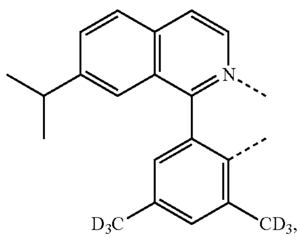

$L_{Q129}$

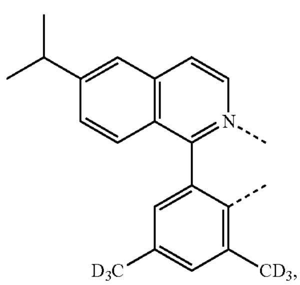

$L_{Q130}$

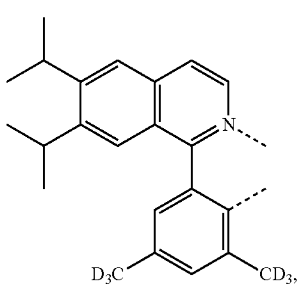

$L_{Q131}$

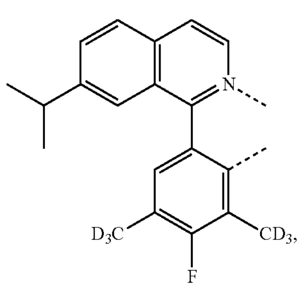

-continued $L_{Q132}$

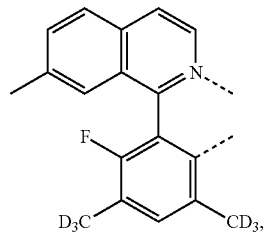

and $L_{Q133}$

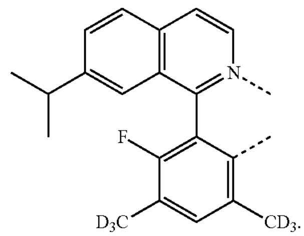

In one embodiment, the compound having the formula of $M(L^1)(L^2)_2$ can be selected from the group consisting of Compound 1 to Compound 1729 defined in Table 1 below:

TABLE 1

| Compound number | $L^1$ | $L^2$ |
|---|---|---|
| 1. | $L_{A1}$ | $L_{Q1}$ |
| 2. | $L_{A1}$ | $L_{Q2}$ |
| 3. | $L_{A1}$ | $L_{Q3}$ |
| 4. | $L_{A1}$ | $L_{Q4}$ |
| 5. | $L_{A1}$ | $L_{Q5}$ |
| 6. | $L_{A1}$ | $L_{Q6}$ |
| 7. | $L_{A1}$ | $L_{Q7}$ |
| 8. | $L_{A1}$ | $L_{Q8}$ |
| 9. | $L_{A1}$ | $L_{Q9}$ |
| 10. | $L_{A1}$ | $L_{Q10}$ |
| 11. | $L_{A1}$ | $L_{Q11}$ |
| 12. | $L_{A1}$ | $L_{Q12}$ |
| 13. | $L_{A1}$ | $L_{Q13}$ |
| 14. | $L_{A1}$ | $L_{Q14}$ |
| 15. | $L_{A1}$ | $L_{Q15}$ |
| 16. | $L_{A1}$ | $L_{Q16}$ |
| 17. | $L_{A1}$ | $L_{Q17}$ |
| 18. | $L_{A1}$ | $L_{Q18}$ |
| 19. | $L_{A1}$ | $L_{Q19}$ |
| 20. | $L_{A1}$ | $L_{Q20}$ |
| 21. | $L_{A1}$ | $L_{Q21}$ |
| 22. | $L_{A1}$ | $L_{Q22}$ |
| 23. | $L_{A1}$ | $L_{Q23}$ |
| 24. | $L_{A1}$ | $L_{Q24}$ |
| 25. | $L_{A1}$ | $L_{Q25}$ |
| 26. | $L_{A1}$ | $L_{Q26}$ |
| 27. | $L_{A1}$ | $L_{Q27}$ |
| 28. | $L_{A1}$ | $L_{Q28}$ |
| 29. | $L_{A1}$ | $L_{Q29}$ |
| 30. | $L_{A1}$ | $L_{Q30}$ |
| 31. | $L_{A1}$ | $L_{Q31}$ |
| 32. | $L_{A1}$ | $L_{Q32}$ |
| 33. | $L_{A1}$ | $L_{Q33}$ |
| 34. | $L_{A1}$ | $L_{Q34}$ |
| 35. | $L_{A1}$ | $L_{Q35}$ |
| 36. | $L_{A1}$ | $L_{Q36}$ |
| 37. | $L_{A1}$ | $L_{Q37}$ |
| 38. | $L_{A1}$ | $L_{Q38}$ |
| 39. | $L_{A1}$ | $L_{Q39}$ |
| 40. | $L_{A1}$ | $L_{Q40}$ |
| 41. | $L_{A1}$ | $L_{Q41}$ |
| 42. | $L_{A1}$ | $L_{Q42}$ |
| 43. | $L_{A1}$ | $L_{Q43}$ |
| 44. | $L_{A1}$ | $L_{Q44}$ |
| 45. | $L_{A1}$ | $L_{Q45}$ |

TABLE 1-continued

| Compound number | $L^1$ | $L^2$ |
|---|---|---|
| 46. | $L_{A1}$ | $L_{Q46}$ |
| 47. | $L_{A1}$ | $L_{Q47}$ |
| 48. | $L_{A1}$ | $L_{Q48}$ |
| 49. | $L_{A1}$ | $L_{Q49}$ |
| 50. | $L_{A1}$ | $L_{Q50}$ |
| 51. | $L_{A1}$ | $L_{Q51}$ |
| 52. | $L_{A1}$ | $L_{Q52}$ |
| 53. | $L_{A1}$ | $L_{Q53}$ |
| 54. | $L_{A1}$ | $L_{Q54}$ |
| 55. | $L_{A1}$ | $L_{Q55}$ |
| 56. | $L_{A1}$ | $L_{Q56}$ |
| 57. | $L_{A1}$ | $L_{Q57}$ |
| 58. | $L_{A1}$ | $L_{Q58}$ |
| 59. | $L_{A1}$ | $L_{Q59}$ |
| 60. | $L_{A1}$ | $L_{Q60}$ |
| 61. | $L_{A1}$ | $L_{Q61}$ |
| 62. | $L_{A1}$ | $L_{Q62}$ |
| 63. | $L_{A1}$ | $L_{Q63}$ |
| 64. | $L_{A1}$ | $L_{Q64}$ |
| 65. | $L_{A1}$ | $L_{Q65}$ |
| 66. | $L_{A1}$ | $L_{Q66}$ |
| 67. | $L_{A1}$ | $L_{Q67}$ |
| 68. | $L_{A1}$ | $L_{Q68}$ |
| 69. | $L_{A1}$ | $L_{Q69}$ |
| 70. | $L_{A1}$ | $L_{Q70}$ |
| 71. | $L_{A1}$ | $L_{Q71}$ |
| 72. | $L_{A1}$ | $L_{Q72}$ |
| 73. | $L_{A1}$ | $L_{Q73}$ |
| 74. | $L_{A1}$ | $L_{Q74}$ |
| 75. | $L_{A1}$ | $L_{Q75}$ |
| 76. | $L_{A1}$ | $L_{Q76}$ |
| 77. | $L_{A1}$ | $L_{Q77}$ |
| 78. | $L_{A1}$ | $L_{Q78}$ |
| 79. | $L_{A1}$ | $L_{Q79}$ |
| 80. | $L_{A1}$ | $L_{Q80}$ |
| 81. | $L_{A1}$ | $L_{Q81}$ |
| 82. | $L_{A1}$ | $L_{Q82}$ |
| 83. | $L_{A1}$ | $L_{Q83}$ |
| 84. | $L_{A1}$ | $L_{Q84}$ |
| 85. | $L_{A1}$ | $L_{Q85}$ |
| 86. | $L_{A1}$ | $L_{Q86}$ |
| 87. | $L_{A1}$ | $L_{Q87}$ |
| 88. | $L_{A1}$ | $L_{Q88}$ |
| 89. | $L_{A1}$ | $L_{Q89}$ |
| 90. | $L_{A1}$ | $L_{Q90}$ |
| 91. | $L_{A1}$ | $L_{Q91}$ |
| 92. | $L_{A1}$ | $L_{Q92}$ |
| 93. | $L_{A1}$ | $L_{Q93}$ |
| 94. | $L_{A1}$ | $L_{Q94}$ |
| 95. | $L_{A1}$ | $L_{Q95}$ |
| 96. | $L_{A1}$ | $L_{Q96}$ |
| 97. | $L_{A1}$ | $L_{Q97}$ |
| 98. | $L_{A1}$ | $L_{Q98}$ |
| 99. | $L_{A1}$ | $L_{Q99}$ |
| 100. | $L_{A1}$ | $L_{Q100}$ |
| 101. | $L_{A1}$ | $L_{Q101}$ |
| 102. | $L_{A1}$ | $L_{Q102}$ |
| 103. | $L_{A1}$ | $L_{Q103}$ |
| 104. | $L_{A1}$ | $L_{Q104}$ |
| 105. | $L_{A1}$ | $L_{Q105}$ |
| 106. | $L_{A1}$ | $L_{Q106}$ |
| 107. | $L_{A1}$ | $L_{Q107}$ |
| 108. | $L_{A1}$ | $L_{Q108}$ |
| 109. | $L_{A1}$ | $L_{Q109}$ |
| 110. | $L_{A1}$ | $L_{Q110}$ |
| 111. | $L_{A1}$ | $L_{Q111}$ |
| 112. | $L_{A1}$ | $L_{Q112}$ |
| 113. | $L_{A1}$ | $L_{Q113}$ |
| 114. | $L_{A1}$ | $L_{Q114}$ |
| 115. | $L_{A1}$ | $L_{Q115}$ |
| 116. | $L_{A1}$ | $L_{Q116}$ |
| 117. | $L_{A1}$ | $L_{Q117}$ |
| 118. | $L_{A1}$ | $L_{Q118}$ |
| 119. | $L_{A1}$ | $L_{Q119}$ |
| 120. | $L_{A1}$ | $L_{Q120}$ |
| 121. | $L_{A1}$ | $L_{Q121}$ |
| 122. | $L_{A1}$ | $L_{Q122}$ |

TABLE 1-continued

| Compound number | $L^1$ | $L^2$ |
|---|---|---|
| 123. | $L_{A1}$ | $L_{Q123}$ |
| 124. | $L_{A1}$ | $L_{Q124}$ |
| 125. | $L_{A1}$ | $L_{Q125}$ |
| 126. | $L_{A1}$ | $L_{Q126}$ |
| 127. | $L_{A1}$ | $L_{Q127}$ |
| 128. | $L_{A1}$ | $L_{Q128}$ |
| 129. | $L_{A1}$ | $L_{Q129}$ |
| 130. | $L_{A1}$ | $L_{Q130}$ |
| 131. | $L_{A1}$ | $L_{Q131}$ |
| 132. | $L_{A1}$ | $L_{Q132}$ |
| 133. | $L_{A1}$ | $L_{Q133}$ |
| 134. | $L_{A2}$ | $L_{Q1}$ |
| 135. | $L_{A2}$ | $L_{Q2}$ |
| 136. | $L_{A2}$ | $L_{Q3}$ |
| 137. | $L_{A2}$ | $L_{Q4}$ |
| 138. | $L_{A2}$ | $L_{Q5}$ |
| 139. | $L_{A2}$ | $L_{Q6}$ |
| 140. | $L_{A2}$ | $L_{Q7}$ |
| 141. | $L_{A2}$ | $L_{Q8}$ |
| 142. | $L_{A2}$ | $L_{Q9}$ |
| 143. | $L_{A2}$ | $L_{Q10}$ |
| 144. | $L_{A2}$ | $L_{Q11}$ |
| 145. | $L_{A2}$ | $L_{Q12}$ |
| 146. | $L_{A2}$ | $L_{Q13}$ |
| 147. | $L_{A2}$ | $L_{Q14}$ |
| 148. | $L_{A2}$ | $L_{Q15}$ |
| 149. | $L_{A2}$ | $L_{Q16}$ |
| 150. | $L_{A2}$ | $L_{Q17}$ |
| 151. | $L_{A2}$ | $L_{Q18}$ |
| 152. | $L_{A2}$ | $L_{Q19}$ |
| 153. | $L_{A2}$ | $L_{Q20}$ |
| 154. | $L_{A2}$ | $L_{Q21}$ |
| 155. | $L_{A2}$ | $L_{Q22}$ |
| 156. | $L_{A2}$ | $L_{Q23}$ |
| 157. | $L_{A2}$ | $L_{Q24}$ |
| 158. | $L_{A2}$ | $L_{Q25}$ |
| 159. | $L_{A2}$ | $L_{Q26}$ |
| 160. | $L_{A2}$ | $L_{Q27}$ |
| 161. | $L_{A2}$ | $L_{Q28}$ |
| 162. | $L_{A2}$ | $L_{Q29}$ |
| 163. | $L_{A2}$ | $L_{Q30}$ |
| 164. | $L_{A2}$ | $L_{Q31}$ |
| 165. | $L_{A2}$ | $L_{Q32}$ |
| 166. | $L_{A2}$ | $L_{Q33}$ |
| 167. | $L_{A2}$ | $L_{Q34}$ |
| 168. | $L_{A2}$ | $L_{Q35}$ |
| 169. | $L_{A2}$ | $L_{Q36}$ |
| 170. | $L_{A2}$ | $L_{Q37}$ |
| 171. | $L_{A2}$ | $L_{Q38}$ |
| 172. | $L_{A2}$ | $L_{Q39}$ |
| 173. | $L_{A2}$ | $L_{Q40}$ |
| 174. | $L_{A2}$ | $L_{Q41}$ |
| 175. | $L_{A2}$ | $L_{Q42}$ |
| 176. | $L_{A2}$ | $L_{Q43}$ |
| 177. | $L_{A2}$ | $L_{Q44}$ |
| 178. | $L_{A2}$ | $L_{Q45}$ |
| 179. | $L_{A2}$ | $L_{Q46}$ |
| 180. | $L_{A2}$ | $L_{Q47}$ |
| 181. | $L_{A2}$ | $L_{Q48}$ |
| 182. | $L_{A2}$ | $L_{Q49}$ |
| 183. | $L_{A2}$ | $L_{Q50}$ |
| 184. | $L_{A2}$ | $L_{Q51}$ |
| 185. | $L_{A2}$ | $L_{Q52}$ |
| 186. | $L_{A2}$ | $L_{Q53}$ |
| 187. | $L_{A2}$ | $L_{Q54}$ |
| 188. | $L_{A2}$ | $L_{Q55}$ |
| 189. | $L_{A2}$ | $L_{Q56}$ |
| 190. | $L_{A2}$ | $L_{Q57}$ |
| 191. | $L_{A2}$ | $L_{Q58}$ |
| 192. | $L_{A2}$ | $L_{Q59}$ |
| 193. | $L_{A2}$ | $L_{Q60}$ |
| 194. | $L_{A2}$ | $L_{Q61}$ |
| 195. | $L_{A2}$ | $L_{Q62}$ |
| 196. | $L_{A2}$ | $L_{Q63}$ |
| 197. | $L_{A2}$ | $L_{Q64}$ |
| 198. | $L_{A2}$ | $L_{Q65}$ |
| 199. | $L_{A2}$ | $L_{Q66}$ |

TABLE 1-continued

| Compound number | $L^1$ | $L^2$ |
|---|---|---|
| 200. | $L_{A2}$ | $L_{Q67}$ |
| 201. | $L_{A2}$ | $L_{Q68}$ |
| 202. | $L_{A2}$ | $L_{Q69}$ |
| 203. | $L_{A2}$ | $L_{Q70}$ |
| 204. | $L_{A2}$ | $L_{Q71}$ |
| 205. | $L_{A2}$ | $L_{Q72}$ |
| 206. | $L_{A2}$ | $L_{Q73}$ |
| 207. | $L_{A2}$ | $L_{Q74}$ |
| 208. | $L_{A2}$ | $L_{Q75}$ |
| 209. | $L_{A2}$ | $L_{Q76}$ |
| 210. | $L_{A2}$ | $L_{Q77}$ |
| 211. | $L_{A2}$ | $L_{Q78}$ |
| 212. | $L_{A2}$ | $L_{Q79}$ |
| 213. | $L_{A2}$ | $L_{Q80}$ |
| 214. | $L_{A2}$ | $L_{Q81}$ |
| 215. | $L_{A2}$ | $L_{Q82}$ |
| 216. | $L_{A2}$ | $L_{Q83}$ |
| 217. | $L_{A2}$ | $L_{Q84}$ |
| 218. | $L_{A2}$ | $L_{Q85}$ |
| 219. | $L_{A2}$ | $L_{Q86}$ |
| 220. | $L_{A2}$ | $L_{Q87}$ |
| 221. | $L_{A2}$ | $L_{Q88}$ |
| 222. | $L_{A2}$ | $L_{Q89}$ |
| 223. | $L_{A2}$ | $L_{Q90}$ |
| 224. | $L_{A2}$ | $L_{Q91}$ |
| 225. | $L_{A2}$ | $L_{Q92}$ |
| 226. | $L_{A2}$ | $L_{Q93}$ |
| 227. | $L_{A2}$ | $L_{Q94}$ |
| 228. | $L_{A2}$ | $L_{Q95}$ |
| 229. | $L_{A2}$ | $L_{Q96}$ |
| 230. | $L_{A2}$ | $L_{Q97}$ |
| 231. | $L_{A2}$ | $L_{Q98}$ |
| 232. | $L_{A2}$ | $L_{Q99}$ |
| 233. | $L_{A2}$ | $L_{Q100}$ |
| 234. | $L_{A2}$ | $L_{Q101}$ |
| 235. | $L_{A2}$ | $L_{Q102}$ |
| 236. | $L_{A2}$ | $L_{Q103}$ |
| 237. | $L_{A2}$ | $L_{Q104}$ |
| 238. | $L_{A2}$ | $L_{Q105}$ |
| 239. | $L_{A2}$ | $L_{Q106}$ |
| 240. | $L_{A2}$ | $L_{Q107}$ |
| 241. | $L_{A2}$ | $L_{Q108}$ |
| 242. | $L_{A2}$ | $L_{Q109}$ |
| 243. | $L_{A2}$ | $L_{Q110}$ |
| 244. | $L_{A2}$ | $L_{Q111}$ |
| 245. | $L_{A2}$ | $L_{Q112}$ |
| 246. | $L_{A2}$ | $L_{Q113}$ |
| 247. | $L_{A2}$ | $L_{Q114}$ |
| 248. | $L_{A2}$ | $L_{Q115}$ |
| 249. | $L_{A2}$ | $L_{Q116}$ |
| 250. | $L_{A2}$ | $L_{Q117}$ |
| 251. | $L_{A2}$ | $L_{Q118}$ |
| 252. | $L_{A2}$ | $L_{Q119}$ |
| 253. | $L_{A2}$ | $L_{Q120}$ |
| 254. | $L_{A2}$ | $L_{Q121}$ |
| 255. | $L_{A2}$ | $L_{Q122}$ |
| 256. | $L_{A2}$ | $L_{Q123}$ |
| 257. | $L_{A2}$ | $L_{Q124}$ |
| 258. | $L_{A2}$ | $L_{Q125}$ |
| 259. | $L_{A2}$ | $L_{Q126}$ |
| 260. | $L_{A2}$ | $L_{Q127}$ |
| 261. | $L_{A2}$ | $L_{Q128}$ |
| 262. | $L_{A2}$ | $L_{Q129}$ |
| 263. | $L_{A2}$ | $L_{Q130}$ |
| 264. | $L_{A2}$ | $L_{Q131}$ |
| 265. | $L_{A2}$ | $L_{Q132}$ |
| 266. | $L_{A2}$ | $L_{Q133}$ |
| 267. | $L_{A3}$ | $L_{Q1}$ |
| 268. | $L_{A3}$ | $L_{Q2}$ |
| 269. | $L_{A3}$ | $L_{Q3}$ |
| 270. | $L_{A3}$ | $L_{Q4}$ |
| 271. | $L_{A3}$ | $L_{Q5}$ |
| 272. | $L_{A3}$ | $L_{Q6}$ |
| 273. | $L_{A3}$ | $L_{Q7}$ |
| 274. | $L_{A3}$ | $L_{Q8}$ |
| 275. | $L_{A3}$ | $L_{Q9}$ |
| 276. | $L_{A3}$ | $L_{Q10}$ |

TABLE 1-continued

| Compound number | $L^1$ | $L^2$ |
|---|---|---|
| 277. | $L_{A3}$ | $L_{Q11}$ |
| 278. | $L_{A3}$ | $L_{Q12}$ |
| 279. | $L_{A3}$ | $L_{Q13}$ |
| 280. | $L_{A3}$ | $L_{Q14}$ |
| 281. | $L_{A3}$ | $L_{Q15}$ |
| 282. | $L_{A3}$ | $L_{Q16}$ |
| 283. | $L_{A3}$ | $L_{Q17}$ |
| 284. | $L_{A3}$ | $L_{Q18}$ |
| 285. | $L_{A3}$ | $L_{Q19}$ |
| 286. | $L_{A3}$ | $L_{Q20}$ |
| 287. | $L_{A3}$ | $L_{Q21}$ |
| 288. | $L_{A3}$ | $L_{Q22}$ |
| 289. | $L_{A3}$ | $L_{Q23}$ |
| 290. | $L_{A3}$ | $L_{Q24}$ |
| 291. | $L_{A3}$ | $L_{Q25}$ |
| 292. | $L_{A3}$ | $L_{Q26}$ |
| 293. | $L_{A3}$ | $L_{Q27}$ |
| 294. | $L_{A3}$ | $L_{Q28}$ |
| 295. | $L_{A3}$ | $L_{Q29}$ |
| 296. | $L_{A3}$ | $L_{Q30}$ |
| 297. | $L_{A3}$ | $L_{Q31}$ |
| 298. | $L_{A3}$ | $L_{Q32}$ |
| 299. | $L_{A3}$ | $L_{Q33}$ |
| 300. | $L_{A3}$ | $L_{Q34}$ |
| 301. | $L_{A3}$ | $L_{Q35}$ |
| 302. | $L_{A3}$ | $L_{Q36}$ |
| 303. | $L_{A3}$ | $L_{Q37}$ |
| 304. | $L_{A3}$ | $L_{Q38}$ |
| 305. | $L_{A3}$ | $L_{Q39}$ |
| 306. | $L_{A3}$ | $L_{Q40}$ |
| 307. | $L_{A3}$ | $L_{Q41}$ |
| 308. | $L_{A3}$ | $L_{Q42}$ |
| 309. | $L_{A3}$ | $L_{Q43}$ |
| 310. | $L_{A3}$ | $L_{Q44}$ |
| 311. | $L_{A3}$ | $L_{Q45}$ |
| 312. | $L_{A3}$ | $L_{Q46}$ |
| 313. | $L_{A3}$ | $L_{Q47}$ |
| 314. | $L_{A3}$ | $L_{Q48}$ |
| 315. | $L_{A3}$ | $L_{Q49}$ |
| 316. | $L_{A3}$ | $L_{Q50}$ |
| 317. | $L_{A3}$ | $L_{Q51}$ |
| 318. | $L_{A3}$ | $L_{Q52}$ |
| 319. | $L_{A3}$ | $L_{Q53}$ |
| 320. | $L_{A3}$ | $L_{Q54}$ |
| 321. | $L_{A3}$ | $L_{Q55}$ |
| 322. | $L_{A3}$ | $L_{Q56}$ |
| 323. | $L_{A3}$ | $L_{Q57}$ |
| 324. | $L_{A3}$ | $L_{Q58}$ |
| 325. | $L_{A3}$ | $L_{Q59}$ |
| 326. | $L_{A3}$ | $L_{Q60}$ |
| 327. | $L_{A3}$ | $L_{Q61}$ |
| 328. | $L_{A3}$ | $L_{Q62}$ |
| 329. | $L_{A3}$ | $L_{Q63}$ |
| 330. | $L_{A3}$ | $L_{Q64}$ |
| 331. | $L_{A3}$ | $L_{Q65}$ |
| 332. | $L_{A3}$ | $L_{Q66}$ |
| 333. | $L_{A3}$ | $L_{Q67}$ |
| 334. | $L_{A3}$ | $L_{Q68}$ |
| 335. | $L_{A3}$ | $L_{Q69}$ |
| 336. | $L_{A3}$ | $L_{Q70}$ |
| 337. | $L_{A3}$ | $L_{Q71}$ |
| 338. | $L_{A3}$ | $L_{Q72}$ |
| 339. | $L_{A3}$ | $L_{Q73}$ |
| 340. | $L_{A3}$ | $L_{Q74}$ |
| 341. | $L_{A3}$ | $L_{Q75}$ |
| 342. | $L_{A3}$ | $L_{Q76}$ |
| 343. | $L_{A3}$ | $L_{Q77}$ |
| 344. | $L_{A3}$ | $L_{Q78}$ |
| 345. | $L_{A3}$ | $L_{Q79}$ |
| 346. | $L_{A3}$ | $L_{Q80}$ |
| 347. | $L_{A3}$ | $L_{Q81}$ |
| 348. | $L_{A3}$ | $L_{Q82}$ |
| 349. | $L_{A3}$ | $L_{Q83}$ |
| 350. | $L_{A3}$ | $L_{Q84}$ |
| 351. | $L_{A3}$ | $L_{Q85}$ |
| 352. | $L_{A3}$ | $L_{Q86}$ |
| 353. | $L_{A3}$ | $L_{Q87}$ |

TABLE 1-continued

| Compound number | $L^1$ | $L^2$ |
|---|---|---|
| 354. | $L_{A3}$ | $L_{Q88}$ |
| 355. | $L_{A3}$ | $L_{Q89}$ |
| 356. | $L_{A3}$ | $L_{Q90}$ |
| 357. | $L_{A3}$ | $L_{Q91}$ |
| 358. | $L_{A3}$ | $L_{Q92}$ |
| 359. | $L_{A3}$ | $L_{Q93}$ |
| 360. | $L_{A3}$ | $L_{Q94}$ |
| 361. | $L_{A3}$ | $L_{Q95}$ |
| 362. | $L_{A3}$ | $L_{Q96}$ |
| 363. | $L_{A3}$ | $L_{Q97}$ |
| 364. | $L_{A3}$ | $L_{Q98}$ |
| 365. | $L_{A3}$ | $L_{Q99}$ |
| 366. | $L_{A3}$ | $L_{Q100}$ |
| 367. | $L_{A3}$ | $L_{Q101}$ |
| 368. | $L_{A3}$ | $L_{Q102}$ |
| 369. | $L_{A3}$ | $L_{Q103}$ |
| 370. | $L_{A3}$ | $L_{Q104}$ |
| 371. | $L_{A3}$ | $L_{Q105}$ |
| 372. | $L_{A3}$ | $L_{Q106}$ |
| 373. | $L_{A3}$ | $L_{Q107}$ |
| 374. | $L_{A3}$ | $L_{Q108}$ |
| 375. | $L_{A3}$ | $L_{Q109}$ |
| 376. | $L_{A3}$ | $L_{Q110}$ |
| 377. | $L_{A3}$ | $L_{Q111}$ |
| 378. | $L_{A3}$ | $L_{Q112}$ |
| 379. | $L_{A3}$ | $L_{Q113}$ |
| 380. | $L_{A3}$ | $L_{Q114}$ |
| 381. | $L_{A3}$ | $L_{Q115}$ |
| 382. | $L_{A3}$ | $L_{Q116}$ |
| 383. | $L_{A3}$ | $L_{Q117}$ |
| 384. | $L_{A3}$ | $L_{Q118}$ |
| 385. | $L_{A3}$ | $L_{Q119}$ |
| 386. | $L_{A3}$ | $L_{Q120}$ |
| 387. | $L_{A3}$ | $L_{Q121}$ |
| 388. | $L_{A3}$ | $L_{Q122}$ |
| 389. | $L_{A3}$ | $L_{Q123}$ |
| 390. | $L_{A3}$ | $L_{Q124}$ |
| 391. | $L_{A3}$ | $L_{Q125}$ |
| 392. | $L_{A3}$ | $L_{Q126}$ |
| 393. | $L_{A3}$ | $L_{Q127}$ |
| 394. | $L_{A3}$ | $L_{Q128}$ |
| 395. | $L_{A3}$ | $L_{Q129}$ |
| 396. | $L_{A3}$ | $L_{Q130}$ |
| 397. | $L_{A3}$ | $L_{Q131}$ |
| 398. | $L_{A3}$ | $L_{Q132}$ |
| 399. | $L_{A3}$ | $L_{Q133}$ |
| 400. | $L_{A4}$ | $L_{Q1}$ |
| 401. | $L_{A4}$ | $L_{Q2}$ |
| 402. | $L_{A4}$ | $L_{Q3}$ |
| 403. | $L_{A4}$ | $L_{Q4}$ |
| 404. | $L_{A4}$ | $L_{Q5}$ |
| 405. | $L_{A4}$ | $L_{Q6}$ |
| 406. | $L_{A4}$ | $L_{Q7}$ |
| 407. | $L_{A4}$ | $L_{Q8}$ |
| 408. | $L_{A4}$ | $L_{Q9}$ |
| 409. | $L_{A4}$ | $L_{Q10}$ |
| 410. | $L_{A4}$ | $L_{Q11}$ |
| 411. | $L_{A4}$ | $L_{Q12}$ |
| 412. | $L_{A4}$ | $L_{Q13}$ |
| 413. | $L_{A4}$ | $L_{Q14}$ |
| 414. | $L_{A4}$ | $L_{Q15}$ |
| 415. | $L_{A4}$ | $L_{Q16}$ |
| 416. | $L_{A4}$ | $L_{Q17}$ |
| 417. | $L_{A4}$ | $L_{Q18}$ |
| 418. | $L_{A4}$ | $L_{Q19}$ |
| 419. | $L_{A4}$ | $L_{Q20}$ |
| 420. | $L_{A4}$ | $L_{Q21}$ |
| 421. | $L_{A4}$ | $L_{Q22}$ |
| 422. | $L_{A4}$ | $L_{Q23}$ |
| 423. | $L_{A4}$ | $L_{Q24}$ |
| 424. | $L_{A4}$ | $L_{Q25}$ |
| 425. | $L_{A4}$ | $L_{Q26}$ |
| 426. | $L_{A4}$ | $L_{Q27}$ |
| 427. | $L_{A4}$ | $L_{Q28}$ |
| 428. | $L_{A4}$ | $L_{Q29}$ |
| 429. | $L_{A4}$ | $L_{Q30}$ |
| 430. | $L_{A4}$ | $L_{Q31}$ |

TABLE 1-continued

| Compound number | $L^1$ | $L^2$ |
|---|---|---|
| 431. | $L_{A4}$ | $L_{Q32}$ |
| 432. | $L_{A4}$ | $L_{Q33}$ |
| 433. | $L_{A4}$ | $L_{Q34}$ |
| 434. | $L_{A4}$ | $L_{Q35}$ |
| 435. | $L_{A4}$ | $L_{Q36}$ |
| 436. | $L_{A4}$ | $L_{Q37}$ |
| 437. | $L_{A4}$ | $L_{Q38}$ |
| 438. | $L_{A4}$ | $L_{Q39}$ |
| 439. | $L_{A4}$ | $L_{Q40}$ |
| 440. | $L_{A4}$ | $L_{Q41}$ |
| 441. | $L_{A4}$ | $L_{Q42}$ |
| 442. | $L_{A4}$ | $L_{Q43}$ |
| 443. | $L_{A4}$ | $L_{Q44}$ |
| 444. | $L_{A4}$ | $L_{Q45}$ |
| 445. | $L_{A4}$ | $L_{Q46}$ |
| 446. | $L_{A4}$ | $L_{Q47}$ |
| 447. | $L_{A4}$ | $L_{Q48}$ |
| 448. | $L_{A4}$ | $L_{Q49}$ |
| 449. | $L_{A4}$ | $L_{Q50}$ |
| 450. | $L_{A4}$ | $L_{Q51}$ |
| 451. | $L_{A4}$ | $L_{Q52}$ |
| 452. | $L_{A4}$ | $L_{Q53}$ |
| 453. | $L_{A4}$ | $L_{Q54}$ |
| 454. | $L_{A4}$ | $L_{Q55}$ |
| 455. | $L_{A4}$ | $L_{Q56}$ |
| 456. | $L_{A4}$ | $L_{Q57}$ |
| 457. | $L_{A4}$ | $L_{Q58}$ |
| 458. | $L_{A4}$ | $L_{Q59}$ |
| 459. | $L_{A4}$ | $L_{Q60}$ |
| 460. | $L_{A4}$ | $L_{Q61}$ |
| 461. | $L_{A4}$ | $L_{Q62}$ |
| 462. | $L_{A4}$ | $L_{Q63}$ |
| 463. | $L_{A4}$ | $L_{Q64}$ |
| 464. | $L_{A4}$ | $L_{Q65}$ |
| 465. | $L_{A4}$ | $L_{Q66}$ |
| 466. | $L_{A4}$ | $L_{Q67}$ |
| 467. | $L_{A4}$ | $L_{Q68}$ |
| 468. | $L_{A4}$ | $L_{Q69}$ |
| 469. | $L_{A4}$ | $L_{Q70}$ |
| 470. | $L_{A4}$ | $L_{Q71}$ |
| 471. | $L_{A4}$ | $L_{Q72}$ |
| 472. | $L_{A4}$ | $L_{Q73}$ |
| 473. | $L_{A4}$ | $L_{Q74}$ |
| 474. | $L_{A4}$ | $L_{Q75}$ |
| 475. | $L_{A4}$ | $L_{Q76}$ |
| 476. | $L_{A4}$ | $L_{Q77}$ |
| 477. | $L_{A4}$ | $L_{Q78}$ |
| 478. | $L_{A4}$ | $L_{Q79}$ |
| 479. | $L_{A4}$ | $L_{Q80}$ |
| 480. | $L_{A4}$ | $L_{Q81}$ |
| 481. | $L_{A4}$ | $L_{Q82}$ |
| 482. | $L_{A4}$ | $L_{Q83}$ |
| 483. | $L_{A4}$ | $L_{Q84}$ |
| 484. | $L_{A4}$ | $L_{Q85}$ |
| 485. | $L_{A4}$ | $L_{Q86}$ |
| 486. | $L_{A4}$ | $L_{Q87}$ |
| 487. | $L_{A4}$ | $L_{Q88}$ |
| 488. | $L_{A4}$ | $L_{Q89}$ |
| 489. | $L_{A4}$ | $L_{Q90}$ |
| 490. | $L_{A4}$ | $L_{Q91}$ |
| 491. | $L_{A4}$ | $L_{Q92}$ |
| 492. | $L_{A4}$ | $L_{Q93}$ |
| 493. | $L_{A4}$ | $L_{Q94}$ |
| 494. | $L_{A4}$ | $L_{Q95}$ |
| 495. | $L_{A4}$ | $L_{Q96}$ |
| 496. | $L_{A4}$ | $L_{Q97}$ |
| 497. | $L_{A4}$ | $L_{Q98}$ |
| 498. | $L_{A4}$ | $L_{Q99}$ |
| 499. | $L_{A4}$ | $L_{Q100}$ |
| 500. | $L_{A4}$ | $L_{Q101}$ |
| 501. | $L_{A4}$ | $L_{Q102}$ |
| 502. | $L_{A4}$ | $L_{Q103}$ |
| 503. | $L_{A4}$ | $L_{Q104}$ |
| 504. | $L_{A4}$ | $L_{Q105}$ |
| 505. | $L_{A4}$ | $L_{Q106}$ |
| 506. | $L_{A4}$ | $L_{Q107}$ |
| 507. | $L_{A4}$ | $L_{Q108}$ |

TABLE 1-continued

| Compound number | $L^1$ | $L^2$ |
|---|---|---|
| 508. | $L_{A4}$ | $L_{Q109}$ |
| 509. | $L_{A4}$ | $L_{Q110}$ |
| 510. | $L_{A4}$ | $L_{Q111}$ |
| 511. | $L_{A4}$ | $L_{Q112}$ |
| 512. | $L_{A4}$ | $L_{Q113}$ |
| 513. | $L_{A4}$ | $L_{Q114}$ |
| 514. | $L_{A4}$ | $L_{Q115}$ |
| 515. | $L_{A4}$ | $L_{Q116}$ |
| 516. | $L_{A4}$ | $L_{Q117}$ |
| 517. | $L_{A4}$ | $L_{Q118}$ |
| 518. | $L_{A4}$ | $L_{Q119}$ |
| 519. | $L_{A4}$ | $L_{Q120}$ |
| 520. | $L_{A4}$ | $L_{Q121}$ |
| 521. | $L_{A4}$ | $L_{Q122}$ |
| 522. | $L_{A4}$ | $L_{Q123}$ |
| 523. | $L_{A4}$ | $L_{Q124}$ |
| 524. | $L_{A4}$ | $L_{Q125}$ |
| 525. | $L_{A4}$ | $L_{Q126}$ |
| 526. | $L_{A4}$ | $L_{Q127}$ |
| 527. | $L_{A4}$ | $L_{Q128}$ |
| 528. | $L_{A4}$ | $L_{Q129}$ |
| 529. | $L_{A4}$ | $L_{Q130}$ |
| 530. | $L_{A4}$ | $L_{Q131}$ |
| 531. | $L_{A4}$ | $L_{Q132}$ |
| 532. | $L_{A4}$ | $L_{Q133}$ |
| 533. | $L_{A5}$ | $L_{Q1}$ |
| 534. | $L_{A5}$ | $L_{Q2}$ |
| 535. | $L_{A5}$ | $L_{Q3}$ |
| 536. | $L_{A5}$ | $L_{Q4}$ |
| 537. | $L_{A5}$ | $L_{Q5}$ |
| 538. | $L_{A5}$ | $L_{Q6}$ |
| 539. | $L_{A5}$ | $L_{Q7}$ |
| 540. | $L_{A5}$ | $L_{Q8}$ |
| 541. | $L_{A5}$ | $L_{Q9}$ |
| 542. | $L_{A5}$ | $L_{Q10}$ |
| 543. | $L_{A5}$ | $L_{Q11}$ |
| 544. | $L_{A5}$ | $L_{Q12}$ |
| 545. | $L_{A5}$ | $L_{Q13}$ |
| 546. | $L_{A5}$ | $L_{Q14}$ |
| 547. | $L_{A5}$ | $L_{Q15}$ |
| 548. | $L_{A5}$ | $L_{Q16}$ |
| 549. | $L_{A5}$ | $L_{Q17}$ |
| 550. | $L_{A5}$ | $L_{Q18}$ |
| 551. | $L_{A5}$ | $L_{Q19}$ |
| 552. | $L_{A5}$ | $L_{Q20}$ |
| 553. | $L_{A5}$ | $L_{Q21}$ |
| 554. | $L_{A5}$ | $L_{Q22}$ |
| 555. | $L_{A5}$ | $L_{Q23}$ |
| 556. | $L_{A5}$ | $L_{Q24}$ |
| 557. | $L_{A5}$ | $L_{Q25}$ |
| 558. | $L_{A5}$ | $L_{Q26}$ |
| 559. | $L_{A5}$ | $L_{Q27}$ |
| 560. | $L_{A5}$ | $L_{Q28}$ |
| 561. | $L_{A5}$ | $L_{Q29}$ |
| 562. | $L_{A5}$ | $L_{Q30}$ |
| 563. | $L_{A5}$ | $L_{Q31}$ |
| 564. | $L_{A5}$ | $L_{Q32}$ |
| 565. | $L_{A5}$ | $L_{Q33}$ |
| 566. | $L_{A5}$ | $L_{Q34}$ |
| 567. | $L_{A5}$ | $L_{Q35}$ |
| 568. | $L_{A5}$ | $L_{Q36}$ |
| 569. | $L_{A5}$ | $L_{Q37}$ |
| 570. | $L_{A5}$ | $L_{Q38}$ |
| 571. | $L_{A5}$ | $L_{Q39}$ |
| 572. | $L_{A5}$ | $L_{Q40}$ |
| 573. | $L_{A5}$ | $L_{Q41}$ |
| 574. | $L_{A5}$ | $L_{Q42}$ |
| 575. | $L_{A5}$ | $L_{Q43}$ |
| 576. | $L_{A5}$ | $L_{Q44}$ |
| 577. | $L_{A5}$ | $L_{Q45}$ |
| 578. | $L_{A5}$ | $L_{Q46}$ |
| 579. | $L_{A5}$ | $L_{Q47}$ |
| 580. | $L_{A5}$ | $L_{Q48}$ |
| 581. | $L_{A5}$ | $L_{Q49}$ |
| 582. | $L_{A5}$ | $L_{Q50}$ |
| 583. | $L_{A5}$ | $L_{Q51}$ |
| 584. | $L_{A5}$ | $L_{Q52}$ |

TABLE 1-continued

| Compound number | $L^1$ | $L^2$ |
|---|---|---|
| 585. | $L_{A5}$ | $L_{Q53}$ |
| 586. | $L_{A5}$ | $L_{Q54}$ |
| 587. | $L_{A5}$ | $L_{Q55}$ |
| 588. | $L_{A5}$ | $L_{Q56}$ |
| 589. | $L_{A5}$ | $L_{Q57}$ |
| 590. | $L_{A5}$ | $L_{Q58}$ |
| 591. | $L_{A5}$ | $L_{Q59}$ |
| 592. | $L_{A5}$ | $L_{Q60}$ |
| 593. | $L_{A5}$ | $L_{Q61}$ |
| 594. | $L_{A5}$ | $L_{Q62}$ |
| 595. | $L_{A5}$ | $L_{Q63}$ |
| 596. | $L_{A5}$ | $L_{Q64}$ |
| 597. | $L_{A5}$ | $L_{Q65}$ |
| 598. | $L_{A5}$ | $L_{Q66}$ |
| 599. | $L_{A5}$ | $L_{Q67}$ |
| 600. | $L_{A5}$ | $L_{Q68}$ |
| 601. | $L_{A5}$ | $L_{Q69}$ |
| 602. | $L_{A5}$ | $L_{Q70}$ |
| 603. | $L_{A5}$ | $L_{Q71}$ |
| 604. | $L_{A5}$ | $L_{Q72}$ |
| 605. | $L_{A5}$ | $L_{Q73}$ |
| 606. | $L_{A5}$ | $L_{Q74}$ |
| 607. | $L_{A5}$ | $L_{Q75}$ |
| 608. | $L_{A5}$ | $L_{Q76}$ |
| 609. | $L_{A5}$ | $L_{Q77}$ |
| 610. | $L_{A5}$ | $L_{Q78}$ |
| 611. | $L_{A5}$ | $L_{Q79}$ |
| 612. | $L_{A5}$ | $L_{Q80}$ |
| 613. | $L_{A5}$ | $L_{Q81}$ |
| 614. | $L_{A5}$ | $L_{Q82}$ |
| 615. | $L_{A5}$ | $L_{Q83}$ |
| 616. | $L_{A5}$ | $L_{Q84}$ |
| 617. | $L_{A5}$ | $L_{Q85}$ |
| 618. | $L_{A5}$ | $L_{Q86}$ |
| 619. | $L_{A5}$ | $L_{Q87}$ |
| 620. | $L_{A5}$ | $L_{Q88}$ |
| 621. | $L_{A5}$ | $L_{Q89}$ |
| 622. | $L_{A5}$ | $L_{Q90}$ |
| 623. | $L_{A5}$ | $L_{Q91}$ |
| 624. | $L_{A5}$ | $L_{Q92}$ |
| 625. | $L_{A5}$ | $L_{Q93}$ |
| 626. | $L_{A5}$ | $L_{Q94}$ |
| 627. | $L_{A5}$ | $L_{Q95}$ |
| 628. | $L_{A5}$ | $L_{Q96}$ |
| 629. | $L_{A5}$ | $L_{Q97}$ |
| 630. | $L_{A5}$ | $L_{Q98}$ |
| 631. | $L_{A5}$ | $L_{Q99}$ |
| 632. | $L_{A5}$ | $L_{Q100}$ |
| 633. | $L_{A5}$ | $L_{Q101}$ |
| 634. | $L_{A5}$ | $L_{Q102}$ |
| 635. | $L_{A5}$ | $L_{Q103}$ |
| 636. | $L_{A5}$ | $L_{Q104}$ |
| 637. | $L_{A5}$ | $L_{Q105}$ |
| 638. | $L_{A5}$ | $L_{Q106}$ |
| 639. | $L_{A5}$ | $L_{Q107}$ |
| 640. | $L_{A5}$ | $L_{Q108}$ |
| 641. | $L_{A5}$ | $L_{Q109}$ |
| 642. | $L_{A5}$ | $L_{Q110}$ |
| 643. | $L_{A5}$ | $L_{Q111}$ |
| 644. | $L_{A5}$ | $L_{Q112}$ |
| 645. | $L_{A5}$ | $L_{Q113}$ |
| 646. | $L_{A5}$ | $L_{Q114}$ |
| 647. | $L_{A5}$ | $L_{Q115}$ |
| 648. | $L_{A5}$ | $L_{Q116}$ |
| 649. | $L_{A5}$ | $L_{Q117}$ |
| 650. | $L_{A5}$ | $L_{Q118}$ |
| 651. | $L_{A5}$ | $L_{Q119}$ |
| 652. | $L_{A5}$ | $L_{Q120}$ |
| 653. | $L_{A5}$ | $L_{Q121}$ |
| 654. | $L_{A5}$ | $L_{Q122}$ |
| 655. | $L_{A5}$ | $L_{Q123}$ |
| 656. | $L_{A5}$ | $L_{Q124}$ |
| 657. | $L_{A5}$ | $L_{Q125}$ |
| 658. | $L_{A5}$ | $L_{Q126}$ |
| 659. | $L_{A5}$ | $L_{Q127}$ |
| 660. | $L_{A5}$ | $L_{Q128}$ |
| 661. | $L_{A5}$ | $L_{Q129}$ |

TABLE 1-continued

| Compound number | $L^1$ | $L^2$ |
|---|---|---|
| 662. | $L_{A5}$ | $L_{Q130}$ |
| 663. | $L_{A5}$ | $L_{Q131}$ |
| 664. | $L_{A5}$ | $L_{Q132}$ |
| 665. | $L_{A5}$ | $L_{Q133}$ |
| 666. | $L_{A6}$ | $L_{Q1}$ |
| 667. | $L_{A6}$ | $L_{Q2}$ |
| 668. | $L_{A6}$ | $L_{Q3}$ |
| 669. | $L_{A6}$ | $L_{Q4}$ |
| 670. | $L_{A6}$ | $L_{Q5}$ |
| 671. | $L_{A6}$ | $L_{Q6}$ |
| 672. | $L_{A6}$ | $L_{Q7}$ |
| 673. | $L_{A6}$ | $L_{Q8}$ |
| 674. | $L_{A6}$ | $L_{Q9}$ |
| 675. | $L_{A6}$ | $L_{Q10}$ |
| 676. | $L_{A6}$ | $L_{Q11}$ |
| 677. | $L_{A6}$ | $L_{Q12}$ |
| 678. | $L_{A6}$ | $L_{Q13}$ |
| 679. | $L_{A6}$ | $L_{Q14}$ |
| 680. | $L_{A6}$ | $L_{Q15}$ |
| 681. | $L_{A6}$ | $L_{Q16}$ |
| 682. | $L_{A6}$ | $L_{Q17}$ |
| 683. | $L_{A6}$ | $L_{Q18}$ |
| 684. | $L_{A6}$ | $L_{Q19}$ |
| 685. | $L_{A6}$ | $L_{Q20}$ |
| 686. | $L_{A6}$ | $L_{Q21}$ |
| 687. | $L_{A6}$ | $L_{Q22}$ |
| 688. | $L_{A6}$ | $L_{Q23}$ |
| 689. | $L_{A6}$ | $L_{Q24}$ |
| 690. | $L_{A6}$ | $L_{Q25}$ |
| 691. | $L_{A6}$ | $L_{Q26}$ |
| 692. | $L_{A6}$ | $L_{Q27}$ |
| 693. | $L_{A6}$ | $L_{Q28}$ |
| 694. | $L_{A6}$ | $L_{Q29}$ |
| 695. | $L_{A6}$ | $L_{Q30}$ |
| 696. | $L_{A6}$ | $L_{Q31}$ |
| 697. | $L_{A6}$ | $L_{Q32}$ |
| 698. | $L_{A6}$ | $L_{Q33}$ |
| 699. | $L_{A6}$ | $L_{Q34}$ |
| 700. | $L_{A6}$ | $L_{Q35}$ |
| 701. | $L_{A6}$ | $L_{Q36}$ |
| 702. | $L_{A6}$ | $L_{Q37}$ |
| 703. | $L_{A6}$ | $L_{Q38}$ |
| 704. | $L_{A6}$ | $L_{Q39}$ |
| 705. | $L_{A6}$ | $L_{Q40}$ |
| 706. | $L_{A6}$ | $L_{Q41}$ |
| 707. | $L_{A6}$ | $L_{Q42}$ |
| 708. | $L_{A6}$ | $L_{Q43}$ |
| 709. | $L_{A6}$ | $L_{Q44}$ |
| 710. | $L_{A6}$ | $L_{Q45}$ |
| 711. | $L_{A6}$ | $L_{Q46}$ |
| 712. | $L_{A6}$ | $L_{Q47}$ |
| 713. | $L_{A6}$ | $L_{Q48}$ |
| 714. | $L_{A6}$ | $L_{Q49}$ |
| 715. | $L_{A6}$ | $L_{Q50}$ |
| 716. | $L_{A6}$ | $L_{Q51}$ |
| 717. | $L_{A6}$ | $L_{Q52}$ |
| 718. | $L_{A6}$ | $L_{Q53}$ |
| 719. | $L_{A6}$ | $L_{Q54}$ |
| 720. | $L_{A6}$ | $L_{Q55}$ |
| 721. | $L_{A6}$ | $L_{Q56}$ |
| 722. | $L_{A6}$ | $L_{Q57}$ |
| 723. | $L_{A6}$ | $L_{Q58}$ |
| 724. | $L_{A6}$ | $L_{Q59}$ |
| 725. | $L_{A6}$ | $L_{Q60}$ |
| 726. | $L_{A6}$ | $L_{Q61}$ |
| 727. | $L_{A6}$ | $L_{Q62}$ |
| 728. | $L_{A6}$ | $L_{Q63}$ |
| 729. | $L_{A6}$ | $L_{Q64}$ |
| 730. | $L_{A6}$ | $L_{Q65}$ |
| 731. | $L_{A6}$ | $L_{Q66}$ |
| 732. | $L_{A6}$ | $L_{Q67}$ |
| 733. | $L_{A6}$ | $L_{Q68}$ |
| 734. | $L_{A6}$ | $L_{Q69}$ |
| 735. | $L_{A6}$ | $L_{Q70}$ |
| 736. | $L_{A6}$ | $L_{Q71}$ |
| 737. | $L_{A6}$ | $L_{Q72}$ |
| 738. | $L_{A6}$ | $L_{Q73}$ |

TABLE 1-continued

| Compound number | $L^1$ | $L^2$ |
|---|---|---|
| 739. | $L_{A6}$ | $L_{Q74}$ |
| 740. | $L_{A6}$ | $L_{Q75}$ |
| 741. | $L_{A6}$ | $L_{Q76}$ |
| 742. | $L_{A6}$ | $L_{Q77}$ |
| 743. | $L_{A6}$ | $L_{Q78}$ |
| 744. | $L_{A6}$ | $L_{Q79}$ |
| 745. | $L_{A6}$ | $L_{Q80}$ |
| 746. | $L_{A6}$ | $L_{Q81}$ |
| 747. | $L_{A6}$ | $L_{Q82}$ |
| 748. | $L_{A6}$ | $L_{Q83}$ |
| 749. | $L_{A6}$ | $L_{Q84}$ |
| 750. | $L_{A6}$ | $L_{Q85}$ |
| 751. | $L_{A6}$ | $L_{Q86}$ |
| 752. | $L_{A6}$ | $L_{Q87}$ |
| 753. | $L_{A6}$ | $L_{Q88}$ |
| 754. | $L_{A6}$ | $L_{Q89}$ |
| 755. | $L_{A6}$ | $L_{Q90}$ |
| 756. | $L_{A6}$ | $L_{Q91}$ |
| 757. | $L_{A6}$ | $L_{Q92}$ |
| 758. | $L_{A6}$ | $L_{Q93}$ |
| 759. | $L_{A6}$ | $L_{Q94}$ |
| 760. | $L_{A6}$ | $L_{Q95}$ |
| 761. | $L_{A6}$ | $L_{Q96}$ |
| 762. | $L_{A6}$ | $L_{Q97}$ |
| 763. | $L_{A6}$ | $L_{Q98}$ |
| 764. | $L_{A6}$ | $L_{Q99}$ |
| 765. | $L_{A6}$ | $L_{Q100}$ |
| 766. | $L_{A6}$ | $L_{Q101}$ |
| 767. | $L_{A6}$ | $L_{Q102}$ |
| 768. | $L_{A6}$ | $L_{Q103}$ |
| 769. | $L_{A6}$ | $L_{Q104}$ |
| 770. | $L_{A6}$ | $L_{Q105}$ |
| 771. | $L_{A6}$ | $L_{Q106}$ |
| 772. | $L_{A6}$ | $L_{Q107}$ |
| 773. | $L_{A6}$ | $L_{Q108}$ |
| 774. | $L_{A6}$ | $L_{Q109}$ |
| 775. | $L_{A6}$ | $L_{Q110}$ |
| 776. | $L_{A6}$ | $L_{Q111}$ |
| 777. | $L_{A6}$ | $L_{Q112}$ |
| 778. | $L_{A6}$ | $L_{Q113}$ |
| 779. | $L_{A6}$ | $L_{Q114}$ |
| 780. | $L_{A6}$ | $L_{Q115}$ |
| 781. | $L_{A6}$ | $L_{Q116}$ |
| 782. | $L_{A6}$ | $L_{Q117}$ |
| 783. | $L_{A6}$ | $L_{Q118}$ |
| 784. | $L_{A6}$ | $L_{Q119}$ |
| 785. | $L_{A6}$ | $L_{Q120}$ |
| 786. | $L_{A6}$ | $L_{Q121}$ |
| 787. | $L_{A6}$ | $L_{Q122}$ |
| 788. | $L_{A6}$ | $L_{Q123}$ |
| 789. | $L_{A6}$ | $L_{Q124}$ |
| 790. | $L_{A6}$ | $L_{Q125}$ |
| 791. | $L_{A6}$ | $L_{Q126}$ |
| 792. | $L_{A6}$ | $L_{Q127}$ |
| 793. | $L_{A6}$ | $L_{Q128}$ |
| 794. | $L_{A6}$ | $L_{Q129}$ |
| 795. | $L_{A6}$ | $L_{Q130}$ |
| 796. | $L_{A6}$ | $L_{Q131}$ |
| 797. | $L_{A6}$ | $L_{Q132}$ |
| 798. | $L_{A6}$ | $L_{Q133}$ |
| 799. | $L_{A7}$ | $L_{Q1}$ |
| 800. | $L_{A7}$ | $L_{Q2}$ |
| 801. | $L_{A7}$ | $L_{Q3}$ |
| 802. | $L_{A7}$ | $L_{Q4}$ |
| 803. | $L_{A7}$ | $L_{Q5}$ |
| 804. | $L_{A7}$ | $L_{Q6}$ |
| 805. | $L_{A7}$ | $L_{Q7}$ |
| 806. | $L_{A7}$ | $L_{Q8}$ |
| 807. | $L_{A7}$ | $L_{Q9}$ |
| 808. | $L_{A7}$ | $L_{Q10}$ |
| 809. | $L_{A7}$ | $L_{Q11}$ |
| 810. | $L_{A7}$ | $L_{Q12}$ |
| 811. | $L_{A7}$ | $L_{Q13}$ |
| 812. | $L_{A7}$ | $L_{Q14}$ |
| 813. | $L_{A7}$ | $L_{Q15}$ |
| 814. | $L_{A7}$ | $L_{Q16}$ |
| 815. | $L_{A7}$ | $L_{Q17}$ |

TABLE 1-continued

| Compound number | $L^1$ | $L^2$ |
|---|---|---|
| 816. | $L_{A7}$ | $L_{Q18}$ |
| 817. | $L_{A7}$ | $L_{Q19}$ |
| 818. | $L_{A7}$ | $L_{Q20}$ |
| 819. | $L_{A7}$ | $L_{Q21}$ |
| 820. | $L_{A7}$ | $L_{Q22}$ |
| 821. | $L_{A7}$ | $L_{Q23}$ |
| 822. | $L_{A7}$ | $L_{Q24}$ |
| 823. | $L_{A7}$ | $L_{Q25}$ |
| 824. | $L_{A7}$ | $L_{Q26}$ |
| 825. | $L_{A7}$ | $L_{Q27}$ |
| 826. | $L_{A7}$ | $L_{Q28}$ |
| 827. | $L_{A7}$ | $L_{Q29}$ |
| 828. | $L_{A7}$ | $L_{Q30}$ |
| 829. | $L_{A7}$ | $L_{Q31}$ |
| 830. | $L_{A7}$ | $L_{Q32}$ |
| 831. | $L_{A7}$ | $L_{Q33}$ |
| 832. | $L_{A7}$ | $L_{Q34}$ |
| 833. | $L_{A7}$ | $L_{Q35}$ |
| 834. | $L_{A7}$ | $L_{Q36}$ |
| 835. | $L_{A7}$ | $L_{Q37}$ |
| 836. | $L_{A7}$ | $L_{Q38}$ |
| 837. | $L_{A7}$ | $L_{Q39}$ |
| 838. | $L_{A7}$ | $L_{Q40}$ |
| 839. | $L_{A7}$ | $L_{Q41}$ |
| 840. | $L_{A7}$ | $L_{Q42}$ |
| 841. | $L_{A7}$ | $L_{Q43}$ |
| 842. | $L_{A7}$ | $L_{Q44}$ |
| 843. | $L_{A7}$ | $L_{Q45}$ |
| 844. | $L_{A7}$ | $L_{Q46}$ |
| 845. | $L_{A7}$ | $L_{Q47}$ |
| 846. | $L_{A7}$ | $L_{Q48}$ |
| 847. | $L_{A7}$ | $L_{Q49}$ |
| 848. | $L_{A7}$ | $L_{Q50}$ |
| 849. | $L_{A7}$ | $L_{Q51}$ |
| 850. | $L_{A7}$ | $L_{Q52}$ |
| 851. | $L_{A7}$ | $L_{Q53}$ |
| 852. | $L_{A7}$ | $L_{Q54}$ |
| 853. | $L_{A7}$ | $L_{Q55}$ |
| 854. | $L_{A7}$ | $L_{Q56}$ |
| 855. | $L_{A7}$ | $L_{Q57}$ |
| 856. | $L_{A7}$ | $L_{Q58}$ |
| 857. | $L_{A7}$ | $L_{Q59}$ |
| 858. | $L_{A7}$ | $L_{Q60}$ |
| 859. | $L_{A7}$ | $L_{Q61}$ |
| 860. | $L_{A7}$ | $L_{Q62}$ |
| 861. | $L_{A7}$ | $L_{Q63}$ |
| 862. | $L_{A7}$ | $L_{Q64}$ |
| 863. | $L_{A7}$ | $L_{Q65}$ |
| 864. | $L_{A7}$ | $L_{Q66}$ |
| 865. | $L_{A7}$ | $L_{Q67}$ |
| 866. | $L_{A7}$ | $L_{Q68}$ |
| 867. | $L_{A7}$ | $L_{Q69}$ |
| 868. | $L_{A7}$ | $L_{Q70}$ |
| 869. | $L_{A7}$ | $L_{Q71}$ |
| 870. | $L_{A7}$ | $L_{Q72}$ |
| 871. | $L_{A7}$ | $L_{Q73}$ |
| 872. | $L_{A7}$ | $L_{Q74}$ |
| 873. | $L_{A7}$ | $L_{Q75}$ |
| 874. | $L_{A7}$ | $L_{Q76}$ |
| 875. | $L_{A7}$ | $L_{Q77}$ |
| 876. | $L_{A7}$ | $L_{Q78}$ |
| 877. | $L_{A7}$ | $L_{Q79}$ |
| 878. | $L_{A7}$ | $L_{Q80}$ |
| 879. | $L_{A7}$ | $L_{Q81}$ |
| 880. | $L_{A7}$ | $L_{Q82}$ |
| 881. | $L_{A7}$ | $L_{Q83}$ |
| 882. | $L_{A7}$ | $L_{Q84}$ |
| 883. | $L_{A7}$ | $L_{Q85}$ |
| 884. | $L_{A7}$ | $L_{Q86}$ |
| 885. | $L_{A7}$ | $L_{Q87}$ |
| 886. | $L_{A7}$ | $L_{Q88}$ |
| 887. | $L_{A7}$ | $L_{Q89}$ |
| 888. | $L_{A7}$ | $L_{Q90}$ |
| 889. | $L_{A7}$ | $L_{Q91}$ |
| 890. | $L_{A7}$ | $L_{Q92}$ |
| 891. | $L_{A7}$ | $L_{Q93}$ |
| 892. | $L_{A7}$ | $L_{Q94}$ |

TABLE 1-continued

| Compound number | $L^1$ | $L^2$ |
|---|---|---|
| 893. | $L_{A7}$ | $L_{Q95}$ |
| 894. | $L_{A7}$ | $L_{Q96}$ |
| 895. | $L_{A7}$ | $L_{Q97}$ |
| 896. | $L_{A7}$ | $L_{Q98}$ |
| 897. | $L_{A7}$ | $L_{Q99}$ |
| 898. | $L_{A7}$ | $L_{Q100}$ |
| 899. | $L_{A7}$ | $L_{Q101}$ |
| 900. | $L_{A7}$ | $L_{Q102}$ |
| 901. | $L_{A7}$ | $L_{Q103}$ |
| 902. | $L_{A7}$ | $L_{Q104}$ |
| 903. | $L_{A7}$ | $L_{Q105}$ |
| 904. | $L_{A7}$ | $L_{Q106}$ |
| 905. | $L_{A7}$ | $L_{Q107}$ |
| 906. | $L_{A7}$ | $L_{Q108}$ |
| 907. | $L_{A7}$ | $L_{Q109}$ |
| 908. | $L_{A7}$ | $L_{Q110}$ |
| 909. | $L_{A7}$ | $L_{Q111}$ |
| 910. | $L_{A7}$ | $L_{Q112}$ |
| 911. | $L_{A7}$ | $L_{Q113}$ |
| 912. | $L_{A7}$ | $L_{Q114}$ |
| 913. | $L_{A7}$ | $L_{Q115}$ |
| 914. | $L_{A7}$ | $L_{Q116}$ |
| 915. | $L_{A7}$ | $L_{Q117}$ |
| 916. | $L_{A7}$ | $L_{Q118}$ |
| 917. | $L_{A7}$ | $L_{Q119}$ |
| 918. | $L_{A7}$ | $L_{Q120}$ |
| 919. | $L_{A7}$ | $L_{Q121}$ |
| 920. | $L_{A7}$ | $L_{Q122}$ |
| 921. | $L_{A7}$ | $L_{Q123}$ |
| 922. | $L_{A7}$ | $L_{Q124}$ |
| 923. | $L_{A7}$ | $L_{Q125}$ |
| 924. | $L_{A7}$ | $L_{Q126}$ |
| 925. | $L_{A7}$ | $L_{Q127}$ |
| 926. | $L_{A7}$ | $L_{Q128}$ |
| 927. | $L_{A7}$ | $L_{Q129}$ |
| 928. | $L_{A7}$ | $L_{Q130}$ |
| 929. | $L_{A7}$ | $L_{Q131}$ |
| 930. | $L_{A7}$ | $L_{Q132}$ |
| 931. | $L_{A7}$ | $L_{Q133}$ |
| 932. | $L_{A8}$ | $L_{Q1}$ |
| 933. | $L_{A8}$ | $L_{Q2}$ |
| 934. | $L_{A8}$ | $L_{Q3}$ |
| 935. | $L_{A8}$ | $L_{Q4}$ |
| 936. | $L_{A8}$ | $L_{Q5}$ |
| 937. | $L_{A8}$ | $L_{Q6}$ |
| 938. | $L_{A8}$ | $L_{Q7}$ |
| 939. | $L_{A8}$ | $L_{Q8}$ |
| 940. | $L_{A8}$ | $L_{Q9}$ |
| 941. | $L_{A8}$ | $L_{Q10}$ |
| 942. | $L_{A8}$ | $L_{Q11}$ |
| 943. | $L_{A8}$ | $L_{Q12}$ |
| 944. | $L_{A8}$ | $L_{Q13}$ |
| 945. | $L_{A8}$ | $L_{Q14}$ |
| 946. | $L_{A8}$ | $L_{Q15}$ |
| 947. | $L_{A8}$ | $L_{Q16}$ |
| 948. | $L_{A8}$ | $L_{Q17}$ |
| 949. | $L_{A8}$ | $L_{Q18}$ |
| 950. | $L_{A8}$ | $L_{Q19}$ |
| 951. | $L_{A8}$ | $L_{Q20}$ |
| 952. | $L_{A8}$ | $L_{Q21}$ |
| 953. | $L_{A8}$ | $L_{Q22}$ |
| 954. | $L_{A8}$ | $L_{Q23}$ |
| 955. | $L_{A8}$ | $L_{Q24}$ |
| 956. | $L_{A8}$ | $L_{Q25}$ |
| 957. | $L_{A8}$ | $L_{Q26}$ |
| 958. | $L_{A8}$ | $L_{Q27}$ |
| 959. | $L_{A8}$ | $L_{Q28}$ |
| 960. | $L_{A8}$ | $L_{Q29}$ |
| 961. | $L_{A8}$ | $L_{Q30}$ |
| 962. | $L_{A8}$ | $L_{Q31}$ |
| 963. | $L_{A8}$ | $L_{Q32}$ |
| 964. | $L_{A8}$ | $L_{Q33}$ |
| 965. | $L_{A8}$ | $L_{Q34}$ |
| 966. | $L_{A8}$ | $L_{Q35}$ |
| 967. | $L_{A8}$ | $L_{Q36}$ |
| 968. | $L_{A8}$ | $L_{Q37}$ |
| 969. | $L_{A8}$ | $L_{Q38}$ |

TABLE 1-continued

| Compound number | $L^1$ | $L^2$ |
|---|---|---|
| 970. | $L_{A48}$ | $L_{Q39}$ |
| 971. | $L_{A48}$ | $L_{Q40}$ |
| 972. | $L_{A48}$ | $L_{Q41}$ |
| 973. | $L_{A48}$ | $L_{Q42}$ |
| 974. | $L_{A48}$ | $L_{Q43}$ |
| 975. | $L_{A48}$ | $L_{Q44}$ |
| 976. | $L_{A48}$ | $L_{Q45}$ |
| 977. | $L_{A48}$ | $L_{Q46}$ |
| 978. | $L_{A48}$ | $L_{Q47}$ |
| 979. | $L_{A48}$ | $L_{Q48}$ |
| 980. | $L_{A48}$ | $L_{Q49}$ |
| 981. | $L_{A48}$ | $L_{Q50}$ |
| 982. | $L_{A48}$ | $L_{Q51}$ |
| 983. | $L_{A48}$ | $L_{Q52}$ |
| 984. | $L_{A48}$ | $L_{Q53}$ |
| 985. | $L_{A48}$ | $L_{Q54}$ |
| 986. | $L_{A48}$ | $L_{Q55}$ |
| 987. | $L_{A48}$ | $L_{Q56}$ |
| 988. | $L_{A48}$ | $L_{Q57}$ |
| 989. | $L_{A48}$ | $L_{Q58}$ |
| 990. | $L_{A48}$ | $L_{Q59}$ |
| 991. | $L_{A48}$ | $L_{Q60}$ |
| 992. | $L_{A48}$ | $L_{Q61}$ |
| 993. | $L_{A48}$ | $L_{Q62}$ |
| 994. | $L_{A48}$ | $L_{Q63}$ |
| 995. | $L_{A48}$ | $L_{Q64}$ |
| 996. | $L_{A48}$ | $L_{Q65}$ |
| 997. | $L_{A48}$ | $L_{Q66}$ |
| 998. | $L_{A48}$ | $L_{Q67}$ |
| 999. | $L_{A48}$ | $L_{Q68}$ |
| 1000. | $L_{A48}$ | $L_{Q69}$ |
| 1001. | $L_{A48}$ | $L_{Q70}$ |
| 1002. | $L_{A48}$ | $L_{Q71}$ |
| 1003. | $L_{A48}$ | $L_{Q72}$ |
| 1004. | $L_{A48}$ | $L_{Q73}$ |
| 1005. | $L_{A48}$ | $L_{Q74}$ |
| 1006. | $L_{A48}$ | $L_{Q75}$ |
| 1007. | $L_{A48}$ | $L_{Q76}$ |
| 1008. | $L_{A48}$ | $L_{Q77}$ |
| 1009. | $L_{A48}$ | $L_{Q78}$ |
| 1010. | $L_{A48}$ | $L_{Q79}$ |
| 1011. | $L_{A48}$ | $L_{Q80}$ |
| 1012. | $L_{A48}$ | $L_{Q81}$ |
| 1013. | $L_{A48}$ | $L_{Q82}$ |
| 1014. | $L_{A48}$ | $L_{Q83}$ |
| 1015. | $L_{A48}$ | $L_{Q84}$ |
| 1016. | $L_{A48}$ | $L_{Q85}$ |
| 1017. | $L_{A48}$ | $L_{Q86}$ |
| 1018. | $L_{A48}$ | $L_{Q87}$ |
| 1019. | $L_{A48}$ | $L_{Q88}$ |
| 1020. | $L_{A48}$ | $L_{Q89}$ |
| 1021. | $L_{A48}$ | $L_{Q90}$ |
| 1022. | $L_{A48}$ | $L_{Q91}$ |
| 1023. | $L_{A48}$ | $L_{Q92}$ |
| 1024. | $L_{A48}$ | $L_{Q93}$ |
| 1025. | $L_{A48}$ | $L_{Q94}$ |
| 1026. | $L_{A48}$ | $L_{Q95}$ |
| 1027. | $L_{A48}$ | $L_{Q96}$ |
| 1028. | $L_{A48}$ | $L_{Q97}$ |
| 1029. | $L_{A48}$ | $L_{Q98}$ |
| 1030. | $L_{A48}$ | $L_{Q99}$ |
| 1031. | $L_{A48}$ | $L_{Q100}$ |
| 1032. | $L_{A48}$ | $L_{Q101}$ |
| 1033. | $L_{A48}$ | $L_{Q102}$ |
| 1034. | $L_{A48}$ | $L_{Q103}$ |
| 1035. | $L_{A48}$ | $L_{Q104}$ |
| 1036. | $L_{A48}$ | $L_{Q105}$ |
| 1037. | $L_{A48}$ | $L_{Q106}$ |
| 1038. | $L_{A48}$ | $L_{Q107}$ |
| 1039. | $L_{A48}$ | $L_{Q108}$ |
| 1040. | $L_{A48}$ | $L_{Q109}$ |
| 1041. | $L_{A48}$ | $L_{Q110}$ |
| 1042. | $L_{A48}$ | $L_{Q111}$ |
| 1043. | $L_{A48}$ | $L_{Q112}$ |
| 1044. | $L_{A48}$ | $L_{Q113}$ |
| 1045. | $L_{A48}$ | $L_{Q114}$ |
| 1046. | $L_{A48}$ | $L_{Q115}$ |

TABLE 1-continued

| Compound number | $L^1$ | $L^2$ |
|---|---|---|
| 1047. | $L_{A48}$ | $L_{Q116}$ |
| 1048. | $L_{A48}$ | $L_{Q117}$ |
| 1049. | $L_{A48}$ | $L_{Q118}$ |
| 1050. | $L_{A48}$ | $L_{Q119}$ |
| 1051. | $L_{A48}$ | $L_{Q120}$ |
| 1052. | $L_{A48}$ | $L_{Q121}$ |
| 1053. | $L_{A48}$ | $L_{Q122}$ |
| 1054. | $L_{A48}$ | $L_{Q123}$ |
| 1055. | $L_{A48}$ | $L_{Q124}$ |
| 1056. | $L_{A48}$ | $L_{Q125}$ |
| 1057. | $L_{A48}$ | $L_{Q126}$ |
| 1058. | $L_{A48}$ | $L_{Q127}$ |
| 1059. | $L_{A48}$ | $L_{Q128}$ |
| 1060. | $L_{A48}$ | $L_{Q129}$ |
| 1061. | $L_{A48}$ | $L_{Q130}$ |
| 1062. | $L_{A48}$ | $L_{Q131}$ |
| 1063. | $L_{A48}$ | $L_{Q132}$ |
| 1064. | $L_{A48}$ | $L_{Q133}$ |
| 1065. | $L_{A49}$ | $L_{Q1}$ |
| 1066. | $L_{A49}$ | $L_{Q2}$ |
| 1067. | $L_{A49}$ | $L_{Q3}$ |
| 1068. | $L_{A49}$ | $L_{Q4}$ |
| 1069. | $L_{A49}$ | $L_{Q5}$ |
| 1070. | $L_{A49}$ | $L_{Q6}$ |
| 1071. | $L_{A49}$ | $L_{Q7}$ |
| 1072. | $L_{A49}$ | $L_{Q8}$ |
| 1073. | $L_{A49}$ | $L_{Q9}$ |
| 1074. | $L_{A49}$ | $L_{Q10}$ |
| 1075. | $L_{A49}$ | $L_{Q11}$ |
| 1076. | $L_{A49}$ | $L_{Q12}$ |
| 1077. | $L_{A49}$ | $L_{Q13}$ |
| 1078. | $L_{A49}$ | $L_{Q14}$ |
| 1079. | $L_{A49}$ | $L_{Q15}$ |
| 1080. | $L_{A49}$ | $L_{Q16}$ |
| 1081. | $L_{A49}$ | $L_{Q17}$ |
| 1082. | $L_{A49}$ | $L_{Q18}$ |
| 1083. | $L_{A49}$ | $L_{Q19}$ |
| 1084. | $L_{A49}$ | $L_{Q20}$ |
| 1085. | $L_{A49}$ | $L_{Q21}$ |
| 1086. | $L_{A49}$ | $L_{Q22}$ |
| 1087. | $L_{A49}$ | $L_{Q23}$ |
| 1088. | $L_{A49}$ | $L_{Q24}$ |
| 1089. | $L_{A49}$ | $L_{Q25}$ |
| 1090. | $L_{A49}$ | $L_{Q26}$ |
| 1091. | $L_{A49}$ | $L_{Q27}$ |
| 1092. | $L_{A49}$ | $L_{Q28}$ |
| 1093. | $L_{A49}$ | $L_{Q29}$ |
| 1094. | $L_{A49}$ | $L_{Q30}$ |
| 1095. | $L_{A49}$ | $L_{Q31}$ |
| 1096. | $L_{A49}$ | $L_{Q32}$ |
| 1097. | $L_{A49}$ | $L_{Q33}$ |
| 1098. | $L_{A49}$ | $L_{Q34}$ |
| 1099. | $L_{A49}$ | $L_{Q35}$ |
| 1100. | $L_{A49}$ | $L_{Q36}$ |
| 1101. | $L_{A49}$ | $L_{Q37}$ |
| 1102. | $L_{A49}$ | $L_{Q38}$ |
| 1103. | $L_{A49}$ | $L_{Q39}$ |
| 1104. | $L_{A49}$ | $L_{Q40}$ |
| 1105. | $L_{A49}$ | $L_{Q41}$ |
| 1106. | $L_{A49}$ | $L_{Q42}$ |
| 1107. | $L_{A49}$ | $L_{Q43}$ |
| 1108. | $L_{A49}$ | $L_{Q44}$ |
| 1109. | $L_{A49}$ | $L_{Q45}$ |
| 1110. | $L_{A49}$ | $L_{Q46}$ |
| 1111. | $L_{A49}$ | $L_{Q47}$ |
| 1112. | $L_{A49}$ | $L_{Q48}$ |
| 1113. | $L_{A49}$ | $L_{Q49}$ |
| 1114. | $L_{A49}$ | $L_{Q50}$ |
| 1115. | $L_{A49}$ | $L_{Q51}$ |
| 1116. | $L_{A49}$ | $L_{Q52}$ |
| 1117. | $L_{A49}$ | $L_{Q53}$ |
| 1118. | $L_{A49}$ | $L_{Q54}$ |
| 1119. | $L_{A49}$ | $L_{Q55}$ |
| 1120. | $L_{A49}$ | $L_{Q56}$ |
| 1121. | $L_{A49}$ | $L_{Q57}$ |
| 1122. | $L_{A49}$ | $L_{Q58}$ |
| 1123. | $L_{A49}$ | $L_{Q59}$ |

TABLE 1-continued

| Compound number | $L^1$ | $L^2$ |
|---|---|---|
| 1124. | $L_{A9}$ | $L_{Q60}$ |
| 1125. | $L_{A9}$ | $L_{Q61}$ |
| 1126. | $L_{A9}$ | $L_{Q62}$ |
| 1127. | $L_{A9}$ | $L_{Q63}$ |
| 1128. | $L_{A9}$ | $L_{Q64}$ |
| 1129. | $L_{A9}$ | $L_{Q65}$ |
| 1130. | $L_{A9}$ | $L_{Q66}$ |
| 1131. | $L_{A9}$ | $L_{Q67}$ |
| 1132. | $L_{A9}$ | $L_{Q68}$ |
| 1133. | $L_{A9}$ | $L_{Q69}$ |
| 1134. | $L_{A9}$ | $L_{Q70}$ |
| 1135. | $L_{A9}$ | $L_{Q71}$ |
| 1136. | $L_{A9}$ | $L_{Q72}$ |
| 1137. | $L_{A9}$ | $L_{Q73}$ |
| 1138. | $L_{A9}$ | $L_{Q74}$ |
| 1139. | $L_{A9}$ | $L_{Q75}$ |
| 1140. | $L_{A9}$ | $L_{Q76}$ |
| 1141. | $L_{A9}$ | $L_{Q77}$ |
| 1142. | $L_{A9}$ | $L_{Q78}$ |
| 1143. | $L_{A9}$ | $L_{Q79}$ |
| 1144. | $L_{A9}$ | $L_{Q80}$ |
| 1145. | $L_{A9}$ | $L_{Q81}$ |
| 1146. | $L_{A9}$ | $L_{Q82}$ |
| 1147. | $L_{A9}$ | $L_{Q83}$ |
| 1148. | $L_{A9}$ | $L_{Q84}$ |
| 1149. | $L_{A9}$ | $L_{Q85}$ |
| 1150. | $L_{A9}$ | $L_{Q86}$ |
| 1151. | $L_{A9}$ | $L_{Q87}$ |
| 1152. | $L_{A9}$ | $L_{Q88}$ |
| 1153. | $L_{A9}$ | $L_{Q89}$ |
| 1154. | $L_{A9}$ | $L_{Q90}$ |
| 1155. | $L_{A9}$ | $L_{Q91}$ |
| 1156. | $L_{A9}$ | $L_{Q92}$ |
| 1157. | $L_{A9}$ | $L_{Q93}$ |
| 1158. | $L_{A9}$ | $L_{Q94}$ |
| 1159. | $L_{A9}$ | $L_{Q95}$ |
| 1160. | $L_{A9}$ | $L_{Q96}$ |
| 1161. | $L_{A9}$ | $L_{Q97}$ |
| 1162. | $L_{A9}$ | $L_{Q98}$ |
| 1163. | $L_{A9}$ | $L_{Q99}$ |
| 1164. | $L_{A9}$ | $L_{Q100}$ |
| 1165. | $L_{A9}$ | $L_{Q101}$ |
| 1166. | $L_{A9}$ | $L_{Q102}$ |
| 1167. | $L_{A9}$ | $L_{Q103}$ |
| 1168. | $L_{A9}$ | $L_{Q104}$ |
| 1169. | $L_{A9}$ | $L_{Q105}$ |
| 1170. | $L_{A9}$ | $L_{Q106}$ |
| 1171. | $L_{A9}$ | $L_{Q107}$ |
| 1172. | $L_{A9}$ | $L_{Q108}$ |
| 1173. | $L_{A9}$ | $L_{Q109}$ |
| 1174. | $L_{A9}$ | $L_{Q110}$ |
| 1175. | $L_{A9}$ | $L_{Q111}$ |
| 1176. | $L_{A9}$ | $L_{Q112}$ |
| 1177. | $L_{A9}$ | $L_{Q113}$ |
| 1178. | $L_{A9}$ | $L_{Q114}$ |
| 1179. | $L_{A9}$ | $L_{Q115}$ |
| 1180. | $L_{A9}$ | $L_{Q116}$ |
| 1181. | $L_{A9}$ | $L_{Q117}$ |
| 1182. | $L_{A9}$ | $L_{Q118}$ |
| 1183. | $L_{A9}$ | $L_{Q119}$ |
| 1184. | $L_{A9}$ | $L_{Q120}$ |
| 1185. | $L_{A9}$ | $L_{Q121}$ |
| 1186. | $L_{A9}$ | $L_{Q122}$ |
| 1187. | $L_{A9}$ | $L_{Q123}$ |
| 1188. | $L_{A9}$ | $L_{Q124}$ |
| 1189. | $L_{A9}$ | $L_{Q125}$ |
| 1190. | $L_{A9}$ | $L_{Q126}$ |
| 1191. | $L_{A9}$ | $L_{Q127}$ |
| 1192. | $L_{A9}$ | $L_{Q128}$ |
| 1193. | $L_{A9}$ | $L_{Q129}$ |
| 1194. | $L_{A9}$ | $L_{Q130}$ |
| 1195. | $L_{A9}$ | $L_{Q131}$ |
| 1196. | $L_{A9}$ | $L_{Q132}$ |
| 1197. | $L_{A9}$ | $L_{Q133}$ |
| 1198. | $L_{A10}$ | $L_{Q1}$ |
| 1199. | $L_{A10}$ | $L_{Q2}$ |
| 1200. | $L_{A10}$ | $L_{Q3}$ |
| 1201. | $L_{A10}$ | $L_{Q4}$ |
| 1202. | $L_{A10}$ | $L_{Q5}$ |
| 1203. | $L_{A10}$ | $L_{Q6}$ |
| 1204. | $L_{A10}$ | $L_{Q7}$ |
| 1205. | $L_{A10}$ | $L_{Q8}$ |
| 1206. | $L_{A10}$ | $L_{Q9}$ |
| 1207. | $L_{A10}$ | $L_{Q10}$ |
| 1208. | $L_{A10}$ | $L_{Q11}$ |
| 1209. | $L_{A10}$ | $L_{Q12}$ |
| 1210. | $L_{A10}$ | $L_{Q13}$ |
| 1211. | $L_{A10}$ | $L_{Q14}$ |
| 1212. | $L_{A10}$ | $L_{Q15}$ |
| 1213. | $L_{A10}$ | $L_{Q16}$ |
| 1214. | $L_{A10}$ | $L_{Q17}$ |
| 1215. | $L_{A10}$ | $L_{Q18}$ |
| 1216. | $L_{A10}$ | $L_{Q19}$ |
| 1217. | $L_{A10}$ | $L_{Q20}$ |
| 1218. | $L_{A10}$ | $L_{Q21}$ |
| 1219. | $L_{A10}$ | $L_{Q22}$ |
| 1220. | $L_{A10}$ | $L_{Q23}$ |
| 1221. | $L_{A10}$ | $L_{Q24}$ |
| 1222. | $L_{A10}$ | $L_{Q25}$ |
| 1223. | $L_{A10}$ | $L_{Q26}$ |
| 1224. | $L_{A10}$ | $L_{Q27}$ |
| 1225. | $L_{A10}$ | $L_{Q28}$ |
| 1226. | $L_{A10}$ | $L_{Q29}$ |
| 1227. | $L_{A10}$ | $L_{Q30}$ |
| 1228. | $L_{A10}$ | $L_{Q31}$ |
| 1229. | $L_{A10}$ | $L_{Q32}$ |
| 1230. | $L_{A10}$ | $L_{Q33}$ |
| 1231. | $L_{A10}$ | $L_{Q34}$ |
| 1232. | $L_{A10}$ | $L_{Q35}$ |
| 1233. | $L_{A10}$ | $L_{Q36}$ |
| 1234. | $L_{A10}$ | $L_{Q37}$ |
| 1235. | $L_{A10}$ | $L_{Q38}$ |
| 1236. | $L_{A10}$ | $L_{Q39}$ |
| 1237. | $L_{A10}$ | $L_{Q40}$ |
| 1238. | $L_{A10}$ | $L_{Q41}$ |
| 1239. | $L_{A10}$ | $L_{Q42}$ |
| 1240. | $L_{A10}$ | $L_{Q43}$ |
| 1241. | $L_{A10}$ | $L_{Q44}$ |
| 1242. | $L_{A10}$ | $L_{Q45}$ |
| 1243. | $L_{A10}$ | $L_{Q46}$ |
| 1244. | $L_{A10}$ | $L_{Q47}$ |
| 1245. | $L_{A10}$ | $L_{Q48}$ |
| 1246. | $L_{A10}$ | $L_{Q49}$ |
| 1247. | $L_{A10}$ | $L_{Q50}$ |
| 1248. | $L_{A10}$ | $L_{Q51}$ |
| 1249. | $L_{A10}$ | $L_{Q52}$ |
| 1250. | $L_{A10}$ | $L_{Q53}$ |
| 1251. | $L_{A10}$ | $L_{Q54}$ |
| 1252. | $L_{A10}$ | $L_{Q55}$ |
| 1253. | $L_{A10}$ | $L_{Q56}$ |
| 1254. | $L_{A10}$ | $L_{Q57}$ |
| 1255. | $L_{A10}$ | $L_{Q58}$ |
| 1256. | $L_{A10}$ | $L_{Q59}$ |
| 1257. | $L_{A10}$ | $L_{Q60}$ |
| 1258. | $L_{A10}$ | $L_{Q61}$ |
| 1259. | $L_{A10}$ | $L_{Q62}$ |
| 1260. | $L_{A10}$ | $L_{Q63}$ |
| 1261. | $L_{A10}$ | $L_{Q64}$ |
| 1262. | $L_{A10}$ | $L_{Q65}$ |
| 1263. | $L_{A10}$ | $L_{Q66}$ |
| 1264. | $L_{A10}$ | $L_{Q67}$ |
| 1265. | $L_{A10}$ | $L_{Q68}$ |
| 1266. | $L_{A10}$ | $L_{Q69}$ |
| 1267. | $L_{A10}$ | $L_{Q70}$ |
| 1268. | $L_{A10}$ | $L_{Q71}$ |
| 1269. | $L_{A10}$ | $L_{Q72}$ |
| 1270. | $L_{A10}$ | $L_{Q73}$ |
| 1271. | $L_{A10}$ | $L_{Q74}$ |
| 1272. | $L_{A10}$ | $L_{Q75}$ |
| 1273. | $L_{A10}$ | $L_{Q76}$ |
| 1274. | $L_{A10}$ | $L_{Q77}$ |
| 1275. | $L_{A10}$ | $L_{Q78}$ |
| 1276. | $L_{A10}$ | $L_{Q79}$ |
| 1277. | $L_{A10}$ | $L_{Q80}$ |

TABLE 1-continued

| Compound number | $L^1$ | $L^2$ |
|---|---|---|
| 1278. | $L_{A10}$ | $L_{Q81}$ |
| 1279. | $L_{A10}$ | $L_{Q82}$ |
| 1280. | $L_{A10}$ | $L_{Q83}$ |
| 1281. | $L_{A10}$ | $L_{Q84}$ |
| 1282. | $L_{A10}$ | $L_{Q85}$ |
| 1283. | $L_{A10}$ | $L_{Q86}$ |
| 1284. | $L_{A10}$ | $L_{Q87}$ |
| 1285. | $L_{A10}$ | $L_{Q88}$ |
| 1286. | $L_{A10}$ | $L_{Q89}$ |
| 1287. | $L_{A10}$ | $L_{Q90}$ |
| 1288. | $L_{A10}$ | $L_{Q91}$ |
| 1289. | $L_{A10}$ | $L_{Q92}$ |
| 1290. | $L_{A10}$ | $L_{Q93}$ |
| 1291. | $L_{A10}$ | $L_{Q94}$ |
| 1292. | $L_{A10}$ | $L_{Q95}$ |
| 1293. | $L_{A10}$ | $L_{Q96}$ |
| 1294. | $L_{A10}$ | $L_{Q97}$ |
| 1295. | $L_{A10}$ | $L_{Q98}$ |
| 1296. | $L_{A10}$ | $L_{Q99}$ |
| 1297. | $L_{A10}$ | $L_{Q100}$ |
| 1298. | $L_{A10}$ | $L_{Q101}$ |
| 1299. | $L_{A10}$ | $L_{Q102}$ |
| 1300. | $L_{A10}$ | $L_{Q103}$ |
| 1301. | $L_{A10}$ | $L_{Q104}$ |
| 1302. | $L_{A10}$ | $L_{Q105}$ |
| 1303. | $L_{A10}$ | $L_{Q106}$ |
| 1304. | $L_{A10}$ | $L_{Q107}$ |
| 1305. | $L_{A10}$ | $L_{Q108}$ |
| 1306. | $L_{A10}$ | $L_{Q109}$ |
| 1307. | $L_{A10}$ | $L_{Q110}$ |
| 1308. | $L_{A10}$ | $L_{Q111}$ |
| 1309. | $L_{A10}$ | $L_{Q112}$ |
| 1310. | $L_{A10}$ | $L_{Q113}$ |
| 1311. | $L_{A10}$ | $L_{Q114}$ |
| 1312. | $L_{A10}$ | $L_{Q115}$ |
| 1313. | $L_{A10}$ | $L_{Q116}$ |
| 1314. | $L_{A10}$ | $L_{Q117}$ |
| 1315. | $L_{A10}$ | $L_{Q118}$ |
| 1316. | $L_{A10}$ | $L_{Q119}$ |
| 1317. | $L_{A10}$ | $L_{Q120}$ |
| 1318. | $L_{A10}$ | $L_{Q121}$ |
| 1319. | $L_{A10}$ | $L_{Q122}$ |
| 1320. | $L_{A10}$ | $L_{Q123}$ |
| 1321. | $L_{A10}$ | $L_{Q124}$ |
| 1322. | $L_{A10}$ | $L_{Q125}$ |
| 1323. | $L_{A10}$ | $L_{Q126}$ |
| 1324. | $L_{A10}$ | $L_{Q127}$ |
| 1325. | $L_{A10}$ | $L_{Q128}$ |
| 1326. | $L_{A10}$ | $L_{Q129}$ |
| 1327. | $L_{A10}$ | $L_{Q130}$ |
| 1328. | $L_{A10}$ | $L_{Q131}$ |
| 1329. | $L_{A10}$ | $L_{Q132}$ |
| 1330. | $L_{A10}$ | $L_{Q133}$ |
| 1331. | $L_{A11}$ | $L_{Q1}$ |
| 1332. | $L_{A11}$ | $L_{Q2}$ |
| 1333. | $L_{A11}$ | $L_{Q3}$ |
| 1334. | $L_{A11}$ | $L_{Q4}$ |
| 1335. | $L_{A11}$ | $L_{Q5}$ |
| 1336. | $L_{A11}$ | $L_{Q6}$ |
| 1337. | $L_{A11}$ | $L_{Q7}$ |
| 1338. | $L_{A11}$ | $L_{Q8}$ |
| 1339. | $L_{A11}$ | $L_{Q9}$ |
| 1340. | $L_{A11}$ | $L_{Q10}$ |
| 1341. | $L_{A11}$ | $L_{Q11}$ |
| 1342. | $L_{A11}$ | $L_{Q12}$ |
| 1343. | $L_{A11}$ | $L_{Q13}$ |
| 1344. | $L_{A11}$ | $L_{Q14}$ |
| 1345. | $L_{A11}$ | $L_{Q15}$ |
| 1346. | $L_{A11}$ | $L_{Q16}$ |
| 1347. | $L_{A11}$ | $L_{Q17}$ |
| 1348. | $L_{A11}$ | $L_{Q18}$ |
| 1349. | $L_{A11}$ | $L_{Q19}$ |
| 1350. | $L_{A11}$ | $L_{Q20}$ |
| 1351. | $L_{A11}$ | $L_{Q21}$ |
| 1352. | $L_{A11}$ | $L_{Q22}$ |
| 1353. | $L_{A11}$ | $L_{Q23}$ |
| 1354. | $L_{A11}$ | $L_{Q24}$ |

TABLE 1-continued

| Compound number | $L^1$ | $L^2$ |
|---|---|---|
| 1355. | $L_{A11}$ | $L_{Q25}$ |
| 1356. | $L_{A11}$ | $L_{Q26}$ |
| 1357. | $L_{A11}$ | $L_{Q27}$ |
| 1358. | $L_{A11}$ | $L_{Q28}$ |
| 1359. | $L_{A11}$ | $L_{Q29}$ |
| 1360. | $L_{A11}$ | $L_{Q30}$ |
| 1361. | $L_{A11}$ | $L_{Q31}$ |
| 1362. | $L_{A11}$ | $L_{Q32}$ |
| 1363. | $L_{A11}$ | $L_{Q33}$ |
| 1364. | $L_{A11}$ | $L_{Q34}$ |
| 1365. | $L_{A11}$ | $L_{Q35}$ |
| 1366. | $L_{A11}$ | $L_{Q36}$ |
| 1367. | $L_{A11}$ | $L_{Q37}$ |
| 1368. | $L_{A11}$ | $L_{Q38}$ |
| 1369. | $L_{A11}$ | $L_{Q39}$ |
| 1370. | $L_{A11}$ | $L_{Q40}$ |
| 1371. | $L_{A11}$ | $L_{Q41}$ |
| 1372. | $L_{A11}$ | $L_{Q42}$ |
| 1373. | $L_{A11}$ | $L_{Q43}$ |
| 1374. | $L_{A11}$ | $L_{Q44}$ |
| 1375. | $L_{A11}$ | $L_{Q45}$ |
| 1376. | $L_{A11}$ | $L_{Q46}$ |
| 1377. | $L_{A11}$ | $L_{Q47}$ |
| 1378. | $L_{A11}$ | $L_{Q48}$ |
| 1379. | $L_{A11}$ | $L_{Q49}$ |
| 1380. | $L_{A11}$ | $L_{Q50}$ |
| 1381. | $L_{A11}$ | $L_{Q51}$ |
| 1382. | $L_{A11}$ | $L_{Q52}$ |
| 1383. | $L_{A11}$ | $L_{Q53}$ |
| 1384. | $L_{A11}$ | $L_{Q54}$ |
| 1385. | $L_{A11}$ | $L_{Q55}$ |
| 1386. | $L_{A11}$ | $L_{Q56}$ |
| 1387. | $L_{A11}$ | $L_{Q57}$ |
| 1388. | $L_{A11}$ | $L_{Q58}$ |
| 1389. | $L_{A11}$ | $L_{Q59}$ |
| 1390. | $L_{A11}$ | $L_{Q60}$ |
| 1391. | $L_{A11}$ | $L_{Q61}$ |
| 1392. | $L_{A11}$ | $L_{Q62}$ |
| 1393. | $L_{A11}$ | $L_{Q63}$ |
| 1394. | $L_{A11}$ | $L_{Q64}$ |
| 1395. | $L_{A11}$ | $L_{Q65}$ |
| 1396. | $L_{A11}$ | $L_{Q66}$ |
| 1397. | $L_{A11}$ | $L_{Q67}$ |
| 1398. | $L_{A11}$ | $L_{Q68}$ |
| 1399. | $L_{A11}$ | $L_{Q69}$ |
| 1400. | $L_{A11}$ | $L_{Q70}$ |
| 1401. | $L_{A11}$ | $L_{Q71}$ |
| 1402. | $L_{A11}$ | $L_{Q72}$ |
| 1403. | $L_{A11}$ | $L_{Q73}$ |
| 1404. | $L_{A11}$ | $L_{Q74}$ |
| 1405. | $L_{A11}$ | $L_{Q75}$ |
| 1406. | $L_{A11}$ | $L_{Q76}$ |
| 1407. | $L_{A11}$ | $L_{Q77}$ |
| 1408. | $L_{A11}$ | $L_{Q78}$ |
| 1409. | $L_{A11}$ | $L_{Q79}$ |
| 1410. | $L_{A11}$ | $L_{Q80}$ |
| 1411. | $L_{A11}$ | $L_{Q81}$ |
| 1412. | $L_{A11}$ | $L_{Q82}$ |
| 1413. | $L_{A11}$ | $L_{Q83}$ |
| 1414. | $L_{A11}$ | $L_{Q84}$ |
| 1415. | $L_{A11}$ | $L_{Q85}$ |
| 1416. | $L_{A11}$ | $L_{Q86}$ |
| 1417. | $L_{A11}$ | $L_{Q87}$ |
| 1418. | $L_{A11}$ | $L_{Q88}$ |
| 1419. | $L_{A11}$ | $L_{Q89}$ |
| 1420. | $L_{A11}$ | $L_{Q90}$ |
| 1421. | $L_{A11}$ | $L_{Q91}$ |
| 1422. | $L_{A11}$ | $L_{Q92}$ |
| 1423. | $L_{A11}$ | $L_{Q93}$ |
| 1424. | $L_{A11}$ | $L_{Q94}$ |
| 1425. | $L_{A11}$ | $L_{Q95}$ |
| 1426. | $L_{A11}$ | $L_{Q96}$ |
| 1427. | $L_{A11}$ | $L_{Q97}$ |
| 1428. | $L_{A11}$ | $L_{Q98}$ |
| 1429. | $L_{A11}$ | $L_{Q99}$ |
| 1430. | $L_{A11}$ | $L_{Q100}$ |
| 1431. | $L_{A11}$ | $L_{Q101}$ |

TABLE 1-continued

| Compound number | $L^1$ | $L^2$ |
|---|---|---|
| 1432. | $L_{A11}$ | $L_{Q102}$ |
| 1433. | $L_{A11}$ | $L_{Q103}$ |
| 1434. | $L_{A11}$ | $L_{Q104}$ |
| 1435. | $L_{A11}$ | $L_{Q105}$ |
| 1436. | $L_{A11}$ | $L_{Q106}$ |
| 1437. | $L_{A11}$ | $L_{Q107}$ |
| 1438. | $L_{A11}$ | $L_{Q108}$ |
| 1439. | $L_{A11}$ | $L_{Q109}$ |
| 1440. | $L_{A11}$ | $L_{Q110}$ |
| 1441. | $L_{A11}$ | $L_{Q111}$ |
| 1442. | $L_{A11}$ | $L_{Q112}$ |
| 1443. | $L_{A11}$ | $L_{Q113}$ |
| 1444. | $L_{A11}$ | $L_{Q114}$ |
| 1445. | $L_{A11}$ | $L_{Q115}$ |
| 1446. | $L_{A11}$ | $L_{Q116}$ |
| 1447. | $L_{A11}$ | $L_{Q117}$ |
| 1448. | $L_{A11}$ | $L_{Q118}$ |
| 1449. | $L_{A11}$ | $L_{Q119}$ |
| 1450. | $L_{A11}$ | $L_{Q120}$ |
| 1451. | $L_{A11}$ | $L_{Q121}$ |
| 1452. | $L_{A11}$ | $L_{Q122}$ |
| 1453. | $L_{A11}$ | $L_{Q123}$ |
| 1454. | $L_{A11}$ | $L_{Q124}$ |
| 1455. | $L_{A11}$ | $L_{Q125}$ |
| 1456. | $L_{A11}$ | $L_{Q126}$ |
| 1457. | $L_{A11}$ | $L_{Q127}$ |
| 1458. | $L_{A11}$ | $L_{Q128}$ |
| 1459. | $L_{A11}$ | $L_{Q129}$ |
| 1460. | $L_{A11}$ | $L_{Q130}$ |
| 1461. | $L_{A11}$ | $L_{Q131}$ |
| 1462. | $L_{A11}$ | $L_{Q132}$ |
| 1463. | $L_{A11}$ | $L_{Q133}$ |
| 1464. | $L_{A12}$ | $L_{Q1}$ |
| 1465. | $L_{A12}$ | $L_{Q2}$ |
| 1466. | $L_{A12}$ | $L_{Q3}$ |
| 1467. | $L_{A12}$ | $L_{Q4}$ |
| 1468. | $L_{A12}$ | $L_{Q5}$ |
| 1469. | $L_{A12}$ | $L_{Q6}$ |
| 1470. | $L_{A12}$ | $L_{Q7}$ |
| 1471. | $L_{A12}$ | $L_{Q8}$ |
| 1472. | $L_{A12}$ | $L_{Q9}$ |
| 1473. | $L_{A12}$ | $L_{Q10}$ |
| 1474. | $L_{A12}$ | $L_{Q11}$ |
| 1475. | $L_{A12}$ | $L_{Q12}$ |
| 1476. | $L_{A12}$ | $L_{Q13}$ |
| 1477. | $L_{A12}$ | $L_{Q14}$ |
| 1478. | $L_{A12}$ | $L_{Q15}$ |
| 1479. | $L_{A12}$ | $L_{Q16}$ |
| 1480. | $L_{A12}$ | $L_{Q17}$ |
| 1481. | $L_{A12}$ | $L_{Q18}$ |
| 1482. | $L_{A12}$ | $L_{Q19}$ |
| 1483. | $L_{A12}$ | $L_{Q20}$ |
| 1484. | $L_{A12}$ | $L_{Q21}$ |
| 1485. | $L_{A12}$ | $L_{Q22}$ |
| 1486. | $L_{A12}$ | $L_{Q23}$ |
| 1487. | $L_{A12}$ | $L_{Q24}$ |
| 1488. | $L_{A12}$ | $L_{Q25}$ |
| 1489. | $L_{A12}$ | $L_{Q26}$ |
| 1490. | $L_{A12}$ | $L_{Q27}$ |
| 1491. | $L_{A12}$ | $L_{Q28}$ |
| 1492. | $L_{A12}$ | $L_{Q29}$ |
| 1493. | $L_{A12}$ | $L_{Q30}$ |
| 1494. | $L_{A12}$ | $L_{Q31}$ |
| 1495. | $L_{A12}$ | $L_{Q32}$ |
| 1496. | $L_{A12}$ | $L_{Q33}$ |
| 1497. | $L_{A12}$ | $L_{Q34}$ |
| 1498. | $L_{A12}$ | $L_{Q35}$ |
| 1499. | $L_{A12}$ | $L_{Q36}$ |
| 1500. | $L_{A12}$ | $L_{Q37}$ |
| 1501. | $L_{A12}$ | $L_{Q38}$ |
| 1502. | $L_{A12}$ | $L_{Q39}$ |
| 1503. | $L_{A12}$ | $L_{Q40}$ |
| 1504. | $L_{A12}$ | $L_{Q41}$ |
| 1505. | $L_{A12}$ | $L_{Q42}$ |
| 1506. | $L_{A12}$ | $L_{Q43}$ |
| 1507. | $L_{A12}$ | $L_{Q44}$ |
| 1508. | $L_{A12}$ | $L_{Q45}$ |

TABLE 1-continued

| Compound number | $L^1$ | $L^2$ |
|---|---|---|
| 1509. | $L_{A12}$ | $L_{Q46}$ |
| 1510. | $L_{A12}$ | $L_{Q47}$ |
| 1511. | $L_{A12}$ | $L_{Q48}$ |
| 1512. | $L_{A12}$ | $L_{Q49}$ |
| 1513. | $L_{A12}$ | $L_{Q50}$ |
| 1514. | $L_{A12}$ | $L_{Q51}$ |
| 1515. | $L_{A12}$ | $L_{Q52}$ |
| 1516. | $L_{A12}$ | $L_{Q53}$ |
| 1517. | $L_{A12}$ | $L_{Q54}$ |
| 1518. | $L_{A12}$ | $L_{Q55}$ |
| 1519. | $L_{A12}$ | $L_{Q56}$ |
| 1520. | $L_{A12}$ | $L_{Q57}$ |
| 1521. | $L_{A12}$ | $L_{Q58}$ |
| 1522. | $L_{A12}$ | $L_{Q59}$ |
| 1523. | $L_{A12}$ | $L_{Q60}$ |
| 1524. | $L_{A12}$ | $L_{Q61}$ |
| 1525. | $L_{A12}$ | $L_{Q62}$ |
| 1526. | $L_{A12}$ | $L_{Q63}$ |
| 1527. | $L_{A12}$ | $L_{Q64}$ |
| 1528. | $L_{A12}$ | $L_{Q65}$ |
| 1529. | $L_{A12}$ | $L_{Q66}$ |
| 1530. | $L_{A12}$ | $L_{Q67}$ |
| 1531. | $L_{A12}$ | $L_{Q68}$ |
| 1532. | $L_{A12}$ | $L_{Q69}$ |
| 1533. | $L_{A12}$ | $L_{Q70}$ |
| 1534. | $L_{A12}$ | $L_{Q71}$ |
| 1535. | $L_{A12}$ | $L_{Q72}$ |
| 1536. | $L_{A12}$ | $L_{Q73}$ |
| 1537. | $L_{A12}$ | $L_{Q74}$ |
| 1538. | $L_{A12}$ | $L_{Q75}$ |
| 1539. | $L_{A12}$ | $L_{Q76}$ |
| 1540. | $L_{A12}$ | $L_{Q77}$ |
| 1541. | $L_{A12}$ | $L_{Q78}$ |
| 1542. | $L_{A12}$ | $L_{Q79}$ |
| 1543. | $L_{A12}$ | $L_{Q80}$ |
| 1544. | $L_{A12}$ | $L_{Q81}$ |
| 1545. | $L_{A12}$ | $L_{Q82}$ |
| 1546. | $L_{A12}$ | $L_{Q83}$ |
| 1547. | $L_{A12}$ | $L_{Q84}$ |
| 1548. | $L_{A12}$ | $L_{Q85}$ |
| 1549. | $L_{A12}$ | $L_{Q86}$ |
| 1550. | $L_{A12}$ | $L_{Q87}$ |
| 1551. | $L_{A12}$ | $L_{Q88}$ |
| 1552. | $L_{A12}$ | $L_{Q89}$ |
| 1553. | $L_{A12}$ | $L_{Q90}$ |
| 1554. | $L_{A12}$ | $L_{Q91}$ |
| 1555. | $L_{A12}$ | $L_{Q92}$ |
| 1556. | $L_{A12}$ | $L_{Q93}$ |
| 1557. | $L_{A12}$ | $L_{Q94}$ |
| 1558. | $L_{A12}$ | $L_{Q95}$ |
| 1559. | $L_{A12}$ | $L_{Q96}$ |
| 1560. | $L_{A12}$ | $L_{Q97}$ |
| 1561. | $L_{A12}$ | $L_{Q98}$ |
| 1562. | $L_{A12}$ | $L_{Q99}$ |
| 1563. | $L_{A12}$ | $L_{Q100}$ |
| 1564. | $L_{A12}$ | $L_{Q101}$ |
| 1565. | $L_{A12}$ | $L_{Q102}$ |
| 1566. | $L_{A12}$ | $L_{Q103}$ |
| 1567. | $L_{A12}$ | $L_{Q104}$ |
| 1568. | $L_{A12}$ | $L_{Q105}$ |
| 1569. | $L_{A12}$ | $L_{Q106}$ |
| 1570. | $L_{A12}$ | $L_{Q107}$ |
| 1571. | $L_{A12}$ | $L_{Q108}$ |
| 1572. | $L_{A12}$ | $L_{Q109}$ |
| 1573. | $L_{A12}$ | $L_{Q110}$ |
| 1574. | $L_{A12}$ | $L_{Q111}$ |
| 1575. | $L_{A12}$ | $L_{Q112}$ |
| 1576. | $L_{A12}$ | $L_{Q113}$ |
| 1577. | $L_{A12}$ | $L_{Q114}$ |
| 1578. | $L_{A12}$ | $L_{Q115}$ |
| 1579. | $L_{A12}$ | $L_{Q116}$ |
| 1580. | $L_{A12}$ | $L_{Q117}$ |
| 1581. | $L_{A12}$ | $L_{Q118}$ |
| 1582. | $L_{A12}$ | $L_{Q119}$ |
| 1583. | $L_{A12}$ | $L_{Q120}$ |
| 1584. | $L_{A12}$ | $L_{Q121}$ |
| 1585. | $L_{A12}$ | $L_{Q122}$ |

TABLE 1-continued

| Compound number | $L^1$ | $L^2$ |
|---|---|---|
| 1586. | $L_{A12}$ | $L_{Q123}$ |
| 1587. | $L_{A12}$ | $L_{Q124}$ |
| 1588. | $L_{A12}$ | $L_{Q125}$ |
| 1589. | $L_{A12}$ | $L_{Q126}$ |
| 1590. | $L_{A12}$ | $L_{Q127}$ |
| 1591. | $L_{A12}$ | $L_{Q128}$ |
| 1592. | $L_{A12}$ | $L_{Q129}$ |
| 1593. | $L_{A12}$ | $L_{Q130}$ |
| 1594. | $L_{A12}$ | $L_{Q131}$ |
| 1595. | $L_{A12}$ | $L_{Q132}$ |
| 1596. | $L_{A12}$ | $L_{Q133}$ |
| 1597. | $L_{A13}$ | $L_{Q1}$ |
| 1598. | $L_{A13}$ | $L_{Q2}$ |
| 1599. | $L_{A13}$ | $L_{Q3}$ |
| 1600. | $L_{A13}$ | $L_{Q4}$ |
| 1601. | $L_{A13}$ | $L_{Q5}$ |
| 1602. | $L_{A13}$ | $L_{Q6}$ |
| 1603. | $L_{A13}$ | $L_{Q7}$ |
| 1604. | $L_{A13}$ | $L_{Q8}$ |
| 1605. | $L_{A13}$ | $L_{Q9}$ |
| 1606. | $L_{A13}$ | $L_{Q10}$ |
| 1607. | $L_{A13}$ | $L_{Q11}$ |
| 1608. | $L_{A13}$ | $L_{Q12}$ |
| 1609. | $L_{A13}$ | $L_{Q13}$ |
| 1610. | $L_{A13}$ | $L_{Q14}$ |
| 1611. | $L_{A13}$ | $L_{Q15}$ |
| 1612. | $L_{A13}$ | $L_{Q16}$ |
| 1613. | $L_{A13}$ | $L_{Q17}$ |
| 1614. | $L_{A13}$ | $L_{Q18}$ |
| 1615. | $L_{A13}$ | $L_{Q19}$ |
| 1616. | $L_{A13}$ | $L_{Q20}$ |
| 1617. | $L_{A13}$ | $L_{Q21}$ |
| 1618. | $L_{A13}$ | $L_{Q22}$ |
| 1619. | $L_{A13}$ | $L_{Q23}$ |
| 1620. | $L_{A13}$ | $L_{Q24}$ |
| 1621. | $L_{A13}$ | $L_{Q25}$ |
| 1622. | $L_{A13}$ | $L_{Q26}$ |
| 1623. | $L_{A13}$ | $L_{Q27}$ |
| 1624. | $L_{A13}$ | $L_{Q28}$ |
| 1625. | $L_{A13}$ | $L_{Q29}$ |
| 1626. | $L_{A13}$ | $L_{Q30}$ |
| 1627. | $L_{A13}$ | $L_{Q31}$ |
| 1628. | $L_{A13}$ | $L_{Q32}$ |
| 1629. | $L_{A13}$ | $L_{Q33}$ |
| 1630. | $L_{A13}$ | $L_{Q34}$ |
| 1631. | $L_{A13}$ | $L_{Q35}$ |
| 1632. | $L_{A13}$ | $L_{Q36}$ |
| 1633. | $L_{A13}$ | $L_{Q37}$ |
| 1634. | $L_{A13}$ | $L_{Q38}$ |
| 1635. | $L_{A13}$ | $L_{Q39}$ |
| 1636. | $L_{A13}$ | $L_{Q40}$ |
| 1637. | $L_{A13}$ | $L_{Q41}$ |
| 1638. | $L_{A13}$ | $L_{Q42}$ |
| 1639. | $L_{A13}$ | $L_{Q43}$ |
| 1640. | $L_{A13}$ | $L_{Q44}$ |
| 1641. | $L_{A13}$ | $L_{Q45}$ |
| 1642. | $L_{A13}$ | $L_{Q46}$ |
| 1643. | $L_{A13}$ | $L_{Q47}$ |
| 1644. | $L_{A13}$ | $L_{Q48}$ |
| 1645. | $L_{A13}$ | $L_{Q49}$ |
| 1646. | $L_{A13}$ | $L_{Q50}$ |
| 1647. | $L_{A13}$ | $L_{Q51}$ |
| 1648. | $L_{A13}$ | $L_{Q52}$ |
| 1649. | $L_{A13}$ | $L_{Q53}$ |
| 1650. | $L_{A13}$ | $L_{Q54}$ |
| 1651. | $L_{A13}$ | $L_{Q55}$ |
| 1652. | $L_{A13}$ | $L_{Q56}$ |
| 1653. | $L_{A13}$ | $L_{Q57}$ |
| 1654. | $L_{A13}$ | $L_{Q58}$ |
| 1655. | $L_{A13}$ | $L_{Q59}$ |
| 1656. | $L_{A13}$ | $L_{Q60}$ |
| 1657. | $L_{A13}$ | $L_{Q61}$ |
| 1658. | $L_{A13}$ | $L_{Q62}$ |
| 1659. | $L_{A13}$ | $L_{Q63}$ |
| 1660. | $L_{A13}$ | $L_{Q64}$ |
| 1661. | $L_{A13}$ | $L_{Q65}$ |
| 1662. | $L_{A13}$ | $L_{Q66}$ |

TABLE 1-continued

| Compound number | $L^1$ | $L^2$ |
|---|---|---|
| 1663. | $L_{A13}$ | $L_{Q67}$ |
| 1664. | $L_{A13}$ | $L_{Q68}$ |
| 1665. | $L_{A13}$ | $L_{Q69}$ |
| 1666. | $L_{A13}$ | $L_{Q70}$ |
| 1667. | $L_{A13}$ | $L_{Q71}$ |
| 1668. | $L_{A13}$ | $L_{Q72}$ |
| 1669. | $L_{A13}$ | $L_{Q73}$ |
| 1670. | $L_{A13}$ | $L_{Q74}$ |
| 1671. | $L_{A13}$ | $L_{Q75}$ |
| 1672. | $L_{A13}$ | $L_{Q76}$ |
| 1673. | $L_{A13}$ | $L_{Q77}$ |
| 1674. | $L_{A13}$ | $L_{Q78}$ |
| 1675. | $L_{A13}$ | $L_{Q79}$ |
| 1676. | $L_{A13}$ | $L_{Q80}$ |
| 1677. | $L_{A13}$ | $L_{Q81}$ |
| 1678. | $L_{A13}$ | $L_{Q82}$ |
| 1679. | $L_{A13}$ | $L_{Q83}$ |
| 1680. | $L_{A13}$ | $L_{Q84}$ |
| 1681. | $L_{A13}$ | $L_{Q85}$ |
| 1682. | $L_{A13}$ | $L_{Q86}$ |
| 1683. | $L_{A13}$ | $L_{Q87}$ |
| 1684. | $L_{A13}$ | $L_{Q88}$ |
| 1685. | $L_{A13}$ | $L_{Q89}$ |
| 1686. | $L_{A13}$ | $L_{Q90}$ |
| 1687. | $L_{A13}$ | $L_{Q91}$ |
| 1688. | $L_{A13}$ | $L_{Q92}$ |
| 1689. | $L_{A13}$ | $L_{Q93}$ |
| 1690. | $L_{A13}$ | $L_{Q94}$ |
| 1691. | $L_{A13}$ | $L_{Q95}$ |
| 1692. | $L_{A13}$ | $L_{Q96}$ |
| 1693. | $L_{A13}$ | $L_{Q97}$ |
| 1694. | $L_{A13}$ | $L_{Q98}$ |
| 1695. | $L_{A13}$ | $L_{Q99}$ |
| 1696. | $L_{A13}$ | $L_{Q100}$ |
| 1697. | $L_{A13}$ | $L_{Q101}$ |
| 1698. | $L_{A13}$ | $L_{Q102}$ |
| 1699. | $L_{A13}$ | $L_{Q103}$ |
| 1700. | $L_{A13}$ | $L_{Q104}$ |
| 1701. | $L_{A13}$ | $L_{Q105}$ |
| 1702. | $L_{A13}$ | $L_{Q106}$ |
| 1703. | $L_{A13}$ | $L_{Q107}$ |
| 1704. | $L_{A13}$ | $L_{Q108}$ |
| 1705. | $L_{A13}$ | $L_{Q109}$ |
| 1706. | $L_{A13}$ | $L_{Q110}$ |
| 1707. | $L_{A13}$ | $L_{Q111}$ |
| 1708. | $L_{A13}$ | $L_{Q112}$ |
| 1709. | $L_{A13}$ | $L_{Q113}$ |
| 1710. | $L_{A13}$ | $L_{Q114}$ |
| 1711. | $L_{A13}$ | $L_{Q115}$ |
| 1712. | $L_{A13}$ | $L_{Q116}$ |
| 1713. | $L_{A13}$ | $L_{Q117}$ |
| 1714. | $L_{A13}$ | $L_{Q118}$ |
| 1715. | $L_{A13}$ | $L_{Q119}$ |
| 1716. | $L_{A13}$ | $L_{Q120}$ |
| 1717. | $L_{A13}$ | $L_{Q121}$ |
| 1718. | $L_{A13}$ | $L_{Q122}$ |
| 1719. | $L_{A13}$ | $L_{Q123}$ |
| 1720. | $L_{A13}$ | $L_{Q124}$ |
| 1721. | $L_{A13}$ | $L_{Q125}$ |
| 1722. | $L_{A13}$ | $L_{Q126}$ |
| 1723. | $L_{A13}$ | $L_{Q127}$ |
| 1724. | $L_{A13}$ | $L_{Q128}$ |
| 1725. | $L_{A13}$ | $L_{Q129}$ |
| 1726. | $L_{A13}$ | $L_{Q130}$ |
| 1727. | $L_{A13}$ | $L_{Q131}$ |
| 1728. | $L_{A13}$ | $L_{Q132}$ |
| 1729. | $L_{A13}$ | $L_{Q133}$ |

In one embodiment, the compound comprising the first ligand $L^1$ having Formula I as defined herein can be selected from the group consisting of:

Compound 8
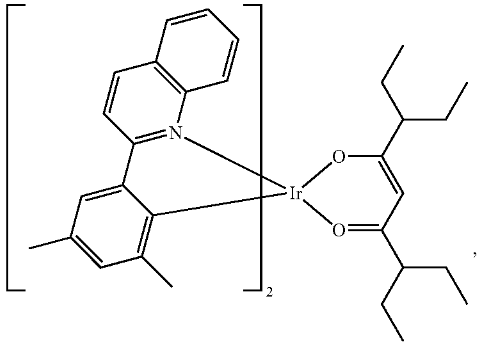
Compound 9
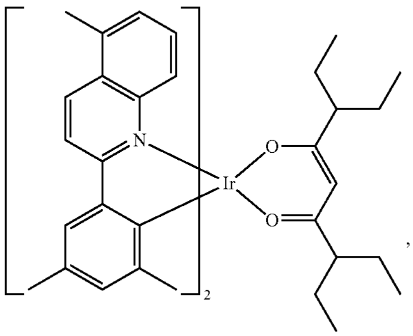
Compound 12
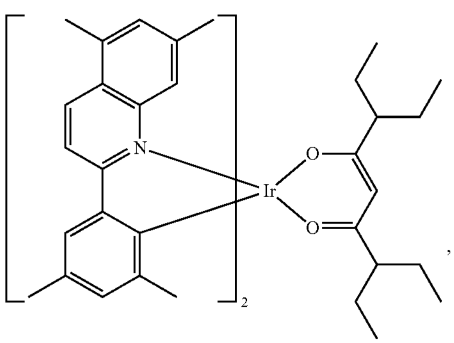
Compound 32
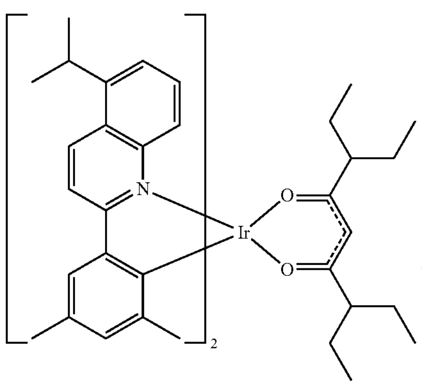
-continued
Compound 43
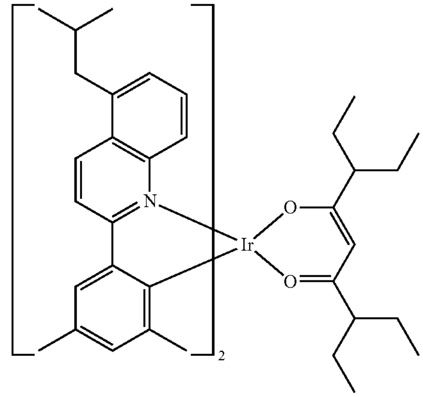
Compound 54
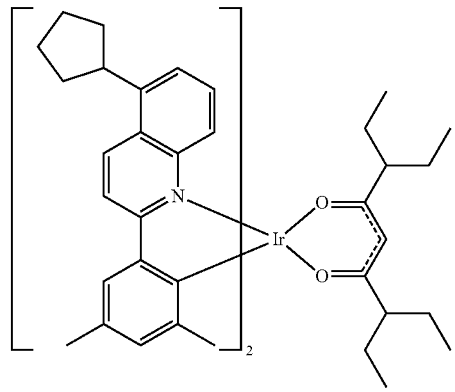
Compound 55
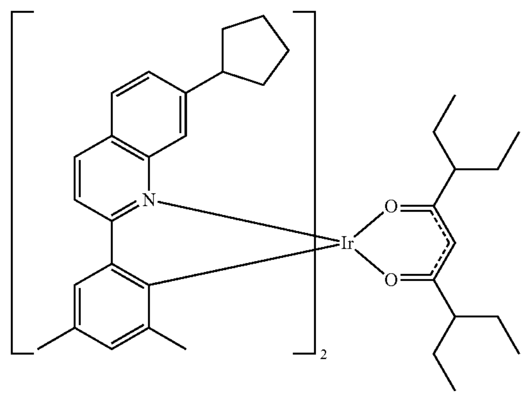
Compound 62
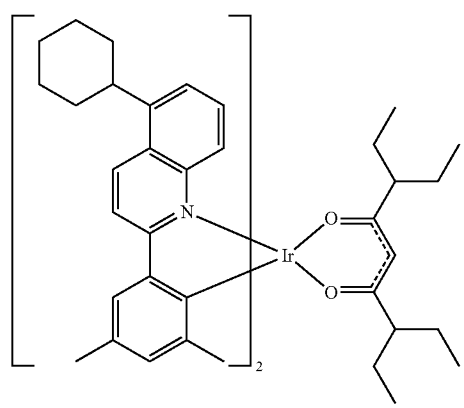

-continued
Compound 83
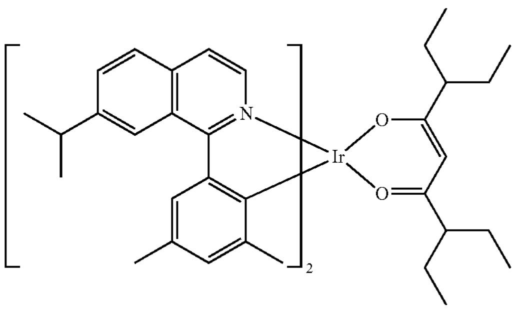
,
Compound 93
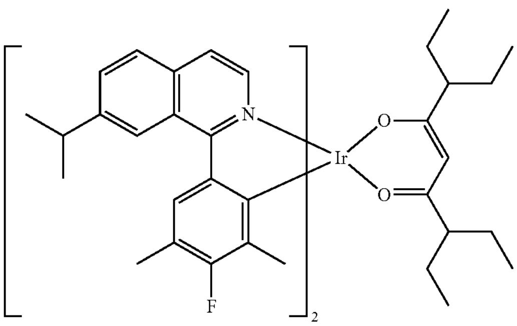
,
Compound 118
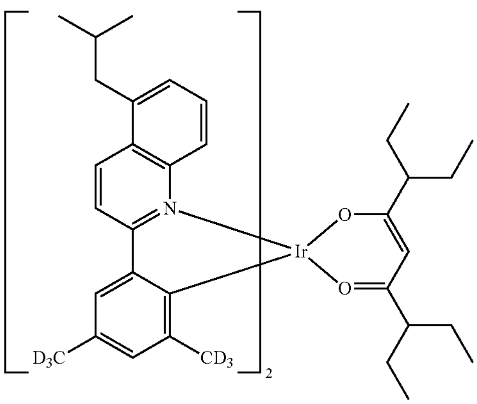
,
Compound 141
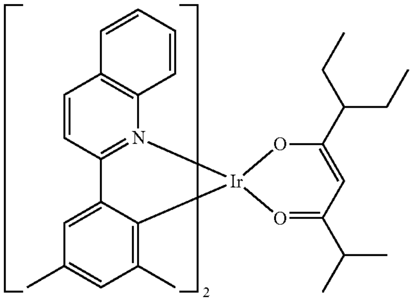
,
-continued
Compound 142
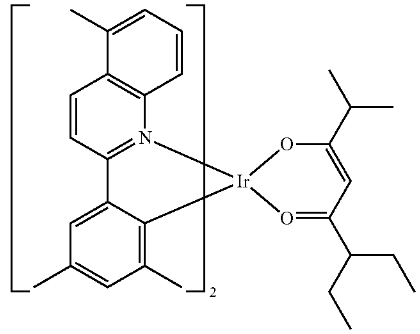
,
Compound 176
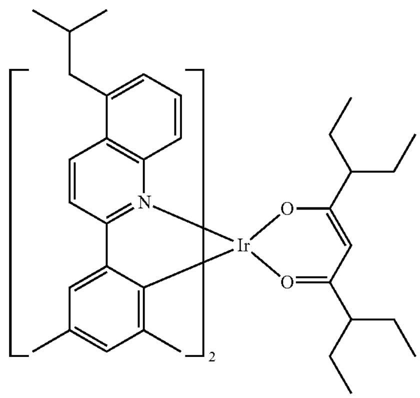
,
Compound 278
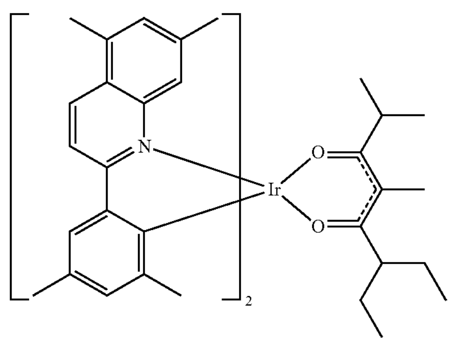
, and
Compound 320
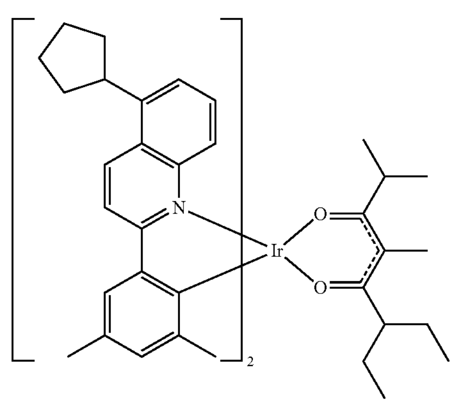
.
According to another aspect of the present disclosure, a first device comprising a first organic light emitting device is provided. The first organic light emitting device can comprise an anode, a cathode, and an organic layer, disposed between the anode and the cathode. The organic layer can include a compound comprising the first ligand $L^1$ having Formula I, as defined herein.

In one embodiment, the compound can be selected from the group consisting of Compound 8, Compound 9, Compound 12, Compound 32, Compound 43, Compound 54, Compound 55, Compound 62, Compound 83, Compound 93, Compound 118, Compound 141, Compound 142, Compound 176, Compound 278, and Compound 320.

The first device can be one or more of a consumer product, an organic light-emitting device, and/or a lighting panel.

The organic layer can be an emissive layer and the compound can be an emissive dopant in some embodiments, while the compound can be a non-emissive dopant in other embodiments.

The organic layer can also include a host. In some embodiments, the host can include a metal complex. In one embodiment, the host can be a metal 8-hydroxyquinolate. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1$-$Ar_2$, $C_nH_{2n}{-}Ar_1$, or no substitution. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof.

The host can be a compound selected from the group consisting of carbazole, dibenzothiphene, dibenzofuran, dibenzoselenophene, azacarbazole, aza-dibenzothiophene, aza-dibenzofuran, and aza-dibenzoselenophene. The "aza" designation in the fragments described above, i.e., aza-dibenzofuran, aza-dibenzonethiophene, etc., means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein. The host can include a metal complex. The host can be a specific compound selected from the group consisting of:

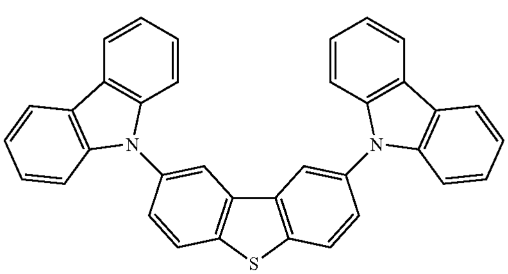

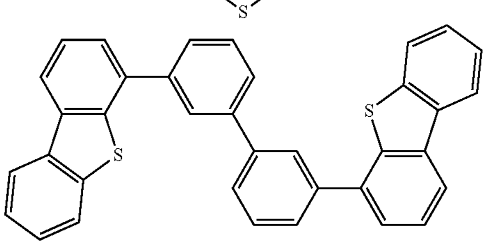

-continued

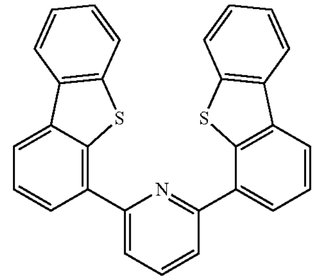

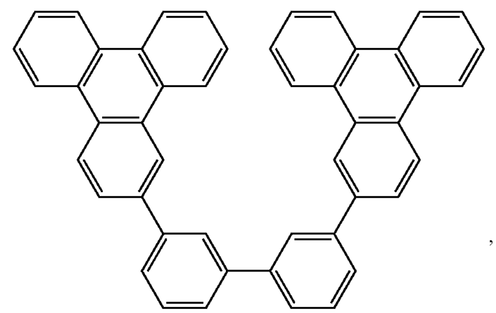

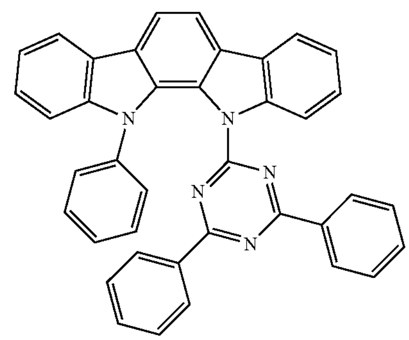

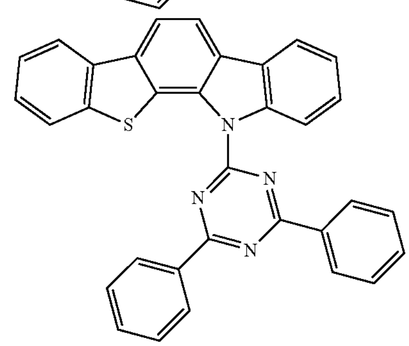

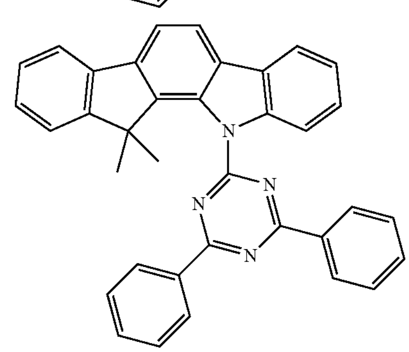

-continued

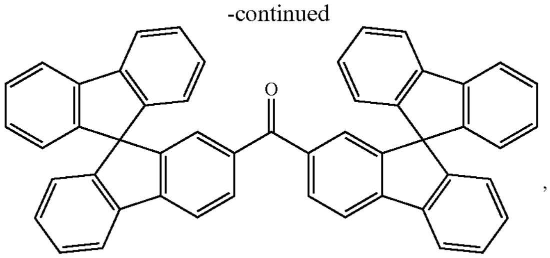

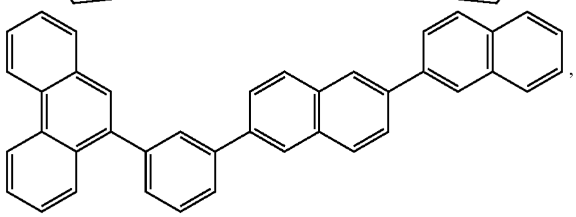

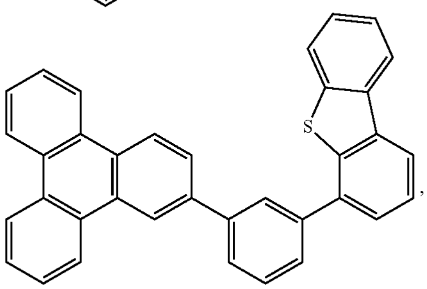

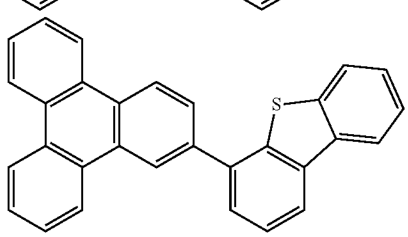

and combinations thereof.

In yet another aspect of the present disclsoure, a formulation comprising the first ligand $L^1$ having Formula I, as defined herein, is also within the scope of the invention disclosed herein. The formulation can include one or more components selected from the group consisting of a solvent, a host, a hole injection material, hole transport material, and an electron transport layer material, disclosed herein.

Combination with other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

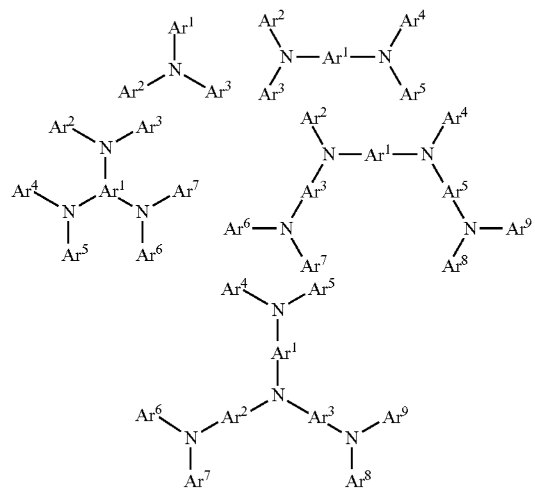

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

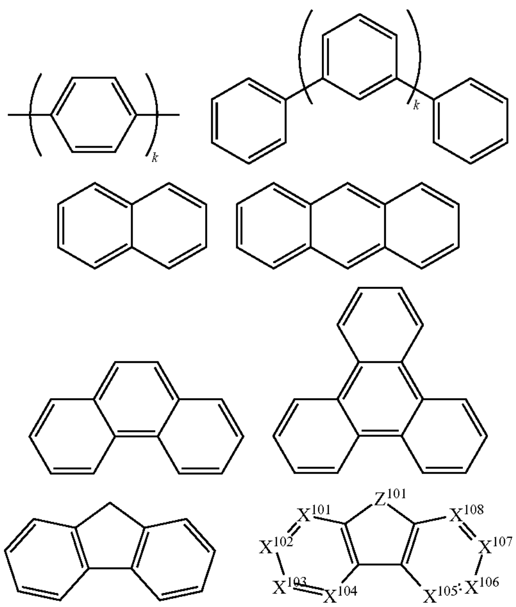

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but not limit to the following general formula:

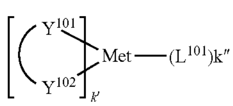

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

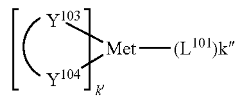

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

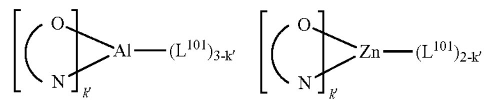

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

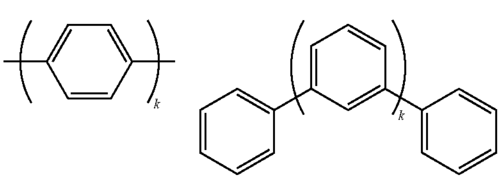

-continued

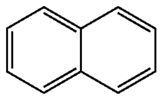
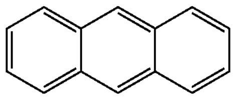
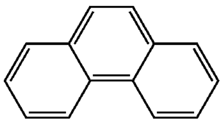
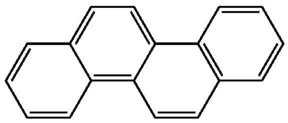
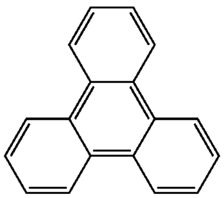
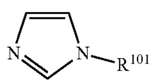
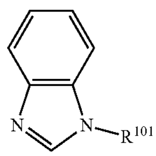
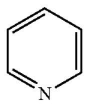
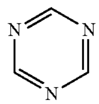
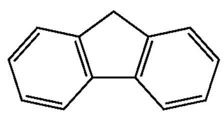
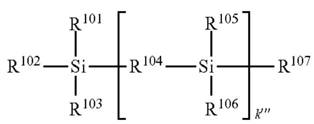
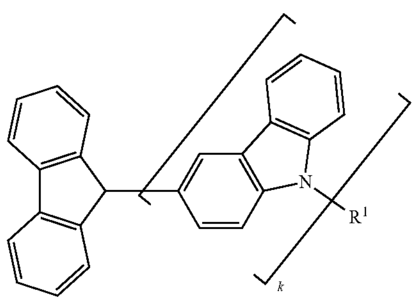
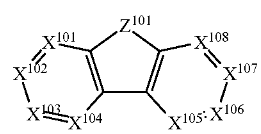
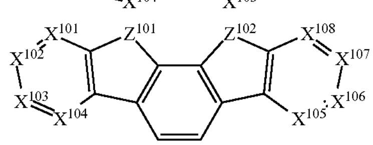
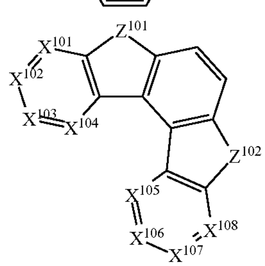
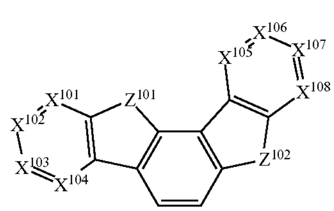

-continued

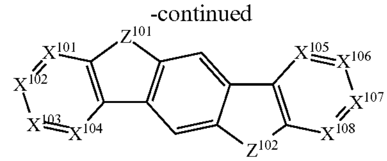
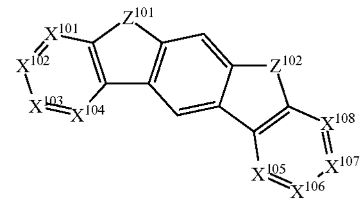

wherein $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N. $Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

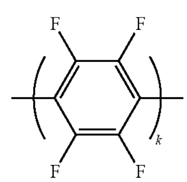
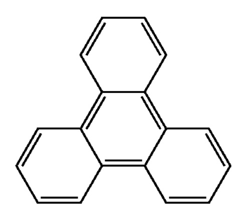
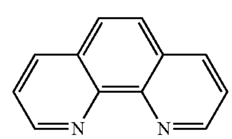
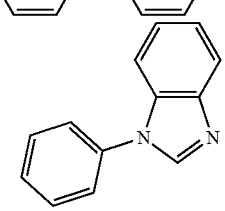
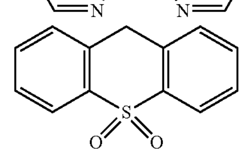
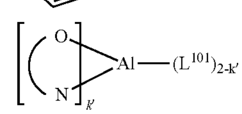

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

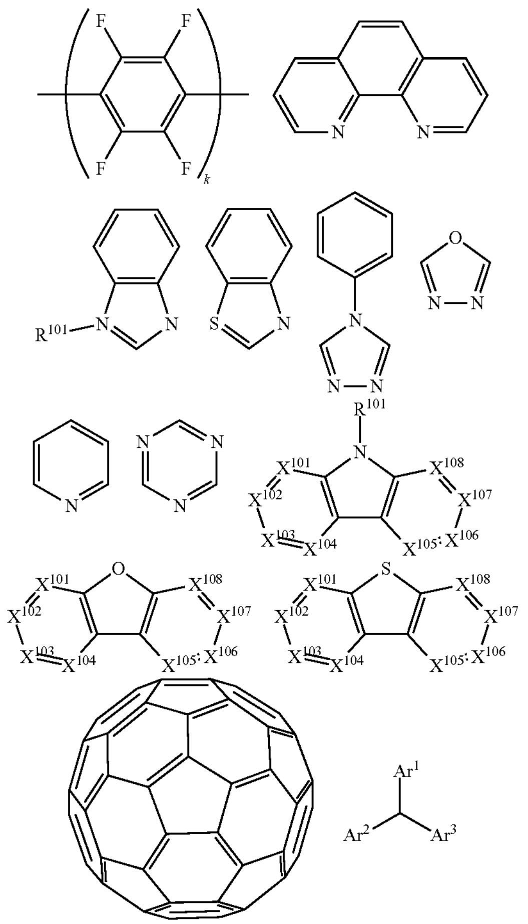

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

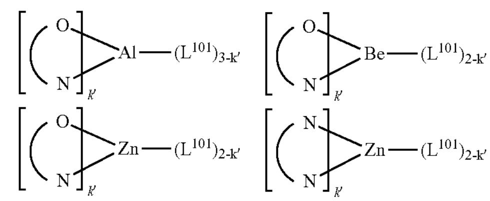

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 2 below. Table 2 lists non-limiting classes of materials, non-limiting examples of compounds for each class, and references that disclose the materials.

TABLE 2

| MATERIAL | EXAMPLES OF MATERIAL | PUBLICATIONS |
|---|---|---|
| | Hole injection materials | |
| Phthalocyanine and porphyrin compounds | 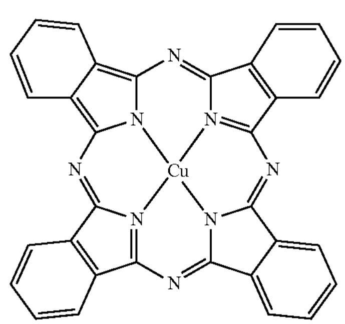 | Appl. Phys. Lett. 69, 2160 (1996) |

TABLE 2-continued

| MATERIAL | EXAMPLES OF MATERIAL | PUBLICATIONS |
| --- | --- | --- |
| | Hole injection materials | |
| Starburst triarylamines | 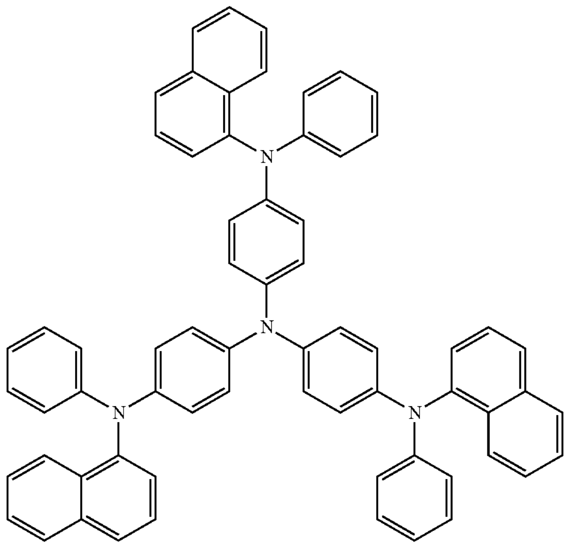 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT:PSS, polyaniline, polythiophene) | 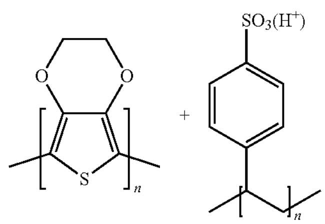 | Synth. Met. 87, 171 (1997) WO2007002683 |
| Phosphonic acid and sliane SAMs | 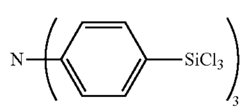 | US20030162053 |
| Triarylamine or polythiophene polymers with conductivity dopants | 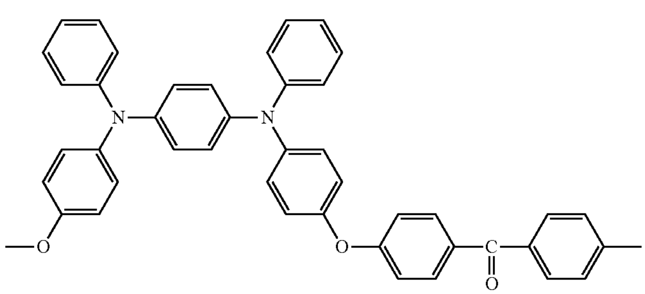 and | EP1725079A1 |

TABLE 2-continued
| MATERIAL | EXAMPLES OF MATERIAL | PUBLICATIONS |
| --- | --- | --- |
| | Hole injection materials | |
| | 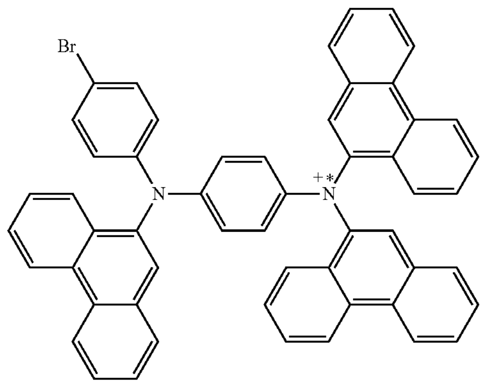 [SMILES: Brc1ccc(N(c2ccc(N(c3cc4ccccc4c4ccccc34)c3cc4ccccc4c4ccccc34)cc2)c2cc3ccccc3c3ccccc23)cc1] | |
| | 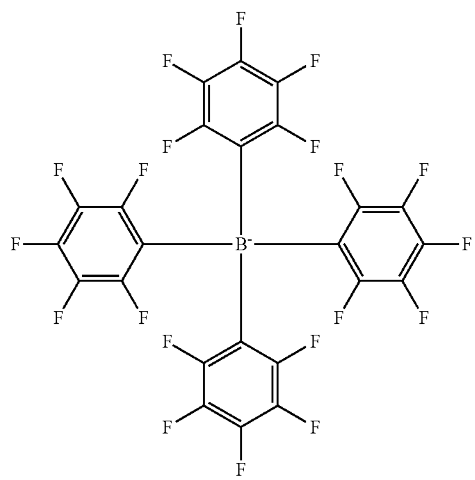 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | |
| Organic compounds with conductive inorganic compounds, such as molybdenum and tungsten oxides | 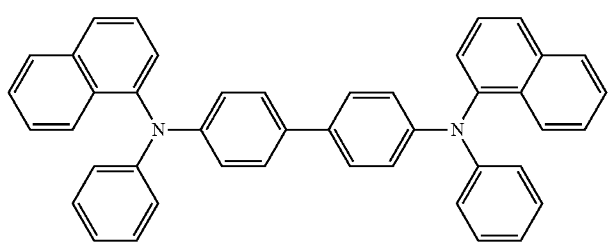 + $MoO_x$ | US20050123751 SID Symposium Digest, 37, 923 (2006) WO2009018009 |
| n-type semiconducting organic complexes | 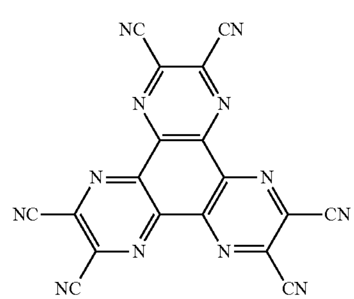 [SMILES: N#Cc1nc2c3nc(C#N)c(C#N)nc3c3nc(C#N)c(C#N)nc3c2nc1C#N] | US20020158242 |

TABLE 2-continued
| MATERIAL | EXAMPLES OF MATERIAL | PUBLICATIONS |
|---|---|---|
| | Hole injection materials | |
| Metal organometallic complexes | 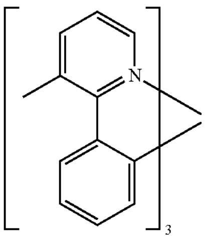 | US20060240279 |
| Cross-linkable compounds | 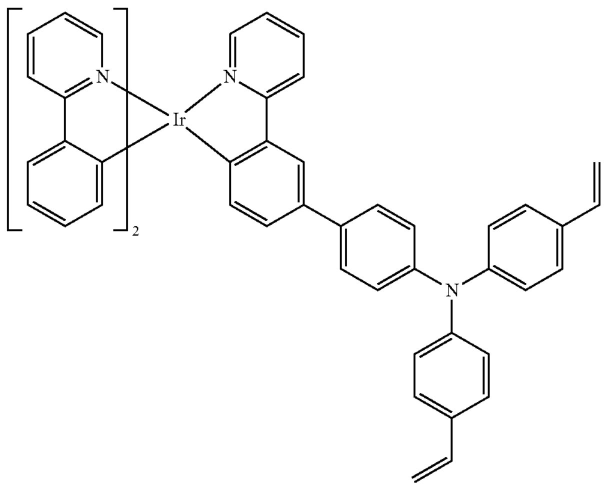 | US20080220265 |
| Polythiophene based polymers and copolymers | 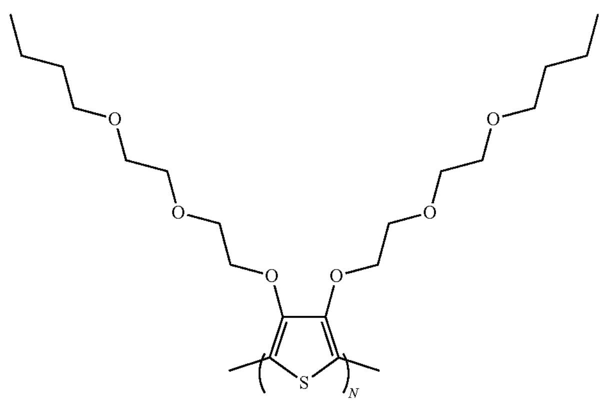 | WO 2011075644 EP2350216 |
| | Hole transporting materials | |
| Triarylamines (e.g., TPD, α-NPD) | 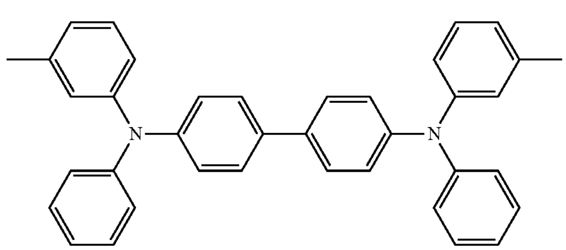 | Appl. Phys. Lett. 51, 913 (1987) |

TABLE 2-continued
| MATERIAL | EXAMPLES OF MATERIAL | PUBLICATIONS |
|---|---|---|
| | Hole injection materials | |
| | 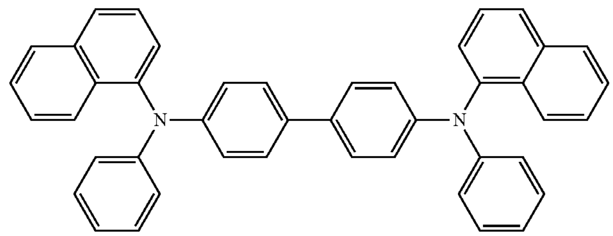 [SMILES: c1ccc(N(c2ccc(-c3ccc(N(c4ccccc4)c4cccc5ccccc45)cc3)cc2)c2cccc3ccccc23)cc1] | U.S. Pat. No. 5,061,569 |
| | 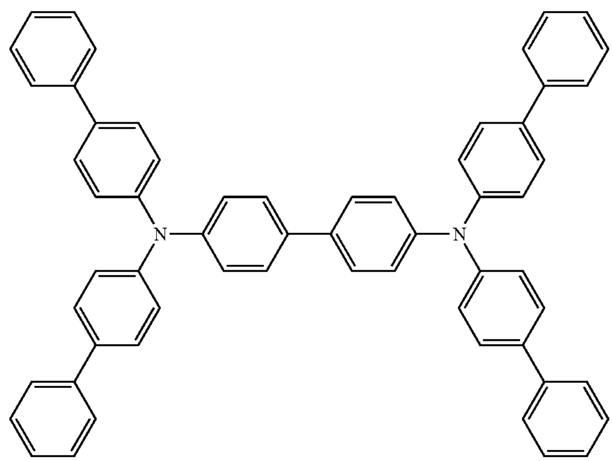 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 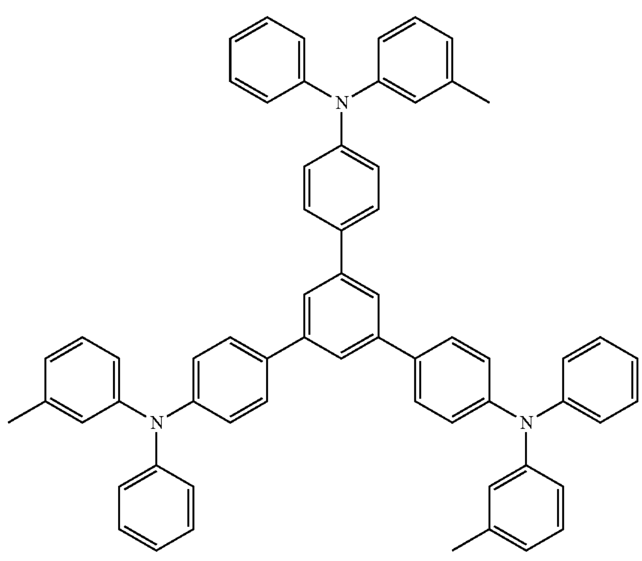 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |

TABLE 2-continued
| MATERIAL | EXAMPLES OF MATERIAL<br>Hole injection materials | PUBLICATIONS |
|---|---|---|
| | 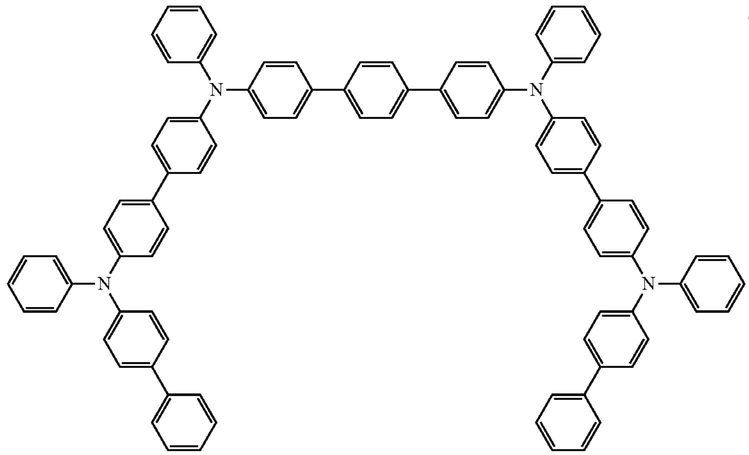 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |
| | 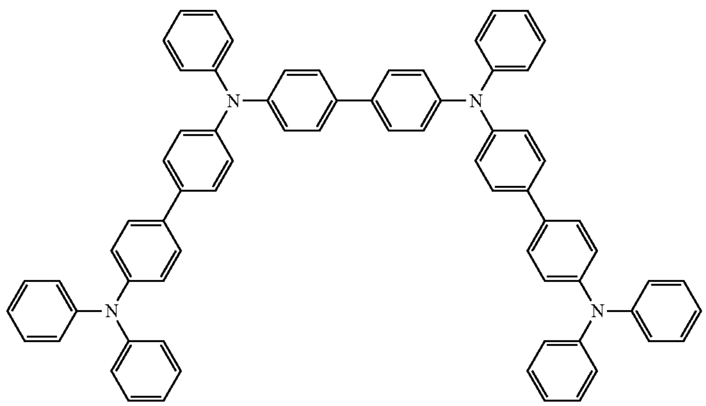 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |
| Triarylamine on spirofluorene core | 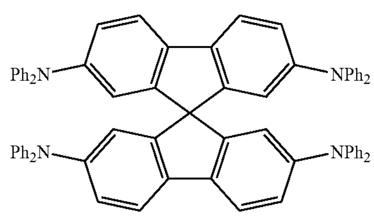 | Synth. Met. 91, 209 (1997) |
| Arylamine carbazole compounds | 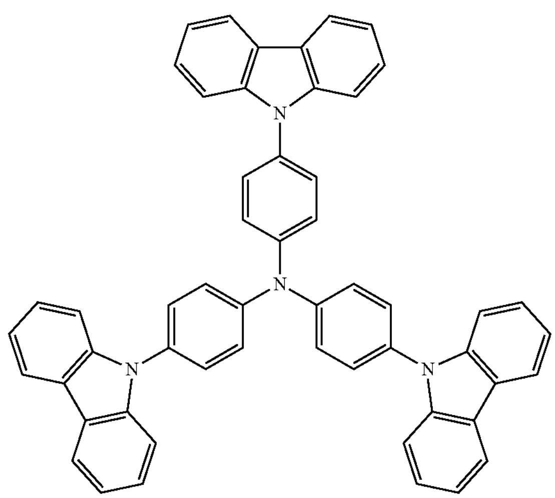 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994), US20080124572 |

TABLE 2-continued
| MATERIAL | EXAMPLES OF MATERIAL<br>Hole injection materials | PUBLICATIONS |
|---|---|---|
| Triarylamine with (di)benzothiophene/ (di)benzofuran | 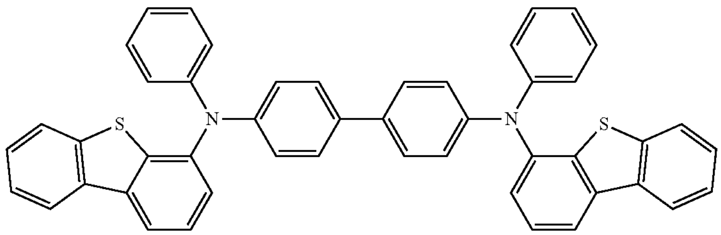 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 US20110163302 |
| Indolocarbazoles | 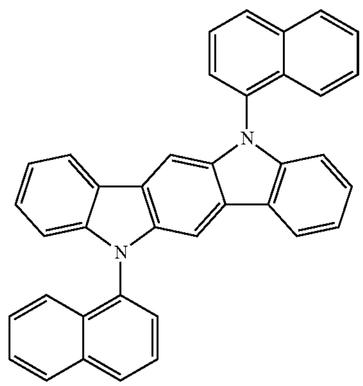 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 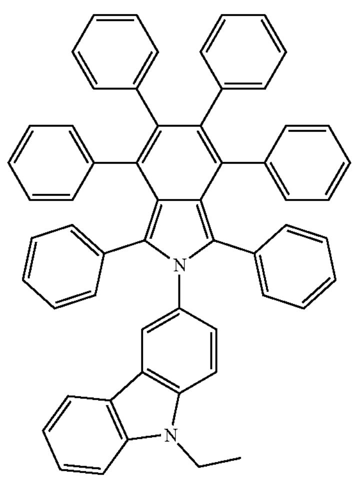 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 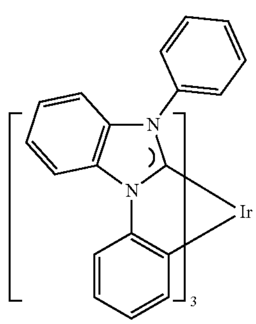 | US20080018221 |

TABLE 2-continued
| MATERIAL | EXAMPLES OF MATERIAL<br>Hole injection materials | PUBLICATIONS |
|---|---|---|
| | Phosphorescent OLED host materials<br>Red hosts | |
| Arylcarbazoles | 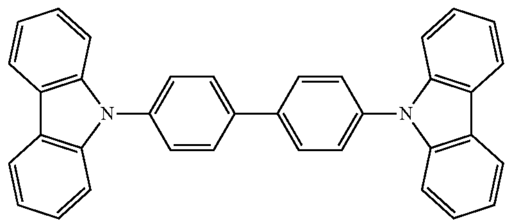 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| Metal 8-hydroxyquinolates (e.g., $Alq_3$, BAlq) | 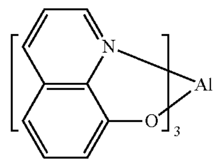 | Nature 395, 151 (1998) |
| | 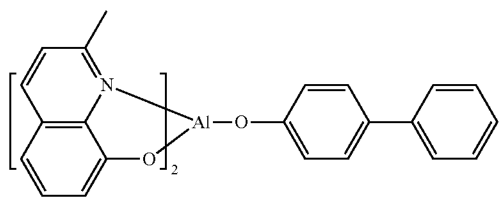 | US20060202194 |
| | 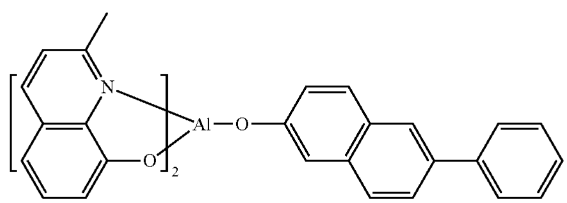 | WO2005014551 |
| | 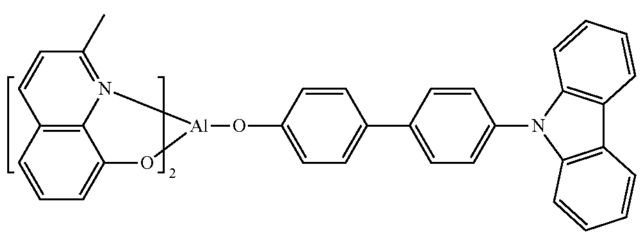 | WO2006072002 |
| Metal phenoxybenzothiazole compounds | 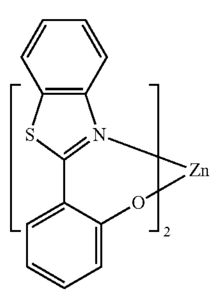 | Appl. Phys. Lett. 90, 123509 (2007) |
| Conjugated oligomers and polymers (e.g., polyfluorene) | 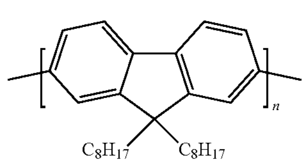 | Org. Electron. 1, 15 (2000) |

TABLE 2-continued
| MATERIAL | EXAMPLES OF MATERIAL | PUBLICATIONS |
| --- | --- | --- |
| | Hole injection materials | |
| Aromatic fused rings | 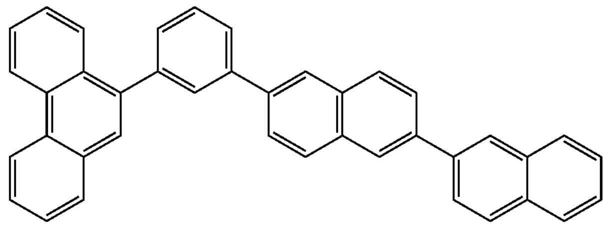 [SMILES: c1cc(-c2ccc3cc(-c4ccc5ccccc5c4)ccc3c2)cc(-c2cc3ccccc3c3ccccc23)c1] | WO2009066779, WO2009066778, WO2009063833, US20090045731, US20090045730, WO2009008311, US20090008605, US20090009065 |
| Zinc complexes | 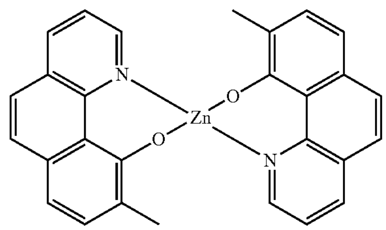 | WO2010056066 |
| Chrysene based compounds | 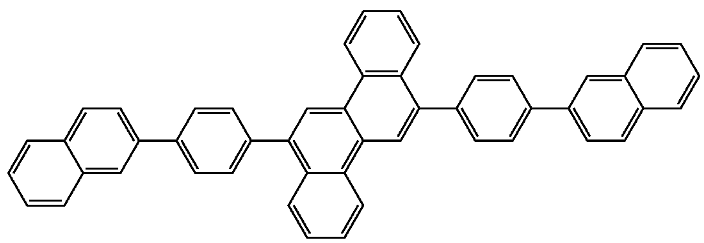 [SMILES: c1ccc2cc(-c3ccc(-c4cc5c6ccccc6c(-c6ccc(-c7ccc8ccccc8c7)cc6)cc5c5ccccc45)cc3)ccc2c1] | WO2011086863 |
| | Green hosts | |
| Arylcarbazoles | 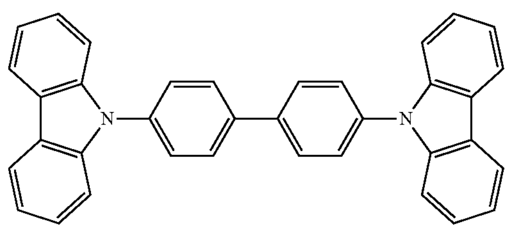 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 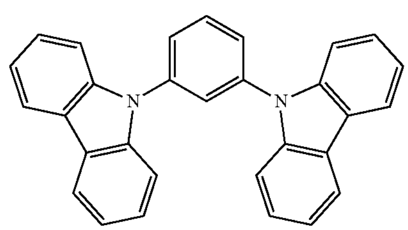 [SMILES: c1cc(-n2c3ccccc3c3ccccc32)cc(-n2c3ccccc3c3ccccc32)c1] | US20030175553 |
| | 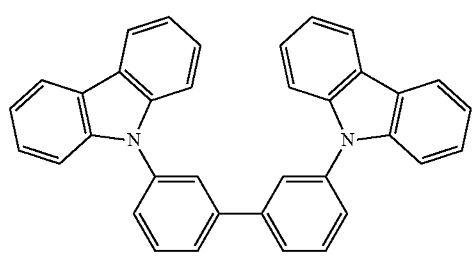 [SMILES: c1cc(-c2cccc(-n3c4ccccc4c4ccccc43)c2)cc(-n2c3ccccc3c3ccccc32)c1] | WO2001039234 |

TABLE 2-continued
| MATERIAL | EXAMPLES OF MATERIAL<br>Hole injection materials | PUBLICATIONS |
|---|---|---|
| Aryltriphenylene compounds | 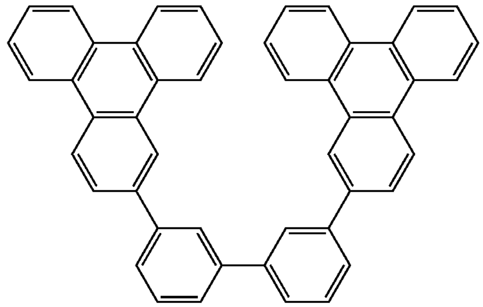 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 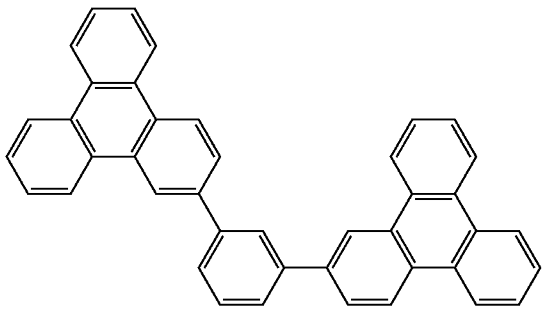 [SMILES: c1cc(-c2ccc3c4ccccc4c4ccccc4c3c2)cc(-c2ccc3c4ccccc4c4ccccc4c3c2)c1] | US20060280965 |
| | 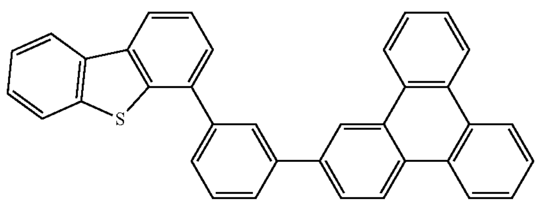 [SMILES: c1cc(-c2ccc3c4ccccc4c4ccccc4c3c2)cc(-c2cccc3c2sc2ccccc23)c1]<br> | WO2009021126 |
| Poly-fused heteroaryl compounds | 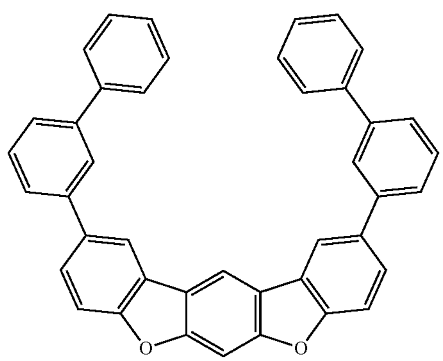 [SMILES: c1ccc(-c2cccc(-c3ccc4oc5cc6oc7ccc(-c8cccc(-c9ccccc9)c8)cc7c6cc5c4c3)c2)cc1]<br> | US20090309488<br>US20090302743<br>US20100012931 |
| Donor acceptor type molecules | 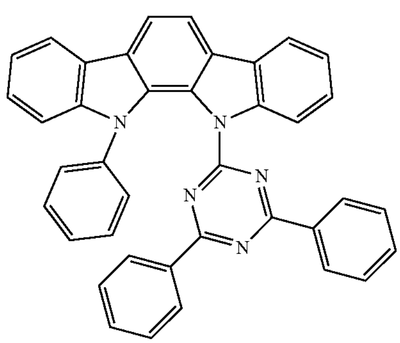 [SMILES: c1ccc(-c2nc(-c3ccccc3)nc(-n3c4ccccc4c4ccc5c6ccccc6n(-c6ccccc6)c5c43)n2)cc1]<br> | WO2008056746 |

TABLE 2-continued
| MATERIAL | EXAMPLES OF MATERIAL<br>Hole injection materials | PUBLICATIONS |
|---|---|---|
| | 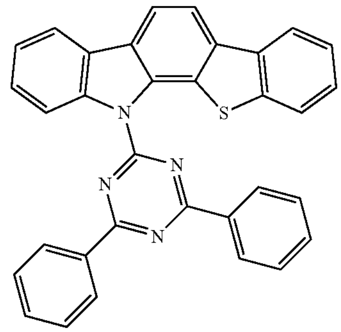 [SMILES: c1ccc(-c2nc(-c3ccccc3)nc(-n3c4ccccc4c4ccc5c6ccccc6sc5c43)n2)cc1] | WO2010107244 |
| Aza-carbazole/DBT/DBF | 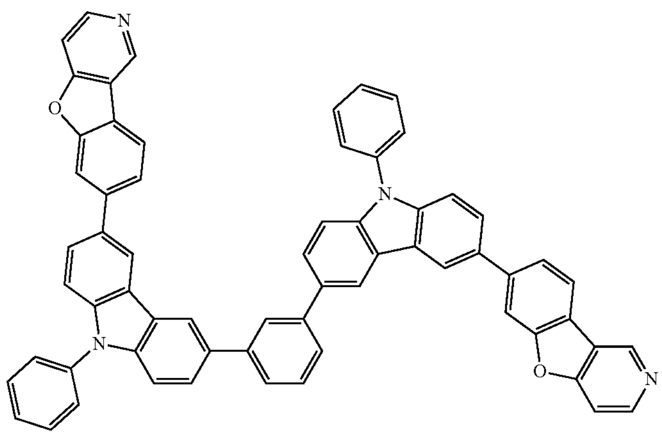 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| | 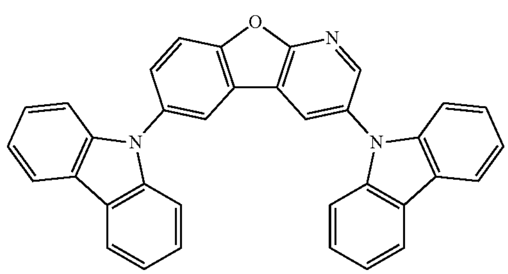 [SMILES: c1ccc2c(c1)c1ccccc1n2-c1ccc2oc3ncc(-n4c5ccccc5c5ccccc54)cc3c2c1] | US20100187984 |
| Polymers (e.g., PVK) | 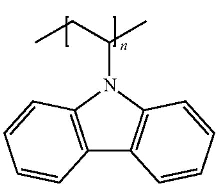 | Appl. Phys. Lett. 77, 2280 (2000) |
| Spirofluorene compounds | 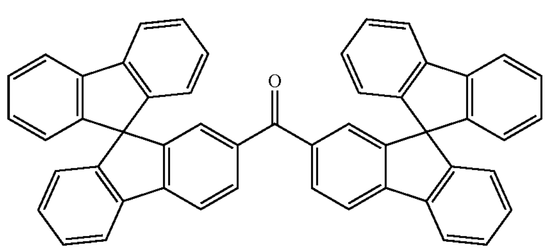 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |

TABLE 2-continued
| MATERIAL | EXAMPLES OF MATERIAL<br>Hole injection materials | PUBLICATIONS |
|---|---|---|
| Metal phenoxybenzooxazole compounds | 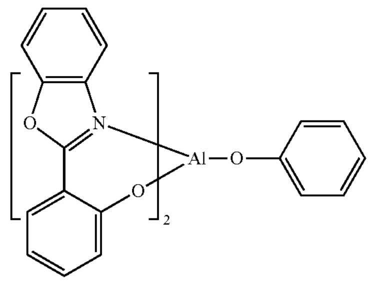 | WO2005089025 |
| | 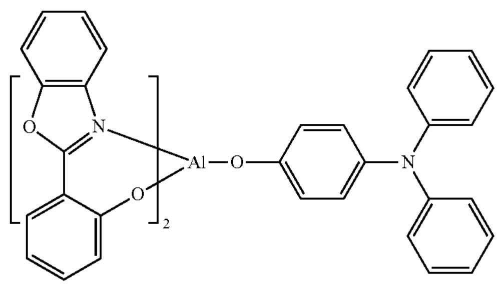 | WO2006132173 |
| | 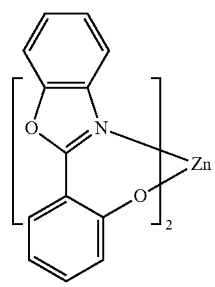 | JP200511610 |
| Spirofluorene-carbazole compounds | 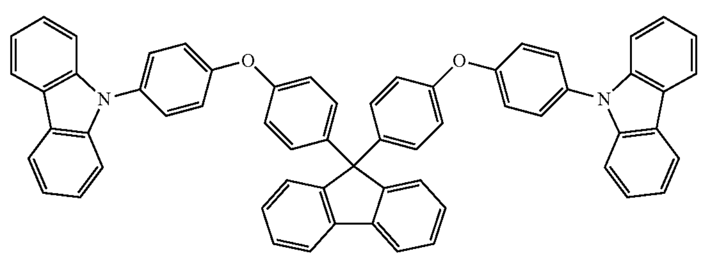 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |
| | 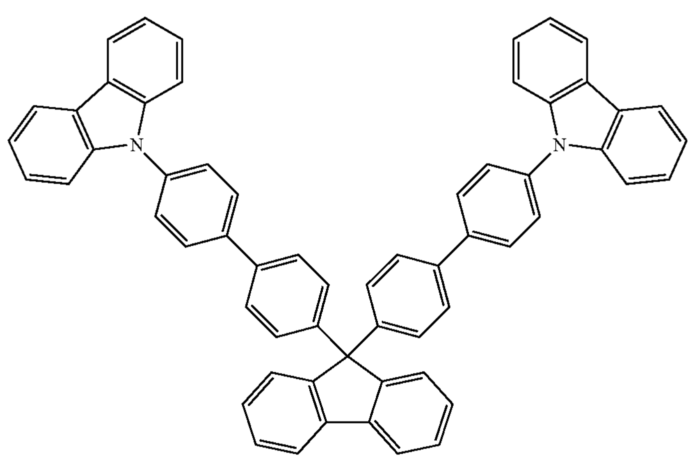 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |

TABLE 2-continued
| MATERIAL | EXAMPLES OF MATERIAL<br>Hole injection materials | PUBLICATIONS |
|---|---|---|
| Indolocarbazoles | 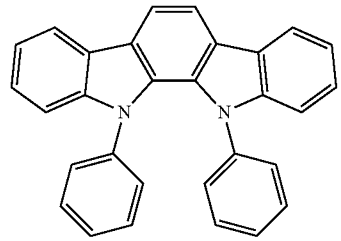 [SMILES: c1ccc(-n2c3ccccc3c3ccc4c5ccccc5n(-c5ccccc5)c4c32)cc1] | WO2007063796 |
| | 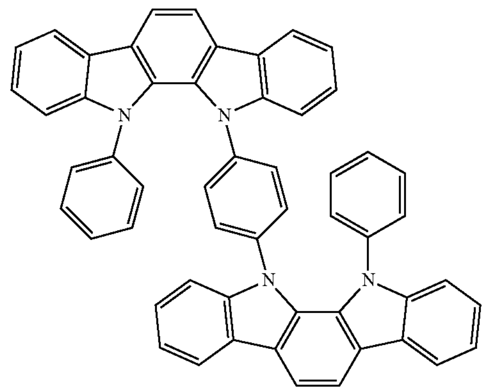 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 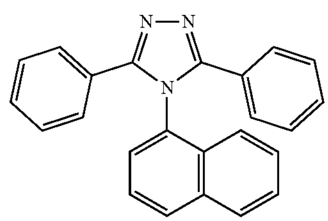 [SMILES: c1ccc(-c2nnc(-c3ccccc3)n2-c2cccc3ccccc23)cc1] | J. Appl. Phys. 90, 5048 (2001) |
| | 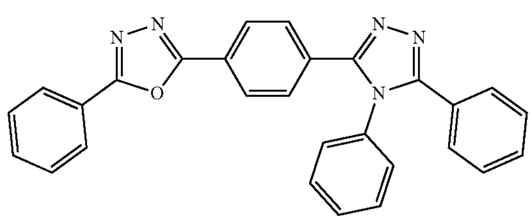 [SMILES: c1ccc(-c2nnc(-c3ccc(-c4nnc(-c5ccccc5)n4-c4ccccc4)cc3)o2)cc1] | WO2004107822 |
| Tetraphenylene complexes | 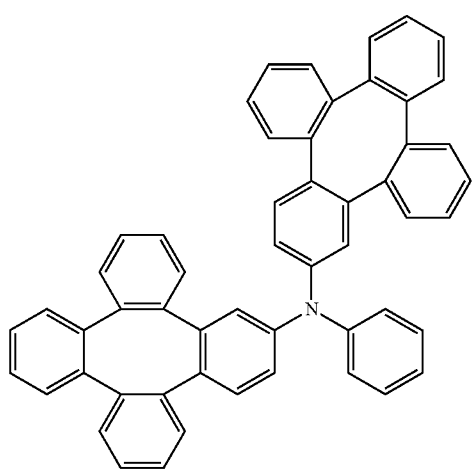 [SMILES: c1ccc(N(c2ccc3c(c2)-c2ccccc2-c2ccccc2-c2ccccc2-3)c2ccc3c(c2)-c2ccccc2-c2ccccc2-c2ccccc2-3)cc1] | US20050112407 |

TABLE 2-continued
| MATERIAL | EXAMPLES OF MATERIAL | PUBLICATIONS |
|---|---|---|
| | Hole injection materials | |
| Metal phenoxypyridine compounds | 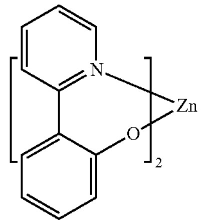 | WO2005030900 |
| Metal coordination complexes (e.g., Zn, Al with N^N ligands) | 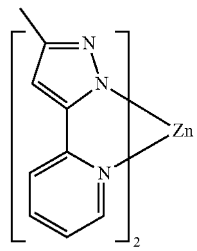 | US20040137268, US20040137267 |
| | Blue hosts | |
| Arylcarbazoles | 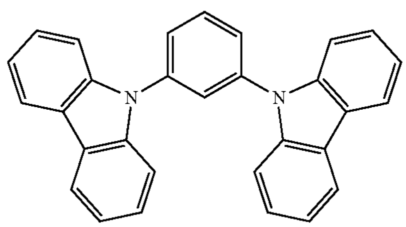 [SMILES: c1cc(-n2c3ccccc3c3ccccc32)cc(-n2c3ccccc3c3ccccc32)c1] | Appl. Phys. Lett, 82, 2422 (2003) |
| | 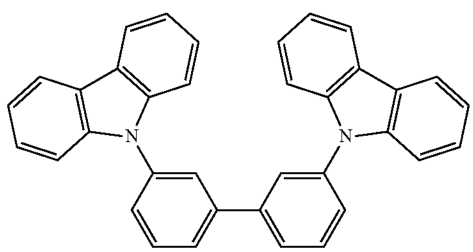 [SMILES: c1cc(-c2cccc(-n3c4ccccc4c4ccccc43)c2)cc(-n2c3ccccc3c3ccccc32)c1] | US20070190359 |
| Dibenzothiophene/ Dibenzofuran-carbazole compounds | 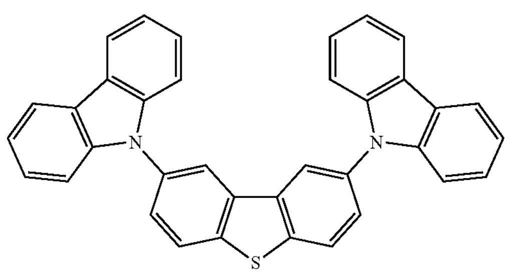 [SMILES: c1ccc2c(c1)c1ccccc1n2-c1ccc2sc3ccc(-n4c5ccccc5c5ccccc54)cc3c2c1] | WO2006114966, US20090167162 |
| | 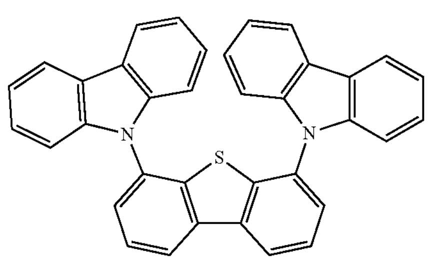 [SMILES: c1cc(-n2c3ccccc3c3ccccc32)c2sc3c(-n4c5ccccc5c5ccccc54)cccc3c2c1] | US20090167162 |

TABLE 2-continued
| MATERIAL | EXAMPLES OF MATERIAL<br>Hole injection materials | PUBLICATIONS |
| --- | --- | --- |
| | 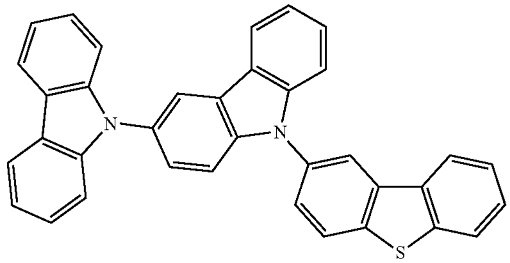 [SMILES: c1ccc2c(c1)sc1ccc(-n3c4ccccc4c4cc(-n5c6ccccc6c6ccccc65)ccc43)cc12] | WO2009086028 |
| | 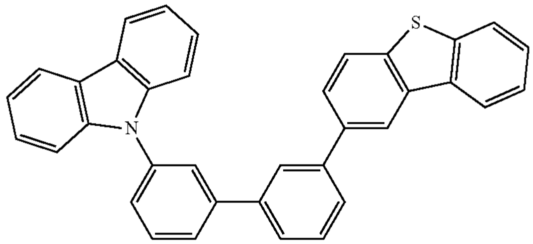 [SMILES: c1cc(-c2cccc(-n3c4ccccc4c4ccccc43)c2)cc(-c2ccc3sc4ccccc4c3c2)c1] | US20090030202,<br>US20090017330 |
| | 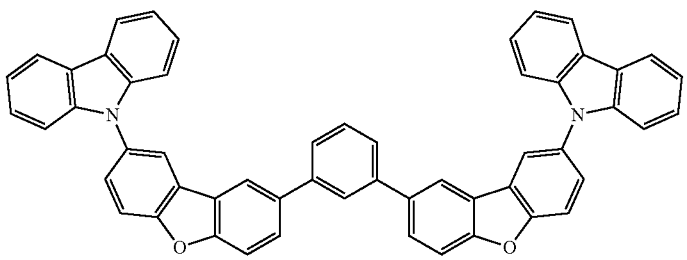 [SMILES: c1cc(-c2ccc3oc4ccc(-n5c6ccccc6c6ccccc65)cc4c3c2)cc(-c2ccc3oc4ccc(-n5c6ccccc6c6ccccc65)cc4c3c2)c1] | US20100084966 |
| Silicon aryl compounds | 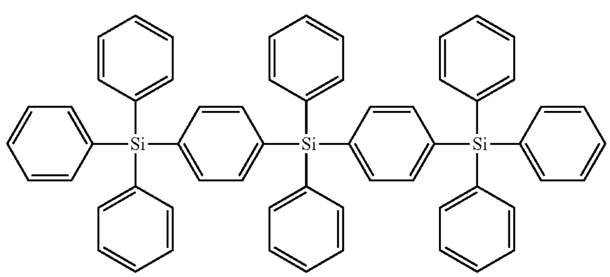 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 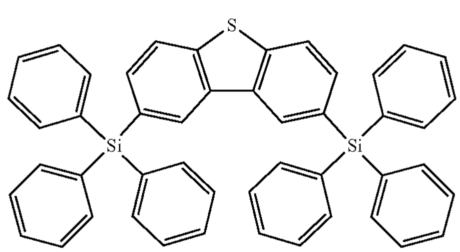 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 2-continued
| MATERIAL | EXAMPLES OF MATERIAL | PUBLICATIONS |
|---|---|---|
| | Hole injection materials | |
| Silicon/Germanium aryl compounds | 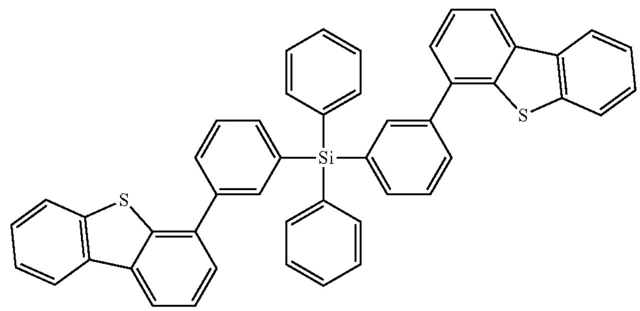 | EP2034538A |
| Aryl benzoyl ester | 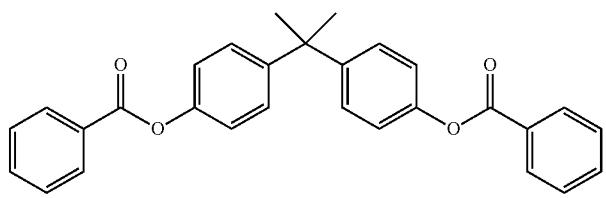 [SMILES: CC(C)(c1ccc(OC(=O)c2ccccc2)cc1)c1ccc(OC(=O)c2ccccc2)cc1] | WO2006100298 |
| Carbazole linked by conjugated groups | 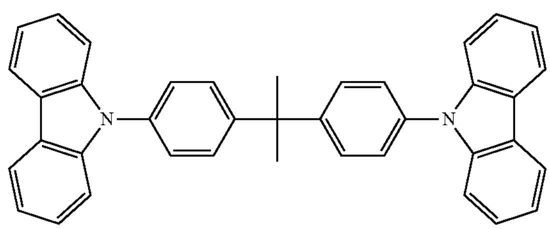 [SMILES: CC(C)(c1ccc(-n2c3ccccc3c3ccccc32)cc1)c1ccc(-n2c3ccccc3c3ccccc32)cc1] | US20040115476 |
| Aza-carbazoles | 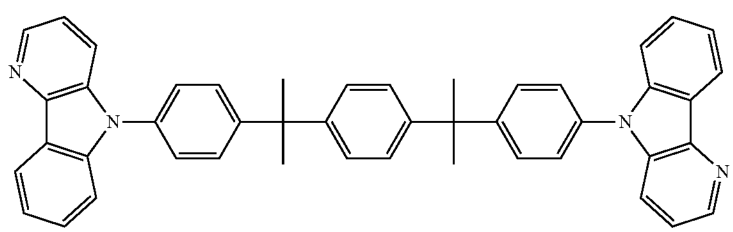 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| High triplet metal organometallic complex | 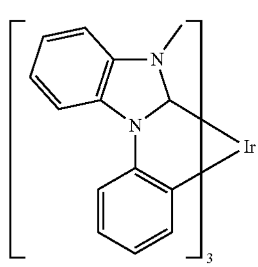 | U.S. Pat. No. 7,154,114 |

TABLE 2-continued
| MATERIAL | EXAMPLES OF MATERIAL Hole injection materials | PUBLICATIONS |
|---|---|---|
| | Phosphorescent dopants Red dopants | |
| Heavy metal porphyrins (e.g., PtOEP) | 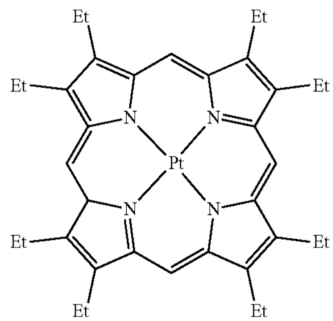 | Nature 395, 151 (1998) |
| Iridium(III) organometallic complexes | 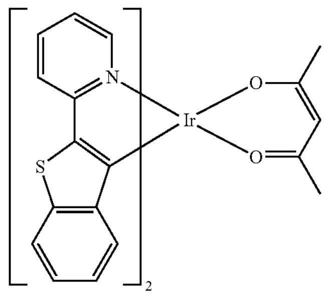 | Appl. Phys. Lett. 78, 1622 (2001) |
| | 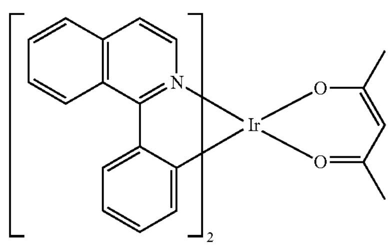 | US2006835469 |
| | 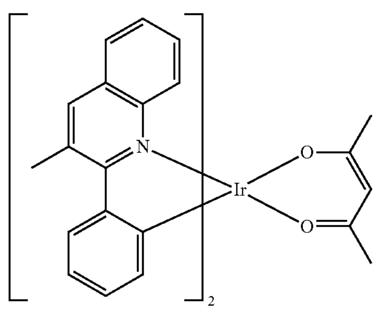 | US2006835469 |
| | 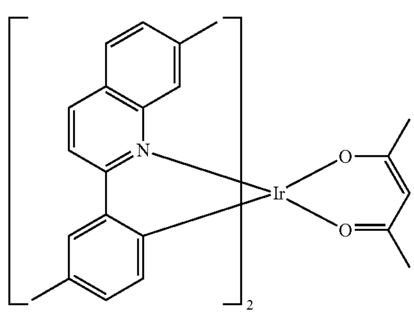 | US20060202194 |

TABLE 2-continued
| MATERIAL | EXAMPLES OF MATERIAL<br>Hole injection materials | PUBLICATIONS |
|---|---|---|
| | 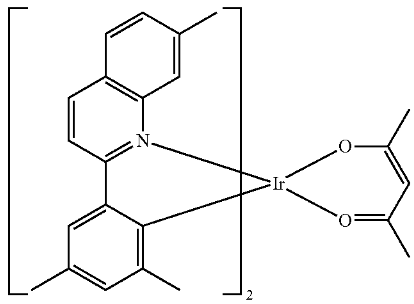 | US20060202194 |
| | 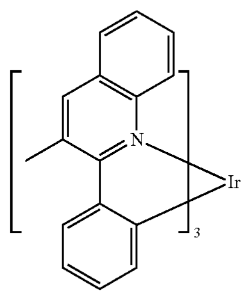 | US20070087321 |
| | 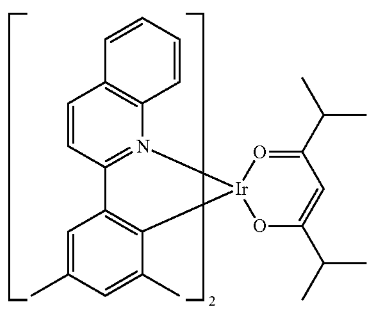 | US20080261076<br>US20100090591 |
| | 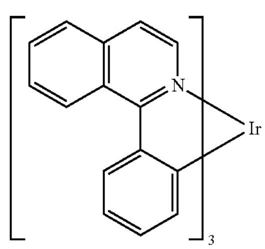 | US20070087321 |
| | 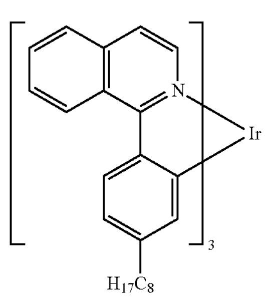 | Adv. Mater. 19, 739 (2007) |

TABLE 2-continued
| MATERIAL | EXAMPLES OF MATERIAL<br>Hole injection materials | PUBLICATIONS |
|---|---|---|
| | 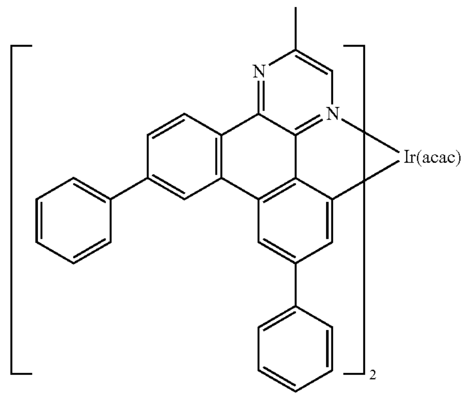 | WO2009100991 |
| | 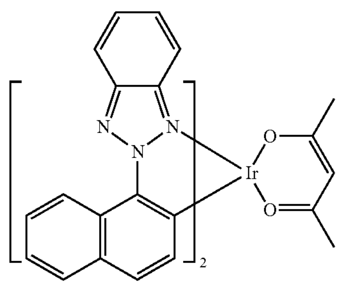 | WO2008101842 |
| | 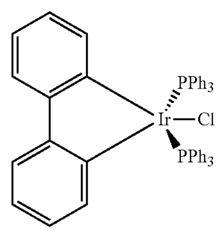 | U.S. Pat. No. 7,232,618 |
| Platinum(II) organometallic complexes | 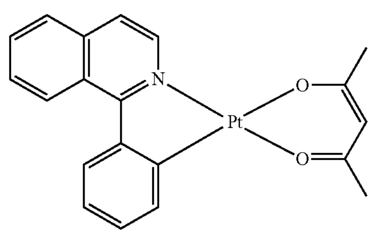 | WO2003040257 |
| | 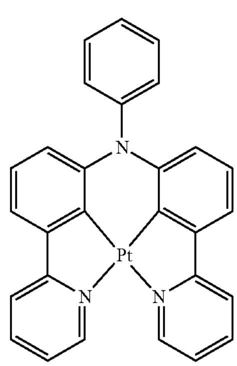 | US20070103060 |

TABLE 2-continued
| MATERIAL | EXAMPLES OF MATERIAL | PUBLICATIONS |
|---|---|---|
| | Hole injection materials | |
| Osminum(III) complexes | 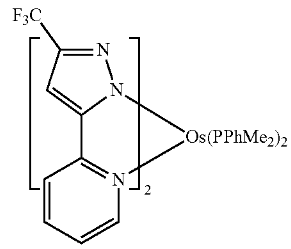 | Chem. Mater. 17, 3532 (2005) |
| Ruthenium(II) complexes | 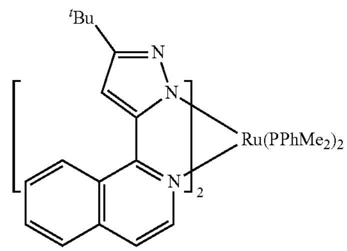 | Adv. Mater. 17, 1059 (2005) |
| Rhenium (I), (II), and (III) complexes | 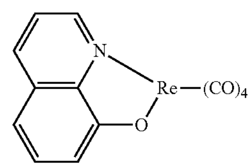 | US20050244673 |
| | Green dopants | |
| Iridium(III) organometallic complexes | 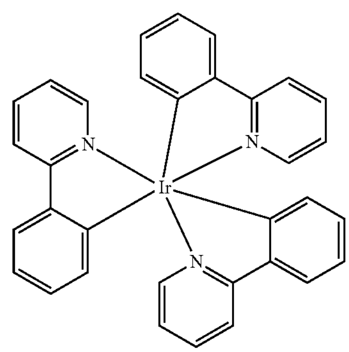 and its derivatives | Inorg. Chem. 40, 1704 (2001) |
| | 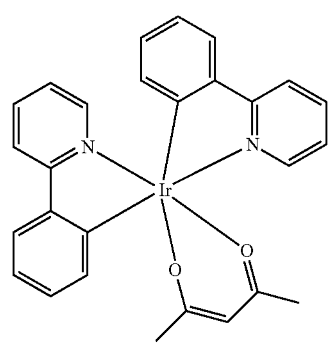 | US20020034656 |

TABLE 2-continued
| MATERIAL | EXAMPLES OF MATERIAL<br>Hole injection materials | PUBLICATIONS |
|---|---|---|
| | 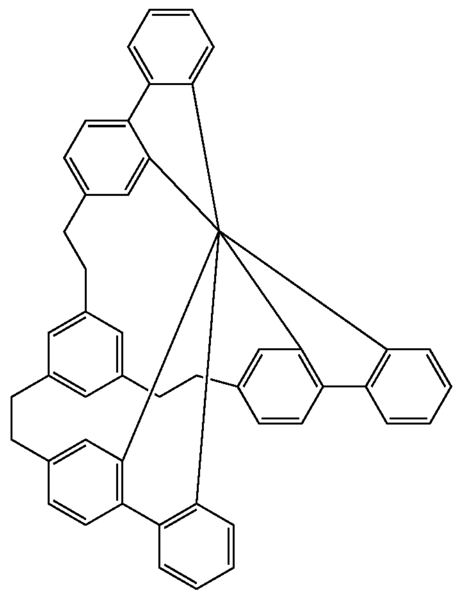 | U.S. Pat. No. 7,332,232 |
| | 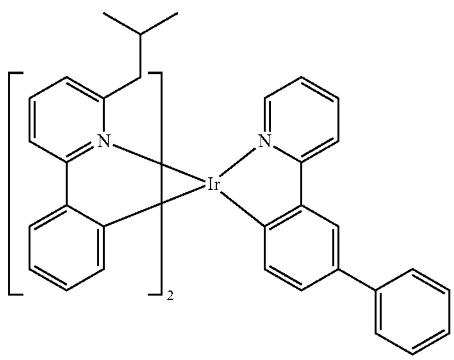 | US20090108737 |
| | 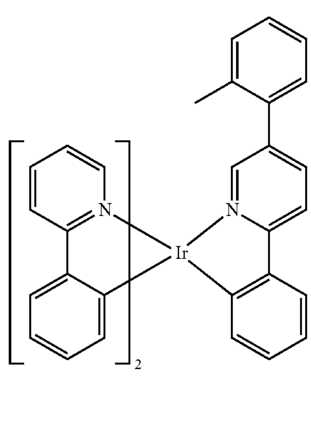 | WO2010028151 |

TABLE 2-continued
| MATERIAL | EXAMPLES OF MATERIAL<br>Hole injection materials | PUBLICATIONS |
|---|---|---|
| | 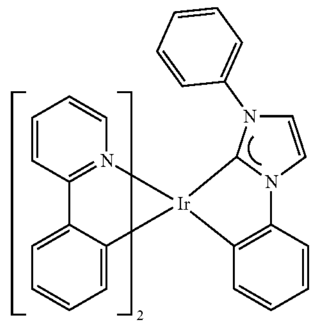 | EP1841834B |
| | 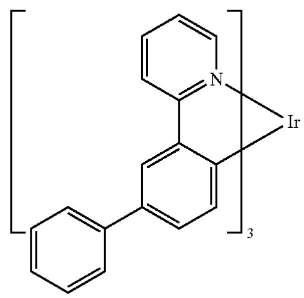 | US20060127696 |
| | 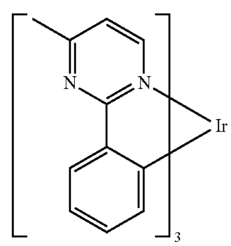 | US20090039776 |
| | 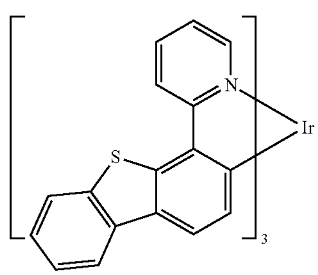 | U.S. Pat. No. 6,921,915 |
| | 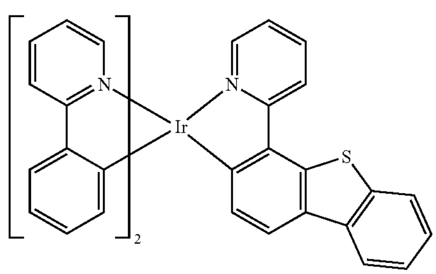 | US20100244004 |

TABLE 2-continued
| MATERIAL | EXAMPLES OF MATERIAL<br>Hole injection materials | PUBLICATIONS |
|---|---|---|
| | 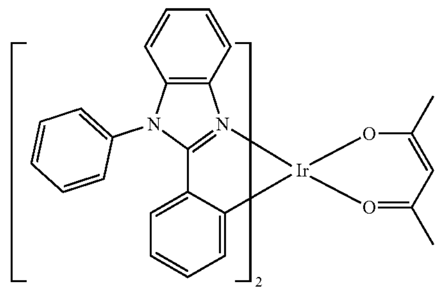 | U.S. Pat. No. 6,687,266 |
| | 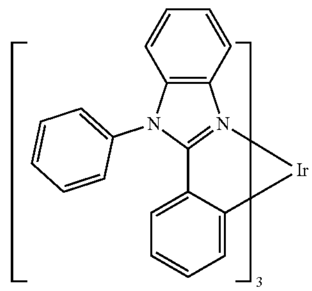 | Chem. Mater. 16, 2480 (2004) |
| | 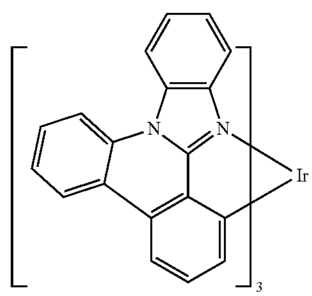 | US20070190359 |
| | 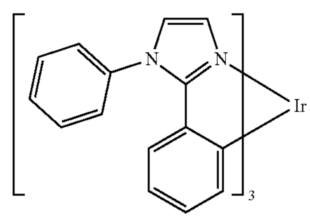 | US 20060008670<br>JP2007123392 |
| | 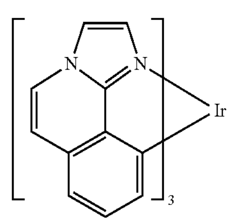 | WO2010086089,<br>WO2011044988 |
| | 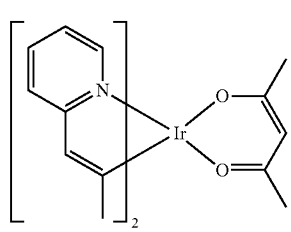 | Adv. Mater. 16, 2003 (2004) |

TABLE 2-continued
| MATERIAL | EXAMPLES OF MATERIAL Hole injection materials | PUBLICATIONS |
|---|---|---|
| | 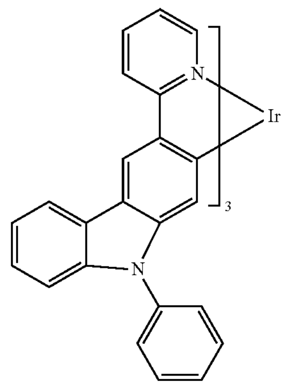 | Angew. Chem. Int. Ed. 2006, 45, 7800 |
| | 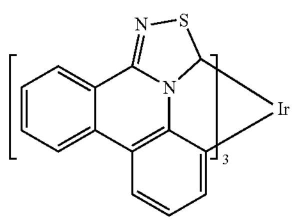 | WO2009050290 |
| | 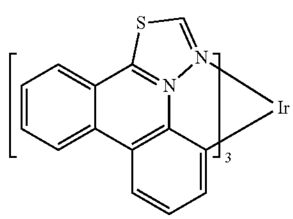 | US20090165846 |
| | 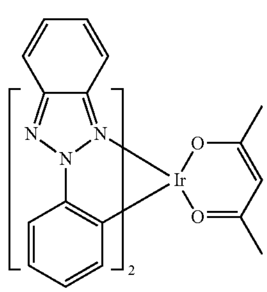 | US20080015355 |
| | 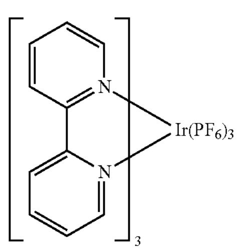 | US20010015432 |

TABLE 2-continued
| MATERIAL | EXAMPLES OF MATERIAL<br>Hole injection materials | PUBLICATIONS |
|---|---|---|
| | 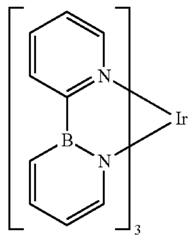 | US20100295032 |
| Monomer for polymeric metal organometallic compounds | 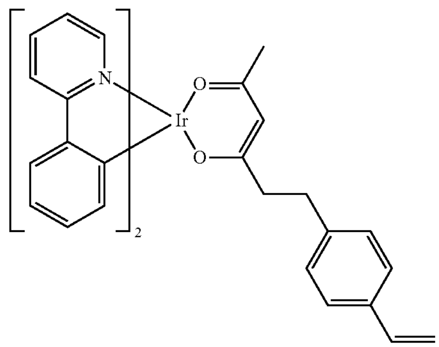 | U.S. Pat. No. 7,250,226, U.S. Pat. No. 7,396,598 |
| Pt(II) organometallic complexes, including polydentated ligands | 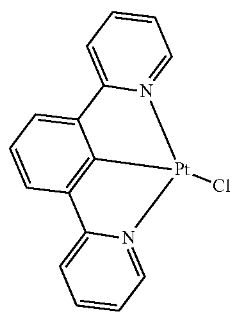 | Appl. Phys. Lett. 86, 153505 (2005) |
| | 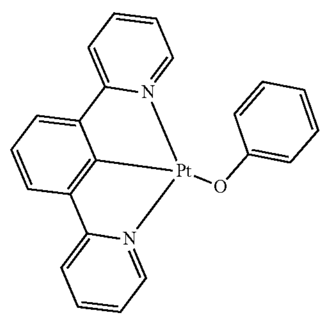 | Appl. Phys. Lett. 86, 153505 (2005) |
| | 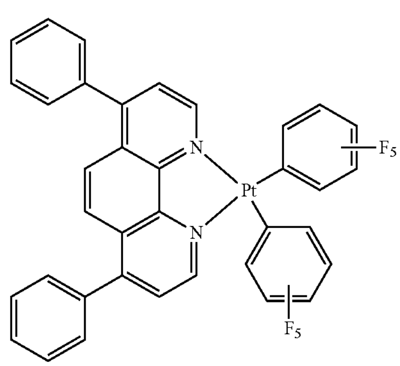 | Chem. Lett. 34, 592 (2005) |

TABLE 2-continued
| MATERIAL | EXAMPLES OF MATERIAL<br>Hole injection materials | PUBLICATIONS |
|---|---|---|
| | 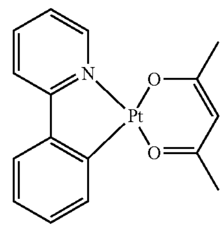 | WO2002015645 |
| | 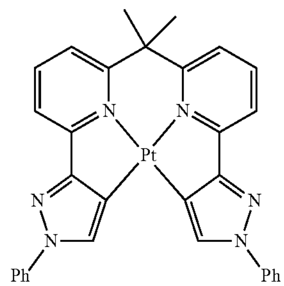 | US20060263635 |
| | 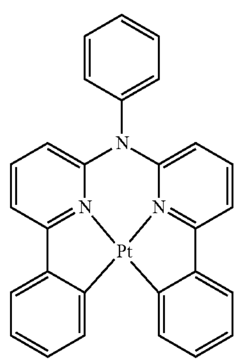 | US20060182992<br>US20070103060 |
| Cu complexes | 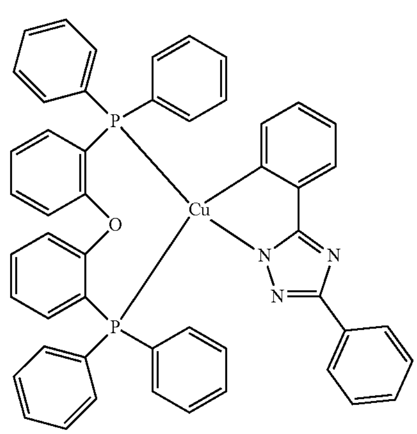 | WO2009000673 |

TABLE 2-continued
| MATERIAL | EXAMPLES OF MATERIAL<br>Hole injection materials | PUBLICATIONS |
|---|---|---|
| | 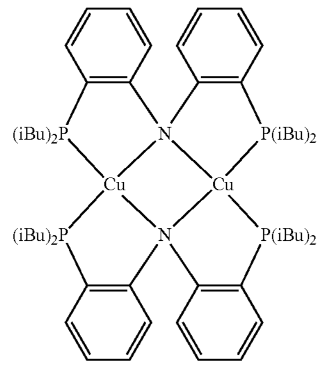 | US20070111026 |
| Gold complexes | 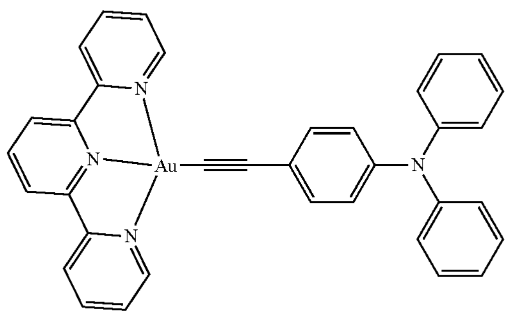 | Chem. Commun. 2906 (2005) |
| Rhenium(III) complexes | 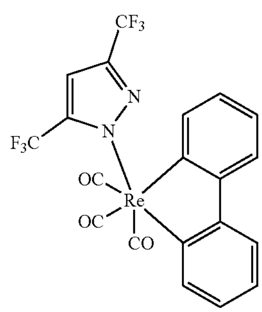 | Inorg. Chem. 42, 1248 (2003) |
| Osmium(II) complexes | 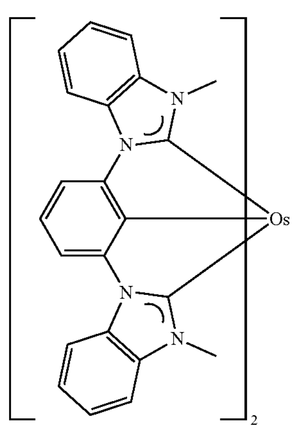 | U.S. Pat. No. 7,279,704 |

TABLE 2-continued
| MATERIAL | EXAMPLES OF MATERIAL | PUBLICATIONS |
|---|---|---|
| | Hole injection materials | |
| Deuterated organometallic complexes | 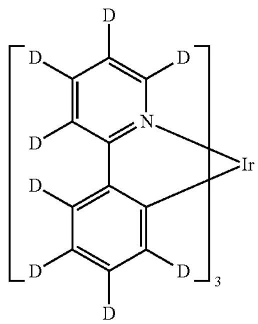 | US20030138657 |
| Organometallic complexes with two or more metal centers | 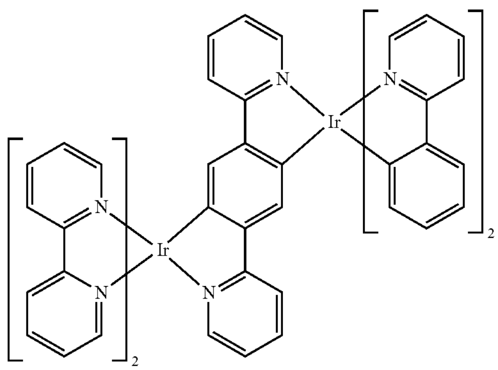 | US20030152802 |
| | 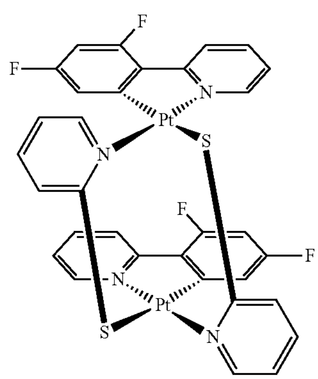 | U.S. Pat. No. 7,090,928 |
| | Blue dopants | |
| Iridium(III) organometallic complexes | 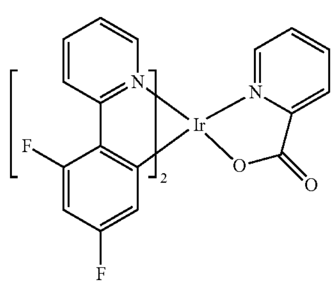 | WO2002002714 |

TABLE 2-continued
| MATERIAL | EXAMPLES OF MATERIAL | PUBLICATIONS |
| --- | --- | --- |
| | Hole injection materials | |
| | 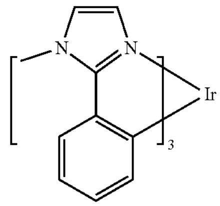 | WO2006009024 |
| | 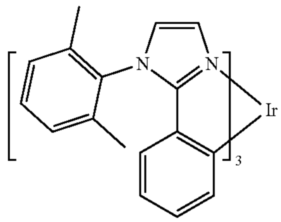 | US20060251923<br>US20110057559<br>US20110204333 |
| | 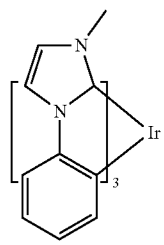 | U.S. Pat. No. 7,393,599,<br>WO2006056418,<br>US20050260441,<br>WO2005019373 |
| | 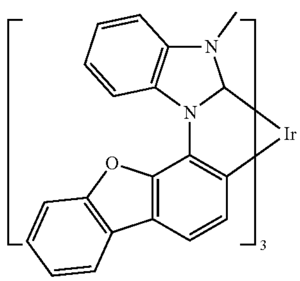 | U.S. Pat. No. 7,534,505 |
| | 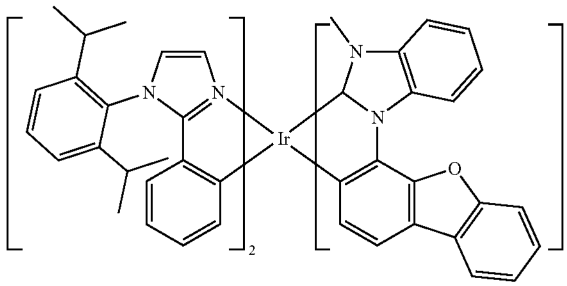 | WO2011051404 |
| | 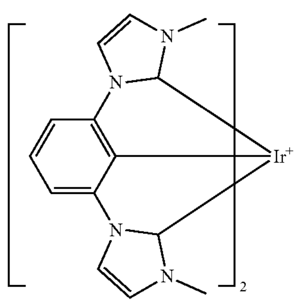 | U.S. Pat. No. 7,445,855 |

TABLE 2-continued
| MATERIAL | EXAMPLES OF MATERIAL<br>Hole injection materials | PUBLICATIONS |
|---|---|---|
| | 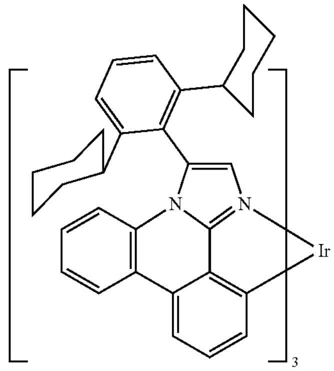 | US20070190359, US20080297033 US20100148663 |
| | 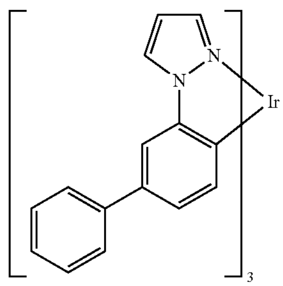 | U.S. Pat. No. 7,338,722 |
| | 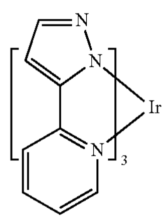 | US20020134984 |
| | 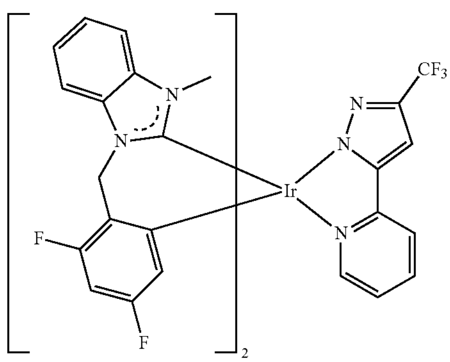 | Angew. Chem. Int. Ed. 47, 4542 (2008) |
| | 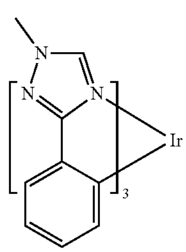 | Chem. Mater. 18, 5119 (2006) |

TABLE 2-continued
| MATERIAL | EXAMPLES OF MATERIAL Hole injection materials | PUBLICATIONS |
| --- | --- | --- |
| | 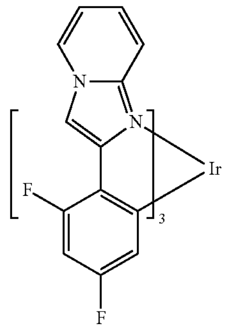 | Inorg. Chem. 46, 4308 (2007) |
| | 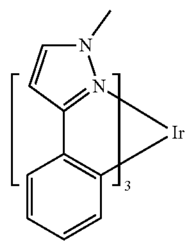 | WO2005123873 |
| | 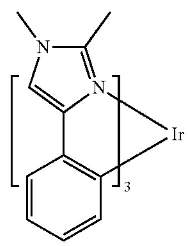 | WO2005123873 |
| | 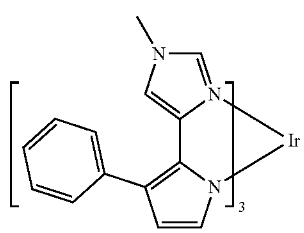 | WO2007004380 |
| | 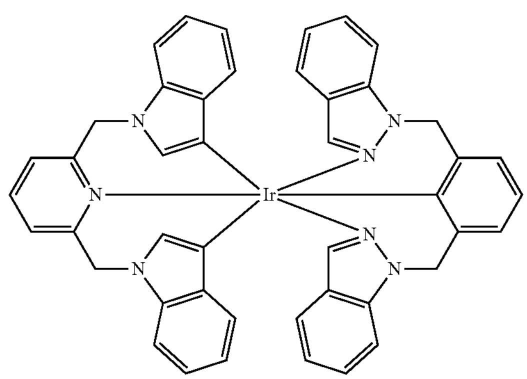 | WO2006082742 |

TABLE 2-continued
| MATERIAL | EXAMPLES OF MATERIAL | PUBLICATIONS |
|---|---|---|
| | Hole injection materials | |
| Osmium(II) complexes | 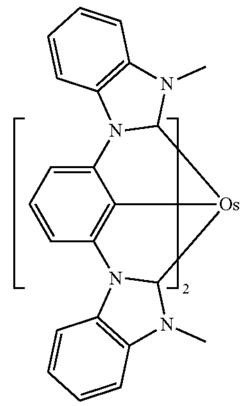 | U.S. Pat. No. 7,279,704 |
| | 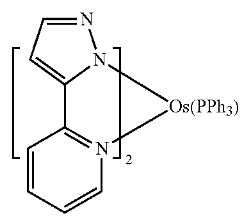 | Organometallics 23, 3745 (2004) |
| Gold complexes | 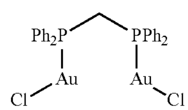 | Appl. Phys. Lett. 74, 1361 (1999) |
| Platinum(II) complexes | 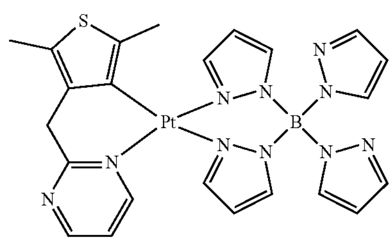 | WO2006098120, WO2006103874 |
| Pt tetradentate complexes with at least one metal-carbene bond | 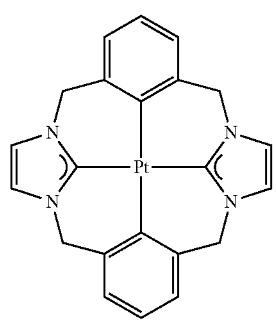 | U.S. Pat. No. 7,655,323 |
| | Exciton/hole blocking layer materials | |
| Bathocuproine compounds (e.g., BCP, BPhen) | 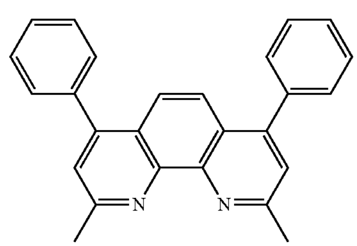 [SMILES: Cc1cc(-c2ccccc2)c2ccc3c(-c4ccccc4)cc(C)nc3c2n1] | Appl. Phys. Lett. 75, 4 (1999) |

TABLE 2-continued
| MATERIAL | EXAMPLES OF MATERIAL | PUBLICATIONS |
|---|---|---|
| | Hole injection materials | |
| | 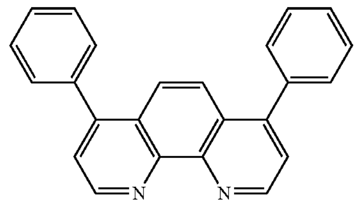 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 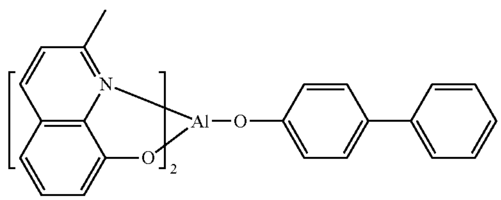 | Appl. Phys. Lett. 81, 162 (2002) |
| 5-member ring electron deficient heterocycles such as triazole, oxadiazole, imidazole, benzoimidazole | 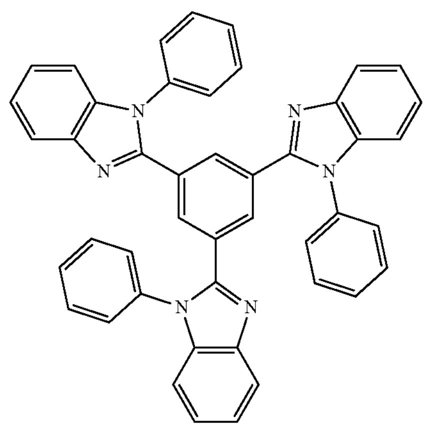 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |
| Triphenylene compounds | 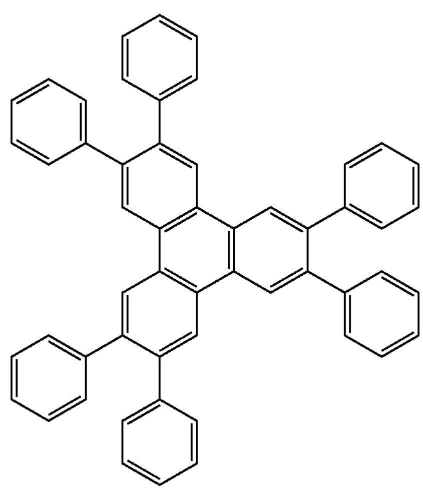 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |

TABLE 2-continued
| MATERIAL | EXAMPLES OF MATERIAL | PUBLICATIONS |
|---|---|---|
| | Hole injection materials | |
| Fluorinated aromatic compounds | 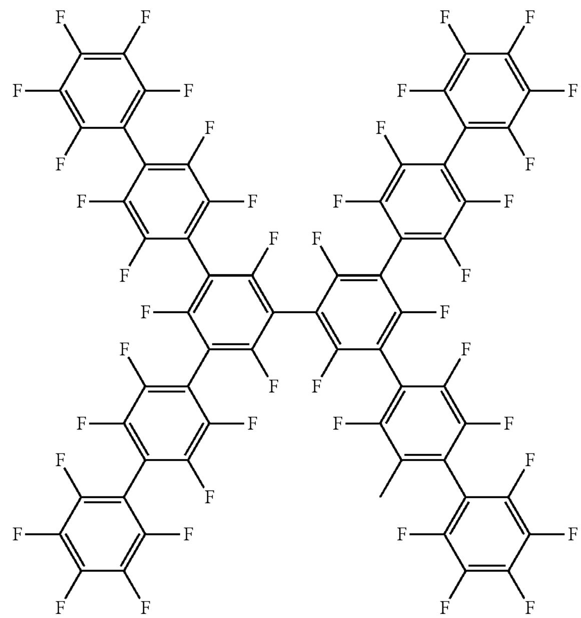 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 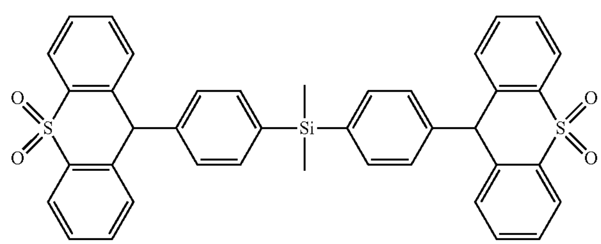 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
| Silylated five-membered nitrogen, oxygen, sulfur or phosphorus dibenzoheterocycles | 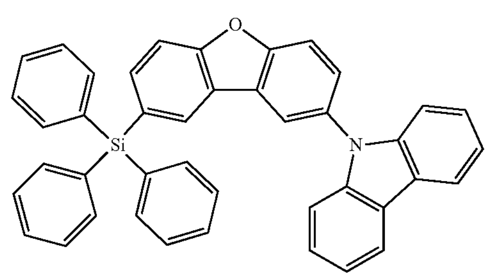 [SMILES: c1ccc([Si](c2ccccc2)(c2ccccc2)c2ccc3oc4ccc(-n5c6ccccc6c6ccccc65)cc4c3c2)cc1] | WO2010079051 |
| Aza-carbazoles | 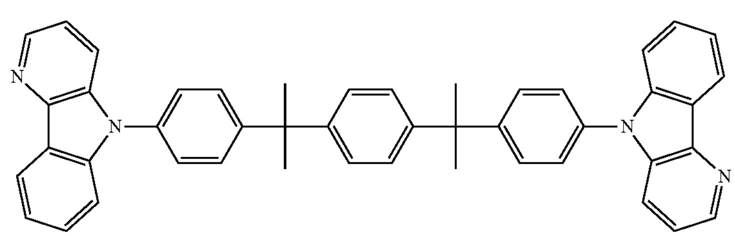 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |

TABLE 2-continued
| MATERIAL | EXAMPLES OF MATERIAL<br>Hole injection materials | PUBLICATIONS |
| --- | --- | --- |
| | Electron transporting materials | |
| Anthracene-benzoimidazole compounds | 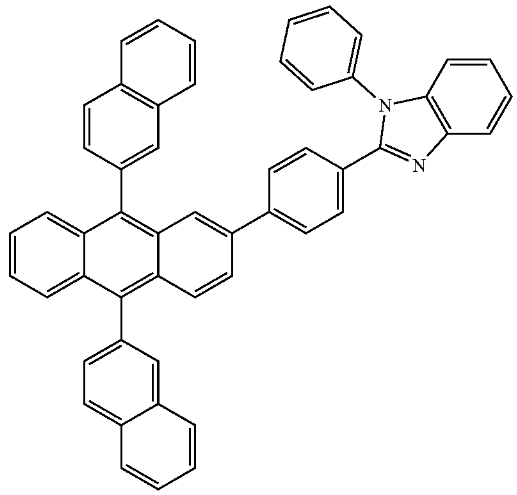 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
| | 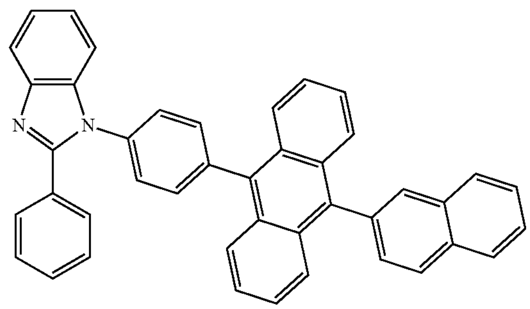 [SMILES: c1ccc(-c2nc3ccccc3n2-c2ccc(-c3c4ccccc4c(-c4ccc5ccccc5c4)c4ccccc34)cc2)cc1] | US20090179554 |
| Aza triphenylene derivatives | 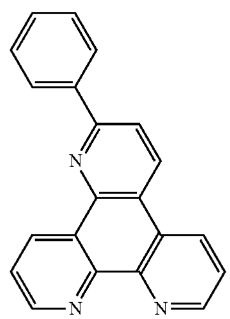 [SMILES: c1ccc(-c2ccc3c4cccnc4c4ncccc4c3n2)cc1] | US20090115316 |
| Anthracene-benzothiazole compounds | 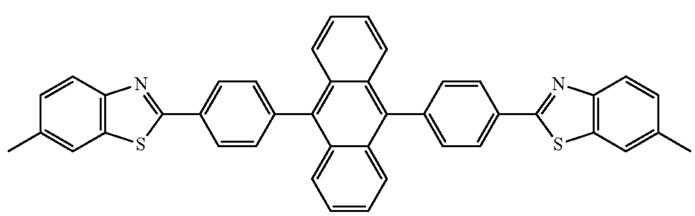 | Appl. Phys. Lett. 89, 063504 (2006) |
| Metal 8-hydroxyquinolates (e.g., $Alq_3$, $Zrq_4$) | 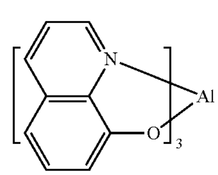 | Appl. Phys. Lett. 51, 913 (1987)<br>U.S. Pat. No. 7,230,107 |

TABLE 2-continued
| MATERIAL | EXAMPLES OF MATERIAL | PUBLICATIONS |
|---|---|---|
| | Hole injection materials | |
| Metal hydroxybenoquinolates | 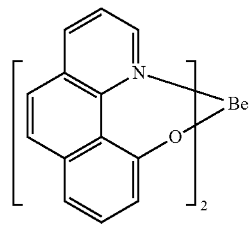 | Chem. Lett. 5, 905 (1993) |
| Bathocuprine compounds such as BCP, BPhen, etc | 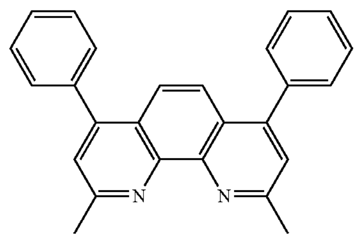 [SMILES: Cc1cc(-c2ccccc2)c2ccc3c(-c4ccccc4)cc(C)nc3c2n1] | Appl. Phys. Lett. 91, 263503 (2007) |
| | 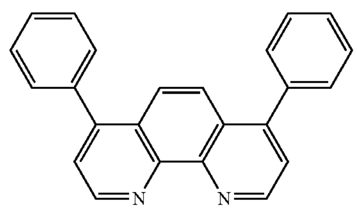 [SMILES: c1ccc(-c2ccnc3c2ccc2c(-c4ccccc4)ccnc23)cc1] | Appl. Phys. Lett. 79, 449 (2001) |
| 5-member ring electron deficient heterocycles (e.g., triazole, oxadiazole, imidazole, benzoimidazole) | 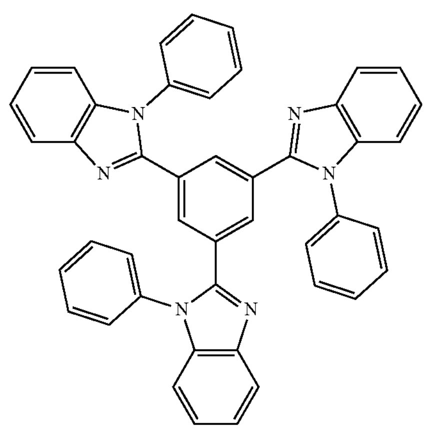 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 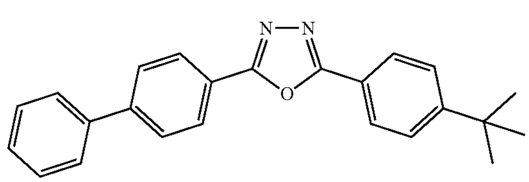 [SMILES: CC(C)(C)c1ccc(-c2nnc(-c3ccc(-c4ccccc4)cc3)o2)cc1] | Appl. Phys. Lett. 55, 1489 (1989) |
| | 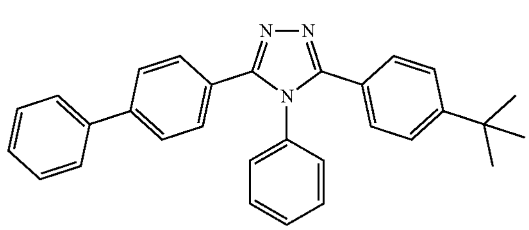 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |

TABLE 2-continued
| MATERIAL | EXAMPLES OF MATERIAL | PUBLICATIONS |
|---|---|---|
| | Hole injection materials | |
| Silole compounds | 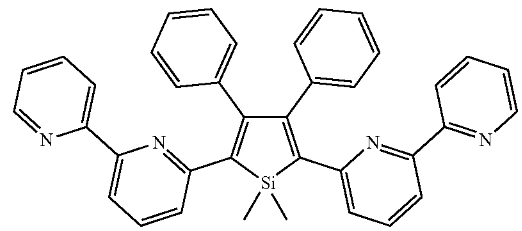 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 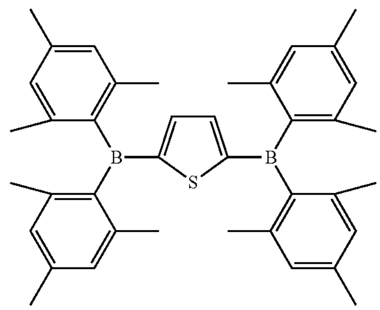 | J. Am. Chem. Soc. 120, 9714 (1998) |
| Fluorinated aromatic compounds | 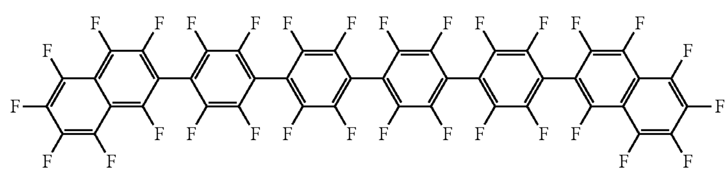 [SMILES: Fc1c(F)c(-c2c(F)c(F)c(-c3c(F)c(F)c4c(F)c(F)c(F)c(F)c4c3F)c(F)c2F)c(F)c(F)c1-c1c(F)c(F)c(-c2c(F)c(F)c(-c3c(F)c(F)c4c(F)c(F)c(F)c(F)c4c3F)c(F)c2F)c(F)c1F] | J. Am. Chem. Soc. 122, 1832 (2000) |
| Fullerene (e.g., C60) | 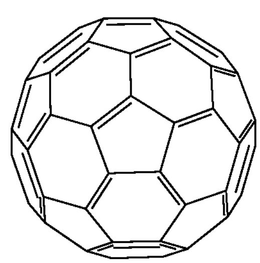 | US20090101870 |
| Triazine complexes | 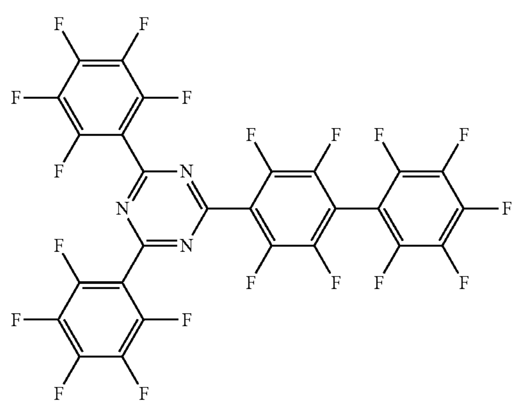 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |

TABLE 2-continued

| MATERIAL | EXAMPLES OF MATERIAL | PUBLICATIONS |
|---|---|---|
| | Hole injection materials | |
| Zn (N^N) complexes | 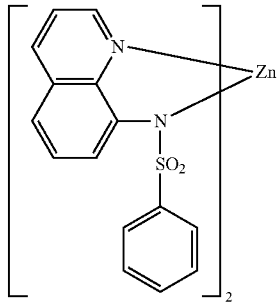 | U.S. Pat. No. 6,528,187 |

Experimental

Device Examples:

Materials used in the Example Devices:

Comparative Compounds used are:

Comparative Compound 1

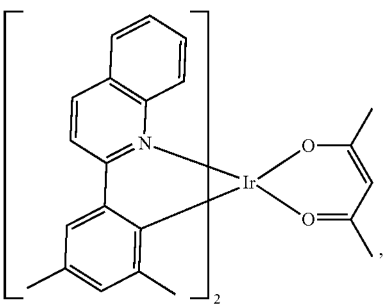

Comparative Compound 2

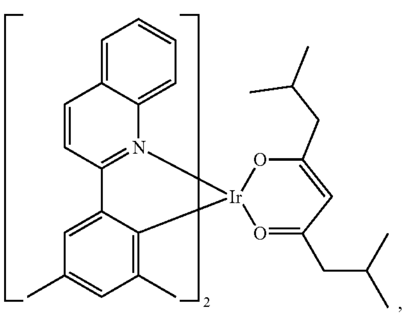

Comparative Compound 3

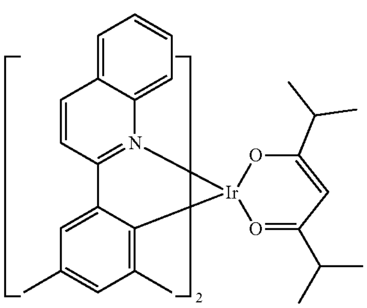

and

-continued

Comparative Compound 4

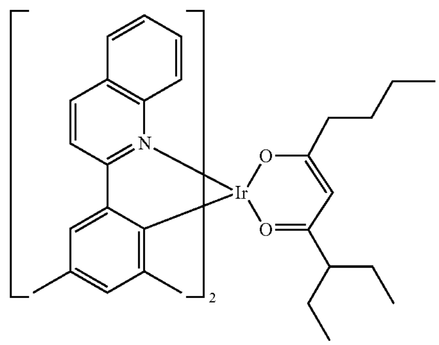

Other Material used in the Devices:

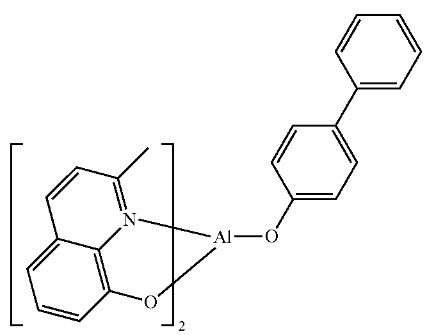

BAlQ

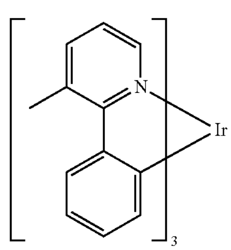

Compound SD

-continued

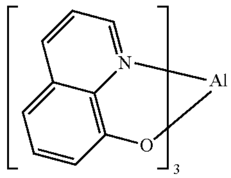

AlQ

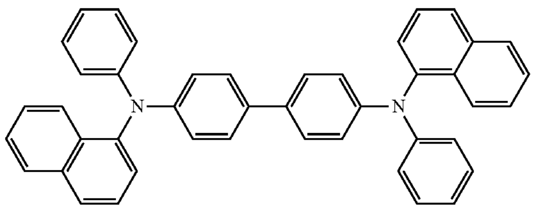

NPD

-continued

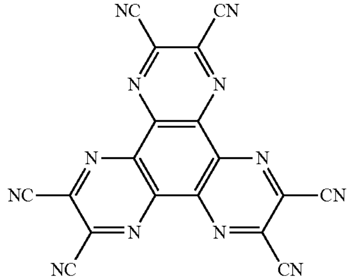

HAT-CN

All example devices were fabricated by high vacuum (<$10^{-7}$ Torr) thermal evaporation. The anode electrode is 1200 Å of indium tin oxide (ITO). The cathode consisted of 10 Å of LiF followed by 1,000 Å of Al. All devices are encapsulated with a glass lid sealed with an epoxy resin in a nitrogen glove box (<1 ppm of $H_2O$ and $O_2$) immediately after fabrication, and a moisture getter was incorporated inside the package.

The organic stack of the example devices consisted of sequentially from the ITO surface, 100 Å of HAT-CN as the hole injection layer (HIL), 400 Å of NPD as the hole transporting layer (HTL), 400 Å of the emissive layer (EML) which contains the compound of Formula 1, Compound SD, and Host (BAlQ), 40 Å of BAlQ as the blocking layer (BL), 450 Å of Al $Q_3$ as the electron transporting layer (ETL) and 10 Å of LiF as the electron injection layer (EIL). The comparative examples were fabricated similarly to the device examples except that the Comparative Compounds 1-4 were used as the emitter in the EML.

TABLE 3

Devices structures of inventive compounds and comparative compounds

| Example | HIL | HTL | EML (400 Å, doping %) | | | BL | ETL |
|---|---|---|---|---|---|---|---|
| Example 1 | HAT-CN 100Å | NPD 400Å | BAlQ 88% | Compound SD 9% | Compound 8 3% | BAlQ 40Å | $AlQ_3$ 450Å |
| Comparative Example 1 | HAT-CN 100Å | NPD 400Å | BAlQ 88% | Compound SD 9% | Comparative Compound 1 3% | BAlQ 40Å | $AlQ_3$ 450Å |
| Comparative Example 2 | HAT-CN 100Å | NPD 400Å | BAlQ 88% | Compound SD 9% | Comparative Compound 2 3% | BAlQ 40Å | $AlQ_3$ 450Å |
| Comparative Example 3 | HAT-CN 100Å | NPD 400Å | BAlQ 88% | Compound SD 9% | Comparative Compound 3 3% | BAlQ 40Å | $AlQ_3$ 450Å |
| Comparative Example 4 | HAT-CN 100Å | NPD 400Å | BAlQ 88% | Compound SD 9% | Comparative Compound 4 3% | BAlQ 40Å | $AlQ_3$ 450Å |

TABLE 4

Device results[1]

| | 1931 CIE | | | At 1,000 nits | | | |
|---|---|---|---|---|---|---|---|
| Example | CIE x | CIE y | FWHM [a.u.] | Voltage [a.u.] | LE [a.u.] | EQE [a.u.] | PE [a.u.] |
| Compound 8 | 0.66 | 0.34 | 1.00 | 1.00 | 1.00 | 1.00 | 1.00 |
| Comparative Compound 1 | 0.67 | 0.33 | 1.11 | 1.09 | 0.78 | 0.90 | 0.71 |
| Comparative Compound 2 | 0.66 | 0.34 | 1.07 | 1.05 | 0.84 | 0.91 | 0.82 |
| Comparative Compound 3 | 0.66 | 0.34 | 1.04 | 1.06 | 0.86 | 0.94 | 0.81 |

TABLE 4-continued

| Device results[1] | | | | | | | |
|---|---|---|---|---|---|---|---|
| | 1931 CIE | | | At 1,000 nits | | | |
| Example | CIE x | CIE y | FWHM [a.u.] | Voltage [a.u.] | LE [a.u.] | EQE [a.u.] | PE [a.u.] |
| Comparative Compound 4 | 0.66 | 0.34 | 1.04 | 1.03 | 0.89 | 0.93 | 0.86 |

[1]All values in Table 4 are relative numbers (arbitrary units a.u.) except for the CIE coordinates.

Table 4 is a summary of the device data. The luminous efficiency (LE), external quantum efficiency (EQE) and power efficiency (PE) were measured at 1000 nits. The inventive Compound 8 shows similar CIE to the comparative compounds since the emission color of these compounds are dominated by the Phenylquinoline ligand. However, the emission spectrum of Compound 8 is narrower than that of the comparative compounds as can be seen from the full width at the half maximum (FWHM) values in table 2. A smaller FWHM value means narrower emission spectrum. The device measurements show that all characteristics are better when a new ancillary ligand as disclosed here is used. For example, a relative driving voltage of 1.00 was obtained for Compound 8 whereas that voltage was between 1.03 and 1.09 for the comparative examples. As for the luminous efficacy (LE), it is much better than for the comparative example where it varies from 78 to 89% of the value for Compound 8. The same trend was found for the external quantum efficiency (EQE) and the power efficacy where the data for Compound 8 is higher compared to the comparative examples.

Table 5 below shows the unexpected performance improvement exhibited by an example of the inventive compounds, Compound 12, over Comparative Compounds 5 and 6 by way of each compounds' photoluminescence quantum yield (PLQY):

TABLE 5

| Compound Structure | PLQY in 5% PMMA film |
|---|---|
| 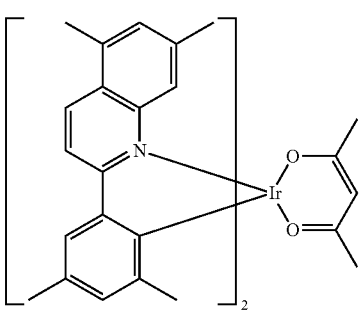 Comparative Compound 5 | 34% |
| 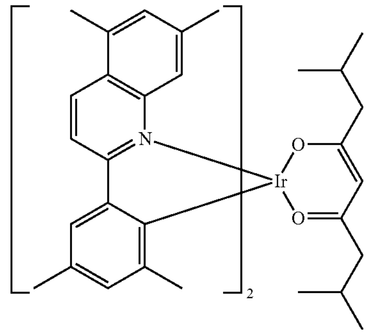 Comparative Compound 6 | 57% |
| 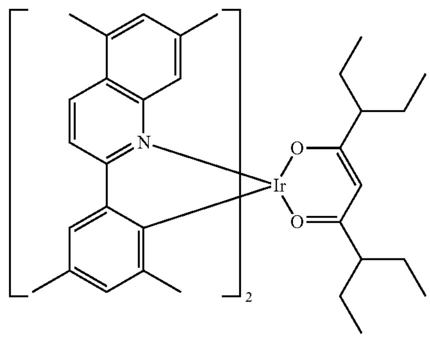 Compound 12 | 59% |

Inventive Compound 12 showed higher PLQY than the comparative compounds. Higher PLQY is desirable for emitters in OLEDs for high EQE.

Material Synthesis:

All reactions were carried out under nitrogen protections unless specified otherwise. All solvents for reactions are anhydrous and used as received from commercial sources.

Synthesis of Compound 8

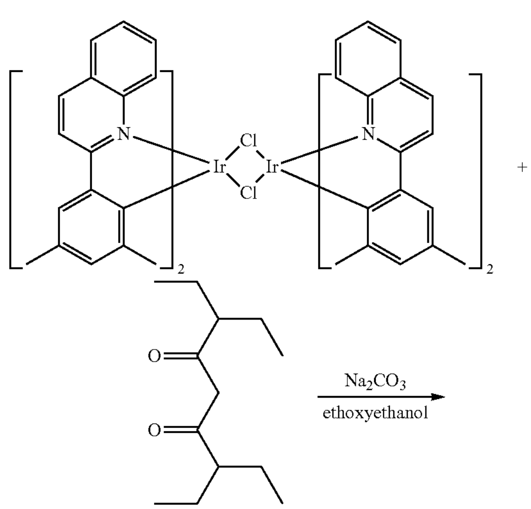

-continued

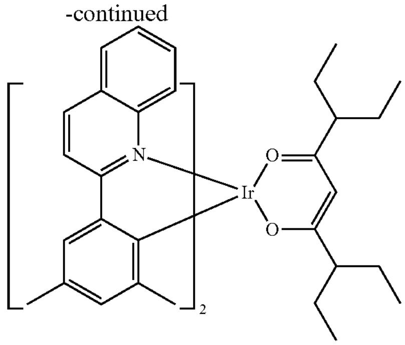

To the Iridium (III) dimer (1.50 g, 1.083 mmol) was added 3,7-diethylnonane-4,6-dione (1.725 g, 8.13 mmol) and the mixture was solubilized in 2-ethoxyethanol (40 mL). The mixture was degassed by bubbling nitrogen for 30 minutes and potassium carbonate (1.123 g, 8.13 mmol) was then added. The mixture was stirred at room temperature for 48 h followed by addition of 200 mL of isopropanol. The mixture was filtered through a Celite® plug and washed with dichloromethane. The solvent was evaporated and the crude product was purified by column chromatography using 20% dichloromethane (DCM) in heptanes in a triethylamine pre-treated silica gel column. The solid product was washed with methanol (20 mL) and filtered to obtain 0.220 g (10% yield) of pure dopant (99.5% on HPLC).

Synthesis of Compound 9

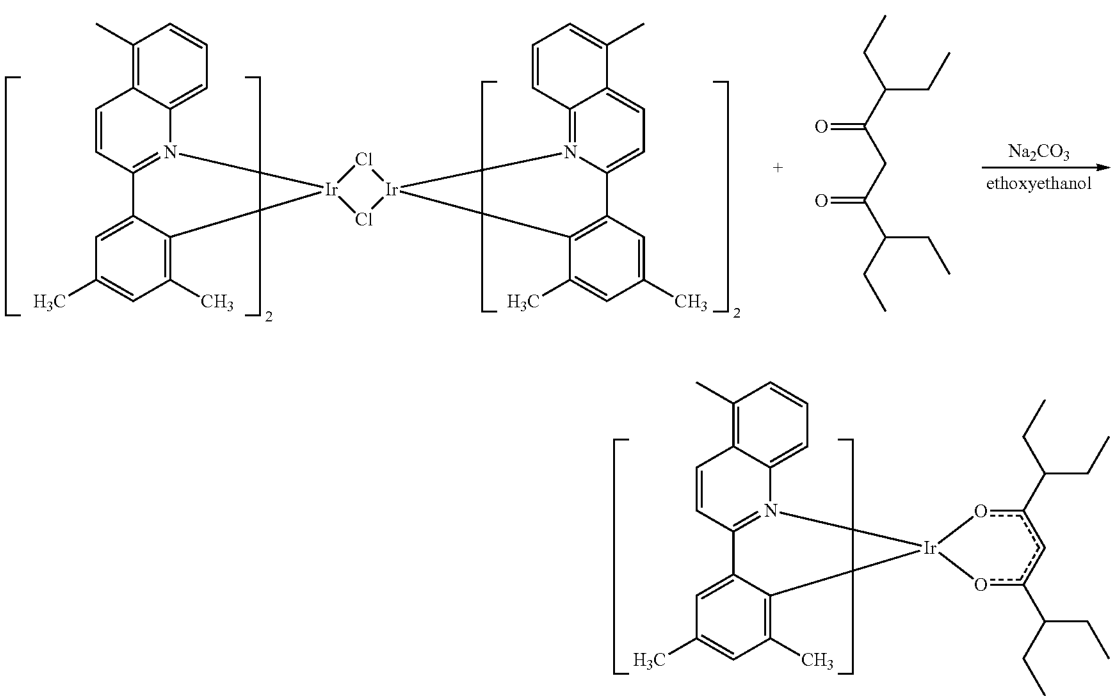

The Ir(III) Dimer (1.70 g, 1.18 mmol) and 3,7-diethylnonane-4,6-dione (2.51 g, 11.8 mmol) were dissolved in ethoxyethanol (50 mL), sodium carbonate (0.63 g, 5.90 mmol) was added followed with degassing by bubbling nitrogen through the mixture. The reaction mixture was stirred overnight at room temperature. The temperature was then increased to 45° C. for 2 hours. Upon cooling to room temperature, the precipitate was filtered through Celite®, washed with MeOH and heptanes. The filtrate with Celite® was suspended in DCM (containing 5% of $Et_3N$), filtered and evaporated. The red solid obtained (0.6 g) had a purity of 99.6% by HPLC.

Synthesis of Compound 12

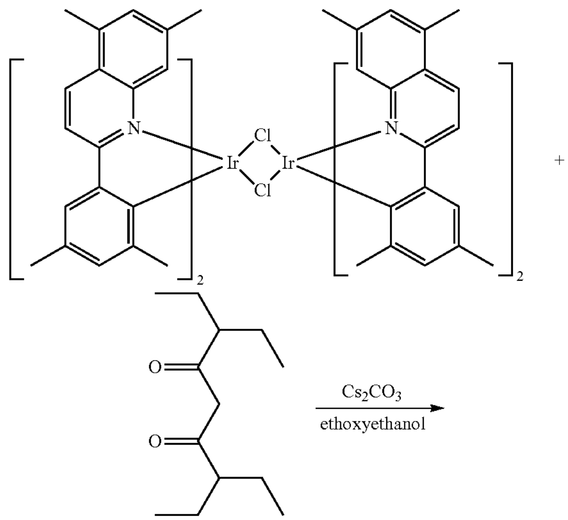

-continued

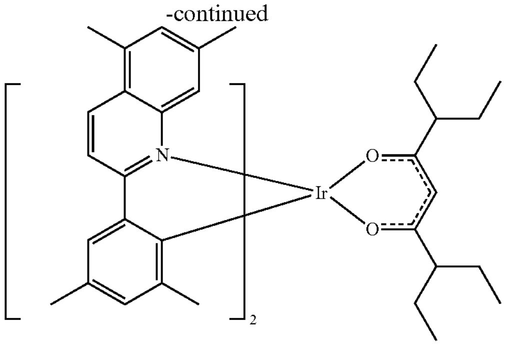

Iridium (III) dimer (1.75 g, 1.17 mmol) and 3,7-diethylnonane-4,6-dione (2.48 g, 11.7 mmol) were suspended in 2-ethoxyethanol (40 mL), degassed by bubbling nitrogen for 30 minutes and cesium carbonate (2.26 g, 11.7 mmol) was added to the solution. The mixture was then stirred at 90° C. overnight. Dichloromethane (100 mL) was added; the solution was filtered through a pad of Celite® and the pad was washed with dichloromethane. The solvents were evaporated and the red solid was coated on Celite® followed by purification by column chromatography on a triethylamine pre-treated silica gel column using 10% DCM in heptanes. Evaporation provided the red solid, which was washed with methanol to give a pure target compound (0.430 g, 40% yield) as a red solid.

Synthesis of Compound 32

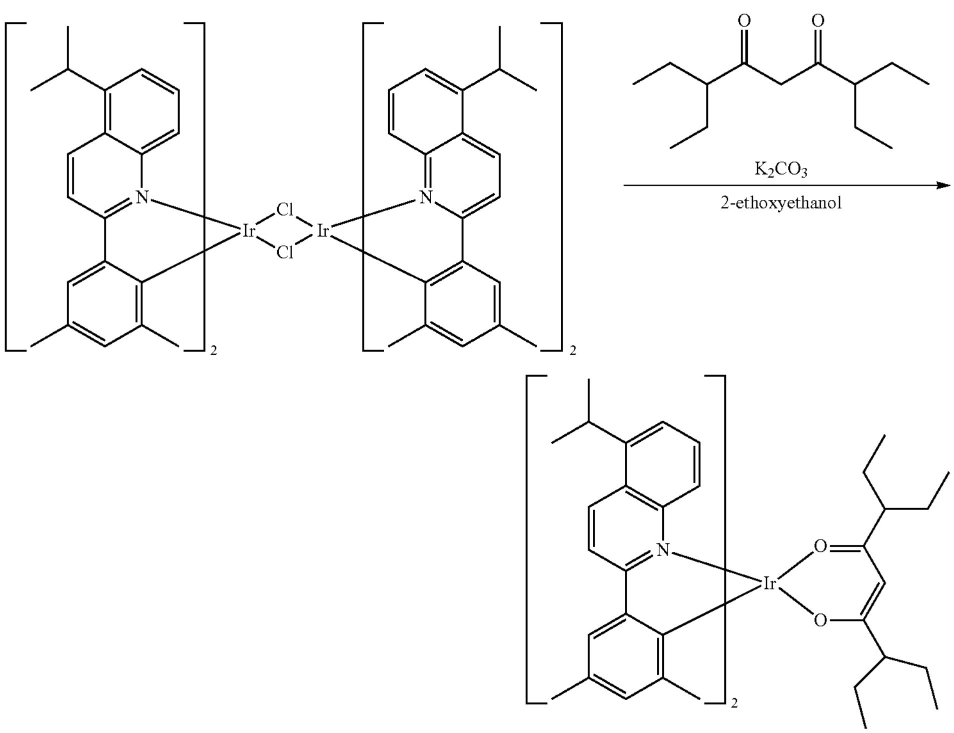

Ir(III) Dimer (1.32 g, 0.85 mmol) in 2-ethoxyethanol (40 mL) was degassed with nitrogen for 30 minutes and mixed with 3,7-diethylnonane-4,6-dione (1.81 g, 8.50 mmol) and potassium carbonate (1.18 g, 8.50 mmol). The reaction mixture was stirred at room temperature overnight. The mixture was then filtered through a plug of Celite® and washed with MeOH. The precipitate was extracted from Celite® with 5% $Et_3N/CH_2Cl_2$ affording 0.2 g of 99.9% pure material (HPLC). The filtrate was concentrated in vacuo, dissolved in DCM and crystallized by layering methanol on top. Crystals obtained are 99.6% pure and they were combined with other product for a total of 0.42 g (26% yield) of the title compound.

Synthesis of Compound 43

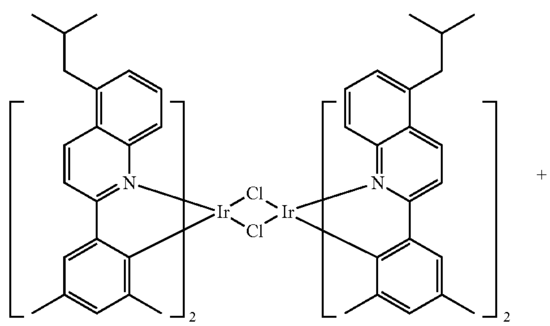

-continued

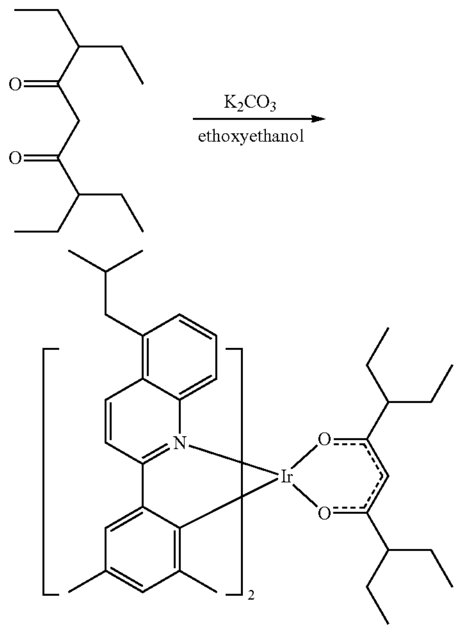

The Iridium (III) dimer (1.75 g, 1.09 mmol) and 3,7-diethylnonane-4,6-dione (2.31 g, 10.9 mmol) was diluted with 2-ethoxyethanol (40 mL), degassed by bubbling nitrogen for 30 minutes and potassium carbonate (1.50 g, 10.9 mmol) was added. The mixture was stirred at room temperature overnight. Dichloromethane (100 mL) was added; the reaction mixture was filtered through a pad of Celite® and the pad was washed with dichloromethane. The solvents were evaporated and the red solid was coated on Celite® followed by purification by column chromatography on a triethylamine pre-treated silica gel column using 10% DCM in heptanes as eluent. The red solid obtained was washed with methanol and re-purified by column chromatography by using 5% DCM in heptanes which affords the pure target compound (340 mg, 31% yield).

Synthesis of Compound 54

Synthesis of 5-cyclopentyl-2-(3,5-dimethylphenyl)quinoline

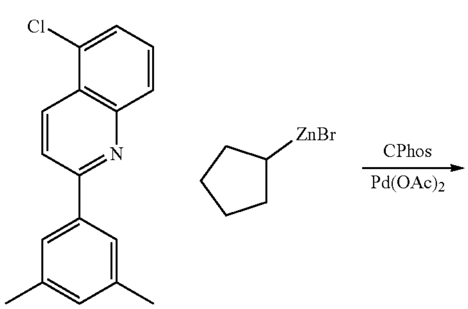

-continued

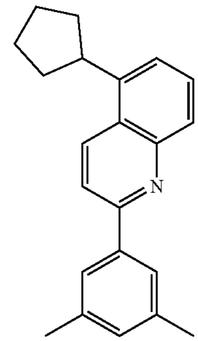

5-chloro-2-(3,5-dimethylphenyl)quinoline (4.29 g, 16.0 mmol), 2'-(dicyclohexylphosphino)-N2,N2,N6,N6-tetramethyl-[1,1'-biphenyl]-2,6-diamine (CPhos) (0.28 g, 0.64 mmol) and diacetoxypalladium (0.072 g, 0.320 mmol) were dissolved in anhydrous THF (60 mL). A solution of cyclopentylzinc(II) bromide (44.9 ml, 22.4 mmol) in THF (0.5 M) was added dropwise via syringe, and stirred at room temperature for 3 hours. The mixture was diluted in EA, washed with brine, dried with sodium sulfate, and concentrated under reduced pressure. The crude material was purified by column chromatography on silica, eluted with heptanes/EA 4/1 (v/v). The yellow powder was then recrystallized from heptanes to afford the title compound as colorless crystals (3.5 g, 72% yield).

Synthesis of Ir(III) Dimer

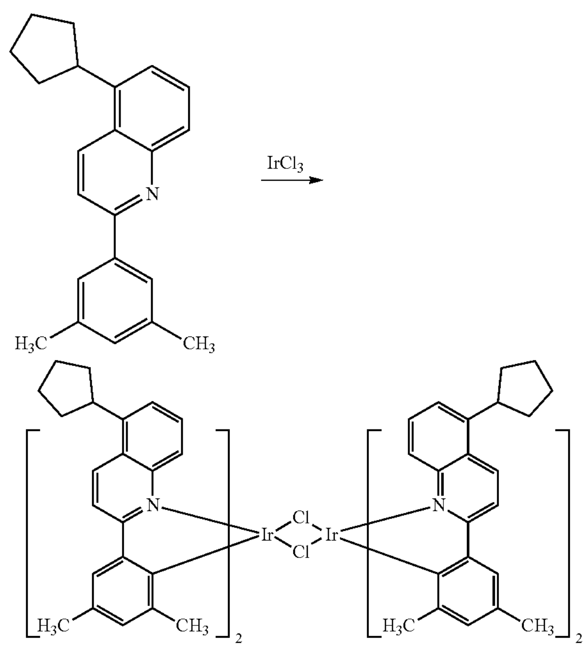

5-Cyclopentyl-2-(3,5-dimethylphenyl)quinoline (3.56 g, 11.8 mmol) and iridium(III) chloride trihydrate (1.30 g, 3.69 mmol) were dissolved in the mixture of ethoxyethanol (90 mL) and water (30 mL). Reaction mixture was degassed and heated to 105° C. for 24 h. The reaction mixture was then cooled down to room temperature and filtered through filter paper. The filtrate was washed with methanol and dried in vacuum, providing iridium complex dimer as dark solid 1.60 g (54% yield).

Synthesis of Compound 54

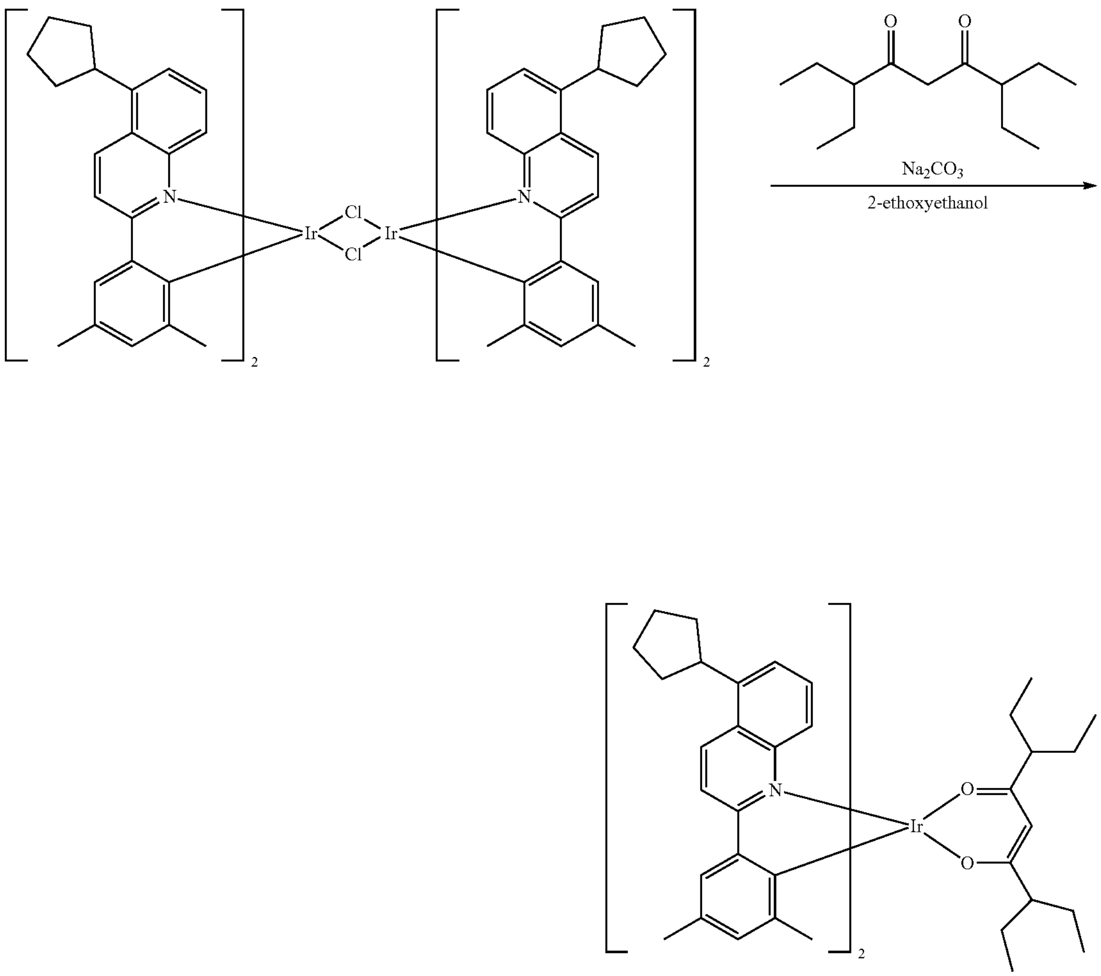

Iridium complex dimer (1.60 g, 1.00 mmol), 3,7-diethylnonane-4,6-dione (2.12 g, 9.98 mmol) and sodium carbonate (0.53 g, 4.99 mmol) were suspended in 50 mL of ethoxyethanol, and stirred overnight under $N_2$ at room temperature. The reaction mixture was then filtered through a pad of Celite®, washed with MeOH. Most of the red material was solubilized and passed through the Celite®. The Celite® was suspended in DCM, containing 10% of triethylamine and this suspension was combined with filtrate and evaporated. The residue was purified by column chromatography on silica gel, pre-treated with $Et_3N$, eluted with hexane/ethyl acetate 9/1 (v/v) mixture, providing a dark red solid. Additional purification with reverse-phase C18 column, eluted with acetonitrile provided after evaporation target complex as dark red solid (0.75 mg, 37% yield).

Synthesis of Compound 55

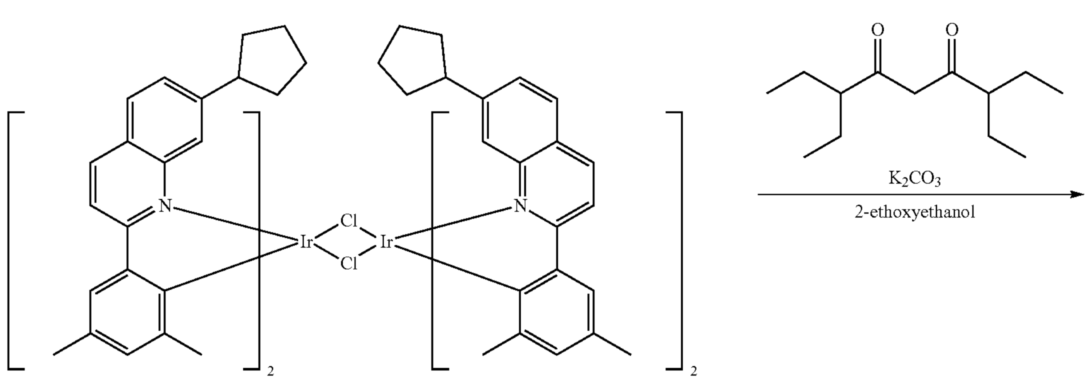

-continued

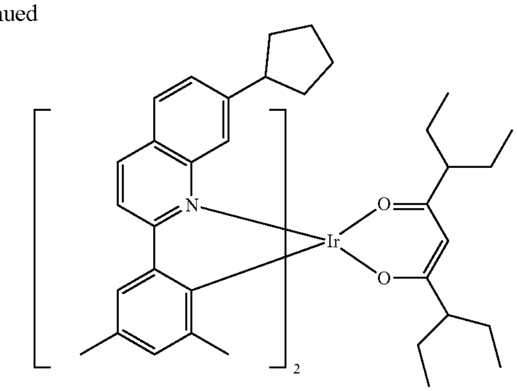

Ir(III) Dimer (2.40 g, 1.45 mmol), potassium carbonate (2.00 g, 14.5 mmol) and 3,7-diethylnonane-4,6-dione (3.08 g, 14.5 mmol) were suspended in 40 mL of ethoxyethanol, degassed and stirred overnight at 45° C. The reaction mixture was cooled down to room temperature and filtered through a pad of Celite®, the pad was washed with cold MeOH. The precipitate combined with the pad of Celite® were suspended in 50 mL of DCM with 5% of $Et_3N$, and filtered through silica plug. The solution was evaporated, providing red solid. Crystallization from DCM/Acetonitrile/MeOH mixture provided 1.4 g of target complex (48% yield).

Synthesis of Compound 62

To a 500 mL round bottom flask was added the chloro-bridged dimer (6.08 g, 3.54 mmol), 3,7-diethylnonane-4,6-dione (4.26 g, 20.06 mmol), sodium carbonate (3.75 g, 35.4 mmol), and 120 mL 2-ethoxyethanol. The reaction mixture was stirred overnight under nitrogen. The reaction mixture was poured onto a plug containing Celite®, basic alumina, and silica gel. The plug was pretreated with 10% triethylamine/heptane, and then washed with heptane and dichloromethane. The plug was eluted with dichloromethane. The filtrate was evaporated in the presence of isopropanol and a solid was filtered from isopropanol. The solid was dissolved in tetrahydrofuran and isopropanol was added. The tetrahydrofuran was removed under reduced pressure and the solution condensed. A red solid was filtered off, washed with isopropanol and dried (4.39 g, 60% yield).

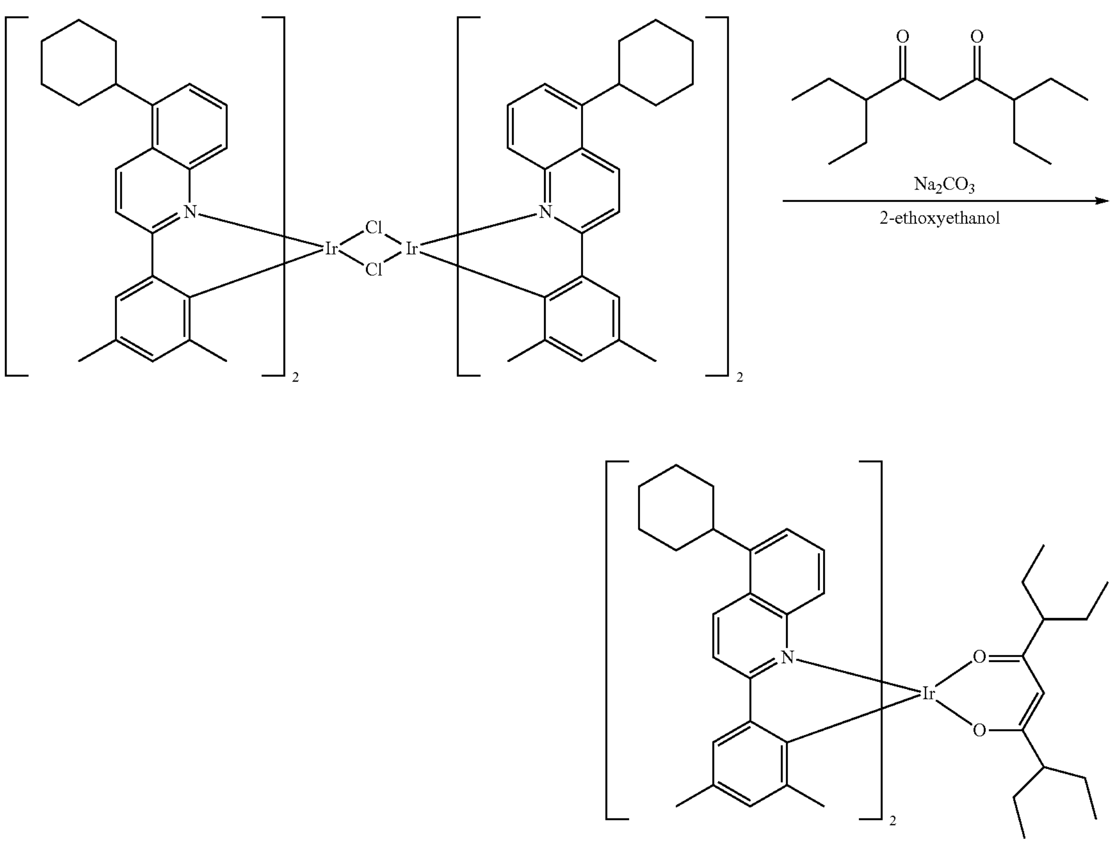

Synthesis of Compound 83

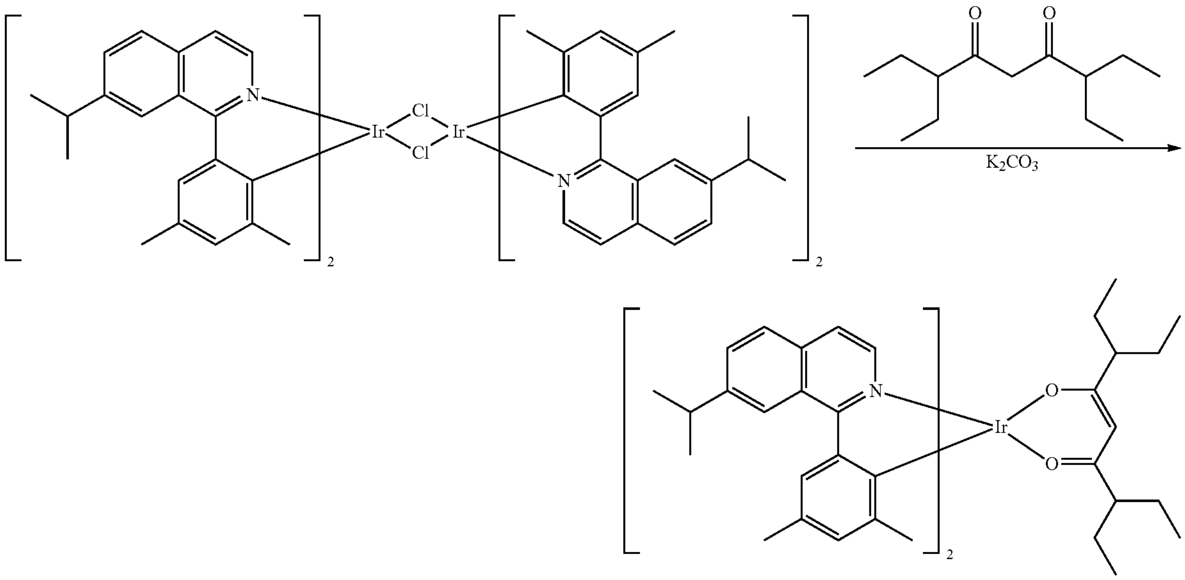

Ir(III) dimer (2.50 g, 2.49 mmol), 3,7-diethylnonane-4,6-dione (3.70 g, 17.43 mmol) and potassium carbonate (2.41 g, 17.4 mmol) were suspended in 50 mL of ethoxyethanol, the reaction mixture was degassed and stirred for 24 h at ambient temperature. Then the reaction mixture was filtered through Celite® pad and the pad was washed with MeOH. The solid filtrate with Celite® was suspended in DCM, containing 10% of $Et_3N$, filtered through silica plug and evaporated. The solid residue was crystallized from DCM/THF/MeOH mixture, providing target complex as red solid (3.1 g, 65% yield).

Synthesis of Compound 93

Synthesis of 4-fluoro-3,5-dimethylbenzoyl chloride

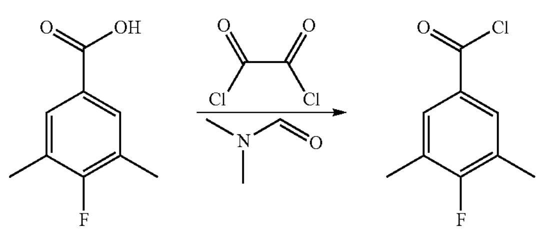

Oxalyl chloride (6.93 ml, 79 mmol) was added dropwise to a solution of 4-fluoro-3,5-dimethylbenzoic acid (12.1 g, 72.0 mmol) in dichloromethane (360 mL) and DMF (0.06 mL, 0.720 mmol) under nitrogen at room temperature. The mixture was then stirred at room temperature and monitored by TLC. Complete solubilization of the mixture occurred within 3 hours. The reaction was complete after an additional hour. Solvent was removed under reduced pressure and the crude mixture was dried in high vacuum and used without further purification.

Synthesis of 4-fluoro-N-(4-isopropylphenethyl)-3,5-dimethylbenzamide

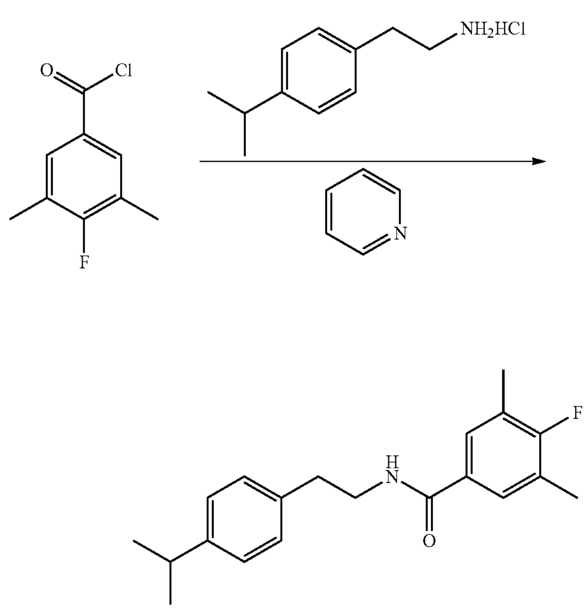

Pyridine (12.12 ml, 150 mmol) and 2-(4-isopropylphenyl) ethanamine hydrochloride (10 g, 50.1 mmol) were added into a 3-necked flask and dissolved in DCM (50 mL). The solution was cooled with an ice-bath and 4-fluoro-3,5-dimethylbenzoyl chloride (10.28 g, 55.1 mmol) was added slowly (portions) and the mixture was stirred at room temperature for 12 hours. DCM was added and the organic layer was washed with 5% HCl and then 5% NaOH solution and dried with sodium sulfate. The solvent was evaporated and the crude compound was used without further purification.

Synthesis of 1-(4-fluoro-3,5-dimethylphenyl)-7-isopropyl-3,4-dihydroisoquinoline

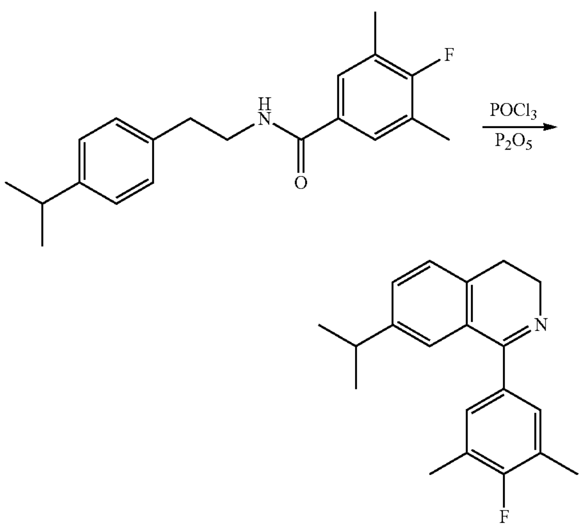

4-Fluoro-N-(4-isopropylphenethyl)-3,5-dimethylbenzamide (15 g, 47.9 mmol), phosphorus pentoxide (42.8 g, 302 mmol), and phosphoryl oxochloride (44.6 ml, 479 mmol) were diluted in xylene (100 mL) and then refluxed for 3 hours under nitrogen. By GCMS, reaction was complete after 2.5 h. The reaction mixture was cooled to RT and stir overnight, the solvent was decanted and ice was slowly added to the solid. The residue mixture in water was made weakly alkaline by adding 50% NaOH and the product was extracted with toluene. The organic layer was washed with water, dried over sodium sulfate, and the solvent was evaporated under reduced pressure. The crude product was used without further purification.

Synthesis of 1-(4-fluoro-3,5-dimethylphenyl)-7-isopropylisoquinoline

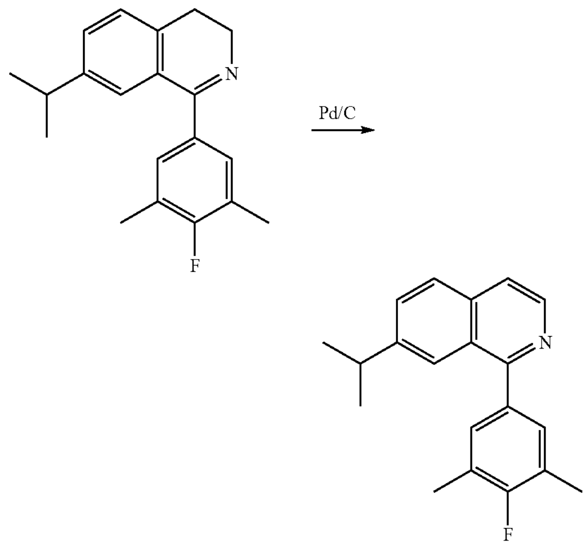

The solution of 1-(4-fluoro-3,5-dimethylphenyl)-7-isopropyl-3,4-dihydroisoquinoline (14.4 g, 47.9 mmol) in xylene (240 mL) was degassed by bubbling nitrogen for 15 minutes. In the meantime, 5% palladium (2.55 g, 2.39 mmol) on carbon was added. The mixture was heated to reflux overnight. The reaction was monitored by TLC. The mixture was filtered through a pad of Celite® and the solvents were evaporated under reduced pressure. The product was coated on Celite® and purified by column chromatography using 10% EA in heptanes to let first impurities come out the EA volume was slowly increased to 15% to let the target come out. The product contains a 2% impurity which comes 10 minutes after the target on HPLC. A reverse phase chromatography on C18 column eluted with 95/5 MeCN/water (v/v) provided 4.5 g of pure material (32% yield over 4 steps).

Synthesis of Ir(III) Dimer

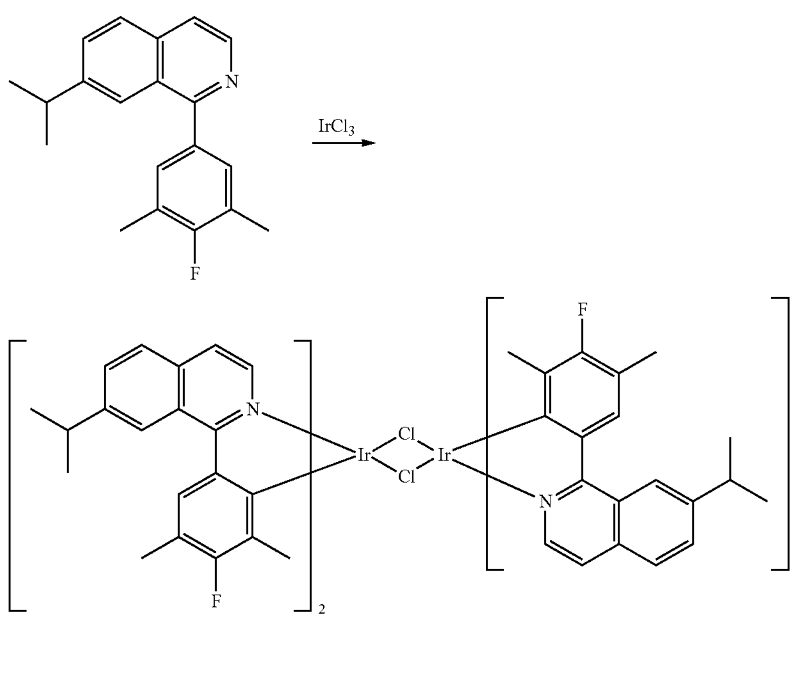

Iridium(III) chloride trihydrate (1.64 g, 4.65 mmol) and 1-(4-fluoro-3,5-dimethylphenyl)-7-isopropylisoquinoline (4.09 g, 13.95 mmol) were suspended in ethoxyethanol (50 mL) and water (12 mL), degassed by bubbling nitrogen and immersed in the oil bath at 105° C. overnight. After cooling down to room temperature, the solid was filtered, washed with MeOH and dried under vacuum to afford 1.8 g (74% yield) of red solid.

Synthesis of Compound 93

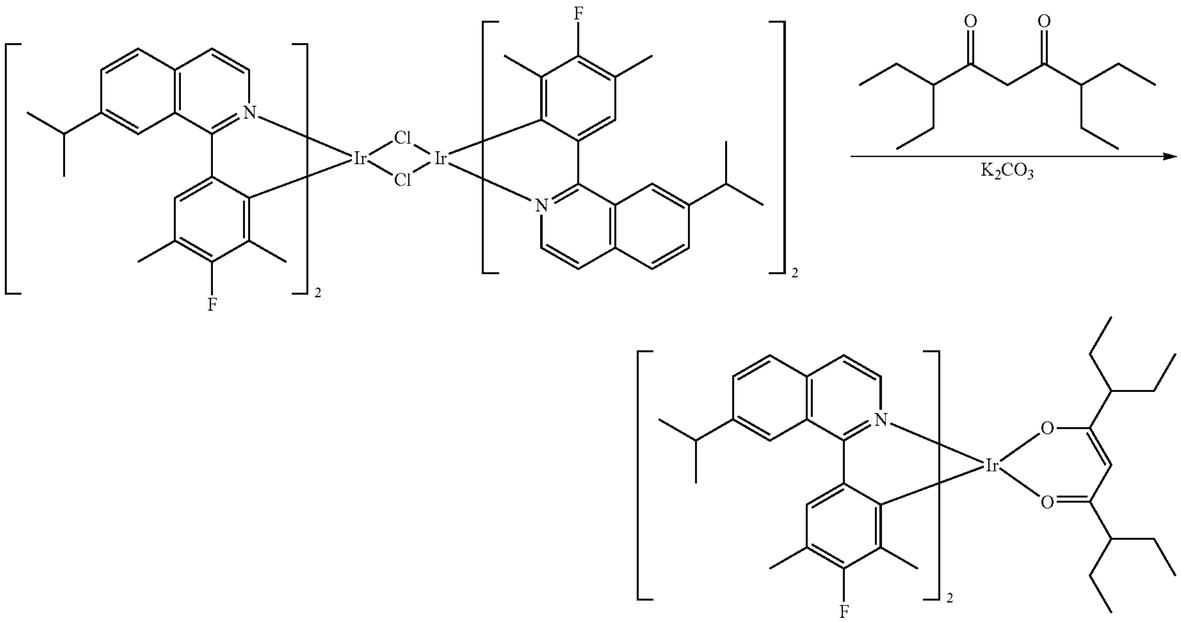

Ir(III) Dimer (1.00 g, 0.96 mmol) was combined with 3,7-diethylnonane-4,6-dione (1.53 g, 7.21 mmol) and the mixture was diluted with 2-ethoxyethanol (36 mL). The solution was degassed by bubbling nitrogen for 15 minute. Potassium carbonate (0.997 g, 7.21 mmol) was then added and the mixture was stirred at room temperature for 18 hours. Then the bright red precipitate was filtered on a Celite® pad and washed with MeOH. The filtrated was discarded and the solid on top of the Celite® was then washed with DCM. The crude product was coated on celite and purified by column chromatography using 5% DCM in heptanes on a triethylamine pre-treated silica gel column. The target compound was obtained as red solid (0.9 g).

Synthesis of Compound 118

Synthesis of 5-isobutylquinoline

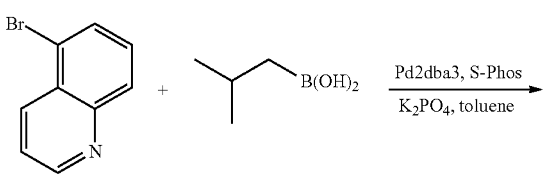

-continued

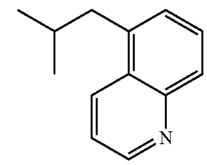

A mixture of 5-bromoquinoline (20 g, 93 mmol), isobutylboronic acid (19.4 g, 186 mmol) and potassium phosphate, $H_2O$ (64.4 g, 280 mmol) in toluene (600 mL) was purged with $N_2$ for 20 minutes $Pd_2dba_3$ (1.71 g, 1.87 mmol) and dicyclohexyl(2',6'-dimethoxy-[1,1'-biphenyl]-2-yl)phosphine (3.06 g, 7.46 mmol) (SPhOS) were then added. The mixture was heated to reflux overnight. The reaction was worked up upon completion. The crude was purified by silica gel column chromatography using heptane/EA: 85/15 to 7/3 (v/v) gradient mixture as eluent to give an oil (11.5 g, 67% yield).

Synthesis of 5-isobutylquinoline 1-oxide

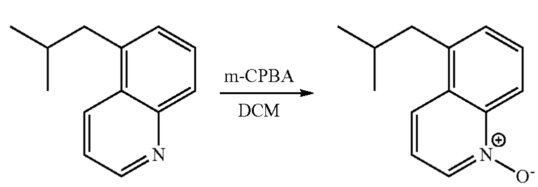

3-Chloroperoxybenzoic acid (m-CPBA) (16.6 g, 74.2 mmol) was added by portions to a solution of 5-isobutylquinoline (12.5 g, 67.5 mmol) in DCM (150 mL) cooled at 0° C. under nitrogen. The mixture was then stirred at room temperature overnight and at 50° C. for 11 hours. More m-CPBA was added to complete the reaction. Upon completion, the reaction mixture was quenched with aqueous $NaHCO_3$. Aqueous mixture was extracted with DCM, washed with water and brine, and dried over $Na_2SO_4$. The crude was purified by silica gel column chromatography using DCM/MeOH: 97/3 to 95/5 (v/v) gradient mixture as eluent to give an off-white solid (11.0 g, 80.0% yield).

Synthesis of 5-isobutylquinolin-2(1H)-one

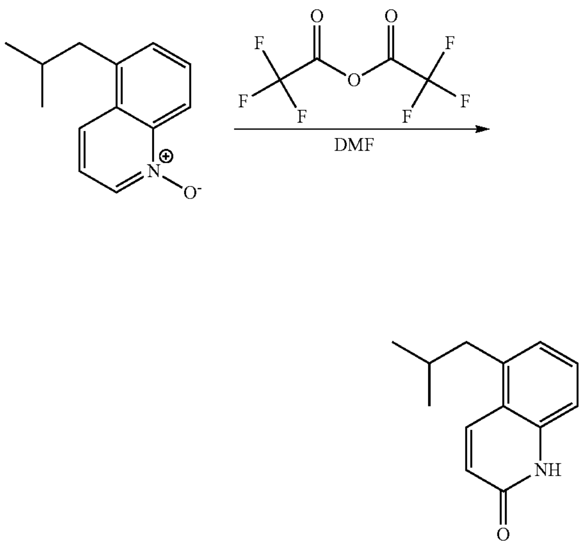

Trifluoroacetic anhydride (61.8 ml, 437 mmol) was added to a 0° C., stirred solution of 5-isobutylquinoline 1-oxide (11 g, 54.7 mmol) in DMF (70 mL) under $N_2$. The mixture was then stirred at room temperature overnight. Upon completion, the trifluoroacetic anhydride was removed under reduced pressure. The residue was quenched with aqueous $NaHCO_3$ and further diluted with water. The crude was recrystallized from aqueous DMF to give a white solid (8.2 g, 75% yield).

Synthesis of 2-chloro-5-isobutylquinoline

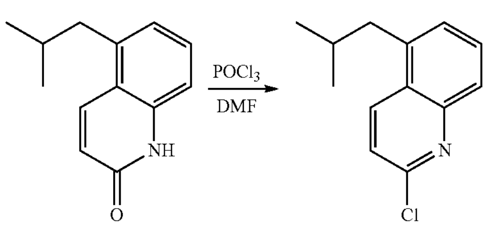

Phosphorus oxychloride (7.60 ml, 81 mmol) was added dropwise to a solution of 5-isobutylquinolin-2(1H)-one (8.2 g, 40.7 mmol) in DMF (160 mL) over 30 minutes under $N_2$. The reaction mixture was then heated at 80° C. After the reaction was complete, the remaining $POCl_3$ was evaporated under reduced pressure and aqueous $Na_2CO_3$ was carefully added. The solid was isolated to give an off-white solid (8.1 g, 91% yield).

Synthesis of 2-(3,5-dichlorophenyl)-5-isobutylquinoline

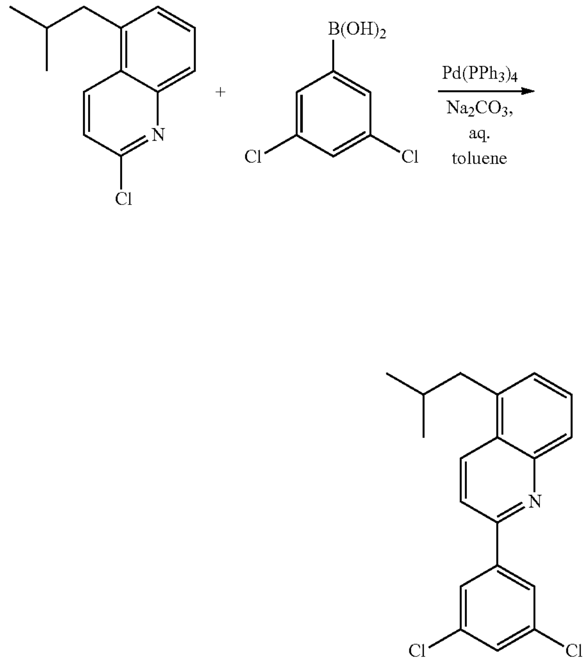

Nitrogen gas was bubbled into a mixture of (3,5-dichlorophenyl)boronic acid (10.6 g, 55.5 mmol), 2-chloro-5-isobutylquinoline (8.13 g, 37 mmol) and $Na_2CO_3$ (7.84 g, 74.0 mmol) in THF (250 mL) and water (50 mL) for 30 min. Tetrakis(triphenylphosphine)palladium (0) (1.71 g, 1.48 mmol) was added and the mixture was heated to reflux overnight. Upon completion (monitored by GCMS) the reaction was worked up by diluting in ethyl acetate and washing with brine and water. The organic layer was dried with sodium sulfate and solvent was evaporated under reduced pressure to give a crude material, which was purified by silica gel column chromatography using heptanes/EA: 98/2 to 96/(v/v) gradient mixture as eluent to yield a solid (8.0 g, 66% yield).

Synthesis of 2-(3,5-dimethyl(D6)phenyl)-5-isobutylquinoline

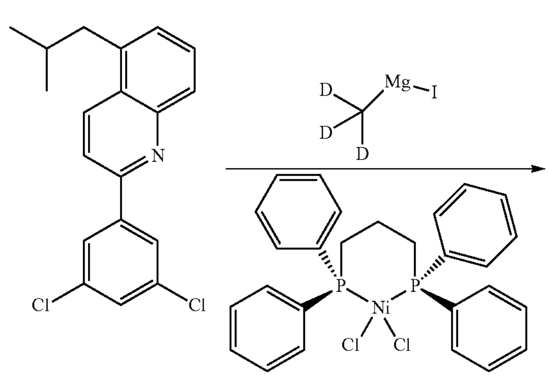

-continued

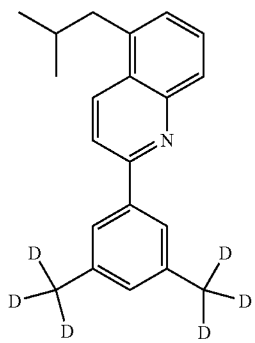

$CD_3MgI$ (61 mL, 61 mmol) in diethyl ether (1.0 M) was added into a stirred mixture of 2-(3,5-dichlorophenyl)-5-isobutylquinoline (8.0 g, 24.2 mmol) and dichloro(1,3-bis(diphenylphosphino)propane)nickel (Ni(dppp)$Cl_2$) (0.39 g, 0.73 mmol) in diethyl ether (120 mL) over a period of 30 min. The mixture was stirred at room temperature overnight. Upon completion, the reaction was cooled with an ice bath and quenched carefully with water. The mixture was extracted with EA, washed with water (3 times) and brine. The crude product was purified by silica gel column chromatography using heptanes/DCM/EA 89/10/1 to 84/15/1 (v/v/v) gradient mixture as eluent to yield an oil (6.5 g, 91% yield).

Synthesis of Ir(III) Dimer

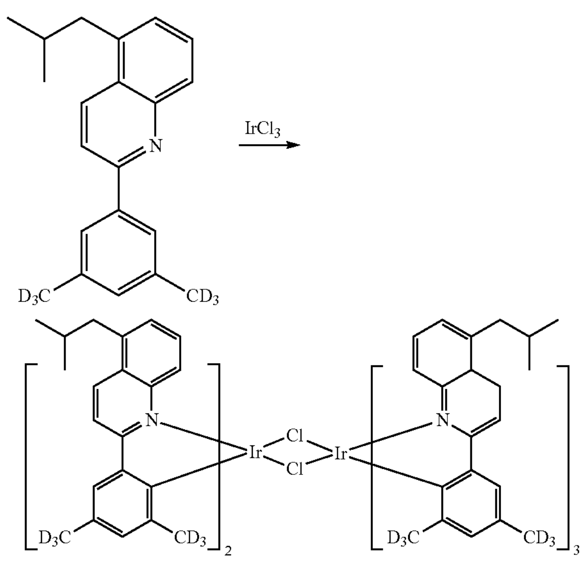

A mixture of 2-(3,5-dimethyl($D_6$)phenyl)-5-isobutylquinoline (5.17 g, 17.5 mmol) and iridium(III) chloride (1.80 g, 4.86 mmol) in ethoxyethanol (30 mL) and water (10 mL) was degassed by bubbling $N_2$ for 30 minutes before heating at 100° C. for 19 h. The reaction mixture was cooled down and small amount of MeOH was added. The Ir(III) dimer was isolated by filtration to give a solid (2.40 g, 61% yield), which was used for next reaction without further purification.

Synthesis of Compound 118

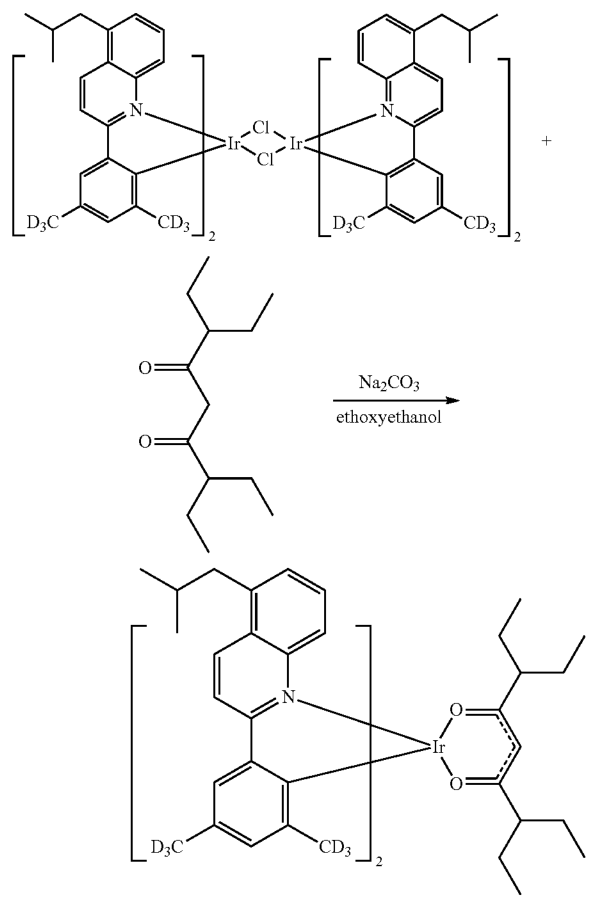

A mixture of Ir(III) dimer (1.30 g, 0.80 mmol), 3,7-diethylnonane-4,6-dione (1.69 g, 7.96 mmol), $Na_2CO_3$ (1.69 g, 15.9 mmol) in ethoxyethanol (25 mL) was degassed for 20 minutes and stirred at room temperature for 24 hours. The reaction mixture was filtered and washed with small amount of methanol and heptane. The solid was dissolved in 10% triethylamine (TEA) in DCM. The mixture was filtered and evaporated under reduced pressure. The red solid was recrystallized from DCM/IPA with 5% TEA to give a red solid (7.0 g, 44% yield).

Synthesis of Compound 141

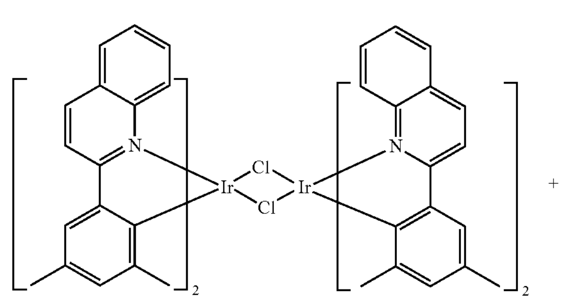

-continued

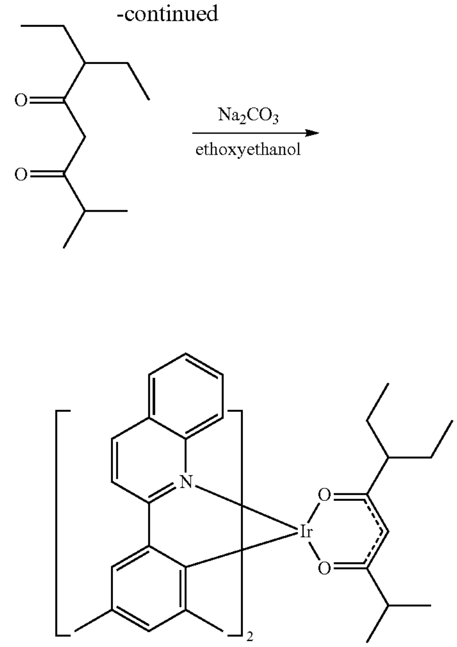

The Ir(III) dimer (0.80 g, 0.58 mmol) and 6-ethyl-2-methyloctane-3,5-dione (0.75 g, 4.06 mmol) were inserted in a round-bottom flask. The mixture was diluted in 2-ethoxyethanol (40 mL), degassed with nitrogen for 30 minutes and $K_2CO_3$ (0.60 g, 4.33 mmol) was inserted. The mixture was stirred at room temperature overnight. The precipitate was filtered through a pad of Celite®. The solvent was evaporated and the crude material was purified with column chromatography on silica gel by using a mixture of heptanes/DCM 95/5 (v/v). The pure material (0.65 g, 67% yield) was obtained.

Synthesis of Compound 142

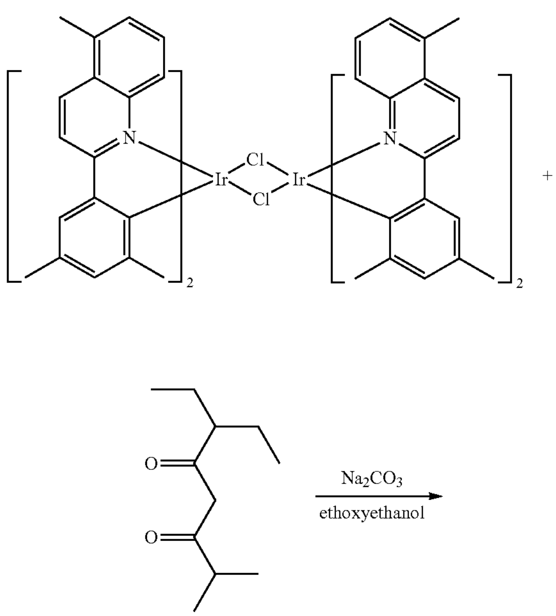

-continued

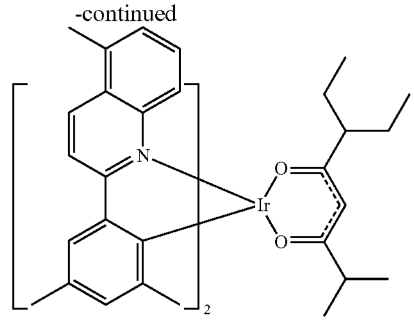

The Iridium (III) dimer (0.80 g, 0.56 mmol) and 6-ethyl-2-methyloctane-3,5-dione (0.77 g, 4.16 mmol) were diluted in ethoxyethanol (19 mL). The mixture was degassed by bubbling nitrogen for 15 minutes followed by the addition of $K_2CO_3$ (0.576 g, 4.16 mmol) and the mixture was stirred at room temperature overnight. Dichloromethane was added followed by filtration of the solution through a pad of Celite® and washed with dichloromethane until the filtrate is clear. The crude product was purified by column chromatography by using a triethylamine-treated silica gel column and eluting with a mixture of heptanes/dichloromethane 95/5 (v/v). The pure product was collected (0.35 g, 67% yield) as a red powder.

Synthesis of Compound 176

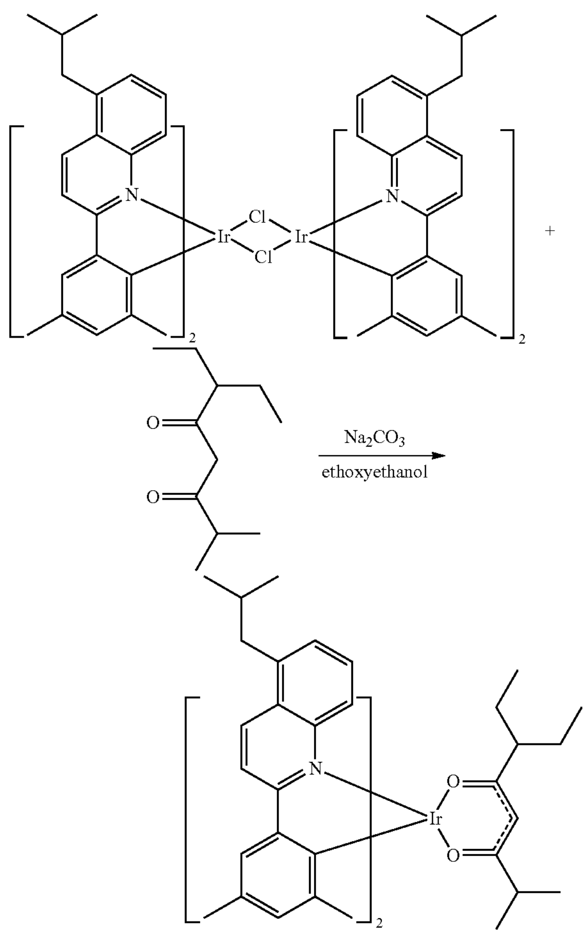

The Ir(III) Dimer (0.75 g, 0.47 mmol) and 6-ethyl-2-methyloctane-3,5-dione (0.64 g, 3.50 mmol) were diluted with ethoxyethanol (16 mL), degassed with nitrogen for 30 minutes, $K_2CO_3$ (0.48 g, 3.50 mmol) was added and the mixture was stirred at room temperature overnight. DCM was added to the mixture to solubilize the product, the reaction mixture was filtered through a pad of Celite® and evaporated. The crude material was purified with column chromatography on silica gel, eluted with the mixture of heptanes/DCM 95/5 (v/v), provided the pure material (0.59 g, 66% yield)

Synthesis of Compound 278

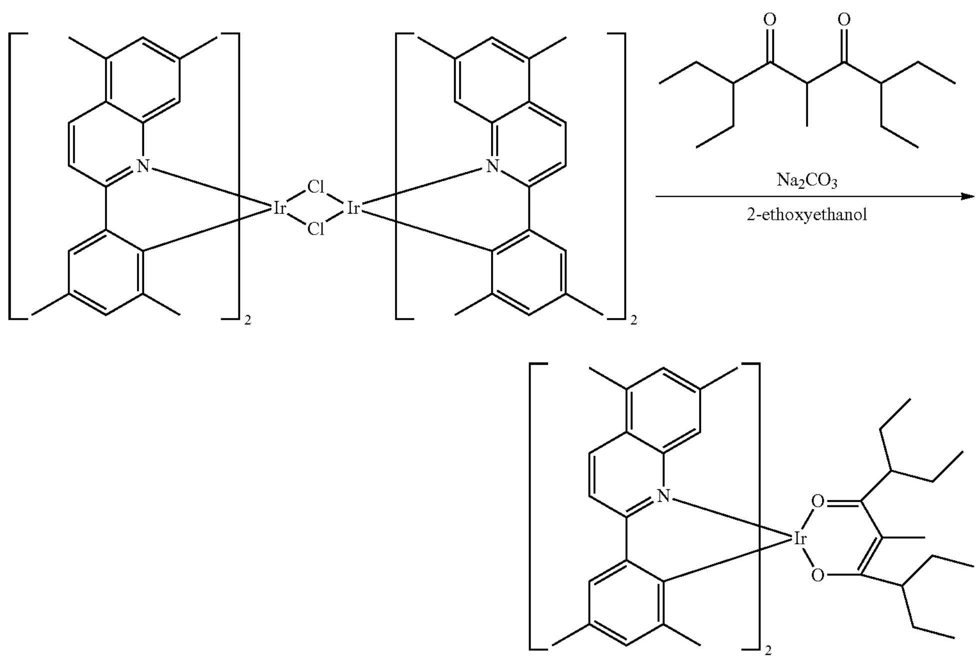

To a round bottom flask was added the chloro-bridged dimer (4.37 g, 2.91 mmol), 3,7-diethyl-5-methylnonane-4,6-dione (3.7 g, 16.4 mmol), sodium carbonate (3.08 g, 29.1 mmol), and 100 mL 2-ethoxyethanol. The reaction mixture was stirred at room temperature for 48 h under nitrogen. The reaction mixture was poured onto a plug containing Celite®, basic alumina, and silica gel. The plug was pretreated with 10% triethylamine/heptanes, and then washed with heptane and dichloromethane. The plug was eluted with dichloromethane. The filtrate was evaporated in the presence of isopropanol and a solid was filtered from isopropanol. The solid was dissolved in tetrahydrofuran and isopropanol was added. The tetrahydrofuran was removed on a rotovap and the solution condensed. A red solid was filtered off and washed with isopropanol (0.79 g, 16% yield).

Synthesis of Compound 320

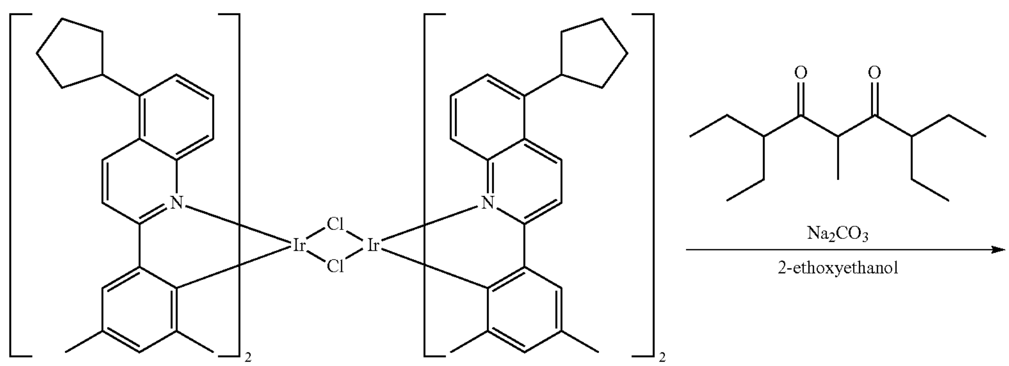

-continued

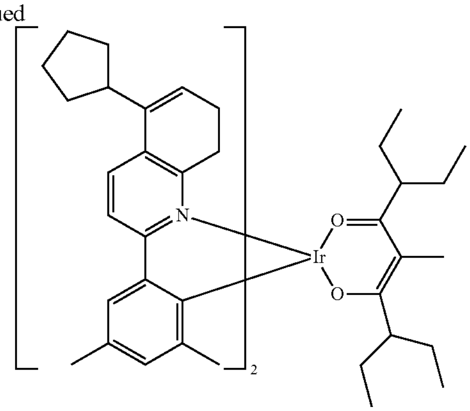

Ir(III) dimer (2.00 g, 1.25 mmol), 3,7-diethyl-5-methylnonane-4,6-dione (1.98 g, 8.73 mmol) and potassium carbonate (1.21 g, 8.73 mmol) were suspended in 50 mL of ethoxyethanol. The reaction mixture was degassed and stirred overnight at room temperature. It was then cooled in the ice bath, filtered through celite pad, and the pad was washed with cold MeOH. The precipitate with the Celite® was suspended in DCM, containing 5% of $Et_3N$, and filtered through silica pad. The solution was evaporated, providing red solid. The solid was purified by crystallization from DCM/MeOH, providing target complex as red solid (1.5 g, 59%).

Synthesis of Comparative Compound 4

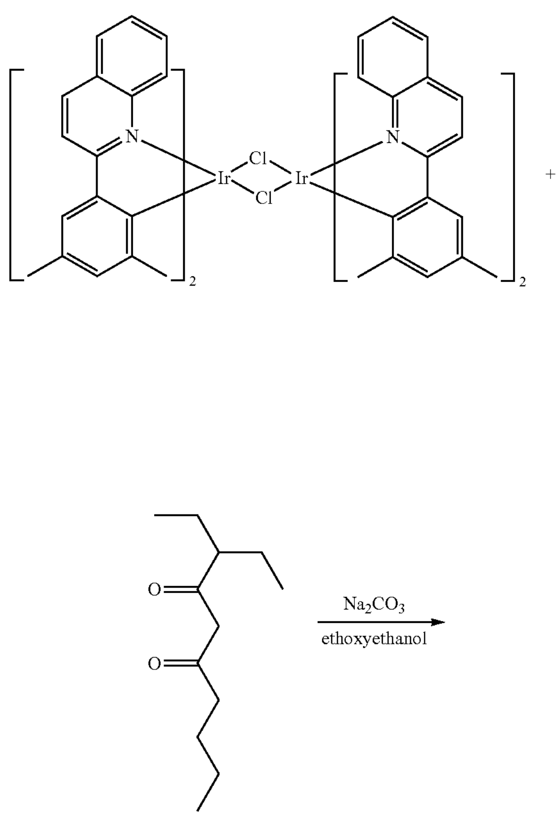

-continued

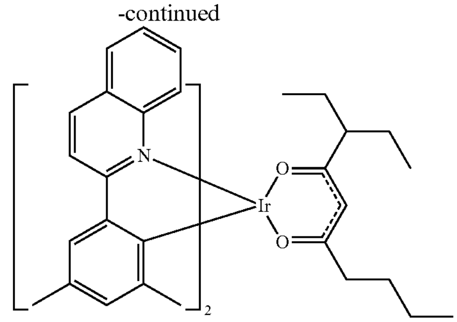

The Iridium (III) Dimer (0.70 g, 0.51 mmol) and 3-ethyldecane-4,6-dione (0.75 g, 3.79 mmol) were suspended in ethoxyethanol (17 mL). The reaction was degassed by bubbling nitrogen for 15 minutes followed by addition $K_2CO_3$ (0.52 g, 3.79 mmol). The mixture was stirred at room temperature overnight. Thin layer chromatography was performed on the reaction mixture in the morning showing complete consumption of the dimer. Dichloromethane was added followed by filtration of the solution through a pad of Celite® and washed with dichloromethane until the filtrate is clear. The crude product was purified by column chromatography by using a triethylamine-treated column and eluting with a mixture of heptanes/dichloromethane (95/5, v/v). The pure product was collected (0.600 g, 70% yield) as a red powder.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A first device comprising a first organic light emitting device, the first organic light emitting device comprising:

an anode;

a cathode; and an organic layer, disposed between the anode and the cathode, comprising a compound having a formula of $Ir(L^1)_x(L^2)_y$, wherein x is 1 or 2;

wherein y is 1 or 2;
wherein x+y is 3;
wherein the first ligand $L^1$ has the formula:

Formula I

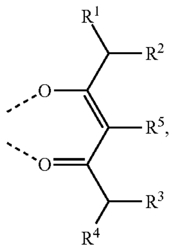

wherein the second ligand $L^2$ has a formula selected from the group consisting of

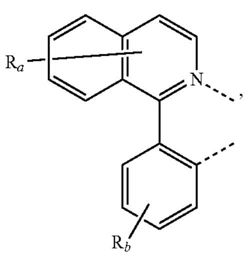

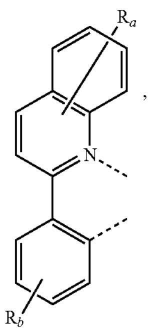

and

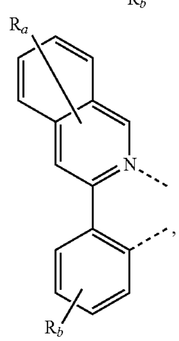

wherein $R^1$, $R^2$, $R^3$, and $R^4$ are independently selected from group consisting of alkyl and cycloalkyl;
wherein each of $R^1$, $R^2$, $R^3$, and $R^4$ has at least two C;
wherein $R_a$ and $R_b$ can represent mono, di, tri, or tetra substitution, or no substitution;
wherein each of $R^a$, $R^b$, and $R^5$ is selected from group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;
wherein two adjacent substituents of $R_a$ and $R_b$ are optionally joined to form a fused ring or form a multidentate ligand; and
wherein $R^1$ and $R^2$ or $R^3$ and $R^4$ can be joined to form into a ring.

2. The first device of claim 1, wherein $R^5$ is selected from group consisting of hydrogen, deuterium, alkyl, cycloalkyl, and combinations thereof.

3. The first device of claim 1, wherein $R^1$, $R^2$, $R^3$, and $R^4$ are alkyl.

4. The first device of claim 1, wherein $R^1$, $R^2$, $R^3$, and $R^4$ are selected from the group consisting of methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, cyclopentyl, cyclohexyl, partially or fully deuterated variants thereof, and combinations thereof.

5. The first device of claim 1, wherein the compound has the formula of $Ir(L^1)(L^2)_2$.

6. The first device of claim 1, wherein $L^1$ is selected from group consisting of:

$L_{A1}$

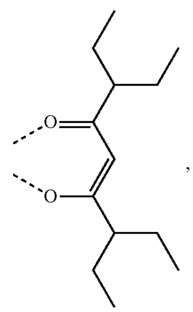

$L_{A3}$

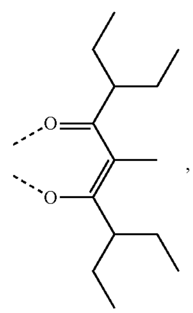

$L_{A5}$

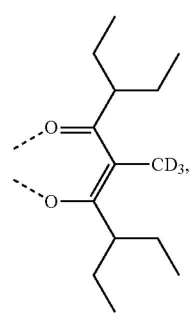

$L_{A7}$

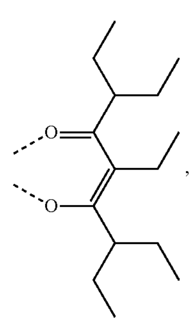

-continued
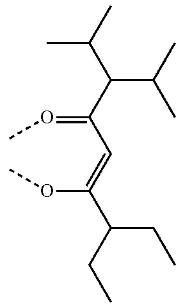
,
$L_{A9}$
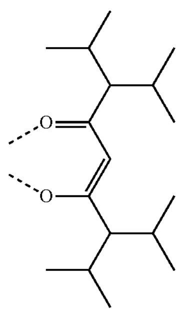
, and
$L_{A10}$
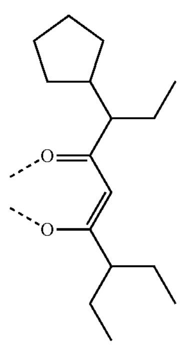
.
$L_{A13}$
7. The first device of claim 6, wherein $L^2$ is selected from group consisting of:
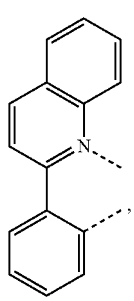
$L_{Q1}$
-continued
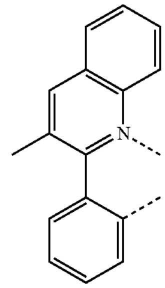
$L_{Q2}$
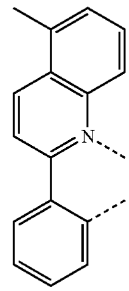
$L_{Q3}$
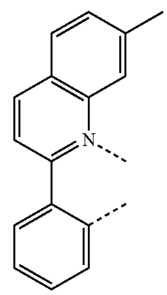
,
$L_{Q4}$
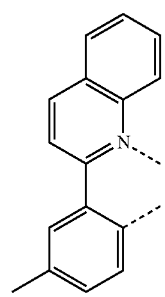
$L_{Q5}$
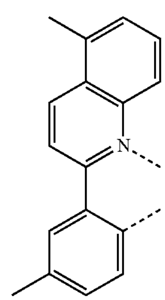
$L_{Q6}$ -continued
LQ7
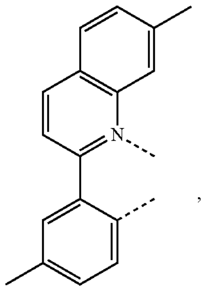
LQ8
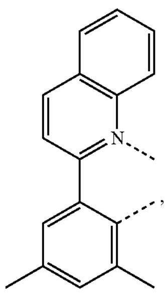
LQ9
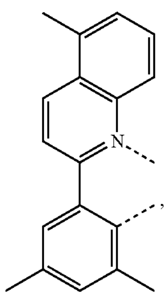
LQ10
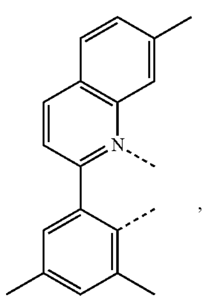
LQ11
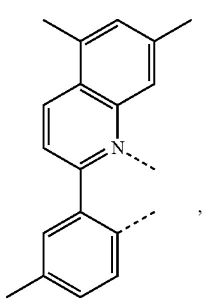
-continued
LQ12
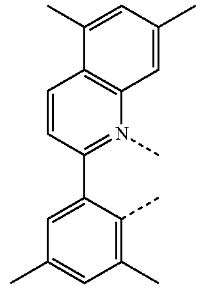
LQ13
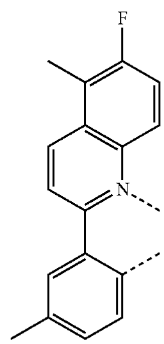
LQ14
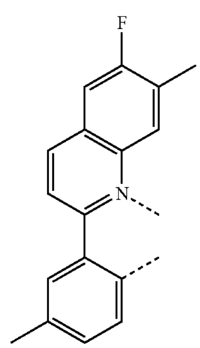
LQ15
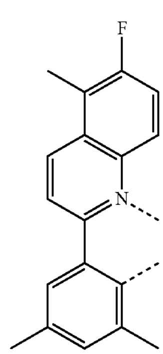

-continued
$L_{Q16}$
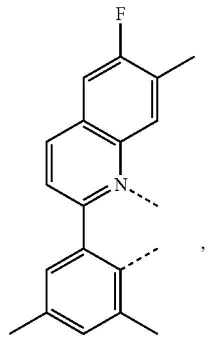
$L_{Q17}$
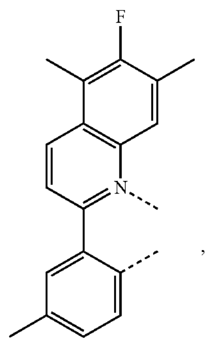
$L_{Q18}$
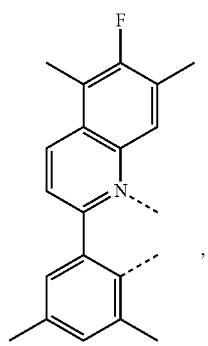
$L_{Q19}$
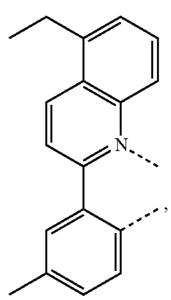
$L_{Q20}$
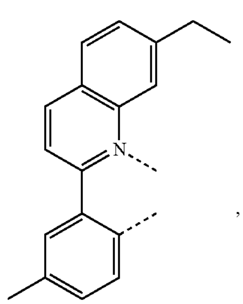
-continued
$L_{Q21}$
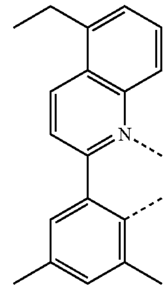
$L_{Q22}$
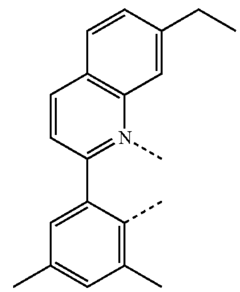
$L_{Q23}$
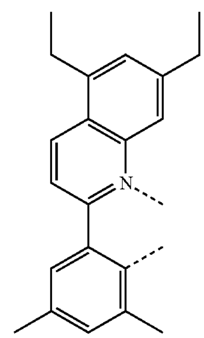
$L_{Q24}$
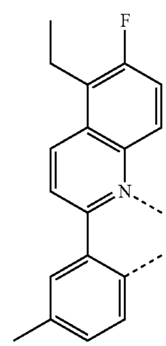
$L_{Q25}$
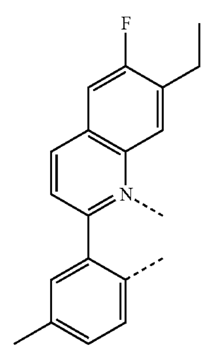

-continued
$L_{Q26}$
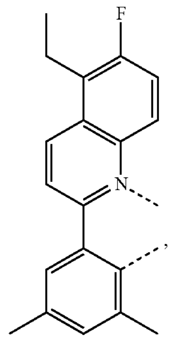
$L_{Q27}$
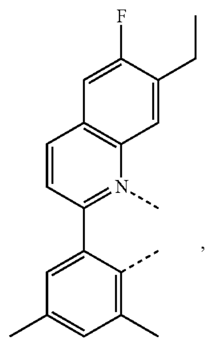
$L_{Q28}$
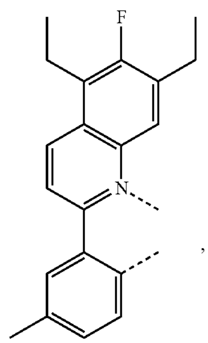
$L_{Q29}$
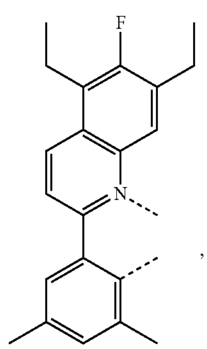
-continued
$L_{Q30}$
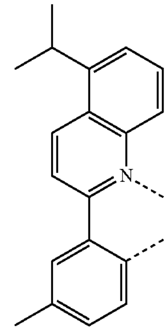
$L_{Q31}$
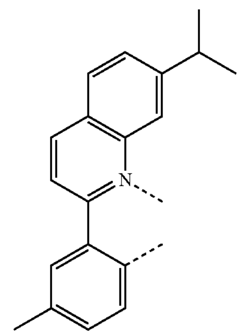
$L_{Q32}$
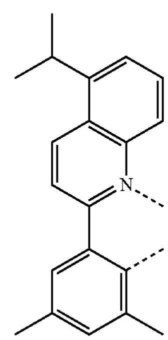
$L_{Q33}$
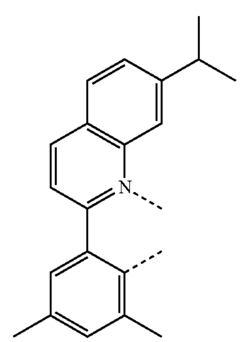

$L_{Q34}$
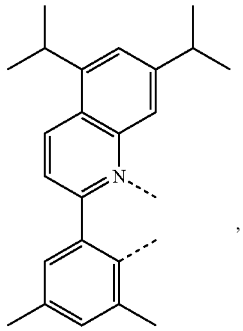
$L_{Q35}$
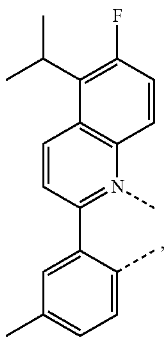
$L_{Q36}$
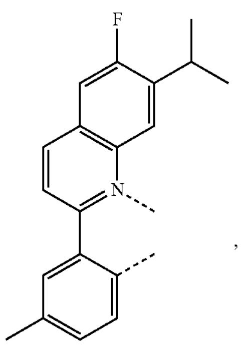
$L_{Q37}$
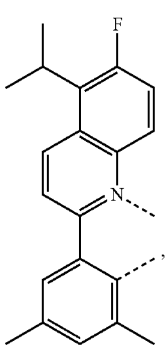
$L_{Q38}$
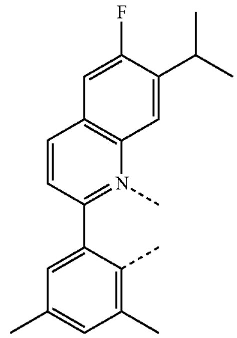
$L_{Q39}$
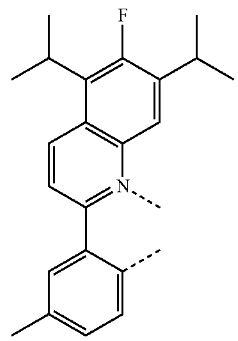
$L_{Q40}$
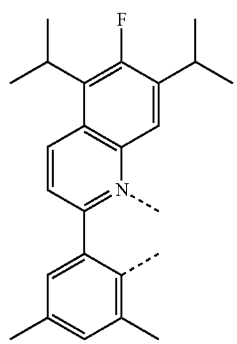
$L_{Q41}$
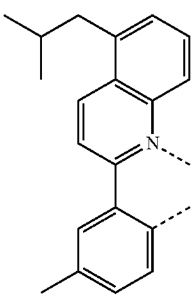
$L_{Q42}$
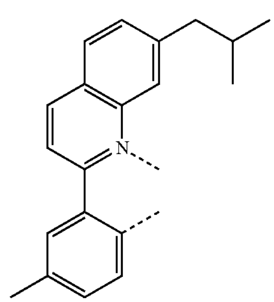

$L_{Q43}$
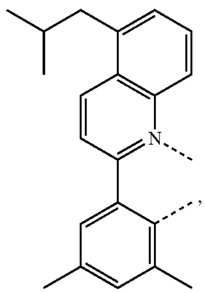
$L_{Q44}$
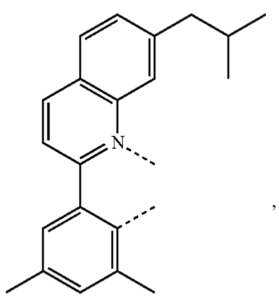
$L_{Q45}$
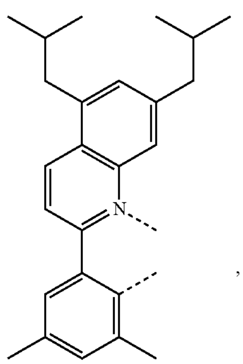
$L_{Q46}$
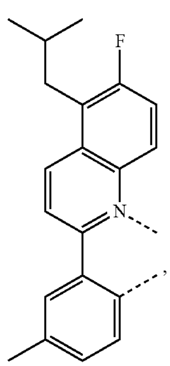
$L_{Q47}$
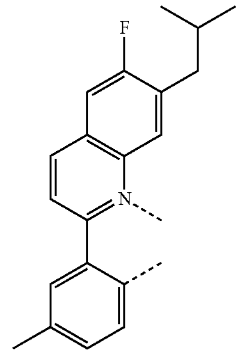
$L_{Q48}$
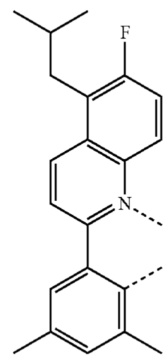
$L_{Q49}$
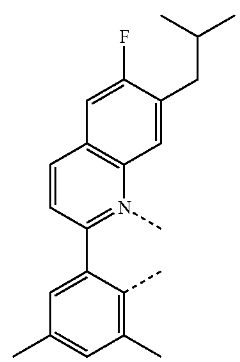
$L_{Q50}$
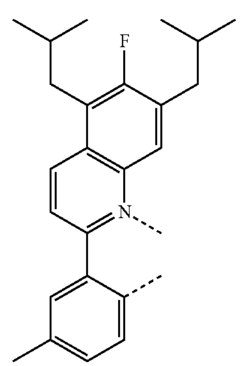

-continued
$L_{Q51}$
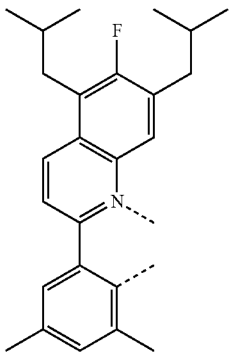
,
$L_{Q52}$
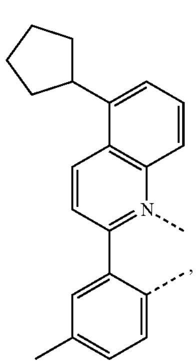
,
$L_{Q53}$
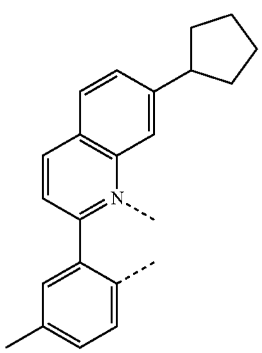
,
$L_{Q54}$
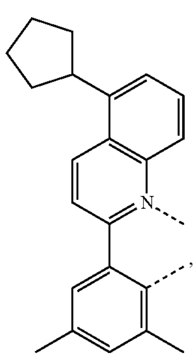
,
-continued
$L_{Q55}$
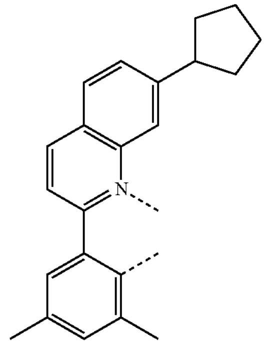
,
$L_{Q56}$
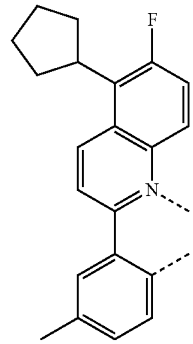
,
$L_{Q57}$
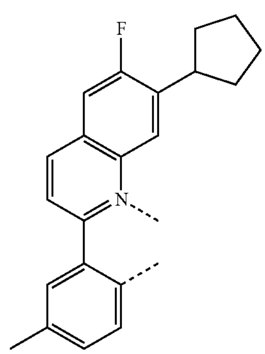
,
$L_{Q58}$
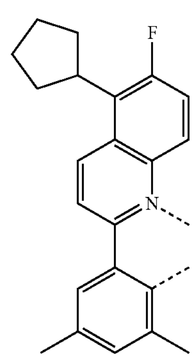
, -continued
$L_{Q59}$
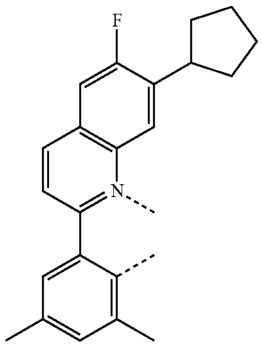
,
$L_{Q60}$
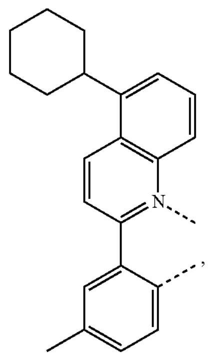
$L_{Q61}$
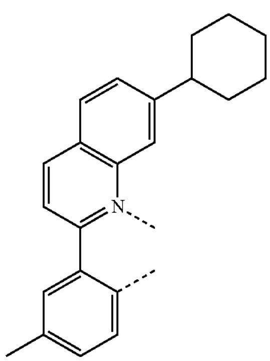
,
$L_{Q62}$
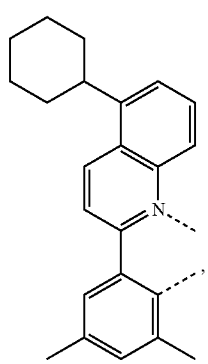
-continued
$L_{Q63}$
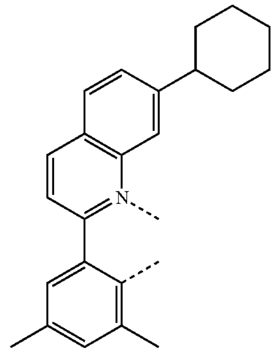
,
$L_{Q64}$
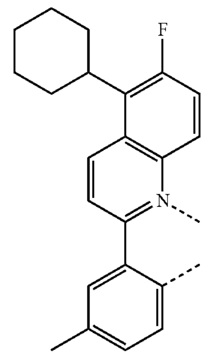
$L_{Q65}$
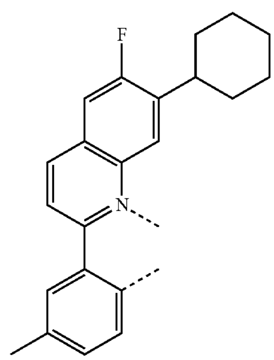
,
$L_{Q66}$
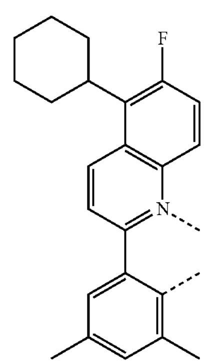

-continued
$L_{Q67}$
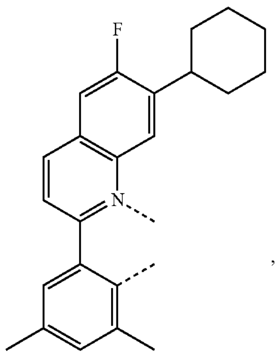
$L_{Q68}$
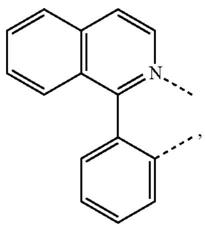
$L_{Q69}$
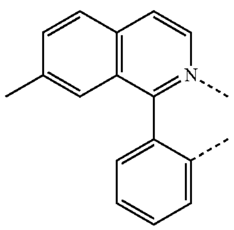
$L_{Q70}$
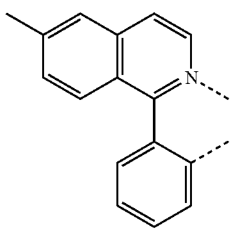
$L_{Q71}$
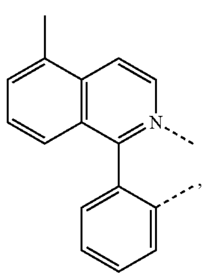
$L_{Q72}$
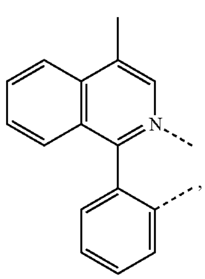
-continued
$L_{Q73}$
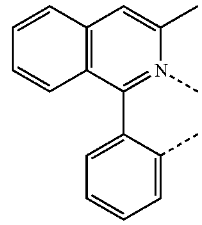
$L_{Q74}$
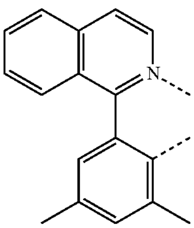
$L_{Q75}$
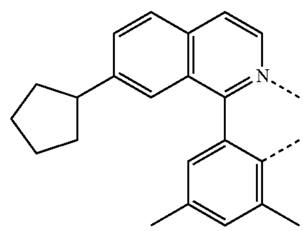
$L_{Q76}$
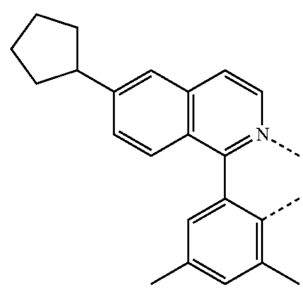
$L_{Q77}$
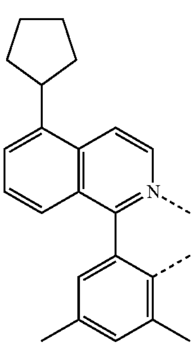

-continued
$L_{Q78}$
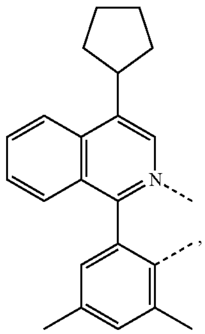
$L_{Q79}$
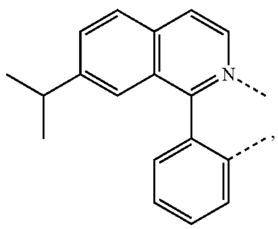
$L_{Q80}$
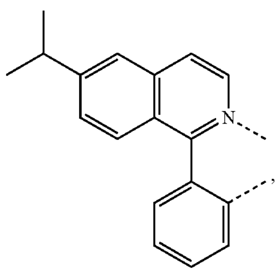
$L_{Q81}$
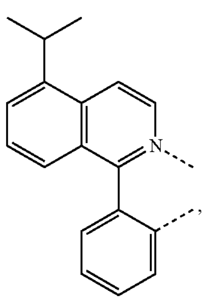
$L_{Q82}$
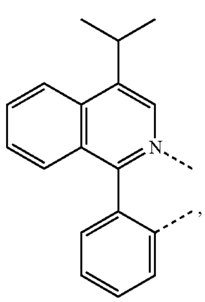
-continued
$L_{Q83}$
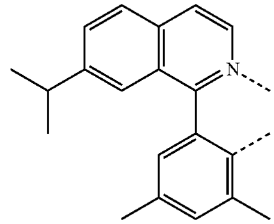
$L_{Q84}$
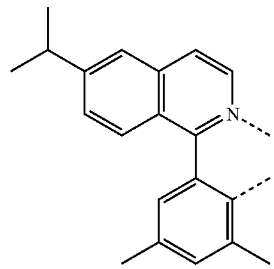
$L_{Q85}$
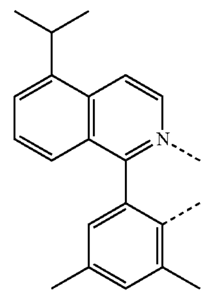
$L_{Q86}$
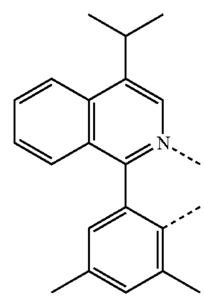
$L_{Q87}$
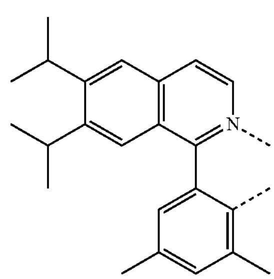

-continued
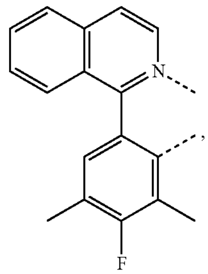
$L_{Q88}$
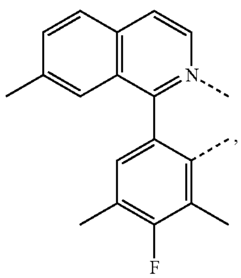
$L_{Q89}$
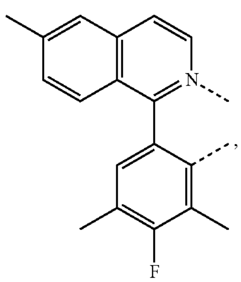
$L_{Q90}$
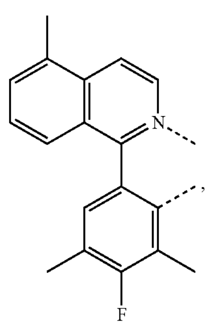
$L_{Q91}$
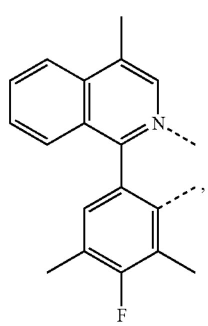
$L_{Q92}$
-continued
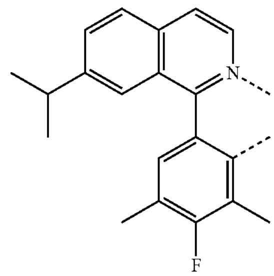
$L_{Q93}$
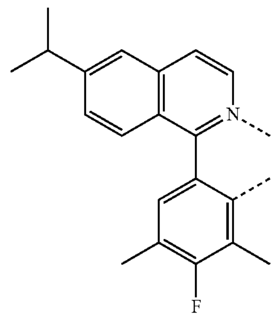
$L_{Q94}$
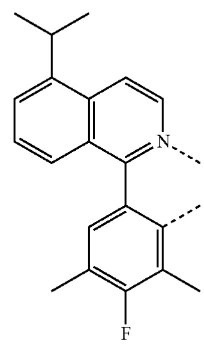
$L_{Q95}$
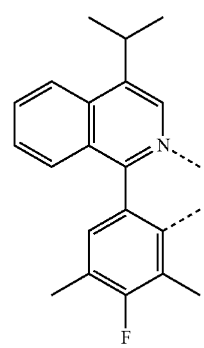
$L_{Q96}$
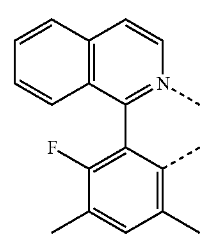
$L_{Q97}$ $L_{Q98}$
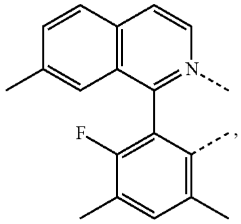
$L_{Q99}$
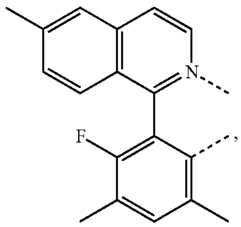
$L_{Q100}$
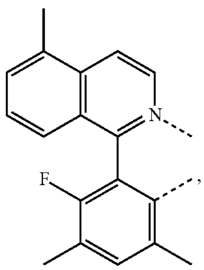
$L_{Q101}$
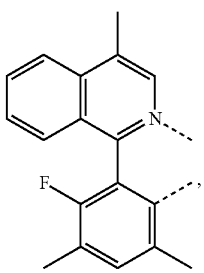
$L_{Q102}$
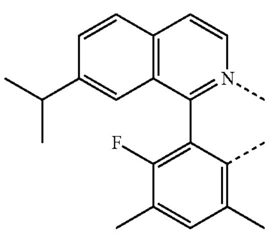
$L_{Q103}$
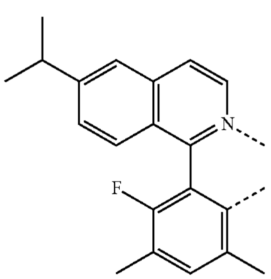
$L_{Q104}$
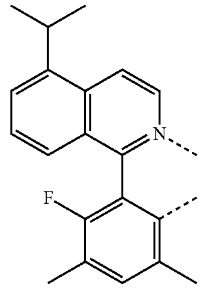
$L_{Q105}$
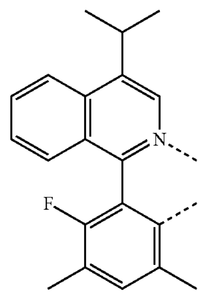
$L_{Q106}$
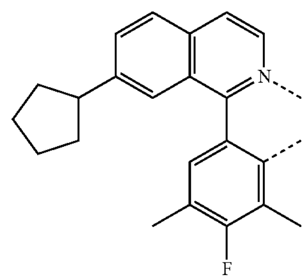
$L_{Q107}$
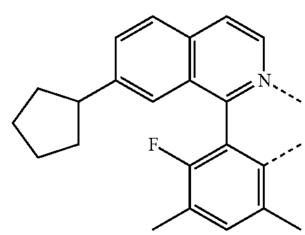
$L_{Q108}$
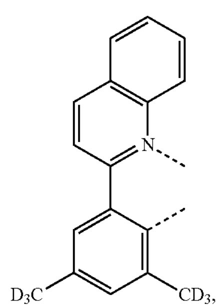

$L_{Q109}$
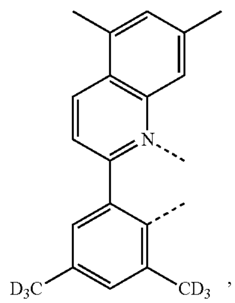
$L_{Q110}$
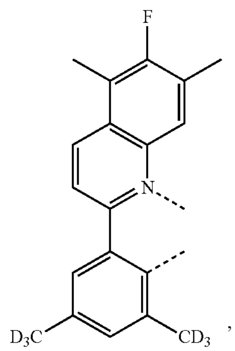
$L_{Q111}$
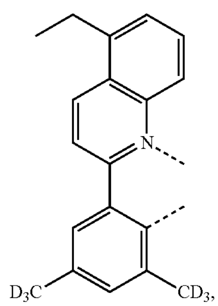
$L_{Q112}$
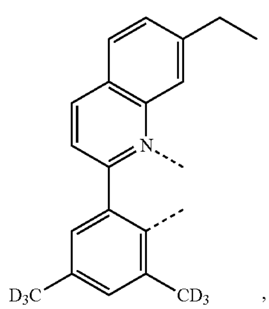
$L_{Q113}$
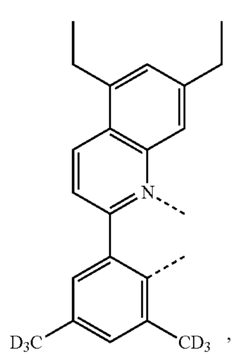
$L_{Q114}$
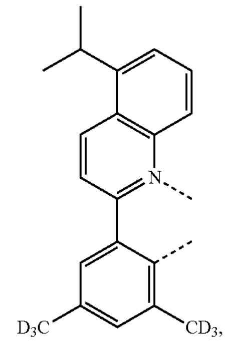
$L_{Q115}$
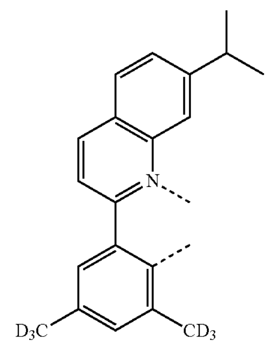
$L_{Q116}$
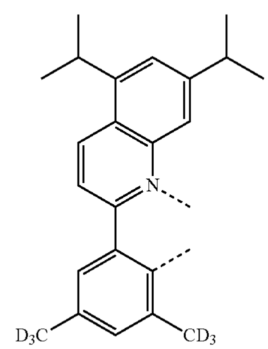
$L_{Q117}$
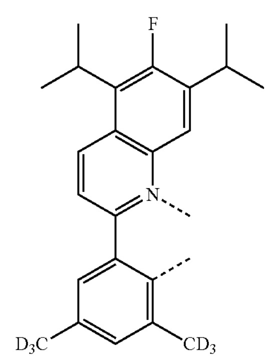

-continued
$L_{Q118}$
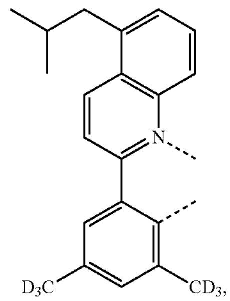
$L_{Q119}$
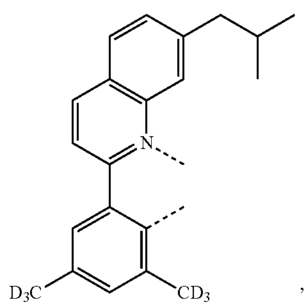
$L_{Q120}$
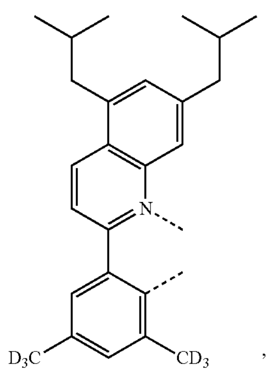
$L_{Q121}$
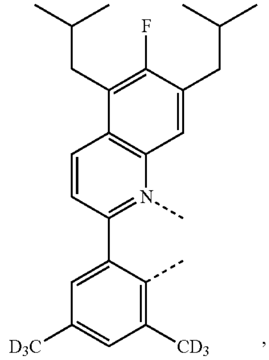
-continued
$L_{Q122}$
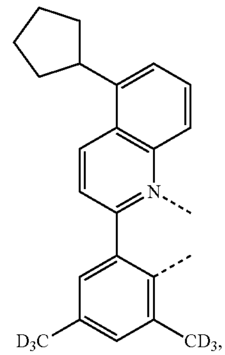
$L_{Q123}$
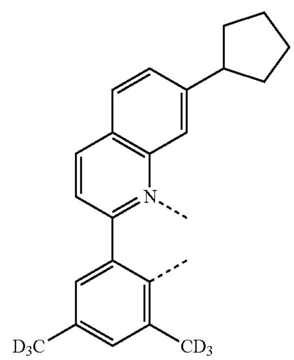
$L_{Q124}$
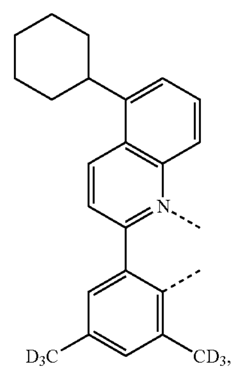
$L_{Q6125}$
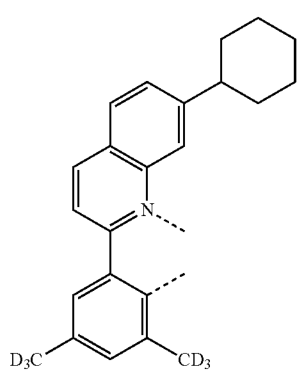

-continued $L_{Q126}$

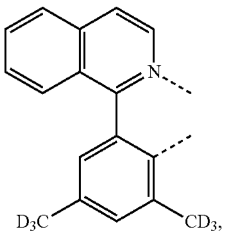

$L_{Q127}$

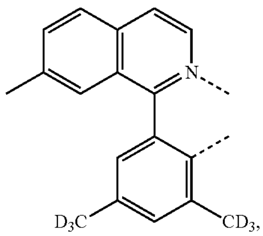

$L_{Q128}$

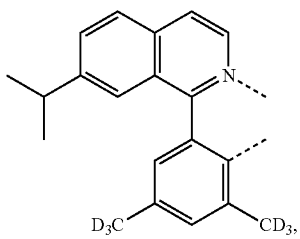

$L_{Q129}$

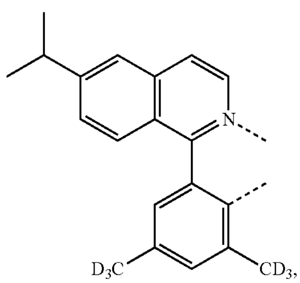

$L_{Q130}$

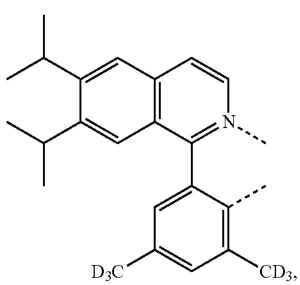

$L_{Q131}$

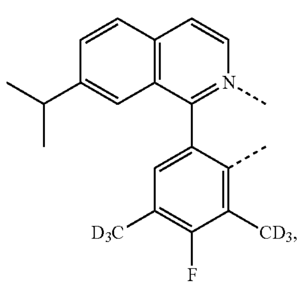

-continued $L_{Q132}$

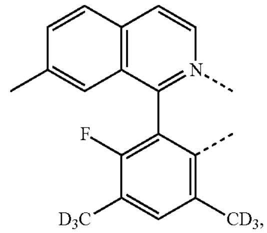

and $L_{Q133}$

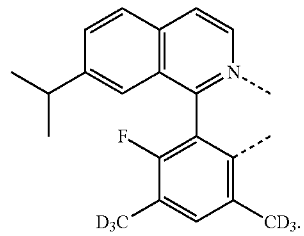

8. The first device of claim 7 wherein the compound has a formula of $M(L^1)(L^2)_2$ and is selected from the group consisting of Compound 1 to Compound 133, Compound 267 to Compound 399, Compound 533 to Compound 665, Compound 799 to Compound 931, Compound 1065 to Compound 1330, and Compound 1597 to Compound 1729 defined in the table below:

| Compound number | $L^1$ | $L^2$ |
|---|---|---|
| 1. | $L_{A1}$ | $L_{Q1}$ |
| 2. | $L_{A1}$ | $L_{Q2}$ |
| 3. | $L_{A1}$ | $L_{Q3}$ |
| 4. | $L_{A1}$ | $L_{Q4}$ |
| 5. | $L_{A1}$ | $L_{Q5}$ |
| 6. | $L_{A1}$ | $L_{Q6}$ |
| 7. | $L_{A1}$ | $L_{Q7}$ |
| 8. | $L_{A1}$ | $L_{Q8}$ |
| 9. | $L_{A1}$ | $L_{Q9}$ |
| 10. | $L_{A1}$ | $L_{Q10}$ |
| 11. | $L_{A1}$ | $L_{Q11}$ |
| 12. | $L_{A1}$ | $L_{Q12}$ |
| 13. | $L_{A1}$ | $L_{Q13}$ |
| 14. | $L_{A1}$ | $L_{Q14}$ |
| 15. | $L_{A1}$ | $L_{Q15}$ |
| 16. | $L_{A1}$ | $L_{Q16}$ |
| 17. | $L_{A1}$ | $L_{Q17}$ |
| 18. | $L_{A1}$ | $L_{Q18}$ |
| 19. | $L_{A1}$ | $L_{Q19}$ |
| 20. | $L_{A1}$ | $L_{Q20}$ |
| 21. | $L_{A1}$ | $L_{Q21}$ |
| 22. | $L_{A1}$ | $L_{Q22}$ |
| 23. | $L_{A1}$ | $L_{Q23}$ |
| 24. | $L_{A1}$ | $L_{Q24}$ |
| 25. | $L_{A1}$ | $L_{Q25}$ |
| 26. | $L_{A1}$ | $L_{Q26}$ |
| 27. | $L_{A1}$ | $L_{Q27}$ |
| 28. | $L_{A1}$ | $L_{Q28}$ |
| 29. | $L_{A1}$ | $L_{Q29}$ |
| 30. | $L_{A1}$ | $L_{Q30}$ |
| 31. | $L_{A1}$ | $L_{Q31}$ |
| 32. | $L_{A1}$ | $L_{Q32}$ |
| 33. | $L_{A1}$ | $L_{Q33}$ |
| 34. | $L_{A1}$ | $L_{Q34}$ |
| 35. | $L_{A1}$ | $L_{Q35}$ |
| 36. | $L_{A1}$ | $L_{Q36}$ |
| 37. | $L_{A1}$ | $L_{Q37}$ |
| 38. | $L_{A1}$ | $L_{Q38}$ |
| 39. | $L_{A1}$ | $L_{Q39}$ |
| 40. | $L_{A1}$ | $L_{Q40}$ |
| 41. | $L_{A1}$ | $L_{Q41}$ |

-continued

| Compound number | $L^1$ | $L^2$ |
|---|---|---|
| 42. | $L_{A1}$ | $L_{Q42}$ |
| 43. | $L_{A1}$ | $L_{Q43}$ |
| 44. | $L_{A1}$ | $L_{Q44}$ |
| 45. | $L_{A1}$ | $L_{Q45}$ |
| 46. | $L_{A1}$ | $L_{Q46}$ |
| 47. | $L_{A1}$ | $L_{Q47}$ |
| 48. | $L_{A1}$ | $L_{Q48}$ |
| 49. | $L_{A1}$ | $L_{Q49}$ |
| 50. | $L_{A1}$ | $L_{Q50}$ |
| 51. | $L_{A1}$ | $L_{Q51}$ |
| 52. | $L_{A1}$ | $L_{Q52}$ |
| 53. | $L_{A1}$ | $L_{Q53}$ |
| 54. | $L_{A1}$ | $L_{Q54}$ |
| 55. | $L_{A1}$ | $L_{Q55}$ |
| 56. | $L_{A1}$ | $L_{Q56}$ |
| 57. | $L_{A1}$ | $L_{Q57}$ |
| 58. | $L_{A1}$ | $L_{Q58}$ |
| 59. | $L_{A1}$ | $L_{Q59}$ |
| 60. | $L_{A1}$ | $L_{Q60}$ |
| 61. | $L_{A1}$ | $L_{Q61}$ |
| 62. | $L_{A1}$ | $L_{Q62}$ |
| 63. | $L_{A1}$ | $L_{Q63}$ |
| 64. | $L_{A1}$ | $L_{Q64}$ |
| 65. | $L_{A1}$ | $L_{Q65}$ |
| 66. | $L_{A1}$ | $L_{Q66}$ |
| 67. | $L_{A1}$ | $L_{Q67}$ |
| 68. | $L_{A1}$ | $L_{Q68}$ |
| 69. | $L_{A1}$ | $L_{Q69}$ |
| 70. | $L_{A1}$ | $L_{Q70}$ |
| 71. | $L_{A1}$ | $L_{Q71}$ |
| 72. | $L_{A1}$ | $L_{Q72}$ |
| 73. | $L_{A1}$ | $L_{Q73}$ |
| 74. | $L_{A1}$ | $L_{Q74}$ |
| 75. | $L_{A1}$ | $L_{Q75}$ |
| 76. | $L_{A1}$ | $L_{Q76}$ |
| 77. | $L_{A1}$ | $L_{Q77}$ |
| 78. | $L_{A1}$ | $L_{Q78}$ |
| 79. | $L_{A1}$ | $L_{Q79}$ |
| 80. | $L_{A1}$ | $L_{Q80}$ |
| 81. | $L_{A1}$ | $L_{Q81}$ |
| 82. | $L_{A1}$ | $L_{Q82}$ |
| 83. | $L_{A1}$ | $L_{Q83}$ |
| 84. | $L_{A1}$ | $L_{Q84}$ |
| 85. | $L_{A1}$ | $L_{Q85}$ |
| 86. | $L_{A1}$ | $L_{Q86}$ |
| 87. | $L_{A1}$ | $L_{Q87}$ |
| 88. | $L_{A1}$ | $L_{Q88}$ |
| 89. | $L_{A1}$ | $L_{Q89}$ |
| 90. | $L_{A1}$ | $L_{Q90}$ |
| 91. | $L_{A1}$ | $L_{Q91}$ |
| 92. | $L_{A1}$ | $L_{Q92}$ |
| 93. | $L_{A1}$ | $L_{Q93}$ |
| 94. | $L_{A1}$ | $L_{Q94}$ |
| 95. | $L_{A1}$ | $L_{Q95}$ |
| 96. | $L_{A1}$ | $L_{Q96}$ |
| 97. | $L_{A1}$ | $L_{Q97}$ |
| 98. | $L_{A1}$ | $L_{Q98}$ |
| 99. | $L_{A1}$ | $L_{Q99}$ |
| 100. | $L_{A1}$ | $L_{Q100}$ |
| 101. | $L_{A1}$ | $L_{Q101}$ |
| 102. | $L_{A1}$ | $L_{Q102}$ |
| 103. | $L_{A1}$ | $L_{Q103}$ |
| 104. | $L_{A1}$ | $L_{Q104}$ |
| 105. | $L_{A1}$ | $L_{Q105}$ |
| 106. | $L_{A1}$ | $L_{Q106}$ |
| 107. | $L_{A1}$ | $L_{Q107}$ |
| 108. | $L_{A1}$ | $L_{Q108}$ |
| 109. | $L_{A1}$ | $L_{Q109}$ |
| 110. | $L_{A1}$ | $L_{Q110}$ |
| 111. | $L_{A1}$ | $L_{Q111}$ |
| 112. | $L_{A1}$ | $L_{Q112}$ |
| 113. | $L_{A1}$ | $L_{Q113}$ |
| 114. | $L_{A1}$ | $L_{Q114}$ |
| 115. | $L_{A1}$ | $L_{Q115}$ |
| 116. | $L_{A1}$ | $L_{Q116}$ |
| 117. | $L_{A1}$ | $L_{Q117}$ |
| 118. | $L_{A1}$ | $L_{Q118}$ |
| 119. | $L_{A1}$ | $L_{Q119}$ |
| 120. | $L_{A1}$ | $L_{Q120}$ |
| 121. | $L_{A1}$ | $L_{Q121}$ |
| 122. | $L_{A1}$ | $L_{Q122}$ |
| 123. | $L_{A1}$ | $L_{Q123}$ |
| 124. | $L_{A1}$ | $L_{Q124}$ |
| 125. | $L_{A1}$ | $L_{Q125}$ |
| 126. | $L_{A1}$ | $L_{Q126}$ |
| 127. | $L_{A1}$ | $L_{Q127}$ |
| 128. | $L_{A1}$ | $L_{Q128}$ |
| 129. | $L_{A1}$ | $L_{Q129}$ |
| 130. | $L_{A1}$ | $L_{Q130}$ |
| 131. | $L_{A1}$ | $L_{Q131}$ |
| 132. | $L_{A1}$ | $L_{Q132}$ |
| 133. | $L_{A1}$ | $L_{Q133}$ |
| 134. | $L_{A2}$ | $L_{Q1}$ |
| 135. | $L_{A2}$ | $L_{Q2}$ |
| 136. | $L_{A2}$ | $L_{Q3}$ |
| 137. | $L_{A2}$ | $L_{Q4}$ |
| 138. | $L_{A2}$ | $L_{Q5}$ |
| 139. | $L_{A2}$ | $L_{Q6}$ |
| 140. | $L_{A2}$ | $L_{Q7}$ |
| 141. | $L_{A2}$ | $L_{Q8}$ |
| 142. | $L_{A2}$ | $L_{Q9}$ |
| 143. | $L_{A2}$ | $L_{Q10}$ |
| 144. | $L_{A2}$ | $L_{Q11}$ |
| 145. | $L_{A2}$ | $L_{Q12}$ |
| 146. | $L_{A2}$ | $L_{Q13}$ |
| 147. | $L_{A2}$ | $L_{Q14}$ |
| 148. | $L_{A2}$ | $L_{Q15}$ |
| 149. | $L_{A2}$ | $L_{Q16}$ |
| 150. | $L_{A2}$ | $L_{Q17}$ |
| 151. | $L_{A2}$ | $L_{Q18}$ |
| 152. | $L_{A2}$ | $L_{Q19}$ |
| 153. | $L_{A2}$ | $L_{Q20}$ |
| 154. | $L_{A2}$ | $L_{Q21}$ |
| 155. | $L_{A2}$ | $L_{Q22}$ |
| 156. | $L_{A2}$ | $L_{Q23}$ |
| 157. | $L_{A2}$ | $L_{Q24}$ |
| 158. | $L_{A2}$ | $L_{Q25}$ |
| 159. | $L_{A2}$ | $L_{Q26}$ |
| 160. | $L_{A2}$ | $L_{Q27}$ |
| 161. | $L_{A2}$ | $L_{Q28}$ |
| 162. | $L_{A2}$ | $L_{Q29}$ |
| 163. | $L_{A2}$ | $L_{Q30}$ |
| 164. | $L_{A2}$ | $L_{Q31}$ |
| 165. | $L_{A2}$ | $L_{Q32}$ |
| 166. | $L_{A2}$ | $L_{Q33}$ |
| 167. | $L_{A2}$ | $L_{Q34}$ |
| 168. | $L_{A2}$ | $L_{Q35}$ |
| 169. | $L_{A2}$ | $L_{Q36}$ |
| 170. | $L_{A2}$ | $L_{Q37}$ |
| 171. | $L_{A2}$ | $L_{Q38}$ |
| 172. | $L_{A2}$ | $L_{Q39}$ |
| 173. | $L_{A2}$ | $L_{Q40}$ |
| 174. | $L_{A2}$ | $L_{Q41}$ |
| 175. | $L_{A2}$ | $L_{Q42}$ |
| 176. | $L_{A2}$ | $L_{Q43}$ |
| 177. | $L_{A2}$ | $L_{Q44}$ |
| 178. | $L_{A2}$ | $L_{Q45}$ |
| 179. | $L_{A2}$ | $L_{Q46}$ |
| 180. | $L_{A2}$ | $L_{Q47}$ |
| 181. | $L_{A2}$ | $L_{Q48}$ |
| 182. | $L_{A2}$ | $L_{Q49}$ |
| 183. | $L_{A2}$ | $L_{Q50}$ |
| 184. | $L_{A2}$ | $L_{Q51}$ |
| 185. | $L_{A2}$ | $L_{Q52}$ |
| 186. | $L_{A2}$ | $L_{Q53}$ |
| 187. | $L_{A2}$ | $L_{Q54}$ |
| 188. | $L_{A2}$ | $L_{Q55}$ |
| 189. | $L_{A2}$ | $L_{Q56}$ |
| 190. | $L_{A2}$ | $L_{Q57}$ |
| 191. | $L_{A2}$ | $L_{Q58}$ |
| 192. | $L_{A2}$ | $L_{Q59}$ |
| 193. | $L_{A2}$ | $L_{Q60}$ |

-continued

| Compound number | $L^1$ | $L^2$ |
|---|---|---|
| 194. | $L_{A2}$ | $L_{Q61}$ |
| 195. | $L_{A2}$ | $L_{Q62}$ |
| 196. | $L_{A2}$ | $L_{Q63}$ |
| 197. | $L_{A2}$ | $L_{Q64}$ |
| 198. | $L_{A2}$ | $L_{Q65}$ |
| 199. | $L_{A2}$ | $L_{Q66}$ |
| 200. | $L_{A2}$ | $L_{Q67}$ |
| 201. | $L_{A2}$ | $L_{Q68}$ |
| 202. | $L_{A2}$ | $L_{Q69}$ |
| 203. | $L_{A2}$ | $L_{Q70}$ |
| 204. | $L_{A2}$ | $L_{Q71}$ |
| 205. | $L_{A2}$ | $L_{Q72}$ |
| 206. | $L_{A2}$ | $L_{Q73}$ |
| 207. | $L_{A2}$ | $L_{Q74}$ |
| 208. | $L_{A2}$ | $L_{Q75}$ |
| 209. | $L_{A2}$ | $L_{Q76}$ |
| 210. | $L_{A2}$ | $L_{Q77}$ |
| 211. | $L_{A2}$ | $L_{Q78}$ |
| 212. | $L_{A2}$ | $L_{Q79}$ |
| 213. | $L_{A2}$ | $L_{Q80}$ |
| 214. | $L_{A2}$ | $L_{Q81}$ |
| 215. | $L_{A2}$ | $L_{Q82}$ |
| 216. | $L_{A2}$ | $L_{Q83}$ |
| 217. | $L_{A2}$ | $L_{Q84}$ |
| 218. | $L_{A2}$ | $L_{Q85}$ |
| 219. | $L_{A2}$ | $L_{Q86}$ |
| 220. | $L_{A2}$ | $L_{Q87}$ |
| 221. | $L_{A2}$ | $L_{Q88}$ |
| 222. | $L_{A2}$ | $L_{Q89}$ |
| 223. | $L_{A2}$ | $L_{Q90}$ |
| 224. | $L_{A2}$ | $L_{Q91}$ |
| 225. | $L_{A2}$ | $L_{Q92}$ |
| 226. | $L_{A2}$ | $L_{Q93}$ |
| 227. | $L_{A2}$ | $L_{Q94}$ |
| 228. | $L_{A2}$ | $L_{Q95}$ |
| 229. | $L_{A2}$ | $L_{Q96}$ |
| 230. | $L_{A2}$ | $L_{Q97}$ |
| 231. | $L_{A2}$ | $L_{Q98}$ |
| 232. | $L_{A2}$ | $L_{Q99}$ |
| 233. | $L_{A2}$ | $L_{Q100}$ |
| 234. | $L_{A2}$ | $L_{Q101}$ |
| 235. | $L_{A2}$ | $L_{Q102}$ |
| 236. | $L_{A2}$ | $L_{Q103}$ |
| 237. | $L_{A2}$ | $L_{Q104}$ |
| 238. | $L_{A2}$ | $L_{Q105}$ |
| 239. | $L_{A2}$ | $L_{Q106}$ |
| 240. | $L_{A2}$ | $L_{Q107}$ |
| 241. | $L_{A2}$ | $L_{Q108}$ |
| 242. | $L_{A2}$ | $L_{Q109}$ |
| 243. | $L_{A2}$ | $L_{Q110}$ |
| 244. | $L_{A2}$ | $L_{Q111}$ |
| 245. | $L_{A2}$ | $L_{Q112}$ |
| 246. | $L_{A2}$ | $L_{Q113}$ |
| 247. | $L_{A2}$ | $L_{Q114}$ |
| 248. | $L_{A2}$ | $L_{Q115}$ |
| 249. | $L_{A2}$ | $L_{Q116}$ |
| 250. | $L_{A2}$ | $L_{Q117}$ |
| 251. | $L_{A2}$ | $L_{Q118}$ |
| 252. | $L_{A2}$ | $L_{Q119}$ |
| 253. | $L_{A2}$ | $L_{Q120}$ |
| 254. | $L_{A2}$ | $L_{Q121}$ |
| 255. | $L_{A2}$ | $L_{Q122}$ |
| 256. | $L_{A2}$ | $L_{Q123}$ |
| 257. | $L_{A2}$ | $L_{Q124}$ |
| 258. | $L_{A2}$ | $L_{Q125}$ |
| 259. | $L_{A2}$ | $L_{Q126}$ |
| 260. | $L_{A2}$ | $L_{Q127}$ |
| 261. | $L_{A2}$ | $L_{Q128}$ |
| 262. | $L_{A2}$ | $L_{Q129}$ |
| 263. | $L_{A2}$ | $L_{Q130}$ |
| 264. | $L_{A2}$ | $L_{Q131}$ |
| 265. | $L_{A2}$ | $L_{Q132}$ |
| 266. | $L_{A2}$ | $L_{Q133}$ |
| 267. | $L_{A3}$ | $L_{Q1}$ |
| 268. | $L_{A3}$ | $L_{Q2}$ |
| 269. | $L_{A3}$ | $L_{Q3}$ |

-continued

| Compound number | $L^1$ | $L^2$ |
|---|---|---|
| 270. | $L_{A3}$ | $L_{Q4}$ |
| 271. | $L_{A3}$ | $L_{Q5}$ |
| 272. | $L_{A3}$ | $L_{Q6}$ |
| 273. | $L_{A3}$ | $L_{Q7}$ |
| 274. | $L_{A3}$ | $L_{Q8}$ |
| 275. | $L_{A3}$ | $L_{Q9}$ |
| 276. | $L_{A3}$ | $L_{Q10}$ |
| 277. | $L_{A3}$ | $L_{Q11}$ |
| 278. | $L_{A3}$ | $L_{Q12}$ |
| 279. | $L_{A3}$ | $L_{Q13}$ |
| 280. | $L_{A3}$ | $L_{Q14}$ |
| 281. | $L_{A3}$ | $L_{Q15}$ |
| 282. | $L_{A3}$ | $L_{Q16}$ |
| 283. | $L_{A3}$ | $L_{Q17}$ |
| 284. | $L_{A3}$ | $L_{Q18}$ |
| 285. | $L_{A3}$ | $L_{Q19}$ |
| 286. | $L_{A3}$ | $L_{Q20}$ |
| 287. | $L_{A3}$ | $L_{Q21}$ |
| 288. | $L_{A3}$ | $L_{Q22}$ |
| 289. | $L_{A3}$ | $L_{Q23}$ |
| 290. | $L_{A3}$ | $L_{Q24}$ |
| 291. | $L_{A3}$ | $L_{Q25}$ |
| 292. | $L_{A3}$ | $L_{Q26}$ |
| 293. | $L_{A3}$ | $L_{Q27}$ |
| 294. | $L_{A3}$ | $L_{Q28}$ |
| 295. | $L_{A3}$ | $L_{Q29}$ |
| 296. | $L_{A3}$ | $L_{Q30}$ |
| 297. | $L_{A3}$ | $L_{Q31}$ |
| 298. | $L_{A3}$ | $L_{Q32}$ |
| 299. | $L_{A3}$ | $L_{Q33}$ |
| 300. | $L_{A3}$ | $L_{Q34}$ |
| 301. | $L_{A3}$ | $L_{Q35}$ |
| 302. | $L_{A3}$ | $L_{Q36}$ |
| 303. | $L_{A3}$ | $L_{Q37}$ |
| 304. | $L_{A3}$ | $L_{Q38}$ |
| 305. | $L_{A3}$ | $L_{Q39}$ |
| 306. | $L_{A3}$ | $L_{Q40}$ |
| 307. | $L_{A3}$ | $L_{Q41}$ |
| 308. | $L_{A3}$ | $L_{Q42}$ |
| 309. | $L_{A3}$ | $L_{Q43}$ |
| 310. | $L_{A3}$ | $L_{Q44}$ |
| 311. | $L_{A3}$ | $L_{Q45}$ |
| 312. | $L_{A3}$ | $L_{Q46}$ |
| 313. | $L_{A3}$ | $L_{Q47}$ |
| 314. | $L_{A3}$ | $L_{Q48}$ |
| 315. | $L_{A3}$ | $L_{Q49}$ |
| 316. | $L_{A3}$ | $L_{Q50}$ |
| 317. | $L_{A3}$ | $L_{Q51}$ |
| 318. | $L_{A3}$ | $L_{Q52}$ |
| 319. | $L_{A3}$ | $L_{Q53}$ |
| 320. | $L_{A3}$ | $L_{Q54}$ |
| 321. | $L_{A3}$ | $L_{Q55}$ |
| 322. | $L_{A3}$ | $L_{Q56}$ |
| 323. | $L_{A3}$ | $L_{Q57}$ |
| 324. | $L_{A3}$ | $L_{Q58}$ |
| 325. | $L_{A3}$ | $L_{Q59}$ |
| 326. | $L_{A3}$ | $L_{Q60}$ |
| 327. | $L_{A3}$ | $L_{Q61}$ |
| 328. | $L_{A3}$ | $L_{Q62}$ |
| 329. | $L_{A3}$ | $L_{Q63}$ |
| 330. | $L_{A3}$ | $L_{Q64}$ |
| 331. | $L_{A3}$ | $L_{Q65}$ |
| 332. | $L_{A3}$ | $L_{Q66}$ |
| 333. | $L_{A3}$ | $L_{Q67}$ |
| 334. | $L_{A3}$ | $L_{Q68}$ |
| 335. | $L_{A3}$ | $L_{Q69}$ |
| 336. | $L_{A3}$ | $L_{Q70}$ |
| 337. | $L_{A3}$ | $L_{Q71}$ |
| 338. | $L_{A3}$ | $L_{Q72}$ |
| 339. | $L_{A3}$ | $L_{Q73}$ |
| 340. | $L_{A3}$ | $L_{Q74}$ |
| 341. | $L_{A3}$ | $L_{Q75}$ |
| 342. | $L_{A3}$ | $L_{Q76}$ |
| 343. | $L_{A3}$ | $L_{Q77}$ |
| 344. | $L_{A3}$ | $L_{Q78}$ |
| 345. | $L_{A3}$ | $L_{Q79}$ |

-continued

| Compound number | $L^1$ | $L^2$ |
|---|---|---|
| 346. | $L_{A3}$ | $L_{Q80}$ |
| 347. | $L_{A3}$ | $L_{Q81}$ |
| 348. | $L_{A3}$ | $L_{Q82}$ |
| 349. | $L_{A3}$ | $L_{Q83}$ |
| 350. | $L_{A3}$ | $L_{Q84}$ |
| 351. | $L_{A3}$ | $L_{Q85}$ |
| 352. | $L_{A3}$ | $L_{Q86}$ |
| 353. | $L_{A3}$ | $L_{Q87}$ |
| 354. | $L_{A3}$ | $L_{Q88}$ |
| 355. | $L_{A3}$ | $L_{Q89}$ |
| 356. | $L_{A3}$ | $L_{Q90}$ |
| 357. | $L_{A3}$ | $L_{Q91}$ |
| 358. | $L_{A3}$ | $L_{Q92}$ |
| 359. | $L_{A3}$ | $L_{Q93}$ |
| 360. | $L_{A3}$ | $L_{Q94}$ |
| 361. | $L_{A3}$ | $L_{Q95}$ |
| 362. | $L_{A3}$ | $L_{Q96}$ |
| 363. | $L_{A3}$ | $L_{Q97}$ |
| 364. | $L_{A3}$ | $L_{Q98}$ |
| 365. | $L_{A3}$ | $L_{Q99}$ |
| 366. | $L_{A3}$ | $L_{Q100}$ |
| 367. | $L_{A3}$ | $L_{Q101}$ |
| 368. | $L_{A3}$ | $L_{Q102}$ |
| 369. | $L_{A3}$ | $L_{Q103}$ |
| 370. | $L_{A3}$ | $L_{Q104}$ |
| 371. | $L_{A3}$ | $L_{Q105}$ |
| 372. | $L_{A3}$ | $L_{Q106}$ |
| 373. | $L_{A3}$ | $L_{Q107}$ |
| 374. | $L_{A3}$ | $L_{Q108}$ |
| 375. | $L_{A3}$ | $L_{Q109}$ |
| 376. | $L_{A3}$ | $L_{Q110}$ |
| 377. | $L_{A3}$ | $L_{Q111}$ |
| 378. | $L_{A3}$ | $L_{Q112}$ |
| 379. | $L_{A3}$ | $L_{Q113}$ |
| 380. | $L_{A3}$ | $L_{Q114}$ |
| 381. | $L_{A3}$ | $L_{Q115}$ |
| 382. | $L_{A3}$ | $L_{Q116}$ |
| 383. | $L_{A3}$ | $L_{Q117}$ |
| 384. | $L_{A3}$ | $L_{Q118}$ |
| 385. | $L_{A3}$ | $L_{Q119}$ |
| 386. | $L_{A3}$ | $L_{Q120}$ |
| 387. | $L_{A3}$ | $L_{Q121}$ |
| 388. | $L_{A3}$ | $L_{Q122}$ |
| 389. | $L_{A3}$ | $L_{Q123}$ |
| 390. | $L_{A3}$ | $L_{Q124}$ |
| 391. | $L_{A3}$ | $L_{Q125}$ |
| 392. | $L_{A3}$ | $L_{Q126}$ |
| 393. | $L_{A3}$ | $L_{Q127}$ |
| 394. | $L_{A3}$ | $L_{Q128}$ |
| 395. | $L_{A3}$ | $L_{Q129}$ |
| 396. | $L_{A3}$ | $L_{Q130}$ |
| 397. | $L_{A3}$ | $L_{Q131}$ |
| 398. | $L_{A3}$ | $L_{Q132}$ |
| 399. | $L_{A3}$ | $L_{Q133}$ |
| 400. | $L_{A4}$ | $L_{Q1}$ |
| 401. | $L_{A4}$ | $L_{Q2}$ |
| 402. | $L_{A4}$ | $L_{Q3}$ |
| 403. | $L_{A4}$ | $L_{Q4}$ |
| 404. | $L_{A4}$ | $L_{Q5}$ |
| 405. | $L_{A4}$ | $L_{Q6}$ |
| 406. | $L_{A4}$ | $L_{Q7}$ |
| 407. | $L_{A4}$ | $L_{Q8}$ |
| 408. | $L_{A4}$ | $L_{Q9}$ |
| 409. | $L_{A4}$ | $L_{Q10}$ |
| 410. | $L_{A4}$ | $L_{Q11}$ |
| 411. | $L_{A4}$ | $L_{Q12}$ |
| 412. | $L_{A4}$ | $L_{Q13}$ |
| 413. | $L_{A4}$ | $L_{Q14}$ |
| 414. | $L_{A4}$ | $L_{Q15}$ |
| 415. | $L_{A4}$ | $L_{Q16}$ |
| 416. | $L_{A4}$ | $L_{Q17}$ |
| 417. | $L_{A4}$ | $L_{Q18}$ |
| 418. | $L_{A4}$ | $L_{Q19}$ |
| 419. | $L_{A4}$ | $L_{Q20}$ |
| 420. | $L_{A4}$ | $L_{Q21}$ |
| 421. | $L_{A4}$ | $L_{Q22}$ |

-continued

| Compound number | $L^1$ | $L^2$ |
|---|---|---|
| 422. | $L_{A4}$ | $L_{Q23}$ |
| 423. | $L_{A4}$ | $L_{Q24}$ |
| 424. | $L_{A4}$ | $L_{Q25}$ |
| 425. | $L_{A4}$ | $L_{Q26}$ |
| 426. | $L_{A4}$ | $L_{Q27}$ |
| 427. | $L_{A4}$ | $L_{Q28}$ |
| 428. | $L_{A4}$ | $L_{Q29}$ |
| 429. | $L_{A4}$ | $L_{Q30}$ |
| 430. | $L_{A4}$ | $L_{Q31}$ |
| 431. | $L_{A4}$ | $L_{Q32}$ |
| 432. | $L_{A4}$ | $L_{Q33}$ |
| 433. | $L_{A4}$ | $L_{Q34}$ |
| 434. | $L_{A4}$ | $L_{Q35}$ |
| 435. | $L_{A4}$ | $L_{Q36}$ |
| 436. | $L_{A4}$ | $L_{Q37}$ |
| 437. | $L_{A4}$ | $L_{Q38}$ |
| 438. | $L_{A4}$ | $L_{Q39}$ |
| 439. | $L_{A4}$ | $L_{Q40}$ |
| 440. | $L_{A4}$ | $L_{Q41}$ |
| 441. | $L_{A4}$ | $L_{Q42}$ |
| 442. | $L_{A4}$ | $L_{Q43}$ |
| 443. | $L_{A4}$ | $L_{Q44}$ |
| 444. | $L_{A4}$ | $L_{Q45}$ |
| 445. | $L_{A4}$ | $L_{Q46}$ |
| 446. | $L_{A4}$ | $L_{Q47}$ |
| 447. | $L_{A4}$ | $L_{Q48}$ |
| 448. | $L_{A4}$ | $L_{Q49}$ |
| 449. | $L_{A4}$ | $L_{Q50}$ |
| 450. | $L_{A4}$ | $L_{Q51}$ |
| 451. | $L_{A4}$ | $L_{Q52}$ |
| 452. | $L_{A4}$ | $L_{Q53}$ |
| 453. | $L_{A4}$ | $L_{Q54}$ |
| 454. | $L_{A4}$ | $L_{Q55}$ |
| 455. | $L_{A4}$ | $L_{Q56}$ |
| 456. | $L_{A4}$ | $L_{Q57}$ |
| 457. | $L_{A4}$ | $L_{Q58}$ |
| 458. | $L_{A4}$ | $L_{Q59}$ |
| 459. | $L_{A4}$ | $L_{Q60}$ |
| 460. | $L_{A4}$ | $L_{Q61}$ |
| 461. | $L_{A4}$ | $L_{Q62}$ |
| 462. | $L_{A4}$ | $L_{Q63}$ |
| 463. | $L_{A4}$ | $L_{Q64}$ |
| 464. | $L_{A4}$ | $L_{Q65}$ |
| 465. | $L_{A4}$ | $L_{Q66}$ |
| 466. | $L_{A4}$ | $L_{Q67}$ |
| 467. | $L_{A4}$ | $L_{Q68}$ |
| 468. | $L_{A4}$ | $L_{Q69}$ |
| 469. | $L_{A4}$ | $L_{Q70}$ |
| 470. | $L_{A4}$ | $L_{Q71}$ |
| 471. | $L_{A4}$ | $L_{Q72}$ |
| 472. | $L_{A4}$ | $L_{Q73}$ |
| 473. | $L_{A4}$ | $L_{Q74}$ |
| 474. | $L_{A4}$ | $L_{Q75}$ |
| 475. | $L_{A4}$ | $L_{Q76}$ |
| 476. | $L_{A4}$ | $L_{Q77}$ |
| 477. | $L_{A4}$ | $L_{Q78}$ |
| 478. | $L_{A4}$ | $L_{Q79}$ |
| 479. | $L_{A4}$ | $L_{Q80}$ |
| 480. | $L_{A4}$ | $L_{Q81}$ |
| 481. | $L_{A4}$ | $L_{Q82}$ |
| 482. | $L_{A4}$ | $L_{Q83}$ |
| 483. | $L_{A4}$ | $L_{Q84}$ |
| 484. | $L_{A4}$ | $L_{Q85}$ |
| 485. | $L_{A4}$ | $L_{Q86}$ |
| 486. | $L_{A4}$ | $L_{Q87}$ |
| 487. | $L_{A4}$ | $L_{Q88}$ |
| 488. | $L_{A4}$ | $L_{Q89}$ |
| 489. | $L_{A4}$ | $L_{Q90}$ |
| 490. | $L_{A4}$ | $L_{Q91}$ |
| 491. | $L_{A4}$ | $L_{Q92}$ |
| 492. | $L_{A4}$ | $L_{Q93}$ |
| 493. | $L_{A4}$ | $L_{Q94}$ |
| 494. | $L_{A4}$ | $L_{Q95}$ |
| 495. | $L_{A4}$ | $L_{Q96}$ |
| 496. | $L_{A4}$ | $L_{Q97}$ |
| 497. | $L_{A4}$ | $L_{Q98}$ |

-continued

| Compound number | $L^1$ | $L^2$ |
|---|---|---|
| 498. | $L_{A4}$ | $L_{Q99}$ |
| 499. | $L_{A4}$ | $L_{Q100}$ |
| 500. | $L_{A4}$ | $L_{Q101}$ |
| 501. | $L_{A4}$ | $L_{Q102}$ |
| 502. | $L_{A4}$ | $L_{Q103}$ |
| 503. | $L_{A4}$ | $L_{Q104}$ |
| 504. | $L_{A4}$ | $L_{Q105}$ |
| 505. | $L_{A4}$ | $L_{Q106}$ |
| 506. | $L_{A4}$ | $L_{Q107}$ |
| 507. | $L_{A4}$ | $L_{Q108}$ |
| 508. | $L_{A4}$ | $L_{Q109}$ |
| 509. | $L_{A4}$ | $L_{Q110}$ |
| 510. | $L_{A4}$ | $L_{Q111}$ |
| 511. | $L_{A4}$ | $L_{Q112}$ |
| 512. | $L_{A4}$ | $L_{Q113}$ |
| 513. | $L_{A4}$ | $L_{Q114}$ |
| 514. | $L_{A4}$ | $L_{Q115}$ |
| 515. | $L_{A4}$ | $L_{Q116}$ |
| 516. | $L_{A4}$ | $L_{Q117}$ |
| 517. | $L_{A4}$ | $L_{Q118}$ |
| 518. | $L_{A4}$ | $L_{Q119}$ |
| 519. | $L_{A4}$ | $L_{Q120}$ |
| 520. | $L_{A4}$ | $L_{Q121}$ |
| 521. | $L_{A4}$ | $L_{Q122}$ |
| 522. | $L_{A4}$ | $L_{Q123}$ |
| 523. | $L_{A4}$ | $L_{Q124}$ |
| 524. | $L_{A4}$ | $L_{Q125}$ |
| 525. | $L_{A4}$ | $L_{Q126}$ |
| 526. | $L_{A4}$ | $L_{Q127}$ |
| 527. | $L_{A4}$ | $L_{Q128}$ |
| 528. | $L_{A4}$ | $L_{Q129}$ |
| 529. | $L_{A4}$ | $L_{Q130}$ |
| 530. | $L_{A4}$ | $L_{Q131}$ |
| 531. | $L_{A4}$ | $L_{Q132}$ |
| 532. | $L_{A4}$ | $L_{Q133}$ |
| 533. | $L_{A5}$ | $L_{Q1}$ |
| 534. | $L_{A5}$ | $L_{Q2}$ |
| 535. | $L_{A5}$ | $L_{Q3}$ |
| 536. | $L_{A5}$ | $L_{Q4}$ |
| 537. | $L_{A5}$ | $L_{Q5}$ |
| 538. | $L_{A5}$ | $L_{Q6}$ |
| 539. | $L_{A5}$ | $L_{Q7}$ |
| 540. | $L_{A5}$ | $L_{Q8}$ |
| 541. | $L_{A5}$ | $L_{Q9}$ |
| 542. | $L_{A5}$ | $L_{Q10}$ |
| 543. | $L_{A5}$ | $L_{Q11}$ |
| 544. | $L_{A5}$ | $L_{Q12}$ |
| 545. | $L_{A5}$ | $L_{Q13}$ |
| 546. | $L_{A5}$ | $L_{Q14}$ |
| 547. | $L_{A5}$ | $L_{Q15}$ |
| 548. | $L_{A5}$ | $L_{Q16}$ |
| 549. | $L_{A5}$ | $L_{Q17}$ |
| 550. | $L_{A5}$ | $L_{Q18}$ |
| 551. | $L_{A5}$ | $L_{Q19}$ |
| 552. | $L_{A5}$ | $L_{Q20}$ |
| 553. | $L_{A5}$ | $L_{Q21}$ |
| 554. | $L_{A5}$ | $L_{Q22}$ |
| 555. | $L_{A5}$ | $L_{Q23}$ |
| 556. | $L_{A5}$ | $L_{Q24}$ |
| 557. | $L_{A5}$ | $L_{Q25}$ |
| 558. | $L_{A5}$ | $L_{Q26}$ |
| 559. | $L_{A5}$ | $L_{Q27}$ |
| 560. | $L_{A5}$ | $L_{Q28}$ |
| 561. | $L_{A5}$ | $L_{Q29}$ |
| 562. | $L_{A5}$ | $L_{Q30}$ |
| 563. | $L_{A5}$ | $L_{Q31}$ |
| 564. | $L_{A5}$ | $L_{Q32}$ |
| 565. | $L_{A5}$ | $L_{Q33}$ |
| 566. | $L_{A5}$ | $L_{Q34}$ |
| 567. | $L_{A5}$ | $L_{Q35}$ |
| 568. | $L_{A5}$ | $L_{Q36}$ |
| 569. | $L_{A5}$ | $L_{Q37}$ |
| 570. | $L_{A5}$ | $L_{Q38}$ |
| 571. | $L_{A5}$ | $L_{Q39}$ |
| 572. | $L_{A5}$ | $L_{Q40}$ |
| 573. | $L_{A5}$ | $L_{Q41}$ |

-continued

| Compound number | $L^1$ | $L^2$ |
|---|---|---|
| 574. | $L_{A5}$ | $L_{Q42}$ |
| 575. | $L_{A5}$ | $L_{Q43}$ |
| 576. | $L_{A5}$ | $L_{Q44}$ |
| 577. | $L_{A5}$ | $L_{Q45}$ |
| 578. | $L_{A5}$ | $L_{Q46}$ |
| 579. | $L_{A5}$ | $L_{Q47}$ |
| 580. | $L_{A5}$ | $L_{Q48}$ |
| 581. | $L_{A5}$ | $L_{Q49}$ |
| 582. | $L_{A5}$ | $L_{Q50}$ |
| 583. | $L_{A5}$ | $L_{Q51}$ |
| 584. | $L_{A5}$ | $L_{Q52}$ |
| 585. | $L_{A5}$ | $L_{Q53}$ |
| 586. | $L_{A5}$ | $L_{Q54}$ |
| 587. | $L_{A5}$ | $L_{Q55}$ |
| 588. | $L_{A5}$ | $L_{Q56}$ |
| 589. | $L_{A5}$ | $L_{Q57}$ |
| 590. | $L_{A5}$ | $L_{Q58}$ |
| 591. | $L_{A5}$ | $L_{Q59}$ |
| 592. | $L_{A5}$ | $L_{Q60}$ |
| 593. | $L_{A5}$ | $L_{Q61}$ |
| 594. | $L_{A5}$ | $L_{Q62}$ |
| 595. | $L_{A5}$ | $L_{Q63}$ |
| 596. | $L_{A5}$ | $L_{Q64}$ |
| 597. | $L_{A5}$ | $L_{Q65}$ |
| 598. | $L_{A5}$ | $L_{Q66}$ |
| 599. | $L_{A5}$ | $L_{Q67}$ |
| 600. | $L_{A5}$ | $L_{Q68}$ |
| 601. | $L_{A5}$ | $L_{Q69}$ |
| 602. | $L_{A5}$ | $L_{Q70}$ |
| 603. | $L_{A5}$ | $L_{Q71}$ |
| 604. | $L_{A5}$ | $L_{Q72}$ |
| 605. | $L_{A5}$ | $L_{Q73}$ |
| 606. | $L_{A5}$ | $L_{Q74}$ |
| 607. | $L_{A5}$ | $L_{Q75}$ |
| 608. | $L_{A5}$ | $L_{Q76}$ |
| 609. | $L_{A5}$ | $L_{Q77}$ |
| 610. | $L_{A5}$ | $L_{Q78}$ |
| 611. | $L_{A5}$ | $L_{Q79}$ |
| 612. | $L_{A5}$ | $L_{Q80}$ |
| 613. | $L_{A5}$ | $L_{Q81}$ |
| 614. | $L_{A5}$ | $L_{Q82}$ |
| 615. | $L_{A5}$ | $L_{Q83}$ |
| 616. | $L_{A5}$ | $L_{Q84}$ |
| 617. | $L_{A5}$ | $L_{Q85}$ |
| 618. | $L_{A5}$ | $L_{Q86}$ |
| 619. | $L_{A5}$ | $L_{Q87}$ |
| 620. | $L_{A5}$ | $L_{Q88}$ |
| 621. | $L_{A5}$ | $L_{Q89}$ |
| 622. | $L_{A5}$ | $L_{Q90}$ |
| 623. | $L_{A5}$ | $L_{Q91}$ |
| 624. | $L_{A5}$ | $L_{Q92}$ |
| 625. | $L_{A5}$ | $L_{Q93}$ |
| 626. | $L_{A5}$ | $L_{Q94}$ |
| 627. | $L_{A5}$ | $L_{Q95}$ |
| 628. | $L_{A5}$ | $L_{Q96}$ |
| 629. | $L_{A5}$ | $L_{Q97}$ |
| 630. | $L_{A5}$ | $L_{Q98}$ |
| 631. | $L_{A5}$ | $L_{Q99}$ |
| 632. | $L_{A5}$ | $L_{Q100}$ |
| 633. | $L_{A5}$ | $L_{Q101}$ |
| 634. | $L_{A5}$ | $L_{Q102}$ |
| 635. | $L_{A5}$ | $L_{Q103}$ |
| 636. | $L_{A5}$ | $L_{Q104}$ |
| 637. | $L_{A5}$ | $L_{Q105}$ |
| 638. | $L_{A5}$ | $L_{Q106}$ |
| 639. | $L_{A5}$ | $L_{Q107}$ |
| 640. | $L_{A5}$ | $L_{Q108}$ |
| 641. | $L_{A5}$ | $L_{Q109}$ |
| 642. | $L_{A5}$ | $L_{Q110}$ |
| 643. | $L_{A5}$ | $L_{Q111}$ |
| 644. | $L_{A5}$ | $L_{Q112}$ |
| 645. | $L_{A5}$ | $L_{Q113}$ |
| 646. | $L_{A5}$ | $L_{Q114}$ |
| 647. | $L_{A5}$ | $L_{Q115}$ |
| 648. | $L_{A5}$ | $L_{Q116}$ |
| 649. | $L_{A5}$ | $L_{Q117}$ |

-continued

| Compound number | $L^1$ | $L^2$ |
|---|---|---|
| 650. | $L_{A5}$ | $L_{Q118}$ |
| 651. | $L_{A5}$ | $L_{Q119}$ |
| 652. | $L_{A5}$ | $L_{Q120}$ |
| 653. | $L_{A5}$ | $L_{Q121}$ |
| 654. | $L_{A5}$ | $L_{Q122}$ |
| 655. | $L_{A5}$ | $L_{Q123}$ |
| 656. | $L_{A5}$ | $L_{Q124}$ |
| 657. | $L_{A5}$ | $L_{Q125}$ |
| 658. | $L_{A5}$ | $L_{Q126}$ |
| 659. | $L_{A5}$ | $L_{Q127}$ |
| 660. | $L_{A5}$ | $L_{Q128}$ |
| 661. | $L_{A5}$ | $L_{Q129}$ |
| 662. | $L_{A5}$ | $L_{Q130}$ |
| 663. | $L_{A5}$ | $L_{Q131}$ |
| 664. | $L_{A5}$ | $L_{Q132}$ |
| 665. | $L_{A5}$ | $L_{Q133}$ |
| 666. | $L_{A6}$ | $L_{Q1}$ |
| 667. | $L_{A6}$ | $L_{Q2}$ |
| 668. | $L_{A6}$ | $L_{Q3}$ |
| 669. | $L_{A6}$ | $L_{Q4}$ |
| 670. | $L_{A6}$ | $L_{Q5}$ |
| 671. | $L_{A6}$ | $L_{Q6}$ |
| 672. | $L_{A6}$ | $L_{Q7}$ |
| 673. | $L_{A6}$ | $L_{Q8}$ |
| 674. | $L_{A6}$ | $L_{Q9}$ |
| 675. | $L_{A6}$ | $L_{Q10}$ |
| 676. | $L_{A6}$ | $L_{Q11}$ |
| 677. | $L_{A6}$ | $L_{Q12}$ |
| 678. | $L_{A6}$ | $L_{Q13}$ |
| 679. | $L_{A6}$ | $L_{Q14}$ |
| 680. | $L_{A6}$ | $L_{Q15}$ |
| 681. | $L_{A6}$ | $L_{Q16}$ |
| 682. | $L_{A6}$ | $L_{Q17}$ |
| 683. | $L_{A6}$ | $L_{Q18}$ |
| 684. | $L_{A6}$ | $L_{Q19}$ |
| 685. | $L_{A6}$ | $L_{Q20}$ |
| 686. | $L_{A6}$ | $L_{Q21}$ |
| 687. | $L_{A6}$ | $L_{Q22}$ |
| 688. | $L_{A6}$ | $L_{Q23}$ |
| 689. | $L_{A6}$ | $L_{Q24}$ |
| 690. | $L_{A6}$ | $L_{Q25}$ |
| 691. | $L_{A6}$ | $L_{Q26}$ |
| 692. | $L_{A6}$ | $L_{Q27}$ |
| 693. | $L_{A6}$ | $L_{Q28}$ |
| 694. | $L_{A6}$ | $L_{Q29}$ |
| 695. | $L_{A6}$ | $L_{Q30}$ |
| 696. | $L_{A6}$ | $L_{Q31}$ |
| 697. | $L_{A6}$ | $L_{Q32}$ |
| 698. | $L_{A6}$ | $L_{Q33}$ |
| 699. | $L_{A6}$ | $L_{Q34}$ |
| 700. | $L_{A6}$ | $L_{Q35}$ |
| 701. | $L_{A6}$ | $L_{Q36}$ |
| 702. | $L_{A6}$ | $L_{Q37}$ |
| 703. | $L_{A6}$ | $L_{Q38}$ |
| 704. | $L_{A6}$ | $L_{Q39}$ |
| 705. | $L_{A6}$ | $L_{Q40}$ |
| 706. | $L_{A6}$ | $L_{Q41}$ |
| 707. | $L_{A6}$ | $L_{Q42}$ |
| 708. | $L_{A6}$ | $L_{Q43}$ |
| 709. | $L_{A6}$ | $L_{Q44}$ |
| 710. | $L_{A6}$ | $L_{Q45}$ |
| 711. | $L_{A6}$ | $L_{Q46}$ |
| 712. | $L_{A6}$ | $L_{Q47}$ |
| 713. | $L_{A6}$ | $L_{Q48}$ |
| 714. | $L_{A6}$ | $L_{Q49}$ |
| 715. | $L_{A6}$ | $L_{Q50}$ |
| 716. | $L_{A6}$ | $L_{Q51}$ |
| 717. | $L_{A6}$ | $L_{Q52}$ |
| 718. | $L_{A6}$ | $L_{Q53}$ |
| 719. | $L_{A6}$ | $L_{Q54}$ |
| 720. | $L_{A6}$ | $L_{Q55}$ |
| 721. | $L_{A6}$ | $L_{Q56}$ |
| 722. | $L_{A6}$ | $L_{Q57}$ |
| 723. | $L_{A6}$ | $L_{Q58}$ |
| 724. | $L_{A6}$ | $L_{Q59}$ |
| 725. | $L_{A6}$ | $L_{Q60}$ |

-continued

| Compound number | $L^1$ | $L^2$ |
|---|---|---|
| 726. | $L_{A6}$ | $L_{Q61}$ |
| 727. | $L_{A6}$ | $L_{Q62}$ |
| 728. | $L_{A6}$ | $L_{Q63}$ |
| 729. | $L_{A6}$ | $L_{Q64}$ |
| 730. | $L_{A6}$ | $L_{Q65}$ |
| 731. | $L_{A6}$ | $L_{Q66}$ |
| 732. | $L_{A6}$ | $L_{Q67}$ |
| 733. | $L_{A6}$ | $L_{Q68}$ |
| 734. | $L_{A6}$ | $L_{Q69}$ |
| 735. | $L_{A6}$ | $L_{Q70}$ |
| 736. | $L_{A6}$ | $L_{Q71}$ |
| 737. | $L_{A6}$ | $L_{Q72}$ |
| 738. | $L_{A6}$ | $L_{Q73}$ |
| 739. | $L_{A6}$ | $L_{Q74}$ |
| 740. | $L_{A6}$ | $L_{Q75}$ |
| 741. | $L_{A6}$ | $L_{Q76}$ |
| 742. | $L_{A6}$ | $L_{Q77}$ |
| 743. | $L_{A6}$ | $L_{Q78}$ |
| 744. | $L_{A6}$ | $L_{Q79}$ |
| 745. | $L_{A6}$ | $L_{Q80}$ |
| 746. | $L_{A6}$ | $L_{Q81}$ |
| 747. | $L_{A6}$ | $L_{Q82}$ |
| 748. | $L_{A6}$ | $L_{Q83}$ |
| 749. | $L_{A6}$ | $L_{Q84}$ |
| 750. | $L_{A6}$ | $L_{Q85}$ |
| 751. | $L_{A6}$ | $L_{Q86}$ |
| 752. | $L_{A6}$ | $L_{Q87}$ |
| 753. | $L_{A6}$ | $L_{Q88}$ |
| 754. | $L_{A6}$ | $L_{Q89}$ |
| 755. | $L_{A6}$ | $L_{Q90}$ |
| 756. | $L_{A6}$ | $L_{Q91}$ |
| 757. | $L_{A6}$ | $L_{Q92}$ |
| 758. | $L_{A6}$ | $L_{Q93}$ |
| 759. | $L_{A6}$ | $L_{Q94}$ |
| 760. | $L_{A6}$ | $L_{Q95}$ |
| 761. | $L_{A6}$ | $L_{Q96}$ |
| 762. | $L_{A6}$ | $L_{Q97}$ |
| 763. | $L_{A6}$ | $L_{Q98}$ |
| 764. | $L_{A6}$ | $L_{Q99}$ |
| 765. | $L_{A6}$ | $L_{Q100}$ |
| 766. | $L_{A6}$ | $L_{Q101}$ |
| 767. | $L_{A6}$ | $L_{Q102}$ |
| 768. | $L_{A6}$ | $L_{Q103}$ |
| 769. | $L_{A6}$ | $L_{Q104}$ |
| 770. | $L_{A6}$ | $L_{Q105}$ |
| 771. | $L_{A6}$ | $L_{Q106}$ |
| 772. | $L_{A6}$ | $L_{Q107}$ |
| 773. | $L_{A6}$ | $L_{Q108}$ |
| 774. | $L_{A6}$ | $L_{Q109}$ |
| 775. | $L_{A6}$ | $L_{Q110}$ |
| 776. | $L_{A6}$ | $L_{Q111}$ |
| 777. | $L_{A6}$ | $L_{Q112}$ |
| 778. | $L_{A6}$ | $L_{Q113}$ |
| 779. | $L_{A6}$ | $L_{Q114}$ |
| 780. | $L_{A6}$ | $L_{Q115}$ |
| 781. | $L_{A6}$ | $L_{Q116}$ |
| 782. | $L_{A6}$ | $L_{Q117}$ |
| 783. | $L_{A6}$ | $L_{Q118}$ |
| 784. | $L_{A6}$ | $L_{Q119}$ |
| 785. | $L_{A6}$ | $L_{Q120}$ |
| 786. | $L_{A6}$ | $L_{Q121}$ |
| 787. | $L_{A6}$ | $L_{Q122}$ |
| 788. | $L_{A6}$ | $L_{Q123}$ |
| 789. | $L_{A6}$ | $L_{Q124}$ |
| 790. | $L_{A6}$ | $L_{Q125}$ |
| 791. | $L_{A6}$ | $L_{Q126}$ |
| 792. | $L_{A6}$ | $L_{Q127}$ |
| 793. | $L_{A6}$ | $L_{Q128}$ |
| 794. | $L_{A6}$ | $L_{Q129}$ |
| 795. | $L_{A6}$ | $L_{Q130}$ |
| 796. | $L_{A6}$ | $L_{Q131}$ |
| 797. | $L_{A6}$ | $L_{Q132}$ |
| 798. | $L_{A6}$ | $L_{Q133}$ |
| 799. | $L_{A7}$ | $L_{Q1}$ |
| 800. | $L_{A7}$ | $L_{Q2}$ |
| 801. | $L_{A7}$ | $L_{Q3}$ |

-continued

| Compound number | $L^1$ | $L^2$ |
|---|---|---|
| 802. | $L_{A7}$ | $L_{Q4}$ |
| 803. | $L_{A7}$ | $L_{Q5}$ |
| 804. | $L_{A7}$ | $L_{Q6}$ |
| 805. | $L_{A7}$ | $L_{Q7}$ |
| 806. | $L_{A7}$ | $L_{Q8}$ |
| 807. | $L_{A7}$ | $L_{Q9}$ |
| 808. | $L_{A7}$ | $L_{Q10}$ |
| 809. | $L_{A7}$ | $L_{Q11}$ |
| 810. | $L_{A7}$ | $L_{Q12}$ |
| 811. | $L_{A7}$ | $L_{Q13}$ |
| 812. | $L_{A7}$ | $L_{Q14}$ |
| 813. | $L_{A7}$ | $L_{Q15}$ |
| 814. | $L_{A7}$ | $L_{Q16}$ |
| 815. | $L_{A7}$ | $L_{Q17}$ |
| 816. | $L_{A7}$ | $L_{Q18}$ |
| 817. | $L_{A7}$ | $L_{Q19}$ |
| 818. | $L_{A7}$ | $L_{Q20}$ |
| 819. | $L_{A7}$ | $L_{Q21}$ |
| 820. | $L_{A7}$ | $L_{Q22}$ |
| 821. | $L_{A7}$ | $L_{Q23}$ |
| 822. | $L_{A7}$ | $L_{Q24}$ |
| 823. | $L_{A7}$ | $L_{Q25}$ |
| 824. | $L_{A7}$ | $L_{Q26}$ |
| 825. | $L_{A7}$ | $L_{Q27}$ |
| 826. | $L_{A7}$ | $L_{Q28}$ |
| 827. | $L_{A7}$ | $L_{Q29}$ |
| 828. | $L_{A7}$ | $L_{Q30}$ |
| 829. | $L_{A7}$ | $L_{Q31}$ |
| 830. | $L_{A7}$ | $L_{Q32}$ |
| 831. | $L_{A7}$ | $L_{Q33}$ |
| 832. | $L_{A7}$ | $L_{Q34}$ |
| 833. | $L_{A7}$ | $L_{Q35}$ |
| 834. | $L_{A7}$ | $L_{Q36}$ |
| 835. | $L_{A7}$ | $L_{Q37}$ |
| 836. | $L_{A7}$ | $L_{Q38}$ |
| 837. | $L_{A7}$ | $L_{Q39}$ |
| 838. | $L_{A7}$ | $L_{Q40}$ |
| 839. | $L_{A7}$ | $L_{Q41}$ |
| 840. | $L_{A7}$ | $L_{Q42}$ |
| 841. | $L_{A7}$ | $L_{Q43}$ |
| 842. | $L_{A7}$ | $L_{Q44}$ |
| 843. | $L_{A7}$ | $L_{Q45}$ |
| 844. | $L_{A7}$ | $L_{Q46}$ |
| 845. | $L_{A7}$ | $L_{Q47}$ |
| 846. | $L_{A7}$ | $L_{Q48}$ |
| 847. | $L_{A7}$ | $L_{Q49}$ |
| 848. | $L_{A7}$ | $L_{Q50}$ |
| 849. | $L_{A7}$ | $L_{Q51}$ |
| 850. | $L_{A7}$ | $L_{Q52}$ |
| 851. | $L_{A7}$ | $L_{Q53}$ |
| 852. | $L_{A7}$ | $L_{Q54}$ |
| 853. | $L_{A7}$ | $L_{Q55}$ |
| 854. | $L_{A7}$ | $L_{Q56}$ |
| 855. | $L_{A7}$ | $L_{Q57}$ |
| 856. | $L_{A7}$ | $L_{Q58}$ |
| 857. | $L_{A7}$ | $L_{Q59}$ |
| 858. | $L_{A7}$ | $L_{Q60}$ |
| 859. | $L_{A7}$ | $L_{Q61}$ |
| 860. | $L_{A7}$ | $L_{Q62}$ |
| 861. | $L_{A7}$ | $L_{Q63}$ |
| 862. | $L_{A7}$ | $L_{Q64}$ |
| 863. | $L_{A7}$ | $L_{Q65}$ |
| 864. | $L_{A7}$ | $L_{Q66}$ |
| 865. | $L_{A7}$ | $L_{Q67}$ |
| 866. | $L_{A7}$ | $L_{Q68}$ |
| 867. | $L_{A7}$ | $L_{Q69}$ |
| 868. | $L_{A7}$ | $L_{Q70}$ |
| 869. | $L_{A7}$ | $L_{Q71}$ |
| 870. | $L_{A7}$ | $L_{Q72}$ |
| 871. | $L_{A7}$ | $L_{Q73}$ |
| 872. | $L_{A7}$ | $L_{Q74}$ |
| 873. | $L_{A7}$ | $L_{Q75}$ |
| 874. | $L_{A7}$ | $L_{Q76}$ |
| 875. | $L_{A7}$ | $L_{Q77}$ |
| 876. | $L_{A7}$ | $L_{Q78}$ |
| 877. | $L_{A7}$ | $L_{Q79}$ |

-continued

| Compound number | $L^1$ | $L^2$ |
|---|---|---|
| 878. | $L_{A7}$ | $L_{Q80}$ |
| 879. | $L_{A7}$ | $L_{Q81}$ |
| 880. | $L_{A7}$ | $L_{Q82}$ |
| 881. | $L_{A7}$ | $L_{Q83}$ |
| 882. | $L_{A7}$ | $L_{Q84}$ |
| 883. | $L_{A7}$ | $L_{Q85}$ |
| 884. | $L_{A7}$ | $L_{Q86}$ |
| 885. | $L_{A7}$ | $L_{Q87}$ |
| 886. | $L_{A7}$ | $L_{Q88}$ |
| 887. | $L_{A7}$ | $L_{Q89}$ |
| 888. | $L_{A7}$ | $L_{Q90}$ |
| 889. | $L_{A7}$ | $L_{Q91}$ |
| 890. | $L_{A7}$ | $L_{Q92}$ |
| 891. | $L_{A7}$ | $L_{Q93}$ |
| 892. | $L_{A7}$ | $L_{Q94}$ |
| 893. | $L_{A7}$ | $L_{Q95}$ |
| 894. | $L_{A7}$ | $L_{Q96}$ |
| 895. | $L_{A7}$ | $L_{Q97}$ |
| 896. | $L_{A7}$ | $L_{Q98}$ |
| 897. | $L_{A7}$ | $L_{Q99}$ |
| 898. | $L_{A7}$ | $L_{Q100}$ |
| 899. | $L_{A7}$ | $L_{Q101}$ |
| 900. | $L_{A7}$ | $L_{Q102}$ |
| 901. | $L_{A7}$ | $L_{Q103}$ |
| 902. | $L_{A7}$ | $L_{Q104}$ |
| 903. | $L_{A7}$ | $L_{Q105}$ |
| 904. | $L_{A7}$ | $L_{Q106}$ |
| 905. | $L_{A7}$ | $L_{Q107}$ |
| 906. | $L_{A7}$ | $L_{Q108}$ |
| 907. | $L_{A7}$ | $L_{Q109}$ |
| 908. | $L_{A7}$ | $L_{Q110}$ |
| 909. | $L_{A7}$ | $L_{Q111}$ |
| 910. | $L_{A7}$ | $L_{Q112}$ |
| 911. | $L_{A7}$ | $L_{Q113}$ |
| 912. | $L_{A7}$ | $L_{Q114}$ |
| 913. | $L_{A7}$ | $L_{Q115}$ |
| 914. | $L_{A7}$ | $L_{Q116}$ |
| 915. | $L_{A7}$ | $L_{Q117}$ |
| 916. | $L_{A7}$ | $L_{Q118}$ |
| 917. | $L_{A7}$ | $L_{Q119}$ |
| 918. | $L_{A7}$ | $L_{Q120}$ |
| 919. | $L_{A7}$ | $L_{Q121}$ |
| 920. | $L_{A7}$ | $L_{Q122}$ |
| 921. | $L_{A7}$ | $L_{Q123}$ |
| 922. | $L_{A7}$ | $L_{Q124}$ |
| 923. | $L_{A7}$ | $L_{Q125}$ |
| 924. | $L_{A7}$ | $L_{Q126}$ |
| 925. | $L_{A7}$ | $L_{Q127}$ |
| 926. | $L_{A7}$ | $L_{Q128}$ |
| 927. | $L_{A7}$ | $L_{Q129}$ |
| 928. | $L_{A7}$ | $L_{Q130}$ |
| 929. | $L_{A7}$ | $L_{Q131}$ |
| 930. | $L_{A7}$ | $L_{Q132}$ |
| 931. | $L_{A7}$ | $L_{Q133}$ |
| 932. | $L_{A8}$ | $L_{Q1}$ |
| 933. | $L_{A8}$ | $L_{Q2}$ |
| 934. | $L_{A8}$ | $L_{Q3}$ |
| 935. | $L_{A8}$ | $L_{Q4}$ |
| 936. | $L_{A8}$ | $L_{Q5}$ |
| 937. | $L_{A8}$ | $L_{Q6}$ |
| 938. | $L_{A8}$ | $L_{Q7}$ |
| 939. | $L_{A8}$ | $L_{Q8}$ |
| 940. | $L_{A8}$ | $L_{Q9}$ |
| 941. | $L_{A8}$ | $L_{Q10}$ |
| 942. | $L_{A8}$ | $L_{Q11}$ |
| 943. | $L_{A8}$ | $L_{Q12}$ |
| 944. | $L_{A8}$ | $L_{Q13}$ |
| 945. | $L_{A8}$ | $L_{Q14}$ |
| 946. | $L_{A8}$ | $L_{Q15}$ |
| 947. | $L_{A8}$ | $L_{Q16}$ |
| 948. | $L_{A8}$ | $L_{Q17}$ |
| 949. | $L_{A8}$ | $L_{Q18}$ |
| 950. | $L_{A8}$ | $L_{Q19}$ |
| 951. | $L_{A8}$ | $L_{Q20}$ |
| 952. | $L_{A8}$ | $L_{Q21}$ |
| 953. | $L_{A8}$ | $L_{Q22}$ |

-continued

| Compound number | $L^1$ | $L^2$ |
|---|---|---|
| 954. | $L_{A8}$ | $L_{Q23}$ |
| 955. | $L_{A8}$ | $L_{Q24}$ |
| 956. | $L_{A8}$ | $L_{Q25}$ |
| 957. | $L_{A8}$ | $L_{Q26}$ |
| 958. | $L_{A8}$ | $L_{Q27}$ |
| 959. | $L_{A8}$ | $L_{Q28}$ |
| 960. | $L_{A8}$ | $L_{Q29}$ |
| 961. | $L_{A8}$ | $L_{Q30}$ |
| 962. | $L_{A8}$ | $L_{Q31}$ |
| 963. | $L_{A8}$ | $L_{Q32}$ |
| 964. | $L_{A8}$ | $L_{Q33}$ |
| 965. | $L_{A8}$ | $L_{Q34}$ |
| 966. | $L_{A8}$ | $L_{Q35}$ |
| 967. | $L_{A8}$ | $L_{Q36}$ |
| 968. | $L_{A8}$ | $L_{Q37}$ |
| 969. | $L_{A8}$ | $L_{Q38}$ |
| 970. | $L_{A8}$ | $L_{Q39}$ |
| 971. | $L_{A8}$ | $L_{Q40}$ |
| 972. | $L_{A8}$ | $L_{Q41}$ |
| 973. | $L_{A8}$ | $L_{Q42}$ |
| 974. | $L_{A8}$ | $L_{Q43}$ |
| 975. | $L_{A8}$ | $L_{Q44}$ |
| 976. | $L_{A8}$ | $L_{Q45}$ |
| 977. | $L_{A8}$ | $L_{Q46}$ |
| 978. | $L_{A8}$ | $L_{Q47}$ |
| 979. | $L_{A8}$ | $L_{Q48}$ |
| 980. | $L_{A8}$ | $L_{Q49}$ |
| 981. | $L_{A8}$ | $L_{Q50}$ |
| 982. | $L_{A8}$ | $L_{Q51}$ |
| 983. | $L_{A8}$ | $L_{Q52}$ |
| 984. | $L_{A8}$ | $L_{Q53}$ |
| 985. | $L_{A8}$ | $L_{Q54}$ |
| 986. | $L_{A8}$ | $L_{Q55}$ |
| 987. | $L_{A8}$ | $L_{Q56}$ |
| 988. | $L_{A8}$ | $L_{Q57}$ |
| 989. | $L_{A8}$ | $L_{Q58}$ |
| 990. | $L_{A8}$ | $L_{Q59}$ |
| 991. | $L_{A8}$ | $L_{Q60}$ |
| 992. | $L_{A8}$ | $L_{Q61}$ |
| 993. | $L_{A8}$ | $L_{Q62}$ |
| 994. | $L_{A8}$ | $L_{Q63}$ |
| 995. | $L_{A8}$ | $L_{Q64}$ |
| 996. | $L_{A8}$ | $L_{Q65}$ |
| 997. | $L_{A8}$ | $L_{Q66}$ |
| 998. | $L_{A8}$ | $L_{Q67}$ |
| 999. | $L_{A8}$ | $L_{Q68}$ |
| 1000. | $L_{A8}$ | $L_{Q69}$ |
| 1001. | $L_{A8}$ | $L_{Q70}$ |
| 1002. | $L_{A8}$ | $L_{Q71}$ |
| 1003. | $L_{A8}$ | $L_{Q72}$ |
| 1004. | $L_{A8}$ | $L_{Q73}$ |
| 1005. | $L_{A8}$ | $L_{Q74}$ |
| 1006. | $L_{A8}$ | $L_{Q75}$ |
| 1007. | $L_{A8}$ | $L_{Q76}$ |
| 1008. | $L_{A8}$ | $L_{Q77}$ |
| 1009. | $L_{A8}$ | $L_{Q78}$ |
| 1010. | $L_{A8}$ | $L_{Q79}$ |
| 1011. | $L_{A8}$ | $L_{Q80}$ |
| 1012. | $L_{A8}$ | $L_{Q81}$ |
| 1013. | $L_{A8}$ | $L_{Q82}$ |
| 1014. | $L_{A8}$ | $L_{Q83}$ |
| 1015. | $L_{A8}$ | $L_{Q84}$ |
| 1016. | $L_{A8}$ | $L_{Q85}$ |
| 1017. | $L_{A8}$ | $L_{Q86}$ |
| 1018. | $L_{A8}$ | $L_{Q87}$ |
| 1019. | $L_{A8}$ | $L_{Q88}$ |
| 1020. | $L_{A8}$ | $L_{Q89}$ |
| 1021. | $L_{A8}$ | $L_{Q90}$ |
| 1022. | $L_{A8}$ | $L_{Q91}$ |
| 1023. | $L_{A8}$ | $L_{Q92}$ |
| 1024. | $L_{A8}$ | $L_{Q93}$ |
| 1025. | $L_{A8}$ | $L_{Q94}$ |
| 1026. | $L_{A8}$ | $L_{Q95}$ |
| 1027. | $L_{A8}$ | $L_{Q96}$ |
| 1028. | $L_{A8}$ | $L_{Q97}$ |
| 1029. | $L_{A8}$ | $L_{Q98}$ |

-continued

| Compound number | $L^1$ | $L^2$ |
|---|---|---|
| 1030. | $L_{A8}$ | $L_{Q99}$ |
| 1031. | $L_{A8}$ | $L_{Q100}$ |
| 1032. | $L_{A8}$ | $L_{Q101}$ |
| 1033. | $L_{A8}$ | $L_{Q102}$ |
| 1034. | $L_{A8}$ | $L_{Q103}$ |
| 1035. | $L_{A8}$ | $L_{Q104}$ |
| 1036. | $L_{A8}$ | $L_{Q105}$ |
| 1037. | $L_{A8}$ | $L_{Q106}$ |
| 1038. | $L_{A8}$ | $L_{Q107}$ |
| 1039. | $L_{A8}$ | $L_{Q108}$ |
| 1040. | $L_{A8}$ | $L_{Q109}$ |
| 1041. | $L_{A8}$ | $L_{Q110}$ |
| 1042. | $L_{A8}$ | $L_{Q111}$ |
| 1043. | $L_{A8}$ | $L_{Q112}$ |
| 1044. | $L_{A8}$ | $L_{Q113}$ |
| 1045. | $L_{A8}$ | $L_{Q114}$ |
| 1046. | $L_{A8}$ | $L_{Q115}$ |
| 1047. | $L_{A8}$ | $L_{Q116}$ |
| 1048. | $L_{A8}$ | $L_{Q117}$ |
| 1049. | $L_{A8}$ | $L_{Q118}$ |
| 1050. | $L_{A8}$ | $L_{Q119}$ |
| 1051. | $L_{A8}$ | $L_{Q120}$ |
| 1052. | $L_{A8}$ | $L_{Q121}$ |
| 1053. | $L_{A8}$ | $L_{Q122}$ |
| 1054. | $L_{A8}$ | $L_{Q123}$ |
| 1055. | $L_{A8}$ | $L_{Q124}$ |
| 1056. | $L_{A8}$ | $L_{Q125}$ |
| 1057. | $L_{A8}$ | $L_{Q126}$ |
| 1058. | $L_{A8}$ | $L_{Q127}$ |
| 1059. | $L_{A8}$ | $L_{Q128}$ |
| 1060. | $L_{A8}$ | $L_{Q129}$ |
| 1061. | $L_{A8}$ | $L_{Q130}$ |
| 1062. | $L_{A8}$ | $L_{Q131}$ |
| 1063. | $L_{A8}$ | $L_{Q132}$ |
| 1064. | $L_{A8}$ | $L_{Q133}$ |
| 1065. | $L_{A9}$ | $L_{Q1}$ |
| 1066. | $L_{A9}$ | $L_{Q2}$ |
| 1067. | $L_{A9}$ | $L_{Q3}$ |
| 1068. | $L_{A9}$ | $L_{Q4}$ |
| 1069. | $L_{A9}$ | $L_{Q5}$ |
| 1070. | $L_{A9}$ | $L_{Q6}$ |
| 1071. | $L_{A9}$ | $L_{Q7}$ |
| 1072. | $L_{A9}$ | $L_{Q8}$ |
| 1073. | $L_{A9}$ | $L_{Q9}$ |
| 1074. | $L_{A9}$ | $L_{Q10}$ |
| 1075. | $L_{A9}$ | $L_{Q11}$ |
| 1076. | $L_{A9}$ | $L_{Q12}$ |
| 1077. | $L_{A9}$ | $L_{Q13}$ |
| 1078. | $L_{A9}$ | $L_{Q14}$ |
| 1079. | $L_{A9}$ | $L_{Q15}$ |
| 1080. | $L_{A9}$ | $L_{Q16}$ |
| 1081. | $L_{A9}$ | $L_{Q17}$ |
| 1082. | $L_{A9}$ | $L_{Q18}$ |
| 1083. | $L_{A9}$ | $L_{Q19}$ |
| 1084. | $L_{A9}$ | $L_{Q20}$ |
| 1085. | $L_{A9}$ | $L_{Q21}$ |
| 1086. | $L_{A9}$ | $L_{Q22}$ |
| 1087. | $L_{A9}$ | $L_{Q23}$ |
| 1088. | $L_{A9}$ | $L_{Q24}$ |
| 1089. | $L_{A9}$ | $L_{Q25}$ |
| 1090. | $L_{A9}$ | $L_{Q26}$ |
| 1091. | $L_{A9}$ | $L_{Q27}$ |
| 1092. | $L_{A9}$ | $L_{Q28}$ |
| 1093. | $L_{A9}$ | $L_{Q29}$ |
| 1094. | $L_{A9}$ | $L_{Q30}$ |
| 1095. | $L_{A9}$ | $L_{Q31}$ |
| 1096. | $L_{A9}$ | $L_{Q32}$ |
| 1097. | $L_{A9}$ | $L_{Q33}$ |
| 1098. | $L_{A9}$ | $L_{Q34}$ |
| 1099. | $L_{A9}$ | $L_{Q35}$ |
| 1100. | $L_{A9}$ | $L_{Q36}$ |
| 1101. | $L_{A9}$ | $L_{Q37}$ |
| 1102. | $L_{A9}$ | $L_{Q38}$ |
| 1103. | $L_{A9}$ | $L_{Q39}$ |
| 1104. | $L_{A9}$ | $L_{Q40}$ |
| 1105. | $L_{A9}$ | $L_{Q41}$ |

-continued

| Compound number | $L^1$ | $L^2$ |
|---|---|---|
| 1106. | $L_{A9}$ | $L_{Q42}$ |
| 1107. | $L_{A9}$ | $L_{Q43}$ |
| 1108. | $L_{A9}$ | $L_{Q44}$ |
| 1109. | $L_{A9}$ | $L_{Q45}$ |
| 1110. | $L_{A9}$ | $L_{Q46}$ |
| 1111. | $L_{A9}$ | $L_{Q47}$ |
| 1112. | $L_{A9}$ | $L_{Q48}$ |
| 1113. | $L_{A9}$ | $L_{Q49}$ |
| 1114. | $L_{A9}$ | $L_{Q50}$ |
| 1115. | $L_{A9}$ | $L_{Q51}$ |
| 1116. | $L_{A9}$ | $L_{Q52}$ |
| 1117. | $L_{A9}$ | $L_{Q53}$ |
| 1118. | $L_{A9}$ | $L_{Q54}$ |
| 1119. | $L_{A9}$ | $L_{Q55}$ |
| 1120. | $L_{A9}$ | $L_{Q56}$ |
| 1121. | $L_{A9}$ | $L_{Q57}$ |
| 1122. | $L_{A9}$ | $L_{Q58}$ |
| 1123. | $L_{A9}$ | $L_{Q59}$ |
| 1124. | $L_{A9}$ | $L_{Q60}$ |
| 1125. | $L_{A9}$ | $L_{Q61}$ |
| 1126. | $L_{A9}$ | $L_{Q62}$ |
| 1127. | $L_{A9}$ | $L_{Q63}$ |
| 1128. | $L_{A9}$ | $L_{Q64}$ |
| 1129. | $L_{A9}$ | $L_{Q65}$ |
| 1130. | $L_{A9}$ | $L_{Q66}$ |
| 1131. | $L_{A9}$ | $L_{Q67}$ |
| 1132. | $L_{A9}$ | $L_{Q68}$ |
| 1133. | $L_{A9}$ | $L_{Q69}$ |
| 1134. | $L_{A9}$ | $L_{Q70}$ |
| 1135. | $L_{A9}$ | $L_{Q71}$ |
| 1136. | $L_{A9}$ | $L_{Q72}$ |
| 1137. | $L_{A9}$ | $L_{Q73}$ |
| 1138. | $L_{A9}$ | $L_{Q74}$ |
| 1139. | $L_{A9}$ | $L_{Q75}$ |
| 1140. | $L_{A9}$ | $L_{Q76}$ |
| 1141. | $L_{A9}$ | $L_{Q77}$ |
| 1142. | $L_{A9}$ | $L_{Q78}$ |
| 1143. | $L_{A9}$ | $L_{Q79}$ |
| 1144. | $L_{A9}$ | $L_{Q80}$ |
| 1145. | $L_{A9}$ | $L_{Q81}$ |
| 1146. | $L_{A9}$ | $L_{Q82}$ |
| 1147. | $L_{A9}$ | $L_{Q83}$ |
| 1148. | $L_{A9}$ | $L_{Q84}$ |
| 1149. | $L_{A9}$ | $L_{Q85}$ |
| 1150. | $L_{A9}$ | $L_{Q86}$ |
| 1151. | $L_{A9}$ | $L_{Q87}$ |
| 1152. | $L_{A9}$ | $L_{Q88}$ |
| 1153. | $L_{A9}$ | $L_{Q89}$ |
| 1154. | $L_{A9}$ | $L_{Q90}$ |
| 1155. | $L_{A9}$ | $L_{Q91}$ |
| 1156. | $L_{A9}$ | $L_{Q92}$ |
| 1157. | $L_{A9}$ | $L_{Q93}$ |
| 1158. | $L_{A9}$ | $L_{Q94}$ |
| 1159. | $L_{A9}$ | $L_{Q95}$ |
| 1160. | $L_{A9}$ | $L_{Q96}$ |
| 1161. | $L_{A9}$ | $L_{Q97}$ |
| 1162. | $L_{A9}$ | $L_{Q98}$ |
| 1163. | $L_{A9}$ | $L_{Q99}$ |
| 1164. | $L_{A9}$ | $L_{Q100}$ |
| 1165. | $L_{A9}$ | $L_{Q101}$ |
| 1166. | $L_{A9}$ | $L_{Q102}$ |
| 1167. | $L_{A9}$ | $L_{Q103}$ |
| 1168. | $L_{A9}$ | $L_{Q104}$ |
| 1169. | $L_{A9}$ | $L_{Q105}$ |
| 1170. | $L_{A9}$ | $L_{Q106}$ |
| 1171. | $L_{A9}$ | $L_{Q107}$ |
| 1172. | $L_{A9}$ | $L_{Q108}$ |
| 1173. | $L_{A9}$ | $L_{Q109}$ |
| 1174. | $L_{A9}$ | $L_{Q110}$ |
| 1175. | $L_{A9}$ | $L_{Q111}$ |
| 1176. | $L_{A9}$ | $L_{Q112}$ |
| 1177. | $L_{A9}$ | $L_{Q113}$ |
| 1178. | $L_{A9}$ | $L_{Q114}$ |
| 1179. | $L_{A9}$ | $L_{Q115}$ |
| 1180. | $L_{A9}$ | $L_{Q116}$ |
| 1181. | $L_{A9}$ | $L_{Q117}$ |

-continued

| Compound number | $L^1$ | $L^2$ |
|---|---|---|
| 1182. | $L_{A9}$ | $L_{Q118}$ |
| 1183. | $L_{A9}$ | $L_{Q119}$ |
| 1184. | $L_{A9}$ | $L_{Q120}$ |
| 1185. | $L_{A9}$ | $L_{Q121}$ |
| 1186. | $L_{A9}$ | $L_{Q122}$ |
| 1187. | $L_{A9}$ | $L_{Q123}$ |
| 1188. | $L_{A9}$ | $L_{Q124}$ |
| 1189. | $L_{A9}$ | $L_{Q125}$ |
| 1190. | $L_{A9}$ | $L_{Q126}$ |
| 1191. | $L_{A9}$ | $L_{Q127}$ |
| 1192. | $L_{A9}$ | $L_{Q128}$ |
| 1193. | $L_{A9}$ | $L_{Q129}$ |
| 1194. | $L_{A9}$ | $L_{Q130}$ |
| 1195. | $L_{A9}$ | $L_{Q131}$ |
| 1196. | $L_{A9}$ | $L_{Q132}$ |
| 1197. | $L_{A9}$ | $L_{Q133}$ |
| 1198. | $L_{A10}$ | $L_{Q1}$ |
| 1199. | $L_{A10}$ | $L_{Q2}$ |
| 1200. | $L_{A10}$ | $L_{Q3}$ |
| 1201. | $L_{A10}$ | $L_{Q4}$ |
| 1202. | $L_{A10}$ | $L_{Q5}$ |
| 1203. | $L_{A10}$ | $L_{Q6}$ |
| 1204. | $L_{A10}$ | $L_{Q7}$ |
| 1205. | $L_{A10}$ | $L_{Q8}$ |
| 1206. | $L_{A10}$ | $L_{Q9}$ |
| 1207. | $L_{A10}$ | $L_{Q10}$ |
| 1208. | $L_{A10}$ | $L_{Q11}$ |
| 1209. | $L_{A10}$ | $L_{Q12}$ |
| 1210. | $L_{A10}$ | $L_{Q13}$ |
| 1211. | $L_{A10}$ | $L_{Q14}$ |
| 1212. | $L_{A10}$ | $L_{Q15}$ |
| 1213. | $L_{A10}$ | $L_{Q16}$ |
| 1214. | $L_{A10}$ | $L_{Q17}$ |
| 1215. | $L_{A10}$ | $L_{Q18}$ |
| 1216. | $L_{A10}$ | $L_{Q19}$ |
| 1217. | $L_{A10}$ | $L_{Q20}$ |
| 1218. | $L_{A10}$ | $L_{Q21}$ |
| 1219. | $L_{A10}$ | $L_{Q22}$ |
| 1220. | $L_{A10}$ | $L_{Q23}$ |
| 1221. | $L_{A10}$ | $L_{Q24}$ |
| 1222. | $L_{A10}$ | $L_{Q25}$ |
| 1223. | $L_{A10}$ | $L_{Q26}$ |
| 1224. | $L_{A10}$ | $L_{Q27}$ |
| 1225. | $L_{A10}$ | $L_{Q28}$ |
| 1226. | $L_{A10}$ | $L_{Q29}$ |
| 1227. | $L_{A10}$ | $L_{Q30}$ |
| 1228. | $L_{A10}$ | $L_{Q31}$ |
| 1229. | $L_{A10}$ | $L_{Q32}$ |
| 1230. | $L_{A10}$ | $L_{Q33}$ |
| 1231. | $L_{A10}$ | $L_{Q34}$ |
| 1232. | $L_{A10}$ | $L_{Q35}$ |
| 1233. | $L_{A10}$ | $L_{Q36}$ |
| 1234. | $L_{A10}$ | $L_{Q37}$ |
| 1235. | $L_{A10}$ | $L_{Q38}$ |
| 1236. | $L_{A10}$ | $L_{Q39}$ |
| 1237. | $L_{A10}$ | $L_{Q40}$ |
| 1238. | $L_{A10}$ | $L_{Q41}$ |
| 1239. | $L_{A10}$ | $L_{Q42}$ |
| 1240. | $L_{A10}$ | $L_{Q43}$ |
| 1241. | $L_{A10}$ | $L_{Q44}$ |
| 1242. | $L_{A10}$ | $L_{Q45}$ |
| 1243. | $L_{A10}$ | $L_{Q46}$ |
| 1244. | $L_{A10}$ | $L_{Q47}$ |
| 1245. | $L_{A10}$ | $L_{Q48}$ |
| 1246. | $L_{A10}$ | $L_{Q49}$ |
| 1247. | $L_{A10}$ | $L_{Q50}$ |
| 1248. | $L_{A10}$ | $L_{Q51}$ |
| 1249. | $L_{A10}$ | $L_{Q52}$ |
| 1250. | $L_{A10}$ | $L_{Q53}$ |
| 1251. | $L_{A10}$ | $L_{Q54}$ |
| 1252. | $L_{A10}$ | $L_{Q55}$ |
| 1253. | $L_{A10}$ | $L_{Q56}$ |
| 1254. | $L_{A10}$ | $L_{Q57}$ |
| 1255. | $L_{A10}$ | $L_{Q58}$ |
| 1256. | $L_{A10}$ | $L_{Q59}$ |
| 1257. | $L_{A10}$ | $L_{Q60}$ |

-continued

| Compound number | $L^1$ | $L^2$ |
|---|---|---|
| 1258. | $L_{A10}$ | $L_{Q61}$ |
| 1259. | $L_{A10}$ | $L_{Q62}$ |
| 1260. | $L_{A10}$ | $L_{Q63}$ |
| 1261. | $L_{A10}$ | $L_{Q64}$ |
| 1262. | $L_{A10}$ | $L_{Q65}$ |
| 1263. | $L_{A10}$ | $L_{Q66}$ |
| 1264. | $L_{A10}$ | $L_{Q67}$ |
| 1265. | $L_{A10}$ | $L_{Q68}$ |
| 1266. | $L_{A10}$ | $L_{Q69}$ |
| 1267. | $L_{A10}$ | $L_{Q70}$ |
| 1268. | $L_{A10}$ | $L_{Q71}$ |
| 1269. | $L_{A10}$ | $L_{Q72}$ |
| 1270. | $L_{A10}$ | $L_{Q73}$ |
| 1271. | $L_{A10}$ | $L_{Q74}$ |
| 1272. | $L_{A10}$ | $L_{Q75}$ |
| 1273. | $L_{A10}$ | $L_{Q76}$ |
| 1274. | $L_{A10}$ | $L_{Q77}$ |
| 1275. | $L_{A10}$ | $L_{Q78}$ |
| 1276. | $L_{A10}$ | $L_{Q79}$ |
| 1277. | $L_{A10}$ | $L_{Q80}$ |
| 1278. | $L_{A10}$ | $L_{Q81}$ |
| 1279. | $L_{A10}$ | $L_{Q82}$ |
| 1280. | $L_{A10}$ | $L_{Q83}$ |
| 1281. | $L_{A10}$ | $L_{Q84}$ |
| 1282. | $L_{A10}$ | $L_{Q85}$ |
| 1283. | $L_{A10}$ | $L_{Q86}$ |
| 1284. | $L_{A10}$ | $L_{Q87}$ |
| 1285. | $L_{A10}$ | $L_{Q88}$ |
| 1286. | $L_{A10}$ | $L_{Q89}$ |
| 1287. | $L_{A10}$ | $L_{Q90}$ |
| 1288. | $L_{A10}$ | $L_{Q91}$ |
| 1289. | $L_{A10}$ | $L_{Q92}$ |
| 1290. | $L_{A10}$ | $L_{Q93}$ |
| 1291. | $L_{A10}$ | $L_{Q94}$ |
| 1292. | $L_{A10}$ | $L_{Q95}$ |
| 1293. | $L_{A10}$ | $L_{Q96}$ |
| 1294. | $L_{A10}$ | $L_{Q97}$ |
| 1295. | $L_{A10}$ | $L_{Q98}$ |
| 1296. | $L_{A10}$ | $L_{Q99}$ |
| 1297. | $L_{A10}$ | $L_{Q100}$ |
| 1298. | $L_{A10}$ | $L_{Q101}$ |
| 1299. | $L_{A10}$ | $L_{Q102}$ |
| 1300. | $L_{A10}$ | $L_{Q103}$ |
| 1301. | $L_{A10}$ | $L_{Q104}$ |
| 1302. | $L_{A10}$ | $L_{Q105}$ |
| 1303. | $L_{A10}$ | $L_{Q106}$ |
| 1304. | $L_{A10}$ | $L_{Q107}$ |
| 1305. | $L_{A10}$ | $L_{Q108}$ |
| 1306. | $L_{A10}$ | $L_{Q109}$ |
| 1307. | $L_{A10}$ | $L_{Q110}$ |
| 1308. | $L_{A10}$ | $L_{Q111}$ |
| 1309. | $L_{A10}$ | $L_{Q112}$ |
| 1310. | $L_{A10}$ | $L_{Q113}$ |
| 1311. | $L_{A10}$ | $L_{Q114}$ |
| 1312. | $L_{A10}$ | $L_{Q115}$ |
| 1313. | $L_{A10}$ | $L_{Q116}$ |
| 1314. | $L_{A10}$ | $L_{Q117}$ |
| 1315. | $L_{A10}$ | $L_{Q118}$ |
| 1316. | $L_{A10}$ | $L_{Q119}$ |
| 1317. | $L_{A10}$ | $L_{Q120}$ |
| 1318. | $L_{A10}$ | $L_{Q121}$ |
| 1319. | $L_{A10}$ | $L_{Q122}$ |
| 1320. | $L_{A10}$ | $L_{Q123}$ |
| 1321. | $L_{A10}$ | $L_{Q124}$ |
| 1322. | $L_{A10}$ | $L_{Q125}$ |
| 1323. | $L_{A10}$ | $L_{Q126}$ |
| 1324. | $L_{A10}$ | $L_{Q127}$ |
| 1325. | $L_{A10}$ | $L_{Q128}$ |
| 1326. | $L_{A10}$ | $L_{Q129}$ |
| 1327. | $L_{A10}$ | $L_{Q130}$ |
| 1328. | $L_{A10}$ | $L_{Q131}$ |
| 1329. | $L_{A10}$ | $L_{Q132}$ |
| 1330. | $L_{A10}$ | $L_{Q133}$ |
| 1331. | $L_{A11}$ | $L_{Q1}$ |
| 1332. | $L_{A11}$ | $L_{Q2}$ |
| 1333. | $L_{A11}$ | $L_{Q3}$ |
| 1334. | $L_{A11}$ | $L_{Q4}$ |
| 1335. | $L_{A11}$ | $L_{Q5}$ |
| 1336. | $L_{A11}$ | $L_{Q6}$ |
| 1337. | $L_{A11}$ | $L_{Q7}$ |
| 1338. | $L_{A11}$ | $L_{Q8}$ |
| 1339. | $L_{A11}$ | $L_{Q9}$ |
| 1340. | $L_{A11}$ | $L_{Q10}$ |
| 1341. | $L_{A11}$ | $L_{Q11}$ |
| 1342. | $L_{A11}$ | $L_{Q12}$ |
| 1343. | $L_{A11}$ | $L_{Q13}$ |
| 1344. | $L_{A11}$ | $L_{Q14}$ |
| 1345. | $L_{A11}$ | $L_{Q15}$ |
| 1346. | $L_{A11}$ | $L_{Q16}$ |
| 1347. | $L_{A11}$ | $L_{Q17}$ |
| 1348. | $L_{A11}$ | $L_{Q18}$ |
| 1349. | $L_{A11}$ | $L_{Q19}$ |
| 1350. | $L_{A11}$ | $L_{Q20}$ |
| 1351. | $L_{A11}$ | $L_{Q21}$ |
| 1352. | $L_{A11}$ | $L_{Q22}$ |
| 1353. | $L_{A11}$ | $L_{Q23}$ |
| 1354. | $L_{A11}$ | $L_{Q24}$ |
| 1355. | $L_{A11}$ | $L_{Q25}$ |
| 1356. | $L_{A11}$ | $L_{Q26}$ |
| 1357. | $L_{A11}$ | $L_{Q27}$ |
| 1358. | $L_{A11}$ | $L_{Q28}$ |
| 1359. | $L_{A11}$ | $L_{Q29}$ |
| 1360. | $L_{A11}$ | $L_{Q30}$ |
| 1361. | $L_{A11}$ | $L_{Q31}$ |
| 1362. | $L_{A11}$ | $L_{Q32}$ |
| 1363. | $L_{A11}$ | $L_{Q33}$ |
| 1364. | $L_{A11}$ | $L_{Q34}$ |
| 1365. | $L_{A11}$ | $L_{Q35}$ |
| 1366. | $L_{A11}$ | $L_{Q36}$ |
| 1367. | $L_{A11}$ | $L_{Q37}$ |
| 1368. | $L_{A11}$ | $L_{Q38}$ |
| 1369. | $L_{A11}$ | $L_{Q39}$ |
| 1370. | $L_{A11}$ | $L_{Q40}$ |
| 1371. | $L_{A11}$ | $L_{Q41}$ |
| 1372. | $L_{A11}$ | $L_{Q42}$ |
| 1373. | $L_{A11}$ | $L_{Q43}$ |
| 1374. | $L_{A11}$ | $L_{Q44}$ |
| 1375. | $L_{A11}$ | $L_{Q45}$ |
| 1376. | $L_{A11}$ | $L_{Q46}$ |
| 1377. | $L_{A11}$ | $L_{Q47}$ |
| 1378. | $L_{A11}$ | $L_{Q48}$ |
| 1379. | $L_{A11}$ | $L_{Q49}$ |
| 1380. | $L_{A11}$ | $L_{Q50}$ |
| 1381. | $L_{A11}$ | $L_{Q51}$ |
| 1382. | $L_{A11}$ | $L_{Q52}$ |
| 1383. | $L_{A11}$ | $L_{Q53}$ |
| 1384. | $L_{A11}$ | $L_{Q54}$ |
| 1385. | $L_{A11}$ | $L_{Q55}$ |
| 1386. | $L_{A11}$ | $L_{Q56}$ |
| 1387. | $L_{A11}$ | $L_{Q57}$ |
| 1388. | $L_{A11}$ | $L_{Q58}$ |
| 1389. | $L_{A11}$ | $L_{Q59}$ |
| 1390. | $L_{A11}$ | $L_{Q60}$ |
| 1391. | $L_{A11}$ | $L_{Q61}$ |
| 1392. | $L_{A11}$ | $L_{Q62}$ |
| 1393. | $L_{A11}$ | $L_{Q63}$ |
| 1394. | $L_{A11}$ | $L_{Q64}$ |
| 1395. | $L_{A11}$ | $L_{Q65}$ |
| 1396. | $L_{A11}$ | $L_{Q66}$ |
| 1397. | $L_{A11}$ | $L_{Q67}$ |
| 1398. | $L_{A11}$ | $L_{Q68}$ |
| 1399. | $L_{A11}$ | $L_{Q69}$ |
| 1400. | $L_{A11}$ | $L_{Q70}$ |
| 1401. | $L_{A11}$ | $L_{Q71}$ |
| 1402. | $L_{A11}$ | $L_{Q72}$ |
| 1403. | $L_{A11}$ | $L_{Q73}$ |
| 1404. | $L_{A11}$ | $L_{Q74}$ |
| 1405. | $L_{A11}$ | $L_{Q75}$ |
| 1406. | $L_{A11}$ | $L_{Q76}$ |
| 1407. | $L_{A11}$ | $L_{Q77}$ |
| 1408. | $L_{A11}$ | $L_{Q78}$ |
| 1409. | $L_{A11}$ | $L_{Q79}$ |

-continued

| Compound number | $L^1$ | $L^2$ |
|---|---|---|
| 1410. | $L_{A11}$ | $L_{Q80}$ |
| 1411. | $L_{A11}$ | $L_{Q81}$ |
| 1412. | $L_{A11}$ | $L_{Q82}$ |
| 1413. | $L_{A11}$ | $L_{Q83}$ |
| 1414. | $L_{A11}$ | $L_{Q84}$ |
| 1415. | $L_{A11}$ | $L_{Q85}$ |
| 1416. | $L_{A11}$ | $L_{Q86}$ |
| 1417. | $L_{A11}$ | $L_{Q87}$ |
| 1418. | $L_{A11}$ | $L_{Q88}$ |
| 1419. | $L_{A11}$ | $L_{Q89}$ |
| 1420. | $L_{A11}$ | $L_{Q90}$ |
| 1421. | $L_{A11}$ | $L_{Q91}$ |
| 1422. | $L_{A11}$ | $L_{Q92}$ |
| 1423. | $L_{A11}$ | $L_{Q93}$ |
| 1424. | $L_{A11}$ | $L_{Q94}$ |
| 1425. | $L_{A11}$ | $L_{Q95}$ |
| 1426. | $L_{A11}$ | $L_{Q96}$ |
| 1427. | $L_{A11}$ | $L_{Q97}$ |
| 1428. | $L_{A11}$ | $L_{Q98}$ |
| 1429. | $L_{A11}$ | $L_{Q99}$ |
| 1430. | $L_{A11}$ | $L_{Q100}$ |
| 1431. | $L_{A11}$ | $L_{Q101}$ |
| 1432. | $L_{A11}$ | $L_{Q102}$ |
| 1433. | $L_{A11}$ | $L_{Q103}$ |
| 1434. | $L_{A11}$ | $L_{Q104}$ |
| 1435. | $L_{A11}$ | $L_{Q105}$ |
| 1436. | $L_{A11}$ | $L_{Q106}$ |
| 1437. | $L_{A11}$ | $L_{Q107}$ |
| 1438. | $L_{A11}$ | $L_{Q108}$ |
| 1439. | $L_{A11}$ | $L_{Q109}$ |
| 1440. | $L_{A11}$ | $L_{Q110}$ |
| 1441. | $L_{A11}$ | $L_{Q111}$ |
| 1442. | $L_{A11}$ | $L_{Q112}$ |
| 1443. | $L_{A11}$ | $L_{Q113}$ |
| 1444. | $L_{A11}$ | $L_{Q114}$ |
| 1445. | $L_{A11}$ | $L_{Q115}$ |
| 1446. | $L_{A11}$ | $L_{Q116}$ |
| 1447. | $L_{A11}$ | $L_{Q117}$ |
| 1448. | $L_{A11}$ | $L_{Q118}$ |
| 1449. | $L_{A11}$ | $L_{Q119}$ |
| 1450. | $L_{A11}$ | $L_{Q120}$ |
| 1451. | $L_{A11}$ | $L_{Q121}$ |
| 1452. | $L_{A11}$ | $L_{Q122}$ |
| 1453. | $L_{A11}$ | $L_{Q123}$ |
| 1454. | $L_{A11}$ | $L_{Q124}$ |
| 1455. | $L_{A11}$ | $L_{Q125}$ |
| 1456. | $L_{A11}$ | $L_{Q126}$ |
| 1457. | $L_{A11}$ | $L_{Q127}$ |
| 1458. | $L_{A11}$ | $L_{Q128}$ |
| 1459. | $L_{A11}$ | $L_{Q129}$ |
| 1460. | $L_{A11}$ | $L_{Q130}$ |
| 1461. | $L_{A11}$ | $L_{Q131}$ |
| 1462. | $L_{A11}$ | $L_{Q132}$ |
| 1463. | $L_{A11}$ | $L_{Q133}$ |
| 1464. | $L_{A12}$ | $L_{Q1}$ |
| 1465. | $L_{A12}$ | $L_{Q2}$ |
| 1466. | $L_{A12}$ | $L_{Q3}$ |
| 1467. | $L_{A12}$ | $L_{Q4}$ |
| 1468. | $L_{A12}$ | $L_{Q5}$ |
| 1469. | $L_{A12}$ | $L_{Q6}$ |
| 1470. | $L_{A12}$ | $L_{Q7}$ |
| 1471. | $L_{A12}$ | $L_{Q8}$ |
| 1472. | $L_{A12}$ | $L_{Q9}$ |
| 1473. | $L_{A12}$ | $L_{Q10}$ |
| 1474. | $L_{A12}$ | $L_{Q11}$ |
| 1475. | $L_{A12}$ | $L_{Q12}$ |
| 1476. | $L_{A12}$ | $L_{Q13}$ |
| 1477. | $L_{A12}$ | $L_{Q14}$ |
| 1478. | $L_{A12}$ | $L_{Q15}$ |
| 1479. | $L_{A12}$ | $L_{Q16}$ |
| 1480. | $L_{A12}$ | $L_{Q17}$ |
| 1481. | $L_{A12}$ | $L_{Q18}$ |
| 1482. | $L_{A12}$ | $L_{Q19}$ |
| 1483. | $L_{A12}$ | $L_{Q20}$ |
| 1484. | $L_{A12}$ | $L_{Q21}$ |
| 1485. | $L_{A12}$ | $L_{Q22}$ |

-continued

| Compound number | $L^1$ | $L^2$ |
|---|---|---|
| 1486. | $L_{A12}$ | $L_{Q23}$ |
| 1487. | $L_{A12}$ | $L_{Q24}$ |
| 1488. | $L_{A12}$ | $L_{Q25}$ |
| 1489. | $L_{A12}$ | $L_{Q26}$ |
| 1490. | $L_{A12}$ | $L_{Q27}$ |
| 1491. | $L_{A12}$ | $L_{Q28}$ |
| 1492. | $L_{A12}$ | $L_{Q29}$ |
| 1493. | $L_{A12}$ | $L_{Q30}$ |
| 1494. | $L_{A12}$ | $L_{Q31}$ |
| 1495. | $L_{A12}$ | $L_{Q32}$ |
| 1496. | $L_{A12}$ | $L_{Q33}$ |
| 1497. | $L_{A12}$ | $L_{Q34}$ |
| 1498. | $L_{A12}$ | $L_{Q35}$ |
| 1499. | $L_{A12}$ | $L_{Q36}$ |
| 1500. | $L_{A12}$ | $L_{Q37}$ |
| 1501. | $L_{A12}$ | $L_{Q38}$ |
| 1502. | $L_{A12}$ | $L_{Q39}$ |
| 1503. | $L_{A12}$ | $L_{Q40}$ |
| 1504. | $L_{A12}$ | $L_{Q41}$ |
| 1505. | $L_{A12}$ | $L_{Q42}$ |
| 1506. | $L_{A12}$ | $L_{Q43}$ |
| 1507. | $L_{A12}$ | $L_{Q44}$ |
| 1508. | $L_{A12}$ | $L_{Q45}$ |
| 1509. | $L_{A12}$ | $L_{Q46}$ |
| 1510. | $L_{A12}$ | $L_{Q47}$ |
| 1511. | $L_{A12}$ | $L_{Q48}$ |
| 1512. | $L_{A12}$ | $L_{Q49}$ |
| 1513. | $L_{A12}$ | $L_{Q50}$ |
| 1514. | $L_{A12}$ | $L_{Q51}$ |
| 1515. | $L_{A12}$ | $L_{Q52}$ |
| 1516. | $L_{A12}$ | $L_{Q53}$ |
| 1517. | $L_{A12}$ | $L_{Q54}$ |
| 1518. | $L_{A12}$ | $L_{Q55}$ |
| 1519. | $L_{A12}$ | $L_{Q56}$ |
| 1520. | $L_{A12}$ | $L_{Q57}$ |
| 1521. | $L_{A12}$ | $L_{Q58}$ |
| 1522. | $L_{A12}$ | $L_{Q59}$ |
| 1523. | $L_{A12}$ | $L_{Q60}$ |
| 1524. | $L_{A12}$ | $L_{Q61}$ |
| 1525. | $L_{A12}$ | $L_{Q62}$ |
| 1526. | $L_{A12}$ | $L_{Q63}$ |
| 1527. | $L_{A12}$ | $L_{Q64}$ |
| 1528. | $L_{A12}$ | $L_{Q65}$ |
| 1529. | $L_{A12}$ | $L_{Q66}$ |
| 1530. | $L_{A12}$ | $L_{Q67}$ |
| 1531. | $L_{A12}$ | $L_{Q68}$ |
| 1532. | $L_{A12}$ | $L_{Q69}$ |
| 1533. | $L_{A12}$ | $L_{Q70}$ |
| 1534. | $L_{A12}$ | $L_{Q71}$ |
| 1535. | $L_{A12}$ | $L_{Q72}$ |
| 1536. | $L_{A12}$ | $L_{Q73}$ |
| 1537. | $L_{A12}$ | $L_{Q74}$ |
| 1538. | $L_{A12}$ | $L_{Q75}$ |
| 1539. | $L_{A12}$ | $L_{Q76}$ |
| 1540. | $L_{A12}$ | $L_{Q77}$ |
| 1541. | $L_{A12}$ | $L_{Q78}$ |
| 1542. | $L_{A12}$ | $L_{Q79}$ |
| 1543. | $L_{A12}$ | $L_{Q80}$ |
| 1544. | $L_{A12}$ | $L_{Q81}$ |
| 1545. | $L_{A12}$ | $L_{Q82}$ |
| 1546. | $L_{A12}$ | $L_{Q83}$ |
| 1547. | $L_{A12}$ | $L_{Q84}$ |
| 1548. | $L_{A12}$ | $L_{Q85}$ |
| 1549. | $L_{A12}$ | $L_{Q86}$ |
| 1550. | $L_{A12}$ | $L_{Q87}$ |
| 1551. | $L_{A12}$ | $L_{Q88}$ |
| 1552. | $L_{A12}$ | $L_{Q89}$ |
| 1553. | $L_{A12}$ | $L_{Q90}$ |
| 1554. | $L_{A12}$ | $L_{Q91}$ |
| 1555. | $L_{A12}$ | $L_{Q92}$ |
| 1556. | $L_{A12}$ | $L_{Q93}$ |
| 1557. | $L_{A12}$ | $L_{Q94}$ |
| 1558. | $L_{A12}$ | $L_{Q95}$ |
| 1559. | $L_{A12}$ | $L_{Q96}$ |
| 1560. | $L_{A12}$ | $L_{Q97}$ |
| 1561. | $L_{A12}$ | $L_{Q98}$ |

-continued

| Compound number | $L^1$ | $L^2$ |
|---|---|---|
| 1562. | $L_{A12}$ | $L_{Q99}$ |
| 1563. | $L_{A12}$ | $L_{Q100}$ |
| 1564. | $L_{A12}$ | $L_{Q101}$ |
| 1565. | $L_{A12}$ | $L_{Q102}$ |
| 1566. | $L_{A12}$ | $L_{Q103}$ |
| 1567. | $L_{A12}$ | $L_{Q104}$ |
| 1568. | $L_{A12}$ | $L_{Q105}$ |
| 1569. | $L_{A12}$ | $L_{Q106}$ |
| 1570. | $L_{A12}$ | $L_{Q107}$ |
| 1571. | $L_{A12}$ | $L_{Q108}$ |
| 1572. | $L_{A12}$ | $L_{Q109}$ |
| 1573. | $L_{A12}$ | $L_{Q110}$ |
| 1574. | $L_{A12}$ | $L_{Q111}$ |
| 1575. | $L_{A12}$ | $L_{Q112}$ |
| 1576. | $L_{A12}$ | $L_{Q113}$ |
| 1577. | $L_{A12}$ | $L_{Q114}$ |
| 1578. | $L_{A12}$ | $L_{Q115}$ |
| 1579. | $L_{A12}$ | $L_{Q116}$ |
| 1580. | $L_{A12}$ | $L_{Q117}$ |
| 1581. | $L_{A12}$ | $L_{Q118}$ |
| 1582. | $L_{A12}$ | $L_{Q119}$ |
| 1583. | $L_{A12}$ | $L_{Q120}$ |
| 1584. | $L_{A12}$ | $L_{Q121}$ |
| 1585. | $L_{A12}$ | $L_{Q122}$ |
| 1586. | $L_{A12}$ | $L_{Q123}$ |
| 1587. | $L_{A12}$ | $L_{Q124}$ |
| 1588. | $L_{A12}$ | $L_{Q125}$ |
| 1589. | $L_{A12}$ | $L_{Q126}$ |
| 1590. | $L_{A12}$ | $L_{Q127}$ |
| 1591. | $L_{A12}$ | $L_{Q128}$ |
| 1592. | $L_{A12}$ | $L_{Q129}$ |
| 1593. | $L_{A12}$ | $L_{Q130}$ |
| 1594. | $L_{A12}$ | $L_{Q131}$ |
| 1595. | $L_{A12}$ | $L_{Q132}$ |
| 1596. | $L_{A12}$ | $L_{Q133}$ |
| 1597. | $L_{A13}$ | $L_{Q1}$ |
| 1598. | $L_{A13}$ | $L_{Q2}$ |
| 1599. | $L_{A13}$ | $L_{Q3}$ |
| 1600. | $L_{A13}$ | $L_{Q4}$ |
| 1601. | $L_{A13}$ | $L_{Q5}$ |
| 1602. | $L_{A13}$ | $L_{Q6}$ |
| 1603. | $L_{A13}$ | $L_{Q7}$ |
| 1604. | $L_{A13}$ | $L_{Q8}$ |
| 1605. | $L_{A13}$ | $L_{Q9}$ |
| 1606. | $L_{A13}$ | $L_{Q10}$ |
| 1607. | $L_{A13}$ | $L_{Q11}$ |
| 1608. | $L_{A13}$ | $L_{Q12}$ |
| 1609. | $L_{A13}$ | $L_{Q13}$ |
| 1610. | $L_{A13}$ | $L_{Q14}$ |
| 1611. | $L_{A13}$ | $L_{Q15}$ |
| 1612. | $L_{A13}$ | $L_{Q16}$ |
| 1613. | $L_{A13}$ | $L_{Q17}$ |
| 1614. | $L_{A13}$ | $L_{Q18}$ |
| 1615. | $L_{A13}$ | $L_{Q19}$ |
| 1616. | $L_{A13}$ | $L_{Q20}$ |
| 1617. | $L_{A13}$ | $L_{Q21}$ |
| 1618. | $L_{A13}$ | $L_{Q22}$ |
| 1619. | $L_{A13}$ | $L_{Q23}$ |
| 1620. | $L_{A13}$ | $L_{Q24}$ |
| 1621. | $L_{A13}$ | $L_{Q25}$ |
| 1622. | $L_{A13}$ | $L_{Q26}$ |
| 1623. | $L_{A13}$ | $L_{Q27}$ |
| 1624. | $L_{A13}$ | $L_{Q28}$ |
| 1625. | $L_{A13}$ | $L_{Q29}$ |
| 1626. | $L_{A13}$ | $L_{Q30}$ |
| 1627. | $L_{A13}$ | $L_{Q31}$ |
| 1628. | $L_{A13}$ | $L_{Q32}$ |
| 1629. | $L_{A13}$ | $L_{Q33}$ |
| 1630. | $L_{A13}$ | $L_{Q34}$ |
| 1631. | $L_{A13}$ | $L_{Q35}$ |
| 1632. | $L_{A13}$ | $L_{Q36}$ |
| 1633. | $L_{A13}$ | $L_{Q37}$ |
| 1634. | $L_{A13}$ | $L_{Q38}$ |
| 1635. | $L_{A13}$ | $L_{Q39}$ |
| 1636. | $L_{A13}$ | $L_{Q40}$ |
| 1637. | $L_{A13}$ | $L_{Q41}$ |
| 1638. | $L_{A13}$ | $L_{Q42}$ |
| 1639. | $L_{A13}$ | $L_{Q43}$ |
| 1640. | $L_{A13}$ | $L_{Q44}$ |
| 1641. | $L_{A13}$ | $L_{Q45}$ |
| 1642. | $L_{A13}$ | $L_{Q46}$ |
| 1643. | $L_{A13}$ | $L_{Q47}$ |
| 1644. | $L_{A13}$ | $L_{Q48}$ |
| 1645. | $L_{A13}$ | $L_{Q49}$ |
| 1646. | $L_{A13}$ | $L_{Q50}$ |
| 1647. | $L_{A13}$ | $L_{Q51}$ |
| 1648. | $L_{A13}$ | $L_{Q52}$ |
| 1649. | $L_{A13}$ | $L_{Q53}$ |
| 1650. | $L_{A13}$ | $L_{Q54}$ |
| 1651. | $L_{A13}$ | $L_{Q55}$ |
| 1652. | $L_{A13}$ | $L_{Q56}$ |
| 1653. | $L_{A13}$ | $L_{Q57}$ |
| 1654. | $L_{A13}$ | $L_{Q58}$ |
| 1655. | $L_{A13}$ | $L_{Q59}$ |
| 1656. | $L_{A13}$ | $L_{Q60}$ |
| 1657. | $L_{A13}$ | $L_{Q61}$ |
| 1658. | $L_{A13}$ | $L_{Q62}$ |
| 1659. | $L_{A13}$ | $L_{Q63}$ |
| 1660. | $L_{A13}$ | $L_{Q64}$ |
| 1661. | $L_{A13}$ | $L_{Q65}$ |
| 1662. | $L_{A13}$ | $L_{Q66}$ |
| 1663. | $L_{A13}$ | $L_{Q67}$ |
| 1664. | $L_{A13}$ | $L_{Q68}$ |
| 1665. | $L_{A13}$ | $L_{Q69}$ |
| 1666. | $L_{A13}$ | $L_{Q70}$ |
| 1667. | $L_{A13}$ | $L_{Q71}$ |
| 1668. | $L_{A13}$ | $L_{Q72}$ |
| 1669. | $L_{A13}$ | $L_{Q73}$ |
| 1670. | $L_{A13}$ | $L_{Q74}$ |
| 1671. | $L_{A13}$ | $L_{Q75}$ |
| 1672. | $L_{A13}$ | $L_{Q76}$ |
| 1673. | $L_{A13}$ | $L_{Q77}$ |
| 1674. | $L_{A13}$ | $L_{Q78}$ |
| 1675. | $L_{A13}$ | $L_{Q79}$ |
| 1676. | $L_{A13}$ | $L_{Q80}$ |
| 1677. | $L_{A13}$ | $L_{Q81}$ |
| 1678. | $L_{A13}$ | $L_{Q82}$ |
| 1679. | $L_{A13}$ | $L_{Q83}$ |
| 1680. | $L_{A13}$ | $L_{Q84}$ |
| 1681. | $L_{A13}$ | $L_{Q85}$ |
| 1682. | $L_{A13}$ | $L_{Q86}$ |
| 1683. | $L_{A13}$ | $L_{Q87}$ |
| 1684. | $L_{A13}$ | $L_{Q88}$ |
| 1685. | $L_{A13}$ | $L_{Q89}$ |
| 1686. | $L_{A13}$ | $L_{Q90}$ |
| 1687. | $L_{A13}$ | $L_{Q91}$ |
| 1688. | $L_{A13}$ | $L_{Q92}$ |
| 1689. | $L_{A13}$ | $L_{Q93}$ |
| 1690. | $L_{A13}$ | $L_{Q94}$ |
| 1691. | $L_{A13}$ | $L_{Q95}$ |
| 1692. | $L_{A13}$ | $L_{Q96}$ |
| 1693. | $L_{A13}$ | $L_{Q97}$ |
| 1694. | $L_{A13}$ | $L_{Q98}$ |
| 1695. | $L_{A13}$ | $L_{Q99}$ |
| 1696. | $L_{A13}$ | $L_{Q100}$ |
| 1697. | $L_{A13}$ | $L_{Q101}$ |
| 1698. | $L_{A13}$ | $L_{Q102}$ |
| 1699. | $L_{A13}$ | $L_{Q103}$ |
| 1700. | $L_{A13}$ | $L_{Q104}$ |
| 1701. | $L_{A13}$ | $L_{Q105}$ |
| 1702. | $L_{A13}$ | $L_{Q106}$ |
| 1703. | $L_{A13}$ | $L_{Q107}$ |
| 1704. | $L_{A13}$ | $L_{Q108}$ |
| 1705. | $L_{A13}$ | $L_{Q109}$ |
| 1706. | $L_{A13}$ | $L_{Q110}$ |
| 1707. | $L_{A13}$ | $L_{Q111}$ |
| 1708. | $L_{A13}$ | $L_{Q112}$ |
| 1709. | $L_{A13}$ | $L_{Q113}$ |
| 1710. | $L_{A13}$ | $L_{Q114}$ |
| 1711. | $L_{A13}$ | $L_{Q115}$ |
| 1712. | $L_{A13}$ | $L_{Q116}$ |
| 1713. | $L_{A13}$ | $L_{Q117}$ |

-continued
| Compound number | $L^1$ | $L^2$ |
|---|---|---|
| 1714. | $L_{A13}$ | $L_{Q118}$ |
| 1715. | $L_{A13}$ | $L_{Q119}$ |
| 1716. | $L_{A13}$ | $L_{Q120}$ |
| 1717. | $L_{A13}$ | $L_{Q121}$ |
| 1718. | $L_{A13}$ | $L_{Q122}$ |
| 1719. | $L_{A13}$ | $L_{Q123}$ |
| 1720. | $L_{A13}$ | $L_{Q124}$ |
| 1721. | $L_{A13}$ | $L_{Q125}$ |
| 1722. | $L_{A13}$ | $L_{Q126}$ |
| 1723. | $L_{A13}$ | $L_{Q127}$ |
| 1724. | $L_{A13}$ | $L_{Q128}$ |
| 1725. | $L_{A13}$ | $L_{Q129}$ |
| 1726. | $L_{A13}$ | $L_{Q130}$ |
| 1727. | $L_{A13}$ | $L_{Q131}$ |
| 1728. | $L_{A13}$ | $L_{Q132}$ |
| 1729. | $L_{A13}$ | $L_{Q133}$. |
9. The first device of claim 1, wherein the compound is selected from the group consisting of:
Compound 8
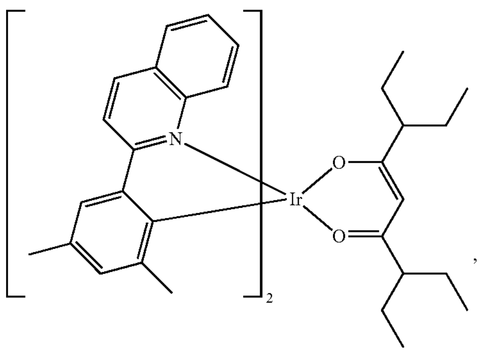
Compound 9
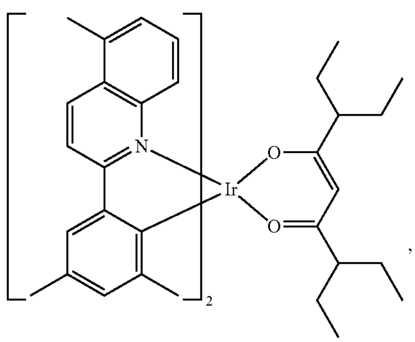
Compound 12
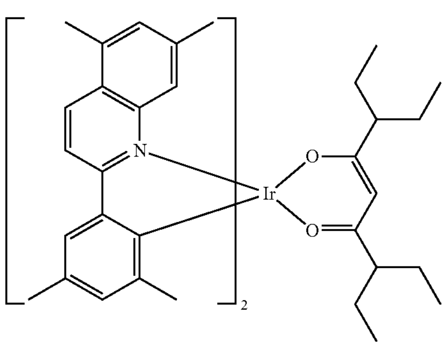
-continued
Compound 32
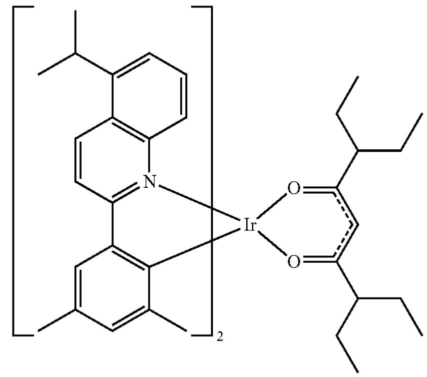
Compound 43
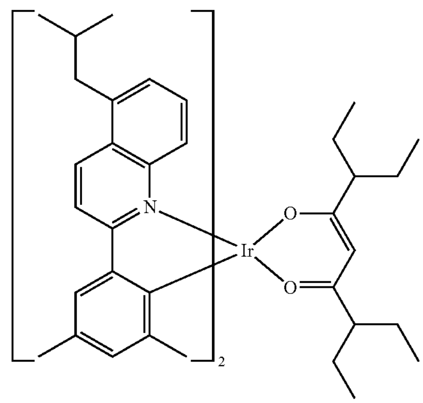
Compound 54
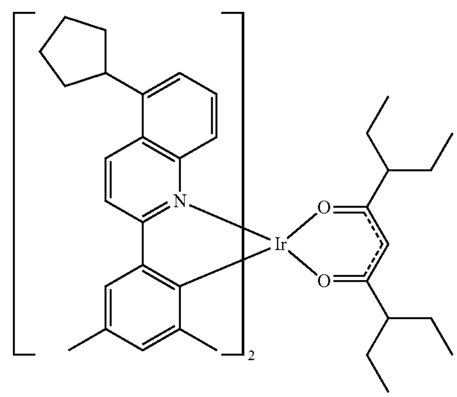
Compound 55
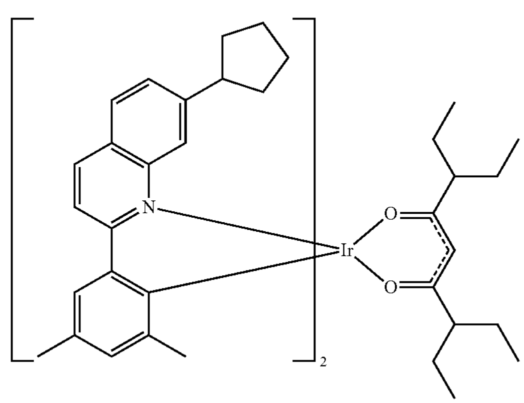

-continued

Compound 62

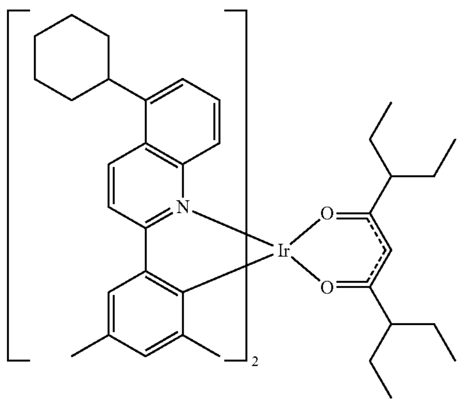

,

Compound 83

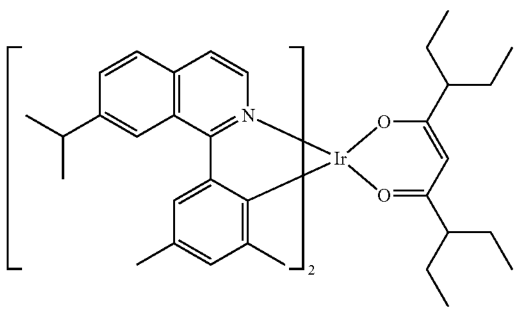

,

Compound 84

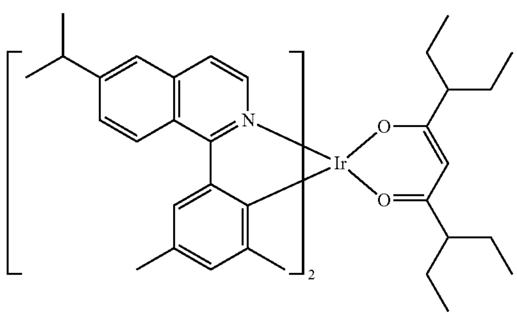

,

Compound 93

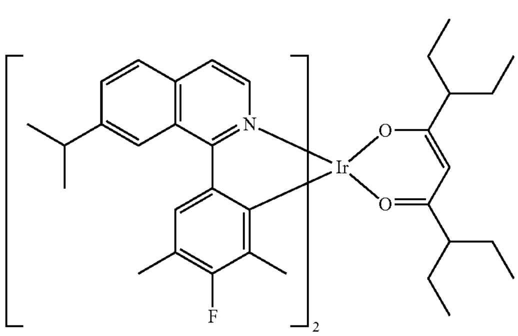

,

-continued

Compound 118

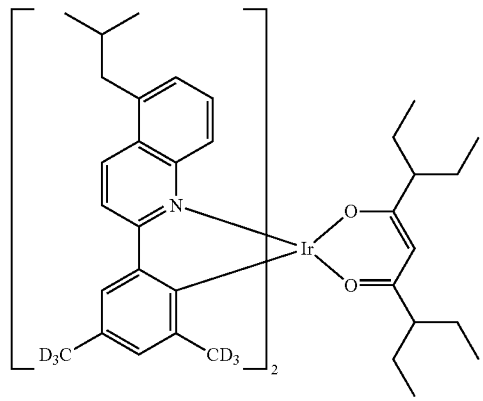

,

Compound 278

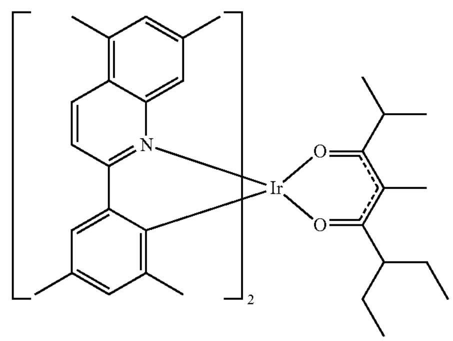

, and

Compound 320

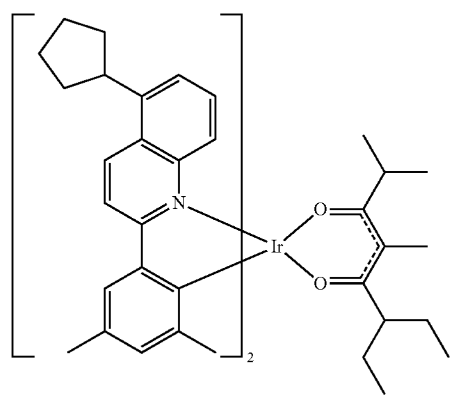

.

10. The first device of claim 1, wherein the first device is selected from the group consisting of a consumer product, an organic light emitting device, and a light panel.

11. The first device of claim 1, wherein the organic layer is an emissive layer and the compound is an emissive dopant or a non-emissive dopant.

12. The first device of claim 1, wherein the organic layer further comprises a host material.

13. The first device of claim 12, wherein the host material comprises a triphenylene containing benzo-fused thiophene or benzo-fused furan;

wherein any substituent in the host material is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1$-$Ar_2$, or $C_nH_{2n}{-}Ar_1$;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

14. The first device of claim 12, wherein the host material comprises at least one chemical group selected from the group consisting of carbazole, dibenzothiophene, dibenzofuran, dibenzoselenophene, azacarbazole, aza-dibenzothiophene, aza-dibenzofuran, and aza-dibenzoselenophene.

15. The first device of claim 12, wherein the host material is selected from the group consisting of:

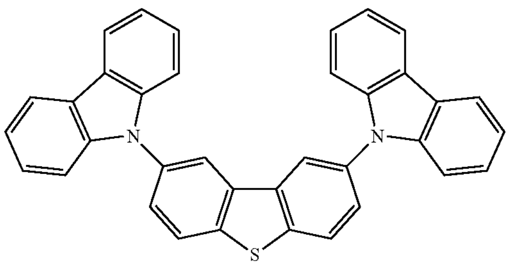

,

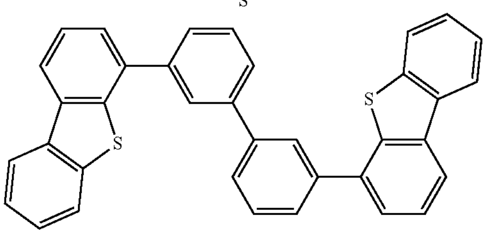

,

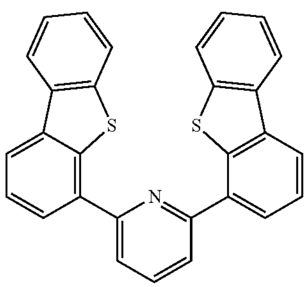

,

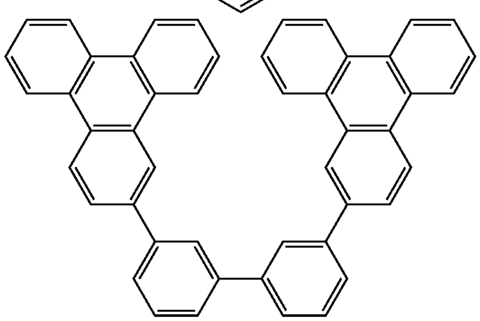

,

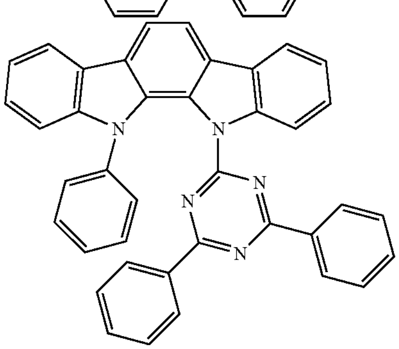

,

-continued

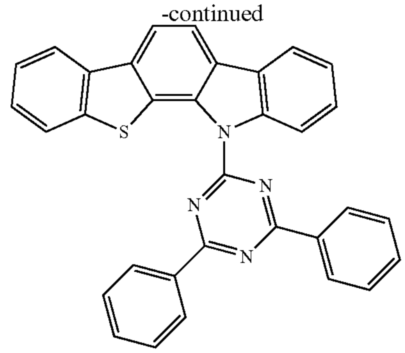

,

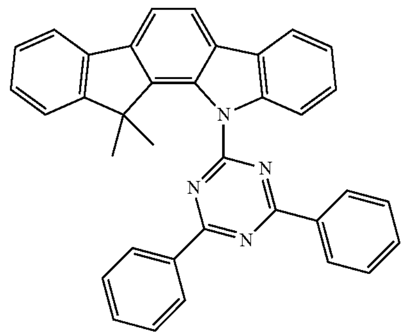

,

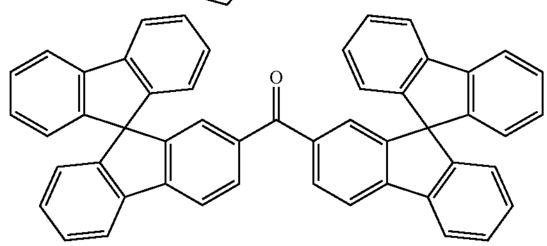

,

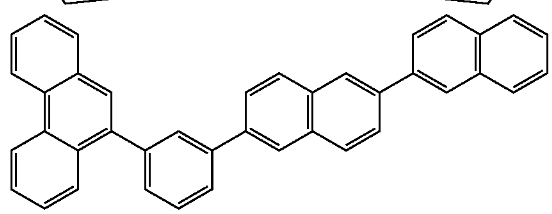

,

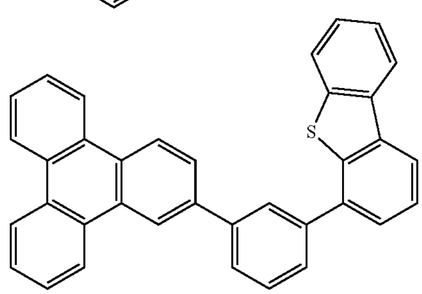

,

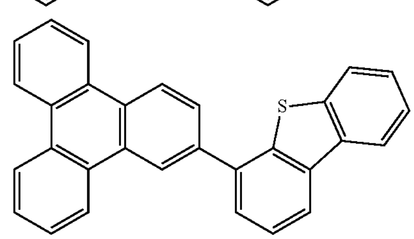

, and combinations thereof.

16. The first device of claim 1, wherein the compound has the formula of $Ir(L^1)_2(L^2)$.

17. The first device of claim 1, wherein each of $R^a$, and $R^b$ is selected from group consisting of hydrogen, deuterium, fluorine, alkyl, cycloalkyl, alkoxy, aryloxy, amino, silyl, aryl, heteroaryl, sulfanyl, and combinations thereof.

18. A first device comprising a first organic light emitting device, the first organic light emitting device comprising:

an anode;

a cathode; and an organic layer, disposed between the anode and the cathode, comprising a compound having a formula of $Ir(L^1)_x(L^2)_y$, wherein x is 1 or 2;

wherein y is 1 or 2;

wherein x+y is 3;

wherein the first ligand $L^1$ has the structure $L_{A1}$

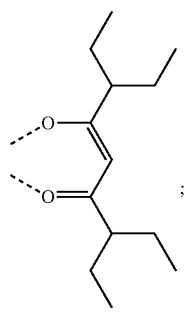

wherein the second ligand $L^2$ has a formula selected from the group consisting of

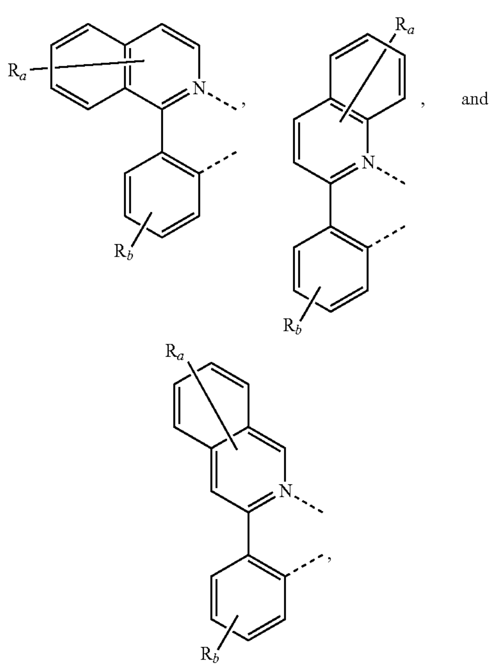

wherein $R_a$ and $R_b$ can represent mono, di, tri, or tetra substitution, or no substitution;

wherein each of $R_a$ and $R^b$ is selected from group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein two adjacent substituents of $R_a$ and $R_b$ are optionally joined to form a fused ring or form a multidentate ligand.

19. The first device of claim 18, wherein each of $R^a$, and $R^b$ is selected from group consisting of hydrogen, deuterium, fluorine, alkyl, cycloalkyl, alkoxy, aryloxy, amino, silyl, aryl, heteroaryl, sulfanyl, and combinations thereof.

20. A consumer product comprising an organic light emitting device comprising:

an anode;

a cathode; and an organic layer, disposed between the anode and the cathode, comprising a compound having a formula of $Ir(L^1)_x(L^2)_y$, wherein x is 1 or 2;

wherein y is 1 or 2;

wherein x+y is 3;

wherein the first ligand $L^1$ has the formula:

Formula I

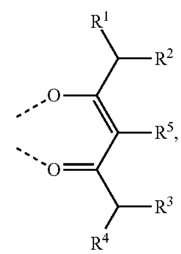

wherein the second ligand $L^2$ has a formula selected from the group consisting of

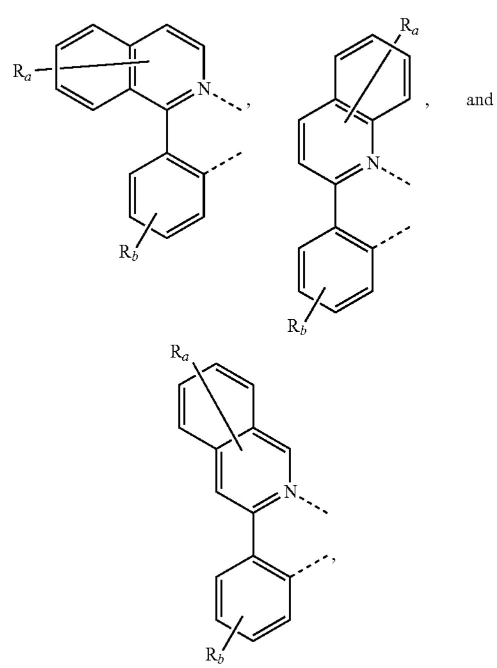

wherein $R^1$, $R^2$, $R^3$, and $R^4$ are independently selected from group consisting of alkyl and cycloalkyl;

wherein each of $R^1$, $R^2$, $R^3$, and $R^4$ has at least two C;

wherein $R_a$ and $R_b$ can represent mono, di, tri, or tetra substitution, or no substitution;

wherein each of $R^a$, $R^b$, and $R^5$ is selected from group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein two adjacent substituents of $R_a$ and $R_b$ are optionally joined to form a fused ring or form a multidentate ligand; and wherein $R^1$ and $R^2$ or $R^3$ and $R^4$ can be joined to form into a ring.

* * * * *